US006184456B1

(12) United States Patent
Matsuyama et al.

(10) Patent No.: US 6,184,456 B1
(45) Date of Patent: Feb. 6, 2001

(54) PHOTOVOLTAIC DEVICE

(75) Inventors: Jinsho Matsuyama, Souraku-gun; Koichi Matsuda, Ikoma, both of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 08/985,312

(22) Filed: Dec. 4, 1997

(30) Foreign Application Priority Data

| | | |
|---|---|---|
| Dec. 6, 1996 | (JP) | 8-342725 |
| Dec. 6, 1996 | (JP) | 8-342726 |
| Jan. 8, 1997 | (JP) | 9-013364 |
| Jan. 8, 1997 | (JP) | 9-013365 |

(51) Int. Cl.[7] .......... H01L 31/00
(52) U.S. Cl. .......... 136/256; 136/258
(58) Field of Search .......... 136/256, 258 PC

(56) References Cited

U.S. PATENT DOCUMENTS

| | | | | |
|---|---|---|---|---|
| 4,431,858 | * | 2/1984 | Gonzalez et al. | 136/258 |
| 5,244,509 | * | 9/1993 | Arao et al. | 136/259 |
| 5,284,525 | * | 2/1994 | Saito et al. | 136/256 |
| 5,486,238 | * | 1/1996 | Nakagawa et al. | 136/259 |
| 5,498,904 | * | 3/1996 | Harata et al. | 257/62.3 |
| 5,668,050 | * | 9/1997 | Iwasaki | 438/69 |

FOREIGN PATENT DOCUMENTS 60-84888 5/1985 (JP) .......... H01L/31/04

OTHER PUBLICATIONS

Borden et al. "The V–Groove Silicon Solar Cell" Conference Record, 16th IEEE Photovoltaic Specialists Conf., Sep. 1982.*

Hamakawa, et al., "New Types of High Efficiency Solar Cells Based on α–Si", Appl. Phys. Lett; 43 (7) pp. 644–646 (1983).

Deckman, et al.; "Optical Enhancement of a α–$SiH_x$ Solar Cells", 16th IEEE Photov. Spec. Conf. pp. 1425–1426 San Diego, CA (1982).

Tiedje, et al.; "Enhanced Optical Absorption By Light Trapping in Amorphous Silicon Films", 16th IEEE Photov. Spec. Conf., pp. 1423–1424, San Diego, CA (1982).

* cited by examiner

*Primary Examiner*—Mark Chapman
(74) *Attorney, Agent, or Firm*—Fitzpatrick, Cella, Harper & Scinto

(57) ABSTRACT

A photovoltaic device of the present invention has a non-single-crystal semiconductor. A layer underlying the non-single-crystal semiconductor has a polycrystalline structure. Individual grains of the polycrystal exposed in the surface of the underlying layer have smooth surfaces. The surface of the underlying layer has a step along the grain boundaries of the polycrystal, or a protrusion or recess at the grain boundaries. Alternatively, polycrystal grains having rough surfaces and polycrystal grains having smooth surfaces commonly exist in the surface of the polycrystalline layer. The polycrystalline layer may be a substrate of the photovoltaic device. The present invention, by virtue of the use of such a polycrystalline layer, provides a highly reliable and efficient thin-film photovoltaic device which enhances light absorption by the semiconductor layer and which can be produced at a high yield even at a practically adoptable low cost, while eliminating deficiencies of known arts in regard to workability, yield and durability.

32 Claims, 14 Drawing Sheets

10 µm

PHOTOVOLTAIC DEVICE

BACKGROUND OF THE INVENTION

1. Field of the Invention

The present invention relates to a photovoltaic device and, more particularly, to a photovoltaic device which, by virtue of light confinement effect, exhibits improved photoelectric conversion efficiency, as well as improved weather resistance and durability, and which offers a greater yield in the production process.

2. Description of the Related Art

Various materials of photovoltaic device devices have been known, such as tetrahedral amorphous semiconductors and polycrystalline semiconductors, e.g., amorphous silicon, amorphous silicon germanium and amorphous silicon carbide, II-VI group compound semiconductors, e.g., CdS and $Cu_2S$, and III-V group compound semiconductors. e.g., GaAs, GaAlAs and so forth. Among these known materials, thin-film photovoltaic device devices having photoelectromotive force generating layer made of an amorphous semiconductor or a polycrystalline semiconductor are considered as being promising, because the use of such materials enables formation of a film of greater area than that made of a single-crystal silicon and reduces the required thickness of the film, while permitting deposition on any desired suitable substrate material.

Such a thin-film photovoltaic device, however, cannot provide photoelectric conversion efficiency of a high level which would compare with that of photovoltaic device using single-crystal silicon. It is necessary that improvements are achieved both in photoelectric conversion efficiency and durability, in order that this type of photovoltaic device is put to practical use.

Various attempts have been made with an aim to improve photoelectric conversion efficiency of thin-film photovoltaic devices. One of the requisites for achieving higher photoelectric conversion efficiency is to enhance absorption of light in the semiconductor layer of the thin film, so as to improve short-circuit current (Jsc). Enhancement of the light absorption is necessary because the thinner semiconductor layer which on the one hand meets the requirement for lower production cost and on the other hand reduces the light absorption as compared with devices using bulk semiconductors. There are five types of technology available for enhancing light absorption in thin-film semiconductor layer, as shown in (1) to (5) below.

(1) A technique has been known in which a reflective film having a high level of reflectance, such as of Ag, Al, Cu, Au or the like, is formed on the side of the photovoltaic device element opposite to the light incident side. According to this technique, the light which has passed through the carrier-generating semiconductor layer is reflected by the reflective film so as to be further absorbed by the semiconductor layer, so that the light absorption in the thin-film semiconductor layer is enhanced to provide a greater output current, whereby photoelectric conversion efficiency is improved.

(2) A method has been disclosed in Japanese {Patent Publication Nos. 59-43101 (Applicant: Fuji Electric Co., Ltd.)) and 60-41878 (Applicant: Sharp Corp.) in which the surface nature of a substrate is improved by a transparent conductive layer intervening between a back-side electrode and a semiconductor layer. According to these disclosures, the transparent conductive layer intervening between the back-side electrode and the semiconductor layer improves the smoothness of the back-side electrode, as well as adhesion of the semiconductor layer, and effectively prevents an alloying reaction between the metal constituting the back-side electrode and the semiconductor layer.

(3) Japanese Patent Laid-Open No. 60-84888 (Applicant: Energy Conversion Devices) discloses a technique in which a transparent conductive layer serving as a barrier layer is formed between a back-side electrode and a semiconductor layer, so as to reduce electrical current flowing through the defective region of the semiconductor layer.

(4) Y. Hamakawa et. al., Appl. Phys. Lett., 43 (1983), p644, reports that a transparent conductive layer of $TiO_2$ interposed between an Ag back-side electrode and an amorphous silicon semiconductor layer serves to enhance sensitivity in longer-wavelength region in the spectral sensitivity of a solar cell.

(5) A technique has been proposed in which the surface of a back-side electrode is textured on the order of the wavelength of the light. According to this technique, long-wavelength light rays which have not been absorbed in the semiconductor layer are scattered so as to provide an effect that the light paths in the semiconductor layer are extended to improve the sensitivity of the photovoltaic device at the long-wavelength region. Consequently, short-circuit current is enhanced to improve photoelectric conversion efficiency. This technique is disclosed in T. Tiedje et. al., Proc. 16th IEEE Photovoltaic Specialist Conf., (1982), p 1423 and also in H. Deckman et. al., Proc. 16th IEEE Photovoltaic Specialist Conf., (1982), p 1425.

With the knowledge concerning these techniques, a photovoltaic device is recommended that has a back-side reflection layer made of a metallic film having a high level of reflectance and which has a light scattering texture of a size on the order of light wavelengths, while serving also as a back-side electrode, and that has a transparent conductive film provided between the back-side reflective film and the semiconductor layer.

It has been found, however, that practical production of a photovoltaic device having such a back-side electrode encounters the following problems (a) to (d) in regard to workability of the materials and durability of the products.

(a) It has been considered that the texture preferably has pyramidal shapes such as those disclosed in T. Tiedje, et. al., Proc. 16th IEEE Photovoltaic Specialist Conf. (1982), p1423, as such shapes are believed to provide superior light confinement effect. It has been discovered, however, that formation of an electrode and a semiconductor layer on the substrate having such a texture tends to cause a leak current through the defect region of the semiconductor layer to increase, thus impairing the yield of production of photovoltaic devices. In addition, the semiconductor layer formed on the substrate surface having such pyramidal texture has an effective thickness smaller than that of a semiconductor layer formed on a smooth substrate surface. Consequently, the effective thicknesses of layers such as a doping layer in the thin-film photovoltaic device, which are intentionally designed to have smaller thicknesses than those in existing devices, are further reduced, with the result that the open circuit voltage (Voc) and fill factor (FF) are reduced as compared with those of photovoltaic devices formed on a smooth substrate surface.

(b) The use of Ag or Cu as the material of the metallic back-side reflection layer involves a problem in that migration of Ag or Cu tends to occur, particularly under a positive bias voltage applied to the metallic back-side reflection layer in a highly humid atmosphere. Such migration allows electrodes on the light-incident side to conduct, thus causing a shunting of the photovoltaic device. It has been confirmed that this phenomenon is remarkable particularly when the metallic back-side reflection layer has a texture on the order of light wavelengths.

(c) Migration such as that observed with the use of Ag or Cu does not occur when Al is used as the material of the back-side reflection layer. In this case, however, the reflectance is lowered when the substrate has a texture. In some cases, reflectance was seriously lowered when a transparent conductive layer was superposed on the textured surface of the Al reflection layer.

(d) Use of a substrate and a back-side reflection layer having smooth surfaces rather than textured surfaces causes insufficient light absorption because the scattering of the light rays at the back side is not appreciable. In addition, such smooth surfaces tend to cause insufficient adhesion between the substrate and the back-side reflection layer, undesirably allowing separation of the back-side reflection layer from the substrate in the course of production of the photovoltaic devices.

These problems are serious particularly when the production process employs, for the purpose of low-cost commercial production, inexpensive substrate material such as a resin film, stainless steel or the like, and higher speed of formation of the semiconductor layer, with the result that the yield of the products is undesirably limited.

SUMMARY OF THE INVENTION

Under these circumstances, it is an object of the present invention to provide a thin-film photovoltaic device which exhibits a high degree of reliability and a high level of photoelectric conversion efficiency, as well as enhanced light absorption by the semiconductor layer, and which can be produced at a high yield despite reduced costs of production, thereby overcoming the problems in regard to workability, yield and durability encountered by the prior art.

The inventors have made an intense study in regard to novel structure and production method of a substrate, in order to obtain a photovoltaic device having superior workability and reliability, as well as enhanced light absorption by the semiconductor layer, while eliminating deficiencies in regard to workability and reliability. As a result, the inventors have found that the foregoing objects of the present invention can be achieved by a photovoltaic device of the present invention which comprises a substrate having structural features set forth below and/or a polycrystalline thin film layer formed on such a substrate, thus accomplishing the present invention.

According to one aspect of the present invention, there is provided a photovoltaic device, comprising: a substrate made of a polycrystalline material;

and a non-single-crystal semiconductor formed on the substrate; wherein the polycrystal grains exposed on the surface of the substrate have smooth surfaces, and wherein the surface of the substrate has a step along the polycrystal grain boundaries, or a protrusion or a recess at the polycrystalline grain boundaries.

According to a second aspect of the present invention, there is provided a photovoltaic device, comprising: a substrate made of a polycrystalline material; and a non-single-crystal semiconductor formed on the substrate; wherein polycrystal grains having rough surfaces and polycrystalline crystal grains having smooth surfaces exist in the surface of the substrate.

According to a third aspect of the present invention, there is provided a photovoltaic device comprising: a substrate; and a polycrystalline thin film and a non-single-crystal semiconductor which are formed on the substrate; wherein the surfaces of individual polycrystal grains of the polycrystalline thin film are substantially smooth, and the surface of the polycrystalline thin film has a step along the polycrystal grain boundary, or a protrusion or recess at the grain boundary.

According to a fourth aspect of the present invention, there is provided a photovoltaic device comprising: a substrate; and a polycrystalline thin film and a non-single-crystal semiconductor; wherein polycrystal grains having rough surfaces and polycrystal grains having smooth surfaces exist in the surface of the polycrystalline thin film.

The features set forth above provide the following advantages.

The polycrystalline substrate or the polycrystalline thin film of the present invention exhibits superior adhesion to a thin film formed thereon, as compared with the conventional polycrystalline substrate or a polycrystalline thin film having a smooth surface. Therefore, peeling of the thin film from the substrate is avoided in the process of production of photovoltaic device, so that controllability and flexibility of the production process are enhanced. At the same time, yield of production of the photovoltaic device is improved.

In addition, it has been confirmed through a weather-resistance acceleration test such as high-temperature high-humidity test and salt spray test that the photovoltaic device of the present invention exhibits superior weather resistance. Superior durability also has been confirmed through a scratch test and a mechanical strength test such as a bending test.

The steps or protrusions or recesses at the grain boundaries or partial surface roughness in the polycrystalline substrate or the polycrystalline film surface enhances random reflection at the back side of the photovoltaic device. Consequently, the long-wavelength light rays which could not be absorbed in the semiconductor layer can be scattered so as to extend the lengths of light paths in the semiconductor layer, which in turn enhances the short-circuit current (Jsc) of the photovoltaic device so as to improve the photoelectric conversion efficiency.

At the same time, the series resistance of the photovoltaic device is reduced so that the fill factor (FF) is enhanced, thus contributing to improvement in the photoelectric conversion efficiency. The reason why the series resistance is reduced has not yet been theoretically clarified. It is, however, considered that such a reduction is attributable to the improved adhesion between the thin film and the polycrystalline substrate or between the thin film and the polycrystalline film. It is also considered that the reduction of the series resistance owes to removal of impurities from the surface of the polycrystalline substrate or the polycrystalline thin film, because the processing of such a surface is performed physically or chemically, through etching with a gaseous phase or a liquid phase. Removal of oxide layer from the surface of the substrate or the polycrystalline thin film also is considered to be one of the reasons of the reduction in the series resistance.

It has been confirmed also that the photovoltaic device of the present invention exhibits reduced leak current, as compared with the conventional devices having polycrystalline substrates with uniform and regular texture. This effect also contributes to an enhancement of the yield. In addition, the photovoltaic device of the present invention exhibits greater open circuit voltage (Voc) and fill factor (FF), while maintaining a high value of short-circuit current. This also contributes to the improvement in the photoelectric conversion efficiency. It is considered that such an advantageous effect is attributed to the following fact. The so-called conventional texture structure has a series of a pyramidal or similar shape. An attempt to increase the height of the pyramidal shape tends to allow defects of the semiconductor layer to appear in the pyramidal summit. In contrast, generation of defects of the semiconductor layer is suppressed in the photovoltaic device of the present invention which is devoid of pyramidal texture.

The semiconductor layer formed on the surface having pyramidal texture has an effective thickness smaller than that of a semiconductor layer formed on a flat surface. The effective thicknesses of layers such as a doping layer, which are intentionally designed to have smaller thicknesses than those in existing devices, are further reduced, with the results that the open circuit voltage (Voc) and fill factor (FF) are reduced. In contrast, in the photovoltaic device of the present invention, the substrate surface is smooth in a polycrystal grain, except for the grain boundaries. Alternatively, rough surfaces are formed only in part of the polycrystal grains, while other polycrystal grains have rather smooth surfaces. Therefore, no substantial thinning of the semiconductor layer is caused. This is considered one of the reasons why the open circuit voltage (Voc) and the fill factor (FF) are increased while a high level of short-circuit current (Jsc) is maintained.

In the conventional devices of the type in which the aforesaid metal having high reflectance is laminated on the substrate surface having so-called texture consisting of pyramidal shapes, or of the type in which the metallic back-side reflection layer of the metal having high reflectance presents a surface with the pyramidal texture structure, the metal of the high reflectance tends to migrate or be diffused into the semiconductor layer, with the result that a shunt of the photovoltaic device is undesirably allowed. In contrast, the use of the substrate of the present invention substantially eliminates diffusion or migration of the metal of high reflectance into the semiconductor layer, thus contributing to an improvement in the yield of production of the photovoltaic device, without impairing the high levels of random reflection and short-circuit current (Jsc). Furthermore, the leak current in the photovoltaic device is reduced, resulting in enhanced open circuit voltage (Voc) and fill factor (FF).

Aluminum is preferably used as the dominant material of the metallic back-side reflection layer, partly because aluminum is inexpensive and partly because it exhibits smaller tendency of migration than silver and copper. Lamination of aluminum on the surface of the substrate having conventional texture structure in the form of pyramidal shapes often results in a reduced total reflection by the surface of the aluminum layer. This is so also in the case where the aluminum layer itself has such a texture structure. A further reduction in the total reflection is caused when a transparent conductive layer is laminated on the aluminum layer. Thus, aluminum could not suitably be used as the material of the back-side reflection layer. Lamination of an aluminum layer on a flat substrate surface also is not preferred because of deficiencies such as reduction in the short-circuit current (Jsc) of the photovoltaic device and easy peeling of the aluminum from the substrate. In contrast, lamination of aluminum on the substrate of the present invention, with or without a transparent conductive layer formed on the aluminum, does not suffer from the reduction in the total reflection. The photovoltaic device of the present invention, therefore, exhibits enhanced light absorption by the semiconductor layer and, accordingly, increased short-circuit current (Jsc), by virtue of the high total reflection presented by the aluminum layer surface. Furthermore, the adhesion between the substrate and the aluminum, as well as flexibility and controllability of the production process, are increased and, at the same time, yield of production of the photovoltaic device is improved. Furthermore, the photovoltaic device of the invention exhibits improved weather resistance and durability.

As stated before, the aluminum layer having the conventional texture structure composed of pyramidal shapes over the entire surface suffers from a reduction in the total reflection. The reason why such a reduction in total reflection occurs has not yet been clarified. It is, however, assumed that the micro-fine pyramidal structure of a size on the order of light wavelength enhances the surface area of the aluminum, which increases the tendency for a reaction to occur at the interface between the aluminum and the transparent conductive layer, thus allowing a compound to be formed on the interface so as to reduce the reflectance. This should be contrasted to the first or second aspect of the present invention which uses a specific substrate and the third or fourth aspect which uses aluminum as the material of the polycrystalline thin film, wherein the increase of the aluminum surface is avoided so that the reaction at the interface between the aluminum and the transparent conductive layer is suppressed, thus offering a remarkable increase in the total reflection.

DESCRIPTION OF THE PREFERRED EMBODIMENTS

Figure 1A:
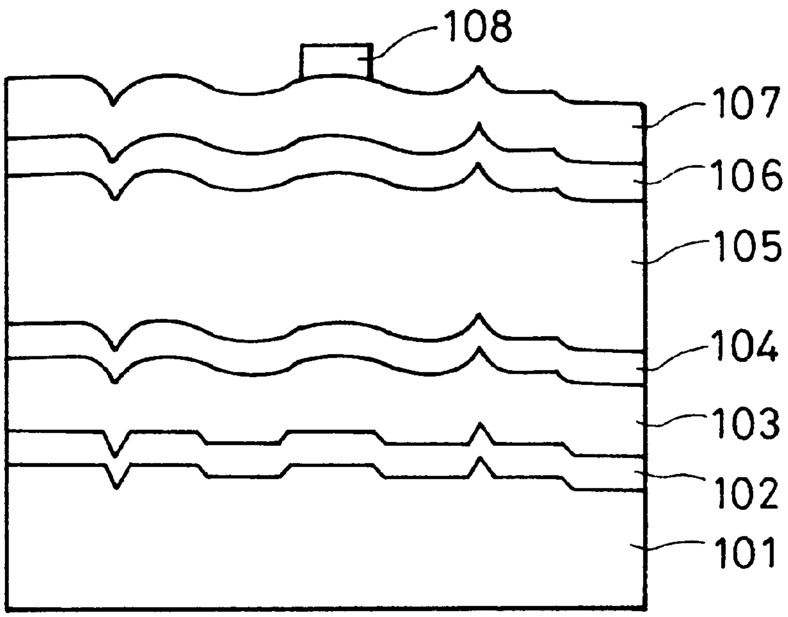
FIGS. 1A to 1D are schematic sectional views of an example of the layer structure in a photovoltaic device in accordance with the present invention.

FIGS. 1A to 1D and FIGS. 2A to 2D show, by way of examples, different forms of the photovoltaic device embodying the present invention. A detailed description will now be given of the construction of a photovoltaic device of the present invention, as well as to a method of producing the photovoltaic device.

FIGS. 1A to 1D are sectional views of a photovoltaic device of the present invention, explanatory of the concept of the present invention. It is to be understood that the photovoltaic device shown in these Figures is not intended to limit the scope of the photovoltaic device of the present invention. Referring to these Figures, there are shown a substrate 101, a metallic back-side electrode 102, a transparent conductive layer 103, an n-type semiconductor layer 104, an i-type semiconductor layer 105, a p-type semiconductor layer 106, a transparent electrode 107, and a collector electrode 108. The structure shown in FIGS. 1A to 1D are of the type in which the incident light enters through the p-type semiconductor layer. When the photovoltaic device is designed such that the incident light enters through the n-type semiconductor layer, the layer 104 is a p-type semiconductor layer, while the layer 106 is an n-type semiconductor layer.

The photovoltaic device shown in FIGS. 1A to 1D are constructed such that the light is made to be incident from the side opposite to the substrate. It is to be understood that the layers except for the substrate may be laminated in the order reverse to that shown in these Figures, in order to obtain a photovoltaic device of the type in which the light is made to be incident from the same side as the substrate.

FIGS. 2A to 2D show, by way of example, sectional views of a stack-type photovoltaic device explanatory of the concept of the present invention. The stack-type photovoltaic device of the present invention shown in these Figures have a lamination of three pin junctions. A first pin junction 215, a second pin junction 216 and a third pin junction 217 are stacked in the order as counted from the light incident side. The photovoltaic device has a substrate 201 on which are formed a metallic back-side reflection layer 202 and a transparent conductive layer 203 on which the three pin junctions are laminated. A transparent electrode 213 and a collecting electrode 214 are formed on the top of the three pin junctions, thus completing the stack-type photovoltaic device. Each pin junction is composed of an n-type semiconductor layer 204 (207, 210), an i-type semiconductor layer 205 (208, 211) and a p-type semiconductor layer 206 (209, 212). As in the case of the photovoltaic device shown in FIGS. 1A to 1D, the positions of the doping layer and the electrode may be changed depending on the direction of the incident light.

A detailed description will now be given of each of the layers of the photovoltaic device. The layers will be mentioned in the order of formation in the production process.

(Substrate)

The substrate has unique crystalline state and surface nature which provide one of the characteristic features of the present invention. The substrate has a polycrystalline structure.

Figure 2A:
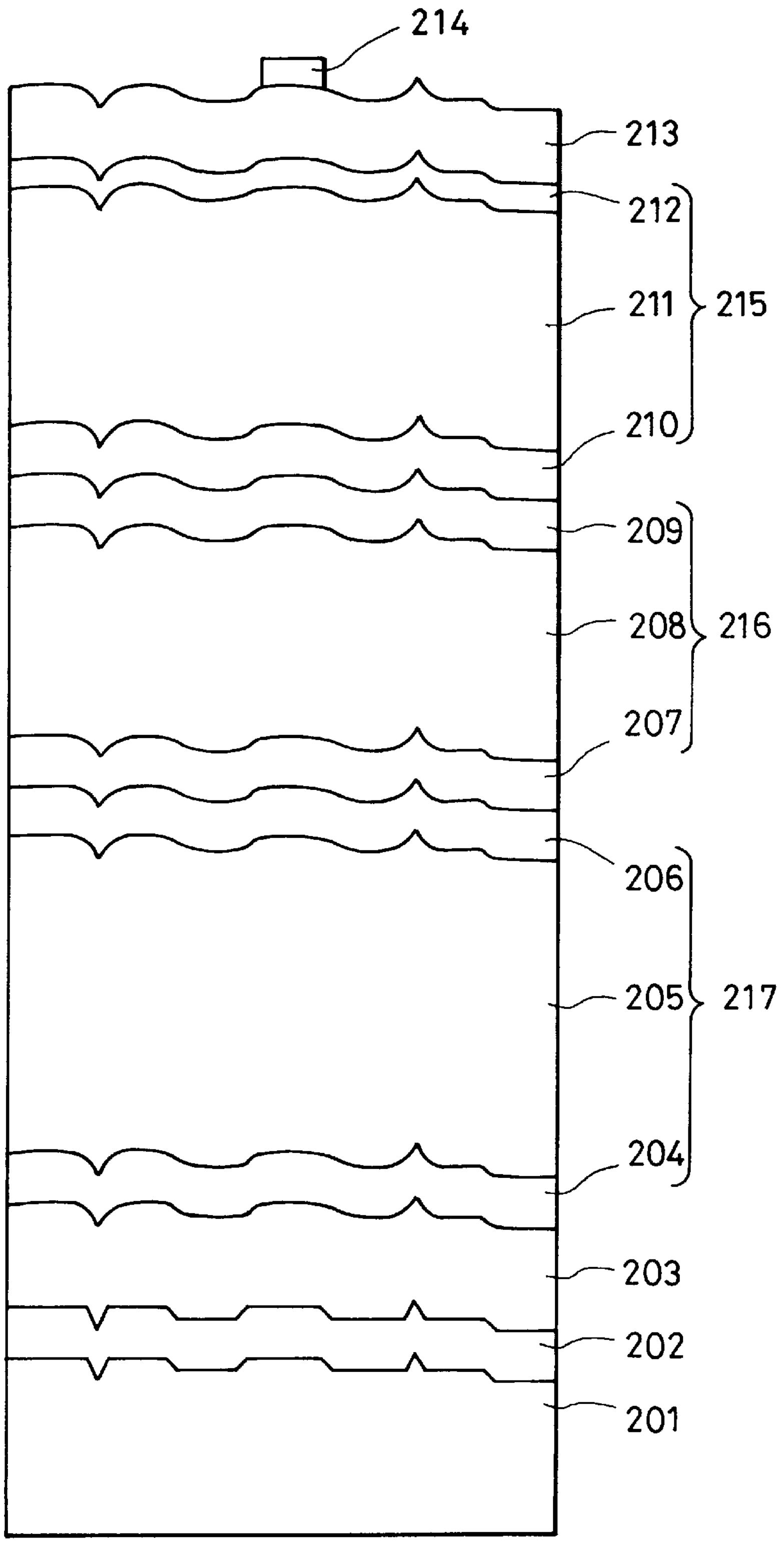
FIGS. 2A to 2D are schematic sectional views showing another example of the layer structure of the photovoltaic device in accordance with the present invention.

Referring to FIGS. 1A and 2A showing photovoltaic devices in accordance with the first aspect of the invention which use a first form of the substrate. Each of the substrates 101, 201 has a surface in which exposed are polycrystalline crystal grains having smooth surfaces. The substrate surface has a step along the polycrystal grain boundary, or a protrusion or recess at the polycrystal grain boundary.

The inventors have found that a too small height of the step or protrusion or recess along the polycrystal grain boundary serves to reduce the scattering of light, thus undesirably leading to a reduction in the short-circuit current Jsc, whereas a too large height causes a leak current of the photovoltaic device to increase, resulting in a reduction of the production yield.

The inventors also found that the height or depth of the step along the polycrystal grain boundary or protrusion or recess at the polycrystal grain boundary preferably ranges from 0.01 $\mu$m to 2 $\mu$m, more preferably from 0.02 $\mu$m to 1.5 $\mu$m, and most preferably from 0.03 $\mu$m to 1 $\mu$m. It has also been found that the degree of roughness of the surfaces of the independent polycrystal grains exposed in the substrate surface in terms of Rmax is preferably smaller than the height of the step or the height of protrusion or recess along the polycrystal grain boundary. A large Rmax of the crystal grain surface provides a surface nature similar to that of the conventional texture structure, resulting in deficiencies encountered with the conventional texture structure, such as an increase in the leak current, shunting of photovoltaic device, and reduction both in the open circuit voltage Voc and the fill factor FF. Thus, the preferred range of the degree of roughness in individual grains vary depending on the height of the step or protrusion or recess along the polycrystal grain boundary. The roughness, however, preferably not greater than 2 $\mu$m, more preferably not greater than 1 $\mu$m and most preferably not greater than 0.5 $\mu$m, in terms of Rmax.

A too small mean grain size of the polycrystal, e.g., below 0.1 $\mu$m, decreases the pitch or spacing of the steps or protrusions or recesses, so that a surface nature becomes similar to that of the conventional texture structure composed of pyramidal shapes, leading to the deficiencies such as increase in the leak current, shunting of the photovoltaic device, and reduction both in the open circuit voltage Voc and the fill factor FF which are encountered with the conventional devices. It has been found also that a too large mean grain size of the polycrystal grains, e.g., above 2 mm, decreases the random reflection at the back side of the photovoltaic device, with the result that the short-circuit current Jsc is decreased.

Therefore, the mean grain size of the polycrystal preferably ranges from 0.1 $\mu$m to 2 mm, more preferably from 0.2 $\mu$m to 1 mm and most preferably from 0.5 $\mu$m to 100 $\mu$m.

Figure 1B:
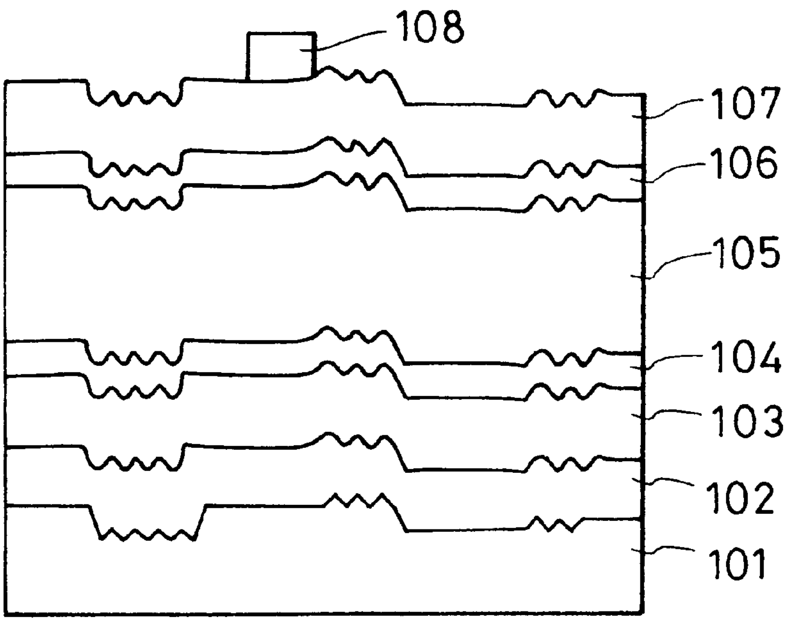
Figure 2B:
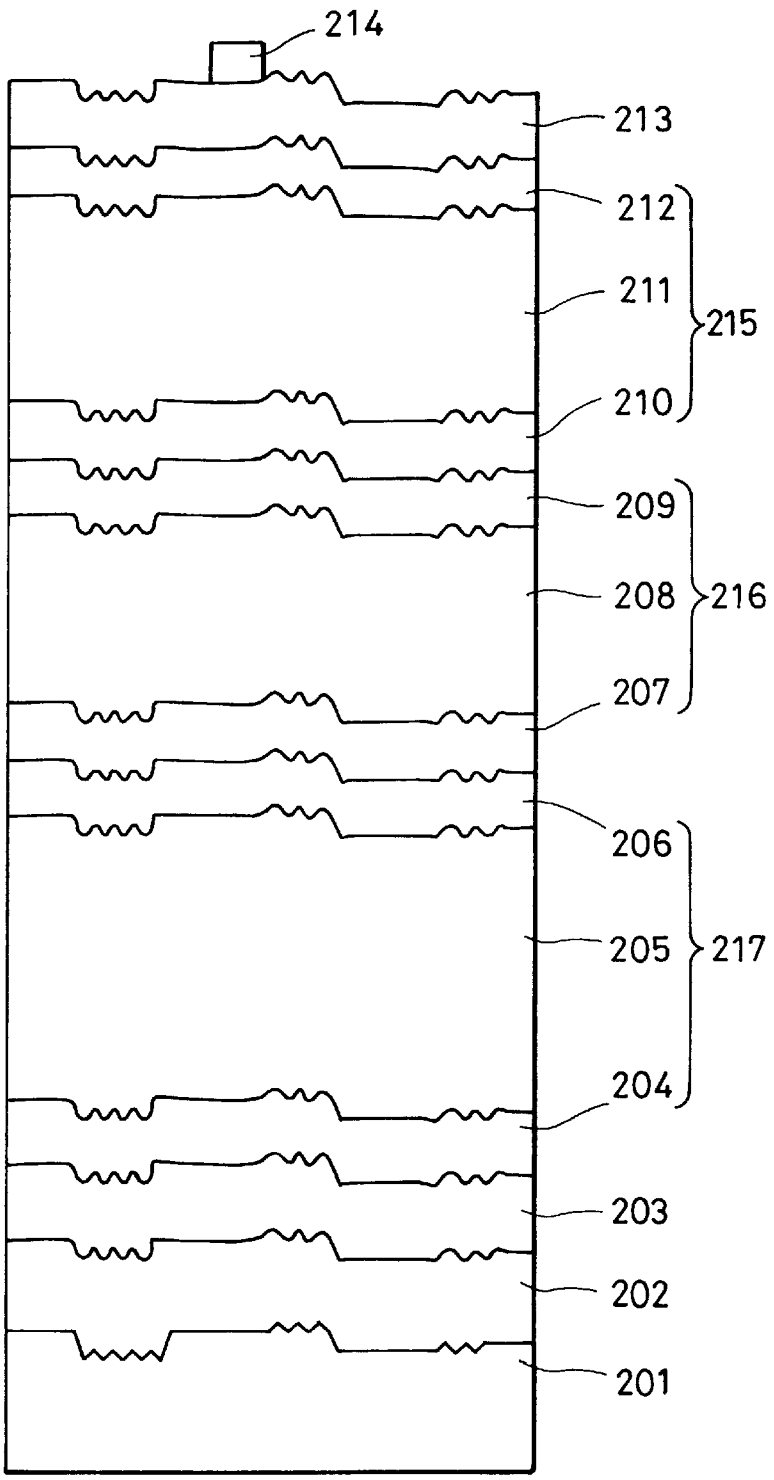

FIGS. 1B and 2B show photovoltaic devices in accordance with the second aspect of the invention incorporating a second form of the substrate. In each of the substrates 101 and 201 shown in these Figures, individual grains of the polycrystal exposed in the substrate surface have different degrees of roughness. More specifically, polycrystal grains having grain surfaces with rough surfaces and polycrystal grains having grain surfaces with smooth surfaces are present in the substrate surface.

A too small difference or variation of the surface roughness between individual polycrystal grains exposed in the substrate surface indicates either that the entire substrate surface is smooth or that the so-called texture structure is developed over the entire surface of the substrate. It has been found that, in either of these two cases, the deficiencies of the known art such as a reduction in the light scattering or increase in the leak current in the photovoltaic device becomes notable. It has also been discovered that, when the difference or variation in the degree of smoothness between the individual grains of polycrystal exposed in the substrate surface is too large, the nature of the substrate surface resembles that of the conventional texture structure due to presence of polycrystal grains having large roughness, leading to the problems such as shunting in the photovoltaic device, increase in the leak current and reduction both in the open circuit voltage Voc and the fill factor FF.

Therefore, the difference in the degree of surface roughness between the individual polycrystal grains exposed in the substrate surface preferably ranges from 0.01 $\mu$m to 1.5 $\mu$m, more preferably from 0.02 $\mu$m to 1 $\mu$m and most preferably from 0.05 $\mu$m to 0.7 $\mu$m, in terms of the difference in Rmax.

A too small mean grain size of the polycrystal, e.g., below 0.1 μm, provides either a smooth surface over the entire area of the substrate or the so-called texture structure developed over the entire surface of the substrate, leading to the deficiencies such as increase in the leak current, shunting of the photovoltaic device, and reduction both in the open circuit voltage Voc and the fill factor FF which are encountered with the conventional devices. It has been found also that a too large mean grain size of the polycrystal grains, e.g., above 2 mm, decreases the random reflection at the back side of the photovoltaic device, with the result that the short-circuit current Jsc decreases.

Therefore, the mean grain size of the polycrystal preferably ranges from 0.1 μm to 2 mm, more preferably from 0.2 μm to 1 mm and most preferably from 0.5 μm to 100 μm.

The material of the substrate may be electrically conductive or electrically insulating. The material also may be light transmissive or non-transmissive. It is, however, preferred that the substrate has a required level of mechanical strength, with small distortion and strain. More practically, the substrate material may be a polycrystalline material in the form of a sheet of metal such as Fe, Ni, Cr, Al, Mo, Au, Nb, Ta, V, Ti, Pt, Pb or the like, an alloy of one of these metals, e.g., brass, stainless steel or the like, a composite material of such sheets, or an insulating polycrystalline material containing $SiO_2$, $Si_3N_4$, $Al_2O_3$ or AlN. When the substrate is made of an electrically conductive material such as a metal, the substrate itself may constitute an electrode through which electrical current is served. When the substrate is made of an electrically insulating material, a later-mentioned metallic back-side reflection layer plays the role of a back-side electrode. If such an insulating substrate is light transmissive, a later-mentioned transparent electrode is formed on the substrate, so as to serve as a current output electrode. Even when the substrate is made of an electrically conductive material such as a metal, a back-side reflection layer of a different metal may be provided on the same side of the substrate as the film deposited on the substrate, for the purpose of enhancing reflectance of the substrate surface for long-wavelength light rays and preventing mutual diffusion of the elements between the substrate material and the deposition film.

The substrate can have a variety of forms depending on uses, such as a tabular form, an elongated belt-like form, cylindrical form an so forth. The thickness of the substrate is determined depending on the photovoltaic device to be obtained. When the photovoltaic device is required to be flexible, the thickness can be minimized as possible, unless such thinning does not impair the function of the substrate. In general, however, the substrate thickness is determined to be not less than 10 μm, from the requirements in regard to production and handling, as well as mechanical strength.

(Methods of surface treatment of substrate)

Different method are usable for obtaining polycrystalline substrate having the features of the present invention, depending on the material of the substrate. For instance, the substrate of the photovoltaic device of the present invention can be obtained through an anisotropic etching which provides different etch rates in accordance with the crystal face orientation and which is executed physically or chemically in gaseous phase or liquid phase.

More specifically, when the etching is conducted in the gaseous phase, techniques such as gas etching, plasma etching and ion etching can be used suitably. One of the following gases or a mixture thereof may be used as the etching gas: $CF_4$, $C_2F_6$, $C_3F_8$, $C_4F_{10}$, $CHF_3$, $CH_2F_2$, $Cl_2$, $ClF_3$, $CCl_4$, $CCl_2F_2$, $CClF_3$, $CHClF_2$, $C_2Cl_2F_4$, $BCL_3$, $PCl_3$, $CBrF_3$, $SF_6$, $SiF_4$, $SiCl_4$, HF, $O_2$, $N_2$, $H_2$, He, Ne, Ar, Xe or the like. When plasma etching is adopted, the gas pressure preferably ranges from $10^{-3}$ Torr to 1 Torr. A D.C. power, an A.C. power, an RF power of 1 to 100 MHz or microwave of 0.1 to 10 GHz can suitably be used as the source of energy for generating the plasma.

When the etching is conducted in a liquid phase, one of the following acids, with or without dilution by water, or a mixture of the acids may be used as the etchant: sulfuric acid, hydrochloric acid, nitric acid, phosphoric acid, hydrofluoric acid, chromic acid, sulfamic acid, oxalic acid, tartaric acid, citric acid, formic acid, lactic acid, glycolic acid, acetic acid, gluconic acid, succinic acid, malic acid or the like. Examples of alkali usable as the etchant include the following alkalis, with or without dilution by water, and mixture of such alkalis: caustic soda, ammonium hydroxide, potassium hydroxide, sodium carbonate, sodium bicarbonate, sodium sesquicarbonate, monobasic sodium phosphate, dibasic sodium phosphate, tribasic sodium phosphate, sodium pyrophosphate, sodium tripolyphosphate, sodium tetrapolyphosphate, sodium trimetaphosphate, sodium tetrametaphosphate, sodium hexametaphosphate, sodium orthosilicate, sodium metasilicate or the like. When etching is executed in liquid phase using such an etching liquid, the etching liquid may be heated. It is also possible to supply an energy by, for example, applying supersonic wave so as to accelerate the etching.

Preferred etching conditions widely vary depending on factors such as the kind of the polycrystalline material, surface nature to be obtained, and so forth. In general, however, the following conditions are preferably adopted in case of a ferrite stainless steel SUS 430-2B and SUS 430-BA with a 0.15 mm thick which has undergone 2B and BA treatment.

A description will be given first of the conditions for etching conducted on SUS 430-2B stainless steel material in a gaseous phase for the purpose of obtaining the first form of the substrate, wherein the polycrystal grains exposed on the surface of said substrate have smooth surfaces, and wherein the surface of said substrate has a step along the polycrystal grain boundaries, or a protrusion or a recess at the polycrystalline grain boundaries. In a preferred etching method, 10 sheets of 47 mm square SUS 430-2B stainless steel, as the substrate blanks, are set on a substrate holder of a sputtering apparatus which is supplied with Ar gas at a rate of 5 to 100 sccm. The gas pressure is maintained at a level of from 1 to 20 mTorr, while a 13.56 MHz RF power of 200 W to 500 W is applied to the substrate material so as to generate an Ar plasma. The treatment by the Ar plasma is continued for 5 to 40 minutes, whereby the surfaces of the substrate blanks are etched. The etching in gaseous phase may be executed by employing a different etching gas, and the plasma may be generated by energy supplied by a different source such as D.C. power or a microwave. Obviously, optimum etching conditions vary when such different etching gas or different energy source is used.

Etching of the SUS 430-2B stainless steel in a liquid phase is preferably conducted under the following conditions. An etching liquid is prepared by mixing hydrofluoric acid, nitric acid, water and acetic acid at a ratio of 1:3:3:50. The etching is conducted by using this etching liquid for a period of from 5 minutes to 60 minutes, while agitating the liquid. Obviously, other types of etching liquids may be used, such as a mixture of hydrofluoric acid, nitric acid and water, or a mixture of hydrochloric acid, nitric acid and water. Preferred etching time varies depending on the type of the etching liquid and the mixing ratio. When an acidic liquid or alkali liquid has a strong etching effect, it is preferred that the liquid is diluted at a high dilution and that a short etching time is set.

A description will now be given of the conditions for etching conducted in a gaseous phase for the purpose of obtaining the second form of the substrate, wherein polycrystal grains having rough surfaces and polycrystal grains having smooth surfaces exist in the surface of the substrate. In a preferred etching method, 10 sheets of 47 mm square SUS 430-BA stainless steel, as the substrate blanks, are set on a substrate holder of a sputtering apparatus. Ar gas is supplied at a rate of 10 to 150 sccm. The gas pressure is maintained at a level of from 2 to 30 mTorr, while a 13.56 MHz RF power of 100 W to 400 W is applied to the substrate material so as to generate an Ar plasma. The treatment by the Ar plasma is continued for 5 to 30 minutes, whereby the surfaces of the substrate blanks are etched. The etching in gaseous phase may be executed by employing a different etching gas, and the plasma may be generated by energy supplied by a different source such as D.C. power or a microwave. Obviously, different etching conditions are applied when such different etching gas or different energy source is used.

Etching of the SUS 430-BA stainless steel in a liquid phase is preferably conducted under the following conditions. An etching liquid is prepared by mixing hydrofluoric acid, nitric acid and water at a ratio of 1:3:200. The etching is conducted by using this etching liquid for a period of from 1 minute to 20 minutes, while agitating the liquid. Obviously, other types of etching liquids may be used, such as a mixture of hydrofluoric acid, nitric acid, acetic acid and water, or a mixture of chloric acid, nitric acid and water. Preferred etching time varies depending on the type of the etching liquid and the mixing ratio. When an acidic liquid or alkali liquid has a strong etching effect, it is preferred that the liquid is diluted at a high dilution and that a short etching time is set.

The etching condition also should vary depending on the degree of finish of the substrate blank surface, regardless of whether the etching is conducted in gaseous or liquid phase. More specifically, when the degree of finish of the substrate blank surface has been increased, e.g., towards mirror-finish, the etching conditions should be determined to provide stronger etching effect. For instance, when the surface of the aforesaid SUS 430 stainless steel has been mirror-finished, it is preferred that stronger etching condition than that described before is employed. Preferred etching condition also varies, even if the substrate material is a stainless steel, if the stainless steel has a slightly different composition as is the case of a martensitic stainless steel and austenitic stainless steel. For instance, it is preferred that etching condition stronger than that applied to the aforesaid SUS 430 stainless steel is applied when an austenitic stainless steel SUS 304 is used. When the etching is conducted in a liquid phase, it is preferred that a stronger etching condition is applied when the substrate blank has a greater thickness, even if the substrate is made of the same material, e.g., SUS 430-2B, and has the same degree of finish of the surface.

(Polycrystalline thin film)

The polycrystalline thin film used in the present invention is a layer which is interposed between the substrate 101 and the semiconductor layer 104. Thus, the polycrystalline thin film includes the metallic back-side reflection layer 102, the transparent conductive layer 103 or another layer which is not shown. The polycrystalline thin film used in the present invention features specific crystalline state and surface nature.

Figure 1C:
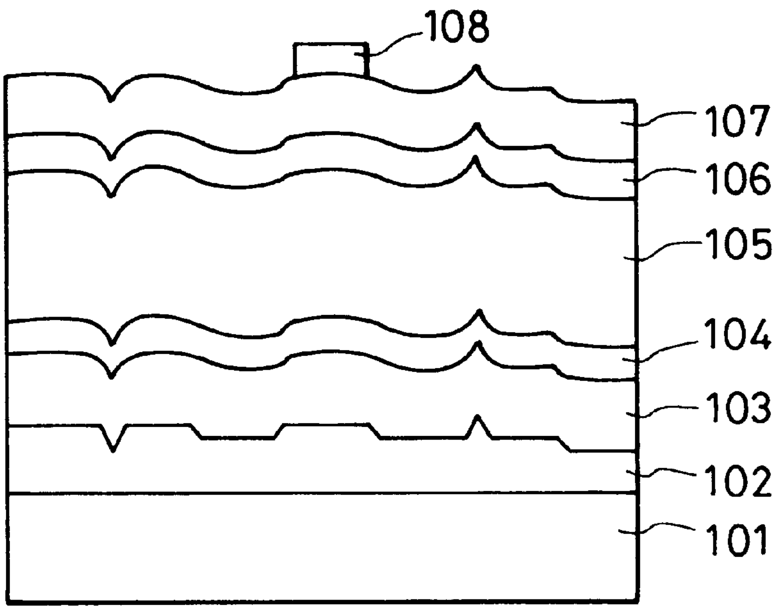
Figure 2C:
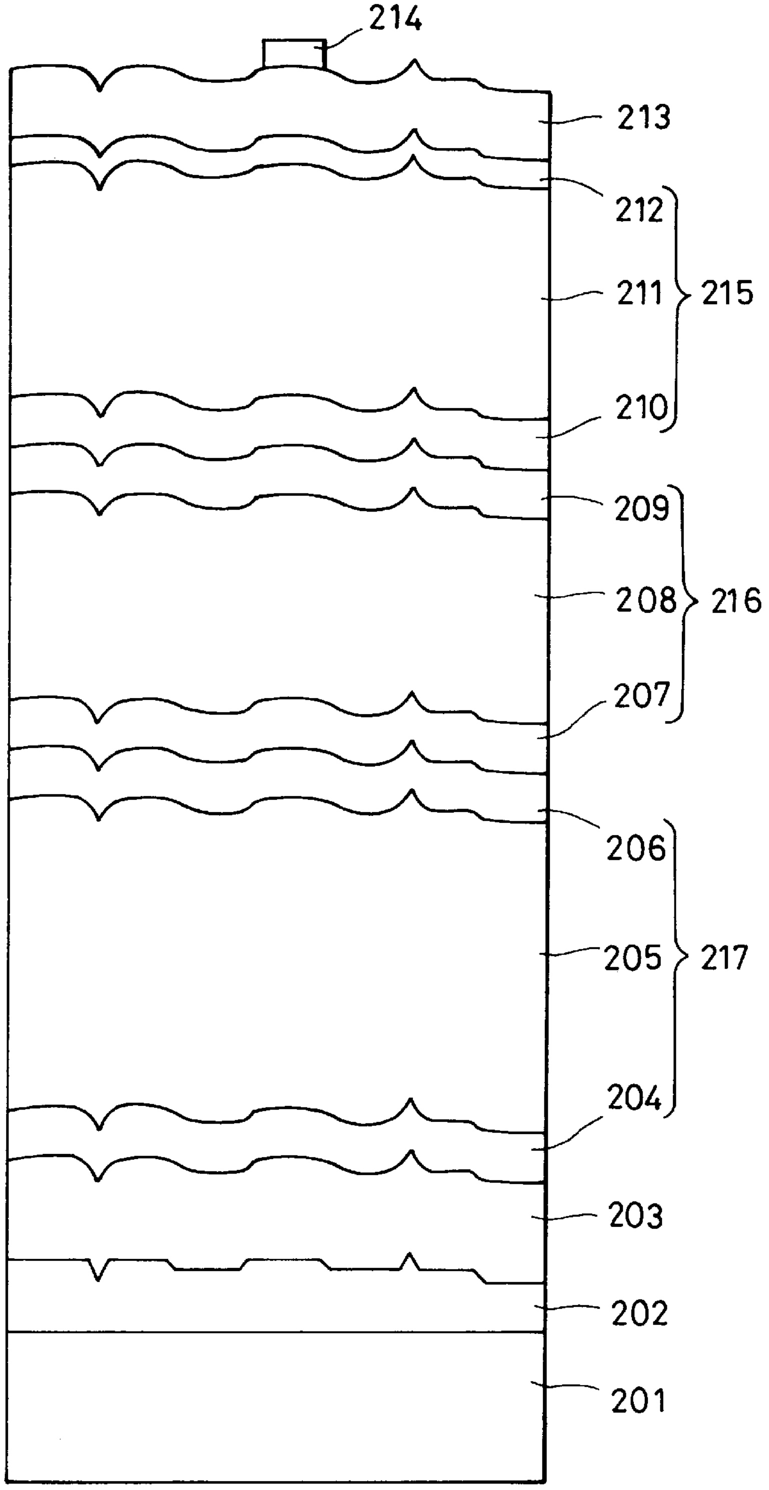

In the photovoltaic device of the third aspect of the present invention, the surfaces of individual polycrystal grains of the polycrystalline thin film are substantially smooth, and the surface of the polycrystalline thin film has a step along the polycrystal grain boundary, or a protrusion or recess at the grain boundary. FIGS. 1C and 2C show photovoltaic devices of the third aspect, in each of which the polycrystalline thin film is used as a metallic back-side reflection layer 102, 202.

It has been found that a too small height of the step or protrusion or recess along the polycrystal grain boundary serves to reduce the scattering of light, thus undesirably leading to a reduction in the short-circuit current Jsc, whereas a too large height causes a leak current of the photovoltaic device to increase, resulting in a reduction of the production yield.

The inventors found that the height or depth of the step along the polycrystal grain boundary or protrusion or recess at the polycrystal grain boundary preferably ranges from 0.01 μm to 2 μm, more preferably from 0.02 μm to 1.5 μm, and most preferably from 0.03 μm to 1 μm. It has also been found that the degree of roughness of the surfaces of the independent polycrystal grains exposed in the substrate surface in terms of Rmax is preferably smaller than the height of the step or protrusion or recess along the polycrystal grain boundary. A large Rmax of the crystal grain surface provides a surface nature similar to that of the conventional texture structure, resulting in deficiencies encountered with the conventional texture structure, such as an increase in the leak current, shunting of photovoltaic device, and reduction both in the open circuit voltage Voc and the fill factor FF. Thus, the preferred range of the degree of roughness in individual grains vary depending on the height of the step of protrusion or recess along the polycrystal grain boundary. The roughness is, however, preferably not greater than 2 μm, more preferably not greater than 1 μm and most preferably not greater than 0.5 μm, in terms of Rmax.

A too small mean grain size of the polycrystal, e.g., below 0.1 μm, decreases the pitch or spacing of the steps or protrusions or recesses, so that a surface nature becomes similar to that of the conventional texture structure composed of pyramidal shapes, leading to the deficiencies such as increase in the leak current, shunting of the photovoltaic device, and reduction both in the open circuit voltage Voc and the fill factor FF which are encountered with the conventional devices. It has been found also that a too large mean grain size of the polycrystal grains, e.g., above 2 mm, decreases the random reflection at the back side of the photovoltaic device, with the result that the short-circuit current Jsc is decreased.

Therefore, the mean grain size of the polycrystal preferably ranges from 0.1 μm to 2 mm, more preferably from 0.2 μm to 1 mm and most preferably from 0.5 μm to 100 μm.

Figure 1D:
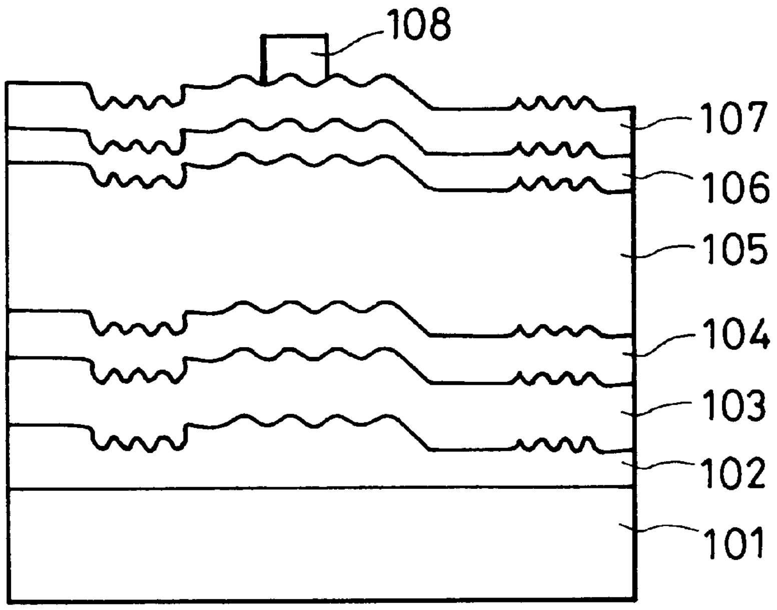
Figure 2D:
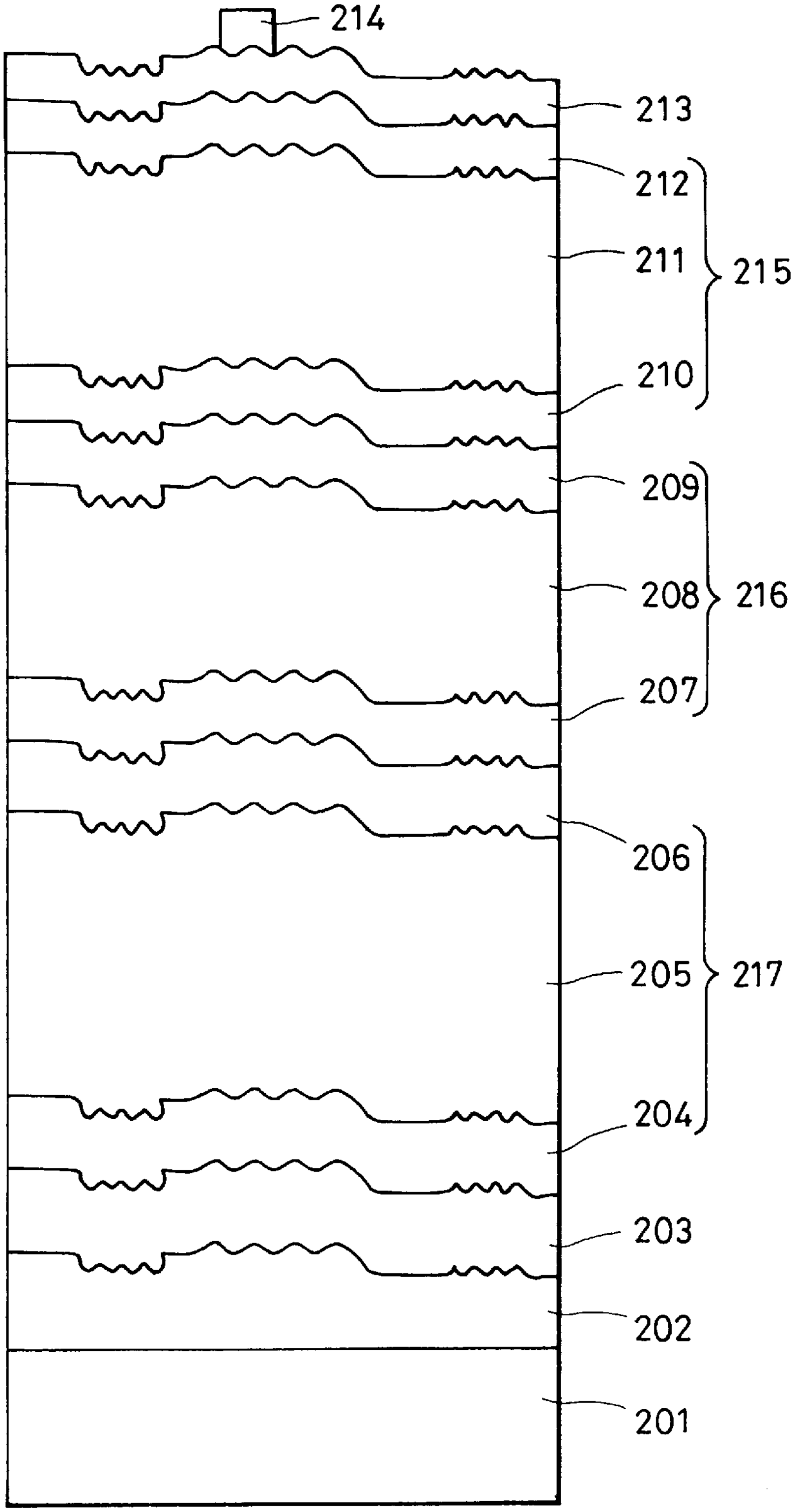

In the photovoltaic device in accordance with the fourth aspect, the degree of surface roughness vary according to individual grains of the polycrystal, and polycrystal grains having rough surfaces and polycrystal grains having smooth surfaces exist in the surface of the polycrystalline thin film. FIGS. 1D and 2D show photovoltaic devices in each of which the polycrystalline thin film is used as a metallic back-side reflection layer 102, 202.

An excessively small difference or variation of the surface roughness between individual polycrystal grains exposed in the surface of the metallic back-side reflection layer indicates either that the entire substrate surface is smooth or that the so-called texture structure is developed over the entire surface of the substrate. It has been found that, in either of these two cases, the deficiencies of the known art such as a reduction in the light scattering or increase in the leak current in the photovoltaic device becomes notable. It has also been discovered that, when the difference or variation in the degree of roughness between the individual grains of polycrystal exposed in the surface of the metallic back-side reflection layer is too large, the nature of the surface resembles that of the conventional texture structure due to presence of polycrystal grains having large roughness, leading to the problems such as shunting in the photovoltaic device, increase in the leak current and reduction both in the open circuit voltage Voc and the fill factor FF.

Therefore, the difference in the degree of surface roughness between the individual polycrystal grains exposed in the surface of the metallic back-side reflection layer preferably ranges from 0.01 $\mu$m to 1.5 $\mu$m, more preferably from 0.02 $\mu$m to 1 $\mu$m and most preferably from 0.05 $\mu$m to 0.7 $\mu$m, in terms of the difference in Rmax.

An excessively small mean grain size of the polycrystal, e.g., below 0.1 $\mu$m, provides either a smooth surface over the entire area of the metallic back-side reflection layer or the so-called texture structure developed over the entire surface of the same, leading to the deficiencies such as increase in the leak current, shunting of the photovoltaic device, and reduction both in the open circuit voltage Voc and the fill factor FF which are encountered with the conventional devices. It has been found also that an excessively large mean grain size of the polycrystal grains, e.g., above 2 mm, decreases the random reflection at the back side of the photovoltaic device, with the result that the short-circuit current Jsc decreases.

Therefore, the mean grain size of the polycrystal preferably ranges from 0.1 $\mu$m to 2 mm, more preferably from 0.2 $\mu$m to 1 mm and most preferably from 0.5 $\mu$m to 100 $\mu$m.

The material of the polycrystalline thin film may be electrically conductive or electrically insulating. The material also may be light transmissive or non-transmissive. It is, however, preferred that the substrate has a required level of mechanical strength, with small distortion and strain. More practically, the substrate material may be a polycrystalline material in the form of a sheet of metal such as Fe, Ni, Cr, Al, Mg, Mo, Au, Nb, Ta, V, Ti, Pt, Pb or the like, an alloy of one of these metals, e.g., brass, stainless steel or the like, a composite material of such sheets, or an insulating polycrystalline material containing $SiO_2$, $Si_3N_4$, $Al_2O_3$ or AlN. It is also possible to use, as is the case of the transparent conductive film which will be described later, a conductive oxide such as $In_2O_3$, $SnO_2$, ITO ($In_2O_3$+$SnO_2$), ZnO, CdO, $Cd_2SnO_4$, $TiO_2$, $Ta_2O_5$, $Bi_2O_3$, $MoO_3$, $Na_xWO_3$ or the like, as well as a mixture of such oxides, with or without addition of a dopant.

When the polycrystalline thin film is made of an electrically conductive material such as a metal, the film itself may constitute an electrode through which electrical current is served. When the polycrystalline thin film is made of an electrically insulating material, a conductive thin film is laminated thereon, so as to serve as a current output electrode. Even when the substrate is made of an electrically conductive material such as a metal, the polycrystalline thin film may be constructed as a laminate film composed of two or more thin films, for the purpose of enhancing reflectance of the substrate surface for long-wavelength light rays and preventing mutual diffusion of the elements between the polycrystalline thin film and the semiconductor layer.

When the photovoltaic device is so constructed that the light is incident to the semiconductor layer from the side opposite to the substrate, the polycrystalline thin film which forms one of the features of the present invention is disposed on the back side of the semiconductor layer as viewed in the direction of the incident light. Thus, the polycrystalline thin film plays a role of the metallic back-side reflection layer 102, 202 for reflecting the light rays which have not been absorbed by the semiconductor layer back to the same semiconductor layer, and also the role of a back-side electrode of the photovoltaic device. In such a case, metals having high reflectivity, such as aluminum, magnesium, copper, silver, gold or the like, among those listed before, are preferably used as the material of the polycrystalline thin film. The use of the metallic material having high reflectivity permits the light rays to be reflected back to the semiconductor layers at a high rate, so that the length of light paths in the semiconductor layer is increased to enhance light absorption by the semiconductor layer, thus offering an increase in the short-circuit current Jsc of the photovoltaic device.

When a transparent conductive oxide (TCO) is used as the material of the polycrystalline thin film in the present invention, the resultant thin film can play also the role of a transparent conductive layer 103.

Various film-forming techniques can be employed for the purpose of forming the polycrystalline thin film. For instance, a CVD technique such as a microwave plasma CVD, RF plasma CVD, Photo-CVD, thermal CVD, MOCVD or the like may be conveniently used as well as an evaporation deposition technique such as EB deposition, sputter deposition, MBE, ion plating and ion beam deposition. It is also possible to use a plating technique, a printing technique or the like, for the purpose of forming the polycrystalline thin film. The following surface treating methods can be employed for treating the surface of the polycrystalline thin film so as to obtain the surface nature specified by the present invention.

(Method of treating surface of polycrystalline thin film)

A polycrystalline thin film which meets the requirements of the present invention can be obtained by effecting, on a metallic, insulating or conductive oxide film deposited by the described technique, an etching in a gaseous or a liquid phase under conditions similar to those described before in connection with the substrate surface. Preferred etching conditions widely vary depending on factors such as the kind of the polycrystalline material, surface nature to be obtained, and so forth. In general, however, the following conditions are preferably adopted in case that the polycrystalline thin film is the aluminum alloy deposited on a ferrite stainless steel SUS 430-BA which has undergone a 0.2 mm thick bright annealing treatment.

A description will be given of the conditions for etching conducted on the aluminum alloy material in a gaseous phase for the purpose of obtaining a polycrystalline thin film to be used in the photovoltaic device of the third aspect of the present invention, wherein the polycrystal grains exposed on the surface of the polycrystalline thin film have smooth surfaces, and wherein the surface of the polycrystalline has a step along the polycrystal grain boundaries, or a protrusion or a recess at the polycrystalline grain boundaries. In a preferred etching method, 10 sheets of 47 mm square SUS 430-BA stainless steel of 0.15 mm thick, each sheet having thereon an aluminum silicon thin film containing 1% of silicon formed thereon to a thickness of 0.5 $\mu$m, are set on a substrate holder of a sputtering apparatus. Ar gas is supplied at a rate of 15 to 150 sccm. The gas pressure is maintained at a level of from 3 to 50 mTorr, while a 13.56 MHz RF power of 100 W to 400 W is applied to the substrate material so as to generate an Ar plasma. The treatment by the Ar plasma is continued for 5 to 40 minutes, whereby the surfaces of the of the aluminum thin films are etched. The etching in gaseous phase may be executed by employing a different etching gas, and the plasma may be generated by energy supplied by a different source such as D.C. power or a microwave. Obviously, optimum etching conditions vary when such different etching gas or different energy source is used.

Etching of the aluminum thin films in a liquid phase is preferably conducted under the following conditions. An etching liquid is prepared by mixing phosphoric acid, nitric acid and water at a ratio of 3:1:10. The etching is conducted by using this etching liquid for a period of from 0.5 minute to 10 minutes, while agitating the liquid. Obviously, other types of etching liquids may be used, such as a mixture of hydrofluoric acid, nitric acid, acetic acid and water. Preferred etching time varies depending on the type of the etching liquid and the mixing ratio. When an acidic liquid or alkali liquid has a strong etching effect on the polycrystalline thin film, it is preferred that the liquid is diluted at a high dilution and that a short etching time is set.

A description will now be given of the conditions for etching conducted in a gaseous phase for the purpose of obtaining the polycrystalline thin film to be used in the fourth aspect of the present invention, wherein polycrystal grains having rough surfaces and polycrystal grains having smooth surfaces exist in the surface of the polycrystalline thin film. In a preferred etching method, 10 sheets of 47 mm square SUS 430-BA stainless steel, each having deposited thereon an aluminum thin film of 0.4 μm, are set on a substrate holder of a sputtering apparatus. Ar gas is supplied at a rate of 20 to 150 sccm. The gas pressure is maintained at a level of from 4 to 100 mTorr, while a 13.56 MHz RF power of 100 W to 400 W is applied to the substrate material so as to generate an Ar plasma. The treatment by the Ar plasma is continued for 2 to 20 minutes, whereby the surfaces of the aluminum thin films are etched. The etching in gaseous phase may be executed by employing a different etching gas, and the plasma may be generated by energy supplied by a different source such as D.C. power or a microwave. Obviously, different etching conditions are applied when such different etching gas or different energy source is used.

Etching of the aluminum thin film in a liquid phase is preferably conducted under the following conditions. An etching liquid is prepared by mixing phosphoric acid, nitric acid and water at a ratio of 3:1:20. The etching is conducted by using this etching liquid for a period of from 0.2 minute to 5 minutes, while agitating the liquid. Obviously, other types of etching liquids may be used, such as a mixture of hydrofluoric acid, nitric acid, acetic acid and water. Preferred etching time varies depending on the type of the etching liquid and the mixing ratio. When an acidic liquid or alkali liquid has a strong etching effect on the polycrystalline thin film material, it is preferred that the liquid is diluted at a high dilution and that a short etching time is set.

A description will now be given of the metallic back-side reflection layer 102, 202 and the transparent conductive layer 103, 203 which can be made up from the polycrystalline thin film which is one of the features of the present invention.

(Metallic back-side reflection layer)

The metallic back-side reflection layer 102, 202 used in the present invention is provided on the back side of the semiconductor layer as viewed in the direction of the incident light, and serves as a light reflecting layer which reflects light rays which have not been absorbed in the semiconductor layer back to the same semiconductor layer for further absorption. The metallic back-side reflection layer serves also as a back-side electrode of the photovoltaic device. Thus, the metallic back-side reflection layer is disposed at a position indicated by 102 in FIG. 1 or, when the substrate 101 is light-transmissive and the light is incident from the same side as the substrate, laminated on the semiconductor layer with a transparent conductive layer interposed therebetween. Examples of the materials of the metallic back-side reflection layer include metals such as gold, silver, copper, aluminum, magnesium, nickel, iron, chromium, molybdenum, tungsten, titanium, cobalt, tantalum, niobium, zirconium and the like, as well as alloys such as stainless steels. Among these metals are preferably used those having high levels of reflectivity such as aluminum, magnesium, copper, silver and gold. When a metal having a high reflectivity is used, the light rays which have not been absorbed in the semiconductor layer are reflected back to the same semiconductor layer at a greater rate, so that the lengths of light paths in the semiconductor layer are extended to enhance absorption of light by the semiconductor layer, thus providing an increased short-circuit current Jsc of the photovoltaic device.

The surface of the metallic back-side reflection layer may be smooth when the substrate used in the first or second aspect as described before is used. It is, however, preferred that the surface of the metallic back-side reflection layer has a step, protrusion or recess corresponding to the polycrystal grain boundaries of the substrate which were described before. The metallic back-side reflection layer, provided with such step, protrusion or recess, offers a greater adhesion between the metallic back-side reflection layer and the transparent conductive layer, contributing to a further increase of the flexibility, as well as controllability, of the production process, and also to a further increase of the production yield, while achieving greater weather resistance and durability. At the same time, crystal grain orientation of the transparent conductive is further improved, with the result that the mean polycrystal grain size of the transparent conductive layer is further increased, suppressing variation of the grain size. Consequently, the series resistance of the photovoltaic device is reduced, while the fill factor FF is increased and, at the same time, the short-circuit current is further increased due to enhanced scattering of the light at the interface between the metallic back-side reflection layer and the transparent conductive layer.

When the film thickness of the metallic back-side reflection layer is small, e.g., 0.1 μm or less, the surface nature of the polycrystalline substrate having steps or protrusions or recesses along the grain boundaries is followed to appear on the surface of the metallic back-side reflection layer. Conversely, when the film thickness of the metallic back-side reflection layer is large, e.g., 1 μm or greater, the surface nature of the substrate does not appear: namely, the metallic back-side reflection layer presents a smooth surface.

In the photovoltaic device of each of the third and fourth aspects which employs the metallic back-side reflection layer 102, 202 constituted by the polycrystalline thin film as specified before, the substrate 101, 201 may have a smooth surface or a surface having slight roughness.

The metallic back-side reflection layer can suitably be formed by an evaporation deposition technique such as EB evaporation and sputtering, a CVD process, plating or printing.

(Transparent conductive layer)

The transparent conductive layer 103 is used in the present invention mainly for the following purposes, and is interposed between the metallic back-side reflection layer 102 and the semiconductor layer 104. Namely, the transparent conductive layer is intended to enhance the random reflection at the back side of the photovoltaic device and to confine the light in the photovoltaic device by a multi-interference effect provided by the thin film, thus extending the lengths of optical paths in the semiconductor layer, thereby increasing the short-circuit current Jsc. In addition, the transparent conductive layer is intended to prevent shunting of the photovoltaic device attributable to diffusion or migration into the semiconductor layer of the metal constituting the metallic back-side reflection layer serving also as the back-side electrode. It is also intended that a certain slight level of electrical resistance posed by the transparent conductive layer prevents any short-circuiting between the metallic back-side reflection layer 102 and the transparent electrode 107 through any defect such as a pin-hole which may exists in the semiconductor layer interposed between the metallic back-side reflection layer 102 and the transparent electrode 107.

The transparent conductive layer 103 is required to have a high light transmission at the wavelength region absorbable by the semiconductor layer and a moderate level of electrical resistivity. Preferably, the transmissivity at wavelength region of 650 nm or greater is not less than 80%, more preferably not less than 85% and most preferably not less than 90%. The resistivity preferably is not less than $1\times10^{-4}$ Ωcm but not more than $1\times10^{6}$ Ωcm, and more preferably not less than $1\times10^{-2}$ Ωcm but not more than $5\times10^{4}$ Ωcm.

As the material of the transparent conductive layer 103, suitably used are a conductive oxide such as $In_2O_3$, $SnO_2$, ITO($In_2O_3$+$SnO_2$), ZnO, CdO, $Cd_2SnO_4$, $TiO_2$, $Ta_2O_5$, $Bi_2O_3$, $MoO_3$, $Na_xWO_3$ or the like, as well as a mixture of such oxides. The compound used as the material of the transparent conductive layer 103 may be doped with an element (dopant) which controls the conductivity.

When the material of the transparent conductive layer is ZnO, the dopant for controlling the conductivity may be one of Al, In, B, Ga, Si, F or the like, whereas, when $In_2O_3$ is used as the material of the transparent conductive layer, Sn, F, Te, Ti, Sb, Pb or the like can be used as the dopant. For the transparent conductive layer made of $SnO_2$, an element such as F, Sb, P, As, In, Tl, Te, W, Cl, Br, I or the like is suitably used as the dopant.

The transparent conductive layer 103 can be formed by any suitable technique such as an evaporation deposition, e.g., EB evaporation or sputtering, a CVD process, spraying method, spin-off process, dipping, and so forth.

The surface of the transparent conductive layer 103 may be smooth when the substrate used in the first or second aspect as described before is used. It is, however, preferred that the surface of the transparent conductive layer 103 has a step, protrusion or recess corresponding to the polycrystal grain boundaries of the substrate which were described before. The transparent conductive layer, provided with such step, protrusion or recess, offers a greater adhesion between the transparent conductive layer and the semiconductor layer, contributing to a further increase of the degree of freedom, as well as controllability, of the production process, and also to a further increase of the production yield, while achieving greater weather resistance and durability. At the same time, scattering of light is enhanced at the interface between the transparent conductive layer and the semiconductor layer, with the result that the short-circuit current Jsc is further increased. The height or depth of the step, protrusion or recess in the surface of the transparent conductive layer 103 along the polycrystal grain boundaries preferably ranges from 0.01 μm to 2 μm, more preferably from 0.02 μm to 1.5 μm and most preferably from 0.03 μm to 1 μm.

In the photovoltaic device of each of the third and fourth aspects which employs the transparent conductive layer 103, 203 constituted by the polycrystalline thin film as specified before, the substrate 101, 201 may have a smooth surface or a surface having slight roughness.

Growth of the polycrystal of the transparent conductive layer may cause slight texture to appear on the surface of the transparent conductive layer, corresponding to the growth surface. In addition, the polycrystalline thin film as the transparent conductive layer may have steps, protrusions or recesses corresponding to the polycrystal grain boundaries of the substrate. Such steps, protrusions and recesses serve to increase the mean grain size of the polycrystal of the transparent conductive layer, which in turn enhances scattering of light, achieving a further increase in the short-circuit current Jsc of the photovoltaic device.

(Semiconductor layer)

Examples of the material of each of the semiconductor layers 104 to 106 used in the present invention includes Group IV elements such as Si, C, Ge and the like, Group IV element alloys such as SiGe, SiC, SiSn and the like, Group II-VI elements such as CdS, CdTe and the like, and Groups I-III-VI elements such as $CuInSe_2$, $Cu(InGa)Se_2$, $CuInS_2$ and the like.

Among these semiconductor materials, particularly suitably used in the photovoltaic device of the present invention are amorphous semiconductor materials of Group IV elements and amorphous alloy semiconductor materials of the Group VI elements, such as a-Si:H (abbreviation of hydrogenated amorphous silicon), a-Si:F, a-Si:H:F, a-SiGe: H, a-SiGe:F, a-SiGe:H:F, a-SiC:H, a-SiC:F, a-SiC:H:F and so forth, as well as micro-crystalline semiconductor materials and polycrystalline semiconductor materials.

The semiconductor layer may undergo a valence control and a forbidden band width control. Practically, such controls may be performed by introducing into the film forming space a material compound containing an element which functions as a valence controller or a forbidden band width controller. Such a material compound may be introduced independently or by being diluted with the material gas of the deposition film or with the diluting gas.

The semiconductor layer is at least partially doped to p-type or n-type as a result of the valence control, thus forming at least one pin junction. A stack cell is formed by stacking a plurality of such pin junctions.

Various methods and techniques are available for use in the formation of the semiconductor layer, such as CVD processes including a microwave plasma CVD, RF plasma CVD, photo-CVD, thermal CVD, MOCVD and so forth, evaporation deposition methods including EB evaporation, MBE, ion plating, ion beam technique and so forth, sputtering, spraying and printing. An industrially adopted method is the plasma CVD process in which the material gases are decomposed by a plasma and deposited on the substrate. The apparatus for use in implementing the reaction may be a batch-type apparatus or a continuous film-forming apparatus which may be selected as desired.

The surface of the semiconductor layer may be smooth. It is, however, preferred that the surface of the semiconductor layer has a certain degree of difference or variation in the smoothness corresponding to the steps, protrusions or recesses along the polycrystal grain boundaries in the substrate or the polycrystalline film. Such a nature of the surface of the semiconductor layer enhances adhesion between the semiconductor layer and the upper layer, so as to increase the flexibility of the production process, as well as controllability, which in turn contributes to a further increase in the yield and further improvement in weather resistance and durability. In addition, scattering of light is enhanced at the interface between the semiconductor layer and the upper layer, achieving a further increase in the short-circuit current Jsc.

A detailed description will now be given of the semiconductor layer made of amorphous semiconductor materials based on the Group IV elements and alloys of Group IV elements.

(1) i-type semiconductor layer (intrinsic semiconductor layer)

The i-type layer used in the pin junction is an important layer which generates and transports carriers in response to irradiating light, particularly in a photovoltaic device made of an amorphous semiconductor material based on a Group IV element or an allow of Group IV element.

The invention does not exclude the use of a slightly-p or slightly-n i-type layer.

As stated before, the non-single-crystal semiconductor material based on a Group IV element or an alloy of a Group IV element contains a hydrogen atom (H, D) or a halogen atom (X) both of which pay important roles.

The hydrogen atom (H, D) or the halogen atom (X) in the i-type layer plays the role of compensating for dangling bond of the i-type layer, so as to improve the product of the carrier mobility and carrier life in the i-type layer. At the same time, the hydrogen atom and the halogen atom serves to compensate for the interface level at the interface between a p-type layer and an i-type layer and at the interface between an n-type layer and an i-type payer, thus effectively contributing to improvement in the photoelectromotive force, photo-current and photo-response of the photovoltaic device. Optimum content of the hydrogen and/or halogen atoms in the i-layer is from 1 to 40 at %. Preferably, these atoms are distributed in such a pattern that the interfaces between the p-type layer and the i-type layer and between the n-type payer and the i-type layer are rich in the hydrogen and/or halogen atoms. It is preferred that the contents of the hydrogen and/or halogen atoms at such interfaces are from 1.1 to 2.0 times as high the hydrogen and/or halogen content of the bulk. It is also preferred that the content of the hydrogen and/or halogen atoms varies in accordance with a change in the silicon atom content.

In the stack-type photovoltaic device, it is preferred that a material having a wide band gap is used as the material of the i-type semiconductor of the pin junction closer to the light incident side while a material having a narrow band gap is used as the material of the i-type layer of the pin junction remoter from the light incident side.

The amorphous silicons and amorphous silicon germaniums are expressed by incorporating the symbols of the elements which compensate for the dangling bonds, as by, for example, a-Si:H, a-Si:F, a-Si:H:F, a-SiFe:H, a-SiGe:F, a-SiGe:H:F and so forth.

Desirable characteristics and properties of the i-type semiconductor layer used in the photovoltaic device of the present invention are as follows: the hydrogen atom content (CH) of from 1.0 to 25.0%, AM of 1.5, photoconductivity (σp) under 100 mW/cm$^2$ pseudo solar irradiation of 1.0×10$^{-7}$ S/cm or greater, dark conductivity (σd) of 1.0×10$^{-9}$ S/cm or less, arback energy as measured by constant photocurrent method (CPM) of 55 mev or less, and local level density of 10$^{17}$/cm$^3$ or less.

(2) p-type semiconductor layer or n-type semiconductor layer

Examples of the amorphous material (headed by "a-") and micro-crystalline material (headed by "μc-") are materials which are obtained by adding, to a high concentration, a p-type valence controller such as one of elements of Group III of the periodic table, e.g., B, Al, Ga, In and Tl or an n-type valence controller such as elements of Group V of the periodic table, e.g., P, As, Sb and Bi into one of the following amorphous or micro-crystal compounds: a-Si:H, a-Si:HX, a-SiC:H, a-SiC:HX, a-SiGe:H, a-SiGe:HX, a-SiGeC:H, a-SiON:H, a-SiON:HX, a-SiO:H, a-SiO:HX, a-SiN:H, a-SiN:HX, a-SiON:H, a-SiON:HX, a-SiOCN:HX, μc-Si:H, μc-Si:HX, μc-SiC:H, μc-SiC:HX, μc-SiO:H, μc-SiO:HX, μc-SiN:H, μc-SiN:HX, μc-SiOCN:H, and μc-SiOCN:HX. Examples of the polycrystalline material (headed by "poly-") are materials which are obtained by adding, to a high concentration, a p-type valence controller such as one of elements of Group III of the periodic table, e.g., B, Al, Ga, In and Tl or an n-type valence controller such as elements of Group V of the periodic table, e.g., P, As, Sb and Bi into one of the following compounds: poly-Si:H, poly-Si:HX, poly-SiC:H, poly-SiC:HX, poly-SiO:H, poly-SiO:HX, poly-SiN:H, poly-SiN:HX, poly-SiGeC:H, poly-SiGeC-HX, poly-SiON:H, poly-SiON:HX, poly-SiOCN:H, poly-SiOCN:HX, poly-Si, poly-SiC, poly-SiO and poly-SiN.

Preferably, a crystalline semiconductor layer which exhibits a small light absorption or an amorphous semiconductor layer having a wide band gap is used as the light-incident side p- or n-type layer.

The amount of addition of the Group III atoms to the p-type layer and the amount of addition of Group V atoms to the n-type layer optimumly ranges from 0.1 at % to 50 at %.

The hydrogen atoms (H, D) or the halogen atoms contained in the p- or n-type layer serves to compensate for dangling bonds in the p- or n-type layer and also serve to improve doping efficiency of the p- or n-type layer. The amount of the hydrogen atoms or halogen atoms added to the p- or n-type layer optimumly ranges from 0.1 at % to 40 at %. In particular, when the p- or n-type layer is a crystalline layer, the amount of the hydrogen or halogen atoms optimumly ranges from 0.1 at % to 8 at %. Preferably, these atoms are distributed in such a pattern that the interfaces between the p-type layer and the i-type layer and between the n-type payer and the i-type layer are rich in the hydrogen and/or halogen atoms. It is preferred that the contents of the hydrogen and/or halogen atoms at such interfaces are from 1.1 to 2.0 times as high the hydrogen and/or halogen content of the bulk. The enrichment of the p-/i-type layer interface and n-/i-type layer interface with hydrogen and/or halogen atoms effectively reduces defect levels in the vicinity of these interfaces, as well as mechanical distortion, thus contributing to the increase of the photoelectromotive force and photo-current of the photovoltaic device in accordance with the present invention.

Regarding the electric characteristics of the p- and n-type layers of the photovoltaic device, the activation energy is preferably 0.2 eV or less and optimumly 0.1 eV or less, while specific resistivity is preferably 100 Ωcm or less and optimumly 1 Ωcm or less. The thickness of the p- and n-type layers preferably ranges from 1 nm to 50 nm, and optimumly from 3 nm to 10 nm.

Examples of the p- or n-type semiconductor layer using the Group II-VI elements are CdS, CdTe, ZnO, ZnSe and so forth, while examples using Group I-III-VI elements are $CuInSe_2$, $Cu(InGa)Se_2$, $CuInS_2$, $CuIn(Se, S)_2$, CuInGaSeTe and so forth.

(Method of forming semiconductor layer)

As stated before, an amorphous semiconductor layer of a Group IV element or an amorphous alloy semiconductor layer based on a Group IV element can suitably constitute the semiconductor layer of the photovoltaic device of the present invention. Such semiconductor layers are preferably formed by an A.C. or an RF plasma CVD process such as RF CVD plasma process or microwave plasma process.

The microwave plasma CVD process employs a deposition chamber (vacuum chamber) which can be evacuated and into which are introduced gases such as material gas and diluting gas. The internal pressure of the chamber is maintained at a constant level by a vacuum pump which draws the gas, while a microwave oscillated by a microwave source is guided by a waveguide tube to the chamber and introduced into the chamber through a dielectric window which may be made of alumina ceramics. The microwave serves to decompose the material gas by generating a plasma, whereby the desired film is deposited on a substrate disposed in the deposition chamber. According to this technique, it is possible to form a deposition film adaptable to the photovoltaic device, under a wide variety of deposition conditions.

When the semiconductor layer in the photovoltaic device of the present invention is formed by the microwave CVD process, the temperature of the substrate in the deposition chamber is preferably maintained at a temperature of from 100° C. to 450° C., while the internal pressure of the chamber is from 0.5 to 30 mTorr. It is also preferred that the microwave power is from 0.01 to 1 W/cm$^3$, while the frequency of the same is preferably from 0.1 to 10 GHz.

When the semiconductor layer is formed by an RF plasma CVD process, the temperature of the substrate in the deposition chamber is preferably maintained at a temperature of from 100° C. to 350° C., while the internal pressure of the chamber is from 0.1 to 10 Torr. It is also preferred that the RF power is from 0.001 to 5.0 W/cm$^3$, while the deposition rate is set to be from 0.1 Å/sec to 30 Å/sec.

A silicon-atom-containing gasifiable compound, a germanium-atom-containing gasifiable compound, a carbon-atom-containing gasifiable compound or a mixture of these gases can suitably be used as the material gas for depositing an amorphous semiconductor layer of Group IV element or alloy of Group IV element which is suitably be used in the photovoltaic device of the present invention.

The silicon-atom-containing gasifiable compound may be a chain or cyclic silane compound. Practical examples of such a compound are gaseous or easily gasifiable compounds such as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, $Si_2Cl_3F_3$ or the like.

Practical examples of the germanium-atom-containing geasifiable compounds are: $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2D_6$ and so forth.

Carbon, oxygen, nitrogen or the like can suitably be used as the element which enlarges the band gap of the i-type semiconductor layer and which is used in the formation of the first p-type semiconductor layer of the photovoltaic device in accordance with the present invention.

Practical example of the carbon-atom-containing gasifiable compound are $CH_4$, $CD_4$, $C_nH_{2n+2}$ (n being an integer), $C_nH_{2n}$, $C_2H_2$, $C_6H_6$, $CO_2$, CO and the like.

The nitrogen-containing gas may be $N_2$, $NH_3$, $ND_3$, NO, $NO_2$, $N_2O$ or the like.

The oxygen-containing gas may be $O_2$, CO, $CO_2$, NO, $NO_2$, $N_2O$, $CH_3CH_2OH$, $CH_3OH$ or the like.

The substance introduced into the p- or n-type layer as the valence controller may be an element of Group III or Group V of the periodic table.

When boron atoms are to be introduced as the Group III element, a hydrogenated boron such as $B_2H_6$, $B_4H_{10}$, $B_5H_9$, $B_5H_{11}$, $B_6H_{10}$, $B_6H_{12}$, $B_6H_{14}$ or the like, as well as a halogenated boron such as $BF_3$, $BCl_3$ or the like, can suitably be used as the starting material. It is also possible to use, as the starting material, $AlCl_3$, $GaCl_3$, $InCl_3$, $TlCl_3$ and so forth. Among these starting materials, most preferably used are $B_2H_6$ and $BF_3$.

When phosphor atoms are to be introduced as the Group V element, a hydrogenated phosphor such as $PH_3$, $P_2H_4$ or the like, as well as a halogenated phosphor such as $PH_4I$, $PF_3$, $PF_5$, $PCl_3$, $PCl_5$, $PBr_3$, $PBr_5$, $PI_3$ or the like, can suitably be used as the starting material. It is also possible to use, as the starting material, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and so forth. Among these starting materials, most preferably used are $PH_3$ and $PF_3$.

The gasifiable compound may be suitably diluted with a gas such as $H_2$, He, Ne, Ar, Xe and Kr, when introduced into the deposition chamber.

In particular, when the layer to be deposited is a microcrystalline or polycrystalline semiconductor or a layer having a small light absorption or a wide band gap such as a-SiC:H, it is preferred that the material gas is diluted by 2 to 100 times with hydrogen gas, and the microwave power or the RF power is set to a comparatively high level.

(Transparent electrode)

The transparent electrode 107 in the photovoltaic device of the present invention serves as a light-incident electrode which transmits light and, at the same time, plays a role of an anti-reflection film when its thickness is properly determined. The transparent electrode 107 is required to have both a high transmissivity in the wavelength region of light rays which can be absorbed by the semiconductor layer and a low electrical resistivity. More practically, the light transmissivity at a wavelength region of 550 nm or greater is preferably 80% or higher, more preferably 85% or higher. The electrical resistivity is preferably not greater than $5\times10^{-3}$ Ωcm, more preferably not greater than $1\times10^{-3}$ Ωcm. Examples of materials suitable for the transparent electrode are conductive oxides such as $In_2O_3$, $SnO_2$, $ITO(In_2O_3+SnO_2)$, ZnO, CdO, $Cd_2SnO_4$, $TiO_2$, $Ta_2O_3$, $Bi_2O_3$, $MoO_3$, $Na_xWO_3$ and so forth, as ell as mixtures of such conductive oxides. These compounds may be doped with an element (dopant) which controls the electrical conductivity.

When the transparent electrode 107 is made of ZnO, for example, Al, In, B, Ga, Si, F or the like can suitably be used as the dopant for controlling the conductivity. When the transparent electrode 107 is made of $In_2O_3$, for example, Sn, F, Te, Ti, Sb, Pb or the like can suitably be used as the dopant for controlling the conductivity. When the transparent electrode 107 is made of $SnO_2$, for example, F, Sb, P, As, In, Ti, Te, W, Cl, Br, I or the like can suitably be used as the dopant for controlling the conductivity. Methods suitable for forming the transparent electrode 107 include evaporation deposition methods such as EB deposition, sputtering deposition or the like, various types of CVD processes, spraying method, spin-on method, dipping method, and so forth.

The surface of the transparent electrode 107 may be smooth. It is, however, preferred that the surface of the transparent electrode 107 has a certain degree of difference or variation in the smoothness corresponding to the steps, protrusions or recesses along the polycrystal grain boundaries in the substrate or the polycrystalline film. Such a nature of the surface of the transparent electrode enhances adhesion between the transparent electrode and the semiconductor layer, so as to increase the degree of freedom of the production process, as well as controllability, which in turn contributes to a further increase in the yield and further improvement in weather resistance and durability. In addition, scattering of light is enhanced at the interface between the transparent conductive layer and the semiconductor layer, achieving a further increase in the short-circuit current Jsc.

(Collecting electrode)

Figure 4:
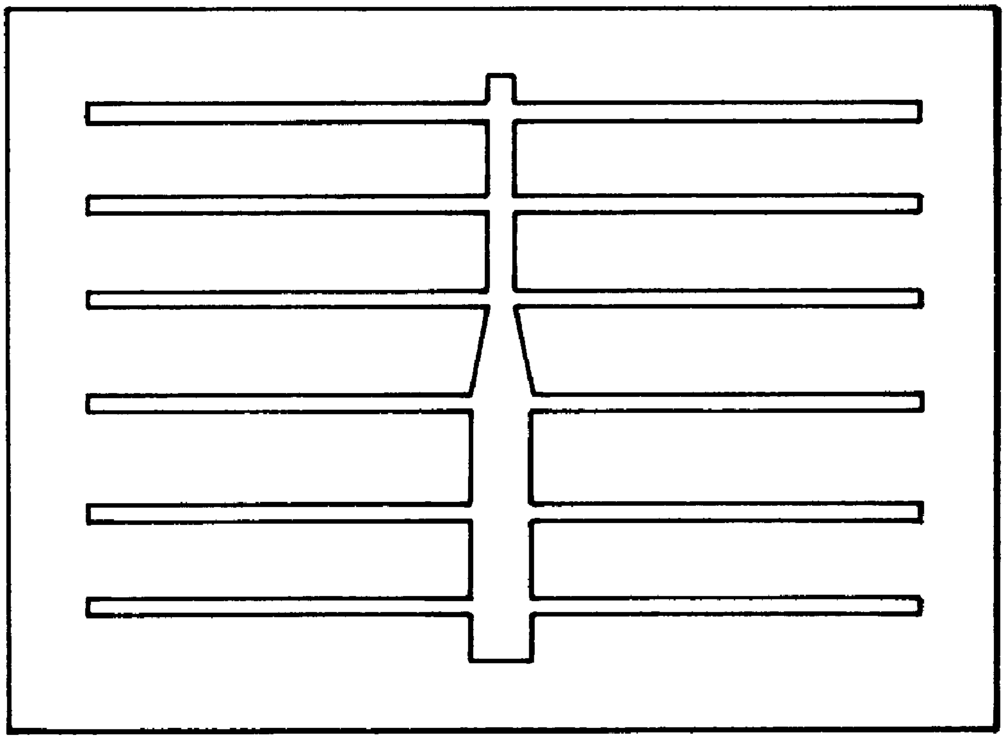
FIG. 4 is a schematic plane view showing a collecting electrode of a photovoltaic device in accordance with the preset invention.

In the present invention, the collecting electrode 108 is formed on a portion of the transparent electrode 107 as required when the transparent electrode 107 does not have required low electrical resistivity, for the purpose of reducing the resistivity of the electrode so as to decrease the series resistance of the photovoltaic devices. Examples of the suitable material of the collecting electrode include a metal such as gold, silver, copper, aluminum, nickel, iron, chromium, molybdenum, tungsten, titanium, cobalt, tantalum, niobium, zirconium or the like, an alloy such as a stainless steel, and a conductive paste formed from a powdered metal or alloy. In order to minimize interruption of the light incident to the semiconductor layer, the collecting electrode is preferably has, for example, a dendritic form as shown in FIG. 4.

The area occupied by the collecting electrode is preferably not greater than 15%, more preferably not greater than 10% and most preferably not greater than 5% of the area of the whole photovoltaic device.

The collecting electrode can be formed by, for example, an evaporation deposition technique, sputtering, plating or printing, by using a suitable mask configured in accordance with the pattern of the collecting electrode.

A photovoltaic apparatus in the form of a module or a panel, capable of producing desired voltage or output current, can be fabricated by connecting a plurality of photovoltaic devices of the invention in series or parallel, with the provision of a protective layer formed on each of the obverse and reverse side of the apparatus and electrodes through which the output voltage or current is delivered. In such an apparatus, the substrates of the photovoltaic devices may be placed on another supporting substrate. When a plurality of photovoltaic devices are connected in series, a diode for preventing backward flow of current may be incorporated in such a series connection.

EXAMPLES

The photovoltaic device in accordance with the present invention will be fully described through illustration of Examples of fabrication of photovoltaic devices and photodiodes formed from non-single-crystal silicon semiconductor materials. It is to be noted, however, that these Examples are not intended to limit the scope of the invention.

Example A

It should be understood that Example A is corresponding to the first embodiment mentioned above.

Example A1

In this example, photovoltaic devices having a structure as shown in FIG. 1A were fabricated using the acid treatment technique for etching surfaces thereof and using a stainless-steel (SUS430BA) plate as a substrate material.

A process for manufacturing photovoltaic devices will now be described.

(1) First, a substrate was prepared. A stainless steel (SUS430BA) plate which is a 0.5 mm thick square sheet measuring 50 mm on each side was ultrasonic-cleaned with acetone and isopropanol, and then dried with hot air, thereby residual oil on the plate was completely removed.

(2) In preparation of etching the surface thereof, the stainless steel plate was placed on a substrate holder made of Teflon resin (not shown), then the holder was placed in a container filled with an acid solution (not shown) so that the substrate was entirely immersed therein. The acid solution was a hydrofluoric acid-nitric acid mixture (HF, $HNO_3$, and $H_2O$ in the mole ratio of 1:3:4) and controlled to be kept at room temperature as indicated in Table A1.

(3) The container filled with the acid solution was placed in a ultrasonic cleaner (not shown), then the substrate was subjected to a surface treatment by applying ultrasonic waves for 1 minute.

(4) At this stage, a part of the acid-treated substrate was left as it was for evaluations (Sample-EMB-A1-1). For other part of the substrate, an optical reflection layer was deposited on the surface thereof by means of a sputtering apparatus.

Figure 5:
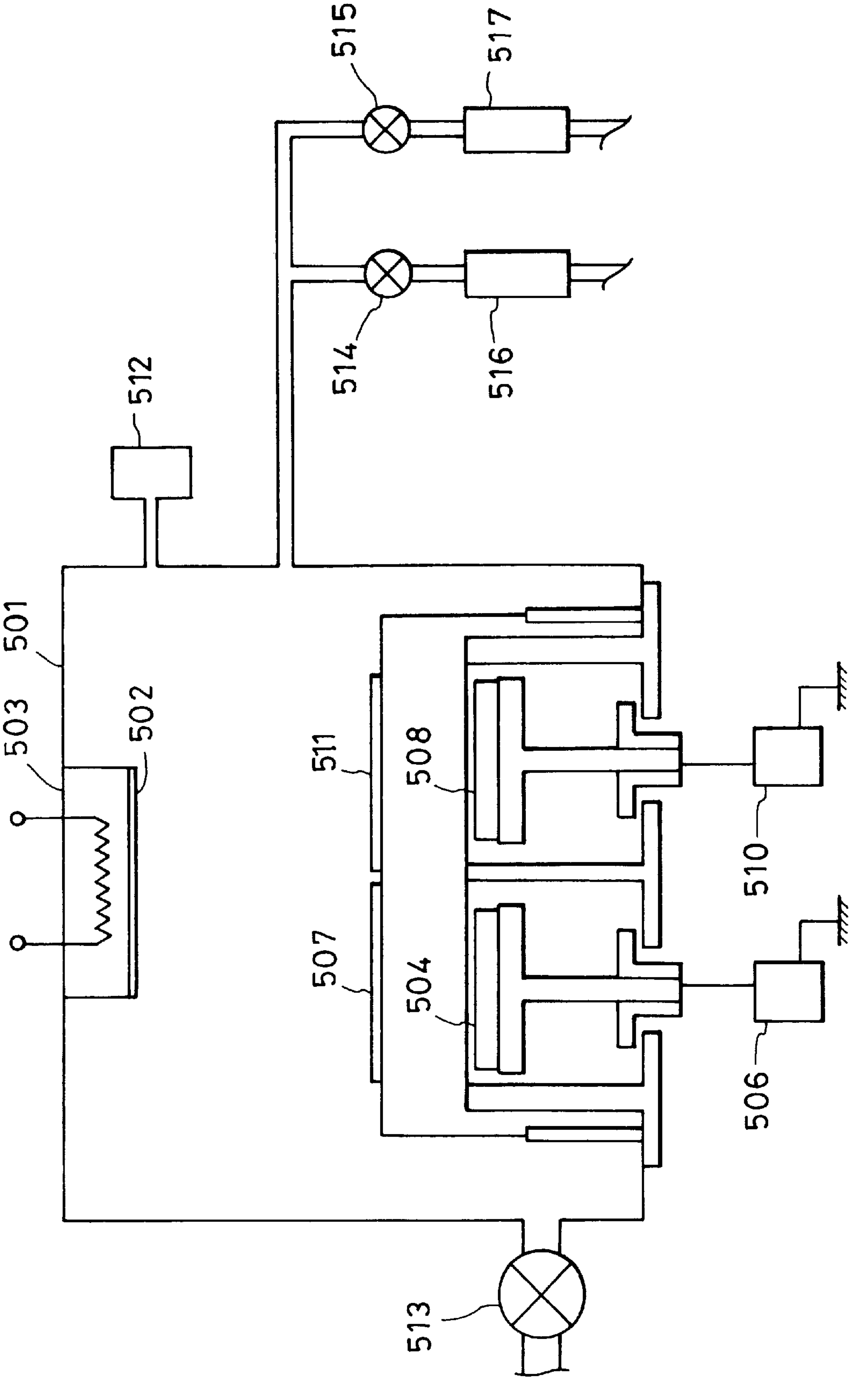
FIG. 5 is a schematic sectional view of a sputtering device suitable for use in the production of a photovoltaic device in accordance with the present invention.

(5) A DC magnetron sputtering apparatus shown in FIG. 5 was used to form an Al light reflection layer on the substrate. The acid-treated (SUS430BA) plate 502 was closely contacted with a heater 503 (shown in FIG. 5) and a deposition chamber 501 was evacuated via a vent to which an oil diffusion pump has been connected. When the internal pressure of the chamber was lowered to $1\times10^{-6}$ Torr, a valve 514 was opened, a mass flow controller 516 was adjusted to introduce an Ar gas at a flow rate of 50 sccm, and a conductance valve 513 was adjusted to set the internal pressure at 7 mTorr. A troidal coil was energized, the DC power of −380 V was supplied from a sputtering power supply 506 to an Al target 504 to create an Ar plasma.

(6) A target shutter 507 was opened to form an Al light reflection layer having a thickness of 0.2 $\mu$m on the surface of the stainless steel plate, then the shutter was closed. After that, the plasma was killed, and thus the deposition of the Al reflection layer was completed.

(7) In the same manner as that of the reflection layer, a ZnO thin film layer was further deposited thereon. The Ar gas was introduced to the deposition chamber at 40 sccm, the temperature of the substrate raised to 200° C., the internal pressure of the chamber was lowered to 5 mTorr, and the DC power of 510–500 V was applied to a ZnO target to create the Ar plasma.

(8) A target shutter 511 was opened to form a ZnO thin film layer having a thickness of 1.0 $\mu$m. Then the shutter was closed and the plasma was killed.

(9) After a transparent conductive layer was completely formed, a part of the substrate was left as it was for evaluations (Sample-EMB-A1-2). Then, for other part of the substrate, a semiconductor layer was deposited on the surface thereof by means of a CVD apparatus.

Figure 6:
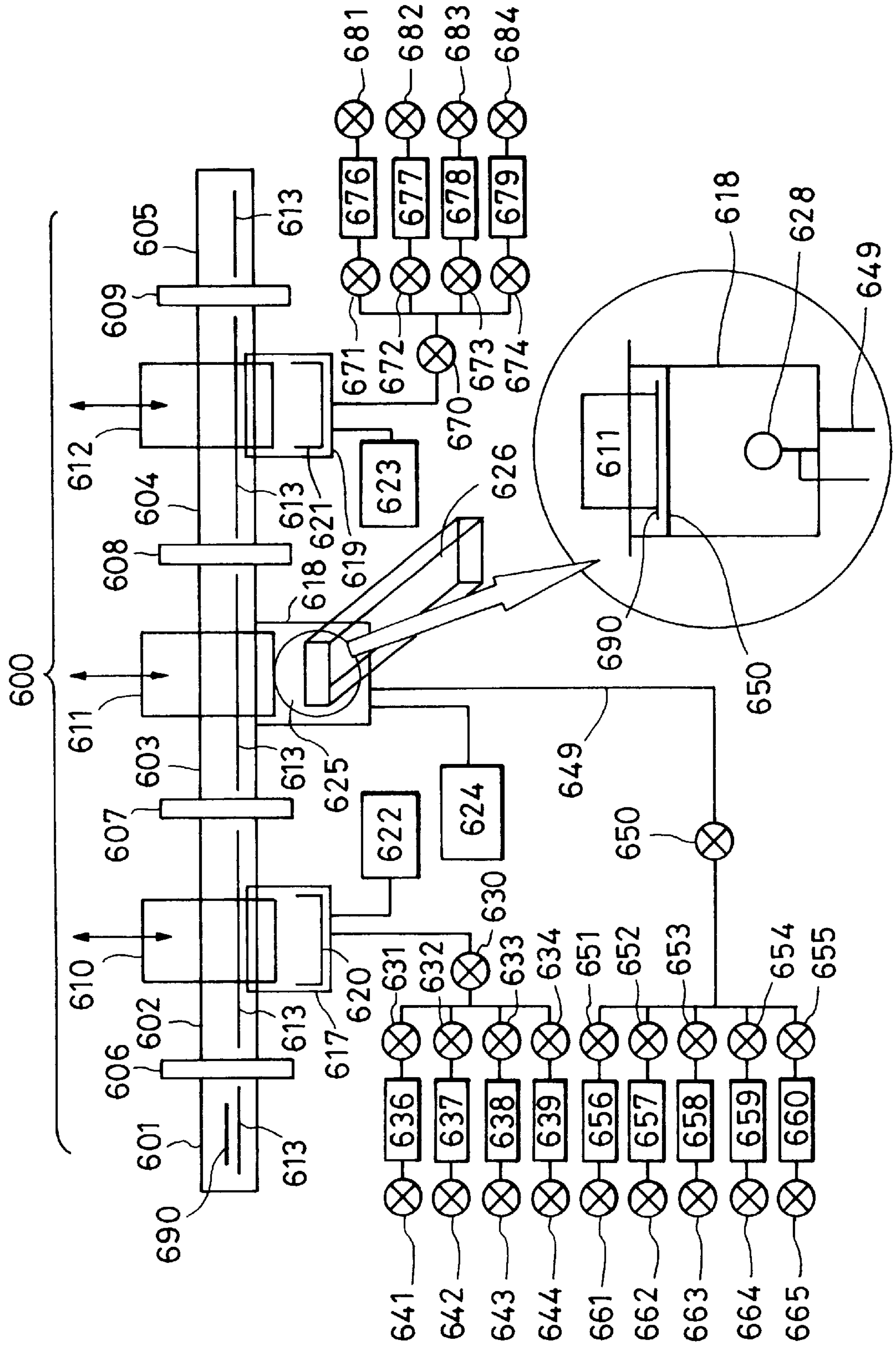
FIG. 6 is a schematic sectional view of a deposition apparatus suitable for use in the production of a photovoltaic device of the present invention.

(10) An n-layer, an i-layer, and an p-layer were sequentially formed on the ZnO thin film layer using a multiple chamber separation type deposition apparatus shown in FIG. 6. An n-layer of a-Si and a p-layer of μc-Si was deposited by means of RFPCVD, and an i-layer of a-Si was deposited by means of RFPCVD and MWPCVD. The forming procedures thereof were as described below.

(10-1) An entire transfer system and the deposition chamber were evacuated down to a pressure of $10^{-6}$ Torr range. The substrate was placed on a substrate holder 690 and place in a load chamber 601. The load chamber was evacuated by a mechanical booster pump and rotary pump (not shown) down to $10^{-3}$ Torr range. Then the evacuating system was switched to a turbo molecular pump and the load chamber was further evacuated down to a pressure $10^{-6}$ Torr range. A gate valve 606 was opened, and the substrate holder 690 was moved into an n-type layer transfer chamber 602. The gate valve 606 was then closed. The substrate was moved until it reached a location just below a substrate heater 610, a hydrogen gas was supplied, and the internal pressure of the transfer chamber was set to the same pressure as for deposition. Then the substrate was heated to the temperature indicated in Table A1. When the temperature of the substrate has becomes stable, a raw material gas indicated in Table A1 for depositing the n-layer was introduced into the deposition chamber via mass flow controllers 636 to 639, stop valves 630 to 634 and 641 to 644. When the pressure therein becomes stable, the RF power indicated in Table A1 was introduced from an RF power supply 622 into a cup 620 for introducing RF power. Thus, an n-type layer having the thickness indicated in Table A was deposited on the substrate after proper time duration.

(10-2) The row material gas for depositing the n-type layer was shut off, and the inside of the deposition chamber was evacuated down to $10^{-6}$ Torr range using the turbo molecular pump. The substrate heater 610 was moved upward, the gate valve 607 was opened, and the substrate holder was moved to an MW i-layer or RF i-layer transfer chamber 603. The gate valve was then closed. The substrate was moved until it reached a location below a substrate heater 611, the substrate heater 611 was lowered properly, and it was heated to and stabilized at the substrate temperature indicated in Table A1. Then an RF i-layer was deposited as described below. The raw material gas indicated in Table A1 for depositing an RF i-layer was introduced into the deposition chamber 618 from a gas supply system (comprising a gas supply line 649, stop valves 650 to 655 and 661 to 665, mass flow controllers 656 to 660) for supplying an MW i-layer or RF i-layer deposition gas. The deposition chamber was evacuated by an exhaust pump to the degree of vacuum indicated in Table A1. Then a desired RF power was supplied from an RF power source (not shown) to a bias electrode 628, and an RF i-layer with the thickness indicated in Table A1 was deposited on the n-type layer mentioned above by means of RF plasma CVD.

(10-3) The raw material gas was shut off and the inside of the deposition chamber was evacuated down to $10^{-6}$ Torr range using the turbo molecular pump, while the substrate was heated to and kept at the temperature listed in Table A1. The material gas indicated in Table A1 which is suitable for depositing an MW i-layer was supplied from the MW i-layer or RF i-layer deposition gas supply system to the deposition chamber 618. The inside of the deposition chamber was kept at the degree of vacuum indicated in Table A1 by means of an exhaust apparatus such as a diffusion pump not shown. The MW power indicated in Table A1 was introduced from an MW power supply not shown, while the bias power indicated in Table A1 was introduced from an RF power (not shown) to a bias electrode 628. A shutter 627 was then opened, and thus deposition of the MW i-layer by means of the microwave plasma CVD according to the present invention was started.

(10-4) After that, the raw material gas indicated in Table A1 which is suitable for depositing the MW i-layer was supplied from the MW i-layer or RF i-layer deposition gas supply system to the deposition chamber 618. After the MW i-layer having a predetermined thickness was deposited onto the MW n-layer, the shutter was closed, the MW power and the like were shut off, and the supply of the raw material gas was stopped. The inside of the deposition chamber 618 was evacuated to a pressure of $10^{-6}$ Torr range. In the same manner as the deposition of the RF i-layer mentioned above, an RF i-layer was further deposited on the MW i-layer according to the requirements indicated in Table A1.

(10-5) The inside of the deposition chamber was evacuated until after the deposition of the RF i-layer was completed. The substrate heater 611 was separated from the substrate, the gate valve 608 was opened, and the substrate holder 690 was moved into a p-type layer transfer chamber. The gate valve was then closed. The substrate was moved until it reached a location just below the substrate heater 612, the substrate was heated to and stabilized at the temperature indicated in Table A1. When the temperature has become stable, a p-type layer deposition gas was supplied from a p-type layer deposition gas supply system (comprising stop valves 670 to 674 and 681 to 684, mass flow controllers 676 to 679) to the deposition chamber 619. The inside of the deposition chamber was evacuated down to the degree of vacuum indicated in Table A1 by means of the exhaust pump. When the pressure therein has become stable, the power indicated in Table A1 was introduced from an RF power supply 623 into a cup electrode 621 for introducing RF power, and a p-type layer having the thickness indicated in Table A1 was deposited on the substrate after proper time duration by means of RF plasma CVD. Thus a pin structure was formed on the substrate.

(11) Next, the p-type layer deposition gas was shut off, and the hydrogen gas was fed for 5 minutes. Then the hydrogen gas was also shut off, the inside of the deposition chamber as well as the inside of the gas lines were evacuated down to $1\times10^{-5}$ Torr, and the substrate was moved into an unload chamber 605. The substrate was taken out to the outside after it was sufficiently cooled.

(12) Subsequently, as a transparent electrode, the ITO indicated in Table A1 was evaporated onto the p-layer by means of resistance heating vacuum evaporation technique. A mask having a comb-shaped window was then placed on the transparent conductive layer, and vacuum evaporation was performed via the mask thereby forming a comb-shaped collection electrode having a multi-layer structure consisting of Cr/Ag/Cr by means of electron-beam vacuum evaporation technique.

Thus, the fabrication of the photovoltaic device having a structure shown in FIG. 1A was completed.

Hereafter, the photovoltaic device of this type will be referred to as EMB-A1.

Comparative Example A1-1

Comparative Example A1-1 differs from above-mentioned Example A1 in that the duration of the ultrasonic acid treatment is 5 seconds.

Samples (Sample-CMP-A1-1 and Sample-CMP-A1-4) and a photovoltaic device (CMP-A1-1) were fabricated in the same manner as in Example A1 except the requirement mentioned above.

Comparative Example A1-2

Comparative Example A1-2 differs from Example A1 in that the temperature to be kept during the ultrasonic acid treatment is 80° C.

Samples (Sample-CMP-A1-2 and Sample-CMP-A1-5) and a photovoltaic device (CMP-A1-2) were fabricated in the same manner as in Example A1 except the requirement mentioned above.

Comparative Example A1-3

Comparative Example A1-3 differs from Example A1 in that the duration of the ultrasonic acid treatment is 10 minutes.

Samples (Sample-CMP-A1-3 and Sample-CMP-A1-6) and a photovoltaic device (CMP-A1-3) were fabricated in the same manner as in Example A1 except the requirement mentioned above.

Evaluation results on Sample-EMB-A1-1, Sample-CMP-A1-1, Sample-CMP-A1-2, and Sample-CMP-A1-3 which are the substrates prepared by processing until after the completion of the acid treatment according to above-mentioned Example A1, Comparative Example A1-1, Comparative Example A1-2, and Comparative Example A1-3, respectively, will be described below.

First, for each of the samples mentioned above, the surface configuration was observed using a scanning electron microscope (SEM) and the crystal grain size was checked. Then, the surface roughness thereof (the maximum peak to peak value, hereinafter referred to as "Rmax") was inspected by means of a needle step. Further, the schematic surface profile thereof was determined from the resultant data.

Table A2 summarize the results.

Figure 3A:
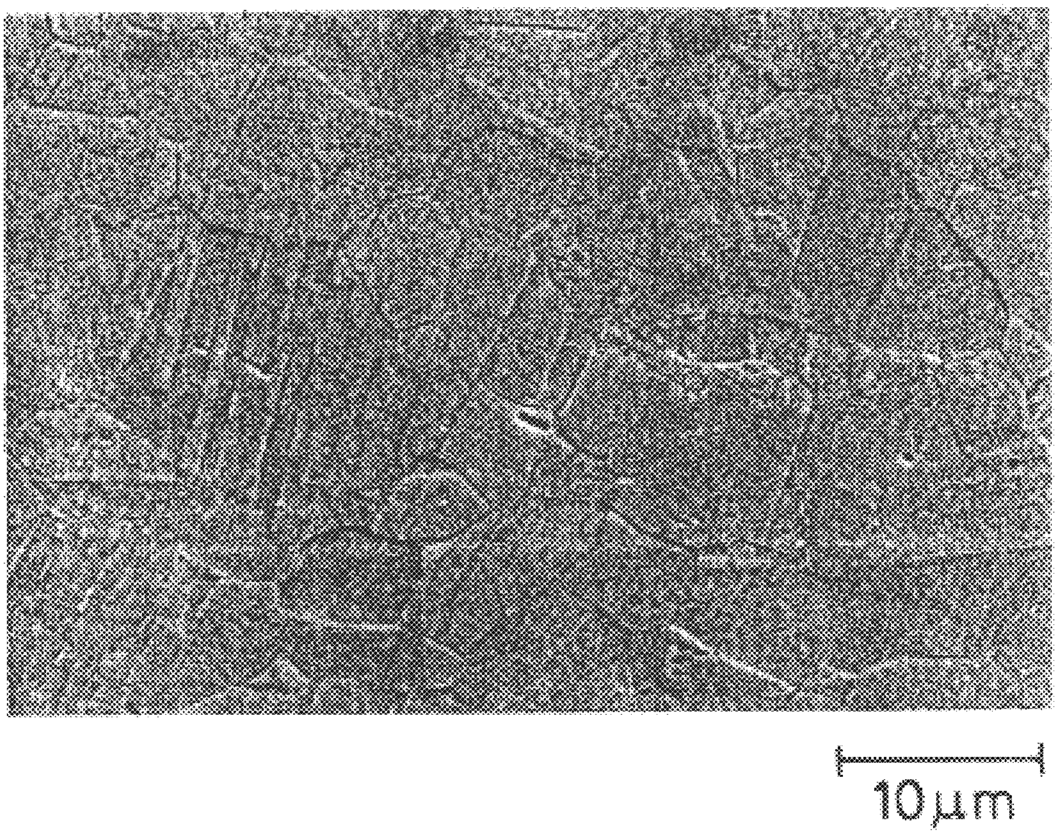
FIGS. 3A to 3D are electron microscopic photographs of the substrate of a photovoltaic device in accordance with the present invention.

FIG. 3A shows an SEM image of Sample-EMB-A1-1. Sample-EMB-A1-1 had height differences or asperities along crystal grain boundaries on the substrate surface and the crystalline plane was generally smooth. On the other hand, Sample-CMP-A1-1 had crystal grain boundaries but no height difference, and Sample-CMP-A1-2 and Sample-CMP-A1-3 had pyramidal-shaped asperities and were larger than Sample-EMB-A1-1 in Rmax.

Evaluation results on Sample-EMB-A1-2, Sample-CMP-A1-4, Sample-CMP-A1-5, and Sample-CMP-A1-6 which are the substrates prepared by processing until after the deposition of a transparent conductive layer according to above-mentioned Example A1, Comparative Example A1-1, Comparative Example A1-2, and Comparative Example A1-3, respectively, will be described below. First, for each of the samples mentioned above, the surface configuration was observed using the scanning electron microscope (SEM), and the size of the ZnO crystal grains was checked. Further, for each of the samples, a total reflectance and irregular reflectance were determined by means of a spectrophotometer with an integrating sphere.

Table A3 summarizes the results.

As shown in Table 3A, Sample-EMB-A1-1 features large size ZnO crystal grains which form a transparent conductive layer, a high total reflectance, and a high irregular reflectance. On the other hand, Sample-CMP-A1-4 had small size grains and low irregular reflectance, and Sample-CMP-A1-5 and Sample-CMP-A1-6 had very low total reflectance and irregular reflectance.

Evaluation results on EMB-A1, CMP-A1-1, CMP-A1-2, and CMP-A1-3 photovoltaic devices which have been fabricated according to above-mentioned Example A1, Comparative Example A1-1, Comparative Example A1-2, and Comparative Example A1-3, respectively, will be described below. First, 5 photovoltaic devices were prepared for each sample type, and each sample were further divided into 25 sub-cells, then the measurement of the shunt resistance was performed with applying a reverse bias voltage of −1.0 V to the samples in a dark place. Supposing that the reference value of the shunt resistance being $4\times10^4$ $\Omega cm^2$, the samples were checked for yield. Subsequently, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

In the adhesion test, first, 10×10 scratches were formed on a surface of each of fabricated photovoltaic device samples in grid pattern at an interval of 1 mm to make 100 squares thereon according to the lattice cutting pattern tape test method. Then, an insulating tape of polyimide was pasted onto the surface and peeled off momentarily after the tape was efficiently adhered thereon, and the adhesion was evaluated based on the unstuck area.

The initial photoelectric conversion efficiency was obtained by exposing a fabricated photovoltaic device to a light of AM-1.5 (100 $mW/cm^2$) and measuring the V-I property.

The optical degradation was evaluated as follows. First, a fabricated photovoltaic device whose initial photoelectric conversion efficiency has been obtained was placed in the environment of 25° C. and 50% relative humidity and exposed to a light of AM-1.5 for 500 hours. Subsequently, the photoelectric conversion efficiency was measured again under the illumination condition of AM 1.5 (100 mW/cm2), and the falling rate relative to the initial value (the ratio of the photoelectric conversion efficiency value following the predetermined optical degradation period to the initial value) was determined.

The high-humidity/temperature reverse bias (HHRB) degradation was evaluated as follows. First, the initial photoelectric conversion efficiency of a fabricated photovoltaic device was measured. Then the photovoltaic device was placed in the environment of 85° C. and 85% relative humidity, and a reverse bias voltage of 0.7 V was applied thereto for 100 hours. Subsequently, the photoelectric conversion efficiency was measured again under the illumination condition of AM 1.5 (100 $mW/cm^2$), and the falling rate relative to the initial value (the ratio of the photoelectric conversion efficiency value following the predetermined HHRB degradation period to the initial value) was determined.

The humidity/temperature degradation was evaluated as follows. First, the initial photoelectric conversion efficiency of a fabricated photovoltaic device was measured. The photovoltaic device was placed in a dark place at 85° C. and 85% relative humidity for 30 minutes, then the temperature was dropped to −20° C. over 70 minutes, kept −20° C. for 30 minutes, and 85° C. and 85% relative humidity were brought back over 70 minutes. This cycle was repeated 100 times. Subsequently, the photoelectric conversion efficiency was measured again under the illumination condition of AM 1.5 (100 $mW/cm^2$), and the falling rate relative to the initial value (the ratio of the photoelectric conversion efficiency value following the predetermined humidity/temperature degradation period to the initial value) was determined.

Table A4 summarizes the results.

The evaluations mentioned above show the fact that CMP-A1-1 photovoltaic device is inferior to EMB-A1 photovoltaic device in yield, adhesion, and photoelectric conversion efficiency following each of the degradation periods. These facts are attributed to the decrease of FF due to the decrease of the series resistance depending on the adhesion. The evaluations mentioned above also show the fact that CMP-A1-2 and CMP-A1-3 photovoltaic devices are inferior to EMB-A1 photovoltaic device in initial photoelectric conversion efficiency and photoelectric conversion efficiency following each of the degradation period. The inferior initial photoelectric conversion efficiency is attributed to the decrease of a short-circuit current (Jsc) due to the decrease of the total reflectance and the irregular reflectance, while the inferior photoelectric conversion efficiencies after respective degradation are mainly attributed to the decrease of the open circuit voltage (Voc).

As seen from the above, it can be concluded that the photovoltaic device (EMB-A1) according to the present invention has better characteristics and properties than the conventional photovoltaic devices (CMP-A1-1, CMP-A1-2, and CMP-A1-3).

Example A2

In this example, photovoltaic devices having a structure as shown in FIG. 1A were fabricated using the RF sputtering technique for etching surfaces thereof and using a stainless-steel (SUS430-2B) plate as the substrate material.

A process for manufacturing photovoltaic devices will now be described.

(1) After residual oil on the plate (SUS-2B) was completely removed in the same manner as in Example A1, the plate surfaces were subjected to the etching treatment by means of the sputtering apparatus shown in FIG. 5. The treated (SUS430-2B) plate 502 was closely contacted with the heater 503 (shown in FIG. 5) and the deposition chamber 501 was evacuated via the vent thereof. When the internal pressure of the chamber was lowered to $1\times10^{-6}$ Torr, the valve 514 was opened, the mass flow controller 516 was adjusted to introduce the Ar gas at a flow rate of 50 sccm, and the conductance valve 513 was adjusted to set the internal pressure at 6 mTorr. The RF power of 400 W was supplied from the sputtering power supply 506 to the substrate, and an Ar plasma was created. After maintaining the Ar plasma for 10 minutes, the plasma was then killed, and thus the etching treatment was completed. shutter was closed and the plasma was killed.

(2) A part of the substrate after the etching treatment was left as it was for evaluations (Sample-EMB-A2-1). For other part of the substrate, an Al reflection layer was deposited on the surface thereof in the same manner as in Example A1 according to the requirements indicated in Table A5.

(3) Subsequently, in the same manner as in Example A1, a ZnO transparent conductive layer was deposited on the Al reflection layer of the substrate according to the requirements indicated in Table A5. A part of the substrate was left as it was for evaluations (Sample-EMB-A2-2). For other part of the substrate, a pin-type semiconductor layer, an $In_2O_3$ transparent electrode, and a collecting electrode were sequentially formed thereon by means of the CVD apparatus according to the requirements indicated in Table A5. Thus the fabrication of the photovoltaic device (EMB-A-2) was completed.

Comparative Example A2-1

Comparative Example A2-1 differs from abovementioned Example A2 in that the duration of the RF sputtering is 10 seconds.

Samples (Sample-CMP-A2-1 and Sample-CMP-A2-4) and a photovoltaic device (CMP-A2-1) were fabricated in the same manner as in Example A2 except the requirement mentioned above.

Comparative Example A2-2

Comparative Example A2-2 differs from Example A2 in that the temperature during the surface treatment of the substrate is 200° C.

Samples (Sample-CMP-A2-2 and Sample-CMP-A2-5) and a photovoltaic device (CMP-A2-1) were fabricated in the same manner as in Example A2 except the requirement mentioned above.

Comparative Example A2-3

Comparative Example A2-3 differs from Example A2 in that the duration of the RF sputtering is 60 minutes.

Samples (Sample-CMP-A2-3 and Sample-CMP-A2-6) and a photovoltaic device (CMP-A2-3) were fabricated in the same manner as in Example A2 except the requirement mentioned above.

Evaluation results on Sample-EMB-A2-1, Sample-CMP-A2-1, Sample-CMP-A2-2, and Sample-CMP-A2-3 which are the substrates prepared by processing until after the completion of the surface treatment in the same manner as in Example A1 will be described below.

First, for each of the samples mentioned above, the surface configuration was observed as in Example A1. The crystal grain size, the surface roughness (Rmax), and the schematic surface profile thereof were then determined.

Table A6 summarizes the results.

As in the case of Example A1, Sample-EMB-A2-2 had height differences or asperities along crystal grain boundaries on the substrate surface and a generally smooth crystalline plane. On the other hand, Sample-CMP-A2-1 had crystal grain boundaries but no height difference, and Sample-CMP-A2-2 and Sample-CMP-A2-3 had pyramidal-shaped asperities and were larger than Sample-EMB-A2-2 in Rmax.

Evaluation results on Sample-EMB-A2-2, Sample-CMP-A2-4, Sample-CMP-A2-5, and Sample-CMP-A2-6 which are the substrates prepared in the same manner as in Example A1 will be described below. First, for each of the samples mentioned above, the surface configuration was observed, the size of the ZnO crystal grains was checked, and the total reflectance and irregular reflectance were determined by means of a spectrophotometer with an integrating sphere, as in the case of Example A1.

Table A7 summarizes the results.

As in the case of Example A1, Sample-EMB-A2-1 features large size ZnO crystal grains which form a transparent conductive layer, a high total reflectance and a high irregular reflectance. On the other hand, Sample-CMP-A2-4 had small size grains and low irregular reflectance, and Sample-CMP-A2-5 and Sample-CMP-A2-6 had very low total reflectance and irregular reflectance.

Evaluation results on EMB-A2, CMP-A2-1, CMP-A2-2, and CMP A2-3 which are photovoltaic devices fabricated in the same manner as in Example A1 according to abovementioned Example A2, Comparative Example A2-1, Comparative Example A2-3, respectively, will be described below. First, 5 photovoltaic devices were prepared for each sample type, and each device was further divided into 25 sub-cells, then the measurement of the shunt resistance was performed with applying a reverse bias voltage of −1.0 V to the samples in a dark place. Supposing that the reference value of the shunt resistance being 4'$10^4$ $\Omega cm^2$, the samples were checked for yield. Subsequently, as in Example A1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table A8 summarizes the results.

The evaluations mentioned above show the fact that CMP-A2-1 photovoltaic device is inferior to EMB-A2 photovoltaic device in yield and adhesion. This fact is attributed to the decrease of FF due to the decrease of the series resistance mainly depending on the adhesion. The evaluations mentioned above also show the fact that CMP-A2-2 and CMP-A2-3 photovoltaic devices are inferior to EMB-A2 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies following the respective degradation periods are mainly attributed to the decrease of the open circuit voltage (Voc).

As seen from the above, it can be concluded that the photovoltaic device (EMB-A2) according to the present invention has better characteristics and properties than the conventional photovoltaic devices (CMP-A2-1, CMP-A2-2, and CMP-A2-3).

Example A3

In this example, photovoltaic devices having a structure as shown in FIG. 1A were fabricated using the acid treatment technique for etching surfaces thereof and using a stainless-steel (SUS430-2B) plate as the substrate material.

A process for manufacturing photovoltaic devices will now be described.

(1) A surface of the plate (SUS430-2B) was etched using the acid solution indicated in Table A9 in the same manner as in Example A1. A part of the substrate after the etching treatment was left as it was for evaluations (Sample-EMB-A3-1). For other part of the substrate, an Al reflection layer was deposited on the surface thereof in the same manner as in Example A1 according to the requirements indicated in Table A9.

(3) After the Al reflection layer was completely deposited, a ZnO transparent conductive layer was deposited on the Al reflection layer of the substrate in the same manner as in Example A1 according to the requirements indicated in Table A9. A part of the substrate was left as it was for evaluations (Sample-EMB-A3-2).

(4) For other part of the substrate, a pin-type semiconductor layer, an $In_2O_3$ transparent electrode, and a collecting electrode were sequentially formed thereon by means of the CVD apparatus according to the requirements indicated in Table A9, and thus the fabrication of the photovoltaic device (EMB-A-3) was completed.

Comparative Example A3-1

Comparative Example A3-1 differs from abovementioned Example A3 in that the mixed solution of hydrofluoric acid, nitric acid mixture, and acetic acid ($HF:HNO_3:H_2O:CH_3COOH$=1:3:3:200) is used for the surface treatment of the substrate.

Samples (Sample-CMP-A3-1, Sample-CMP-A3-5, and Sample-CMP-A3-9) and a photovoltaic device (CMP-A3-1) were fabricated in the same manner as in Example A3 except the requirement mentioned above.

Comparative Example A3-2

Comparative Example A3-2 differs from Example A3 in that the thickness of the reflection layer to be deposited is 1000 nm.

Samples (Sample-CMP-A3-2, Sample-CMP-A3-6 and Sample-CMP-A3-10) and a photovoltaic device (CMP-A3-1) were fabricated in the same manner as in Example A3 except the requirement mentioned above.

Comparative Example A3-3

Comparative Example A3-3 differs from Example A3 in that the substrate temperature to be kept during depositing the reflection layer onto the substrate is 150° C.

Samples (Sample-CMP-A3-3, Sample-CMP-A3-7, and Sample-CMP-A3-11) and a photovoltaic device (CMP-A3-3) were fabricated in the same manner as in Example A3 except the requirement mentioned above.

Comparative Example A3-4

Comparative Example A3-4 differs from Example A3 in that the duration of the acid treatment for the substrate surface is 90 minutes.

Samples (Sample-CMP-A3-4, Sample-CMP-A3-8, and Sample-CMP-A3-12) and a photovoltaic device (CMP-A3-4) were fabricated in the same manner as in Example A3 except the requirement mentioned above.

Evaluation results on Sample-EMB-A3-1, Sample-CMP-A3-1, Sample-CMP-A3-2, Sample-CMP-A3-3, and Sample-CMP-A3-4 which are the substrates prepared by processing in the same manner as in Example A1 until after the completion of the surface treatment will be described below. For each of the samples mentioned above, the surface configuration was observed, the crystal grain size, the surface roughness (Rmax), and the schematic surface profile thereof (hereinafter referred to as "Schematic Surface Profile (Subst.)") were determined, as in the case of Example A1. After the reflection layer has been deposited, further observation for each of the substrates was performed using the scanning electron microscope to the precisely same position where the substrate has been observed before the deposition of the reflection layer, and the schematic shape of the cross section thereof (hereinafter referred to as "Schematic Surface Profile (Ref.)") was determined.

Table A10 summarizes the results.

As seen from Table A10, Sample-EMB-A3-1 had height differences or asperities along crystal grain boundaries on the surface thereof, the height differences on the etched substrate surface were reflected to the shape of the reflection layer as it was, and the crystalline plane was generally smooth. On the other hand, Sample-CMP-A3-1 had crystal grain boundaries but no height difference, and Sample-CMP-A3-2 and Sample-CMP-A3-3 had pyramidal-shaped asperities and were larger than Sample-EMB-A3-2 in Rmax.

Further, for each of Sample-EMB-A3-2, Sample-CMP-A3-6, Sample-CMP-A3-7, and Sample-CMP-A3-8 which are the substrates prepared by processing until after deposition of the transparent conductive layer, the size of the ZnO crystal grains were obtained, and the total reflectance and irregular reflectance were determined Table A11 summarizes the results.

As in the case of Example A1, Sample-EMB-A3-2 features large size ZnO crystal grains which form a transparent conductive layer, a high total reflectance, and a high irregular reflectance were obtained. On the other hand, Sample-CMP-A3-5 and Sample-CMP-A3-6 had small size grains and low irregular reflectance, and Sample-CMP-A3-7 and Sample-CMP-A3-8 had very low total reflectance and irregular reflectance.

Evaluation results on EMB-A3, CMP-A3-1, CMP-A3-2, CMP-A3-3, and CMP A3-4 which are, as in the case of Example A4, photovoltaic devices fabricated according to abovementioned Example A3, Comparative Example A3-1, Comparative Example A3-2, Comparative Example A3-3, and Comparative Example A3-4 respectively, will be described below. First, 5 photovoltaic devices were prepared for each sample type, and each device was further divided into 25 sub-cells. After that, the samples were checked for yield. Subsequently, as in the case of Example A1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table A12 summarizes the results.

The evaluations mentioned above show the fact that CMP-A3-1 and CMP-A3-2 photovoltaic devices are inferior to EMB-A3 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-A3-3 and CMP-A3-4 photovoltaic devices are inferior to EMB-A3 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc).

As seen from the above, it can be concluded that the photovoltaic device (EMB-A3) according to the present invention has better characteristics and properties than the conventional photovoltaic devices (CMP-A3-1, CMP-A3-2, CMP-A3-3, and CMP-A3-4).

Example A4

In this example, photovoltaic devices having a structure as shown in FIG. 1A were fabricated using the acid treatment technique for etching surfaces thereof and using a stainless-steel (SUS430-2B) plate as the substrate material.

A process for manufacturing photovoltaic devices will now be described.

(1) A surface of the plate (SUS430-2B) was etched using the acid solution indicated in Table A13 in the same manner as in Example A3.

(2) A part of the substrate after the etching treatment was left as it was for evaluations (Sample-EMB-A4-1). For other part of the substrate, an Ag reflection layer was deposited on the surface thereof in the same manner as in Example A3 according to the requirements indicated in Table A13.

(3) After the Ag reflection layer was completely deposited, a ZnO transparent conductive layer was deposited on the Ag reflection layer of the substrate according to the requirements indicated in Table A13. A part of the substrate was left as it was for evaluations (Sample-EMB-A4-2).

(4) For other part of the substrate, a pin-type semiconductor layer, an $In_2O_3$ transparent electrode, and a collecting electrode were sequentially formed thereon according to the requirements indicated in Table A13, as in the same manner in Example A3, and thus the fabrication of the photovoltaic device (EMB-A4) was completed.

Comparative Example A4-1

Comparative Example A4-1 differs from abovementioned Example A4 in that the thickness of the reflection layer to be deposited is 2000 nm.

Samples (Sample-CMP-A4-1 and Sample-CMP-A4-4) and a photovoltaic device (CMP-A4-1) were fabricated in the same manner as in Example A4 except the requirement mentioned above.

Comparative Example A4-2

Comparative Example A4-2 differs from Example A4 in that the substrate temperature to be kept during depositing the reflection layer onto the substrate is 300° C.

Samples (Sample-CMP-A4-2 and Sample-CMP-A4-5) and a photovoltaic device (CMP-A4-2) were fabricated in the same manner as in Example A4 except the requirement mentioned above.

Comparative Example A4-3

Comparative Example A4-3 differs from Example A4 in that the duration of the acid treatment for the substrate surface is 70 minutes.

Samples (Sample-CMP-A4-3 and Sample-CMP-A4-6) and a photovoltaic device (CMP-A4-3) were fabricated in the same manner as in Example A4 except the requirement mentioned above.

Evaluation results on Sample-EMB-A4-1, Sample-CMP-A4-1, Sample-CMP-A4-2, and Sample-CMP-A4-3 which are the substrates prepared by processing in the same manner as in Example A3 until after the completion of the surface treatment will be described below. For each of the samples mentioned above, the surface configuration was observed, the crystal grain size, the surface roughness (Rmax), and the schematic surface profile thereof (hereinafter referred to as "Schematic Surface Profile (Subst.)") were determined, as in the case of Example A3. After the transparent conductive layer has been deposited, further observation for each of the substrates was performed using the scanning electron microscope to the precisely same position where the substrate has been observed before the deposition of the reflection layer, and the schematic shape of the cross section thereof (hereinafter referred to as "Schematic Surface Profile (Transp.)") was determined.

Table A14 summarizes the results.

As seen from Table A14, Sample-EMB-A4-1 had height differences or asperities along crystal grain boundaries on the surface thereof, the height differences on the etched substrate surface were reflected to the shape of the transparent conductive layer as it was, and the crystalline plane was generally smooth. On the other hand, Sample-CMP-A4-1 had height differences or asperities along crystal grain boundaries on the surface thereof, but the shape thereof was not reflected to that of the transparent conductive layer. Besides, Sample-CMP-A4-2 and Sample-CMP-A4-3 had pyramidal-shaped asperities and were larger than Sample-EMB-A4-1 in Rmax.

Further, for each of Sample-EMB-A4-2, Sample-CMP-A4-4, Sample-CMP-A4-5, and Sample-CMP-A4-6 which are the substrates prepared as in the same manner in Example A3 by processing until after the deposition of the transparent conductive layer, the surface configuration was observed, and the size of the ZnO crystal grains, the total reflectance, and the irregular reflectance were determined Table A15 summarizes the results.

As in the case of Example A3, Sample-EMB-A4-2 features large size ZnO crystal grains which form a transparent conductive layer, a high total reflectance, and a high irregular reflectance. On the other hand, Sample-CMP-A4-4 had small size grains and low irregular reflectance, and Sample-CMP-A4-5 and Sample-CMP-A4-6 had very low total reflectance and irregular reflectance.

Evaluation results on EMB-A4, CMP-A4-1, CMP-A4-2, and CMP A4-3 which are, as in the case Example A3, photovoltaic devices fabricated according to abovementioned Example A4, Comparative Example A4-1, Comparative Example A4-2, and Comparative Example A4-3, respectively, will be described below. First, 5 photovoltaic devices were prepared for each sample type, and each device was further divided into 25 sub-cells. After that, the samples were checked for yield. Subsequently, as in the case of Example A3, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table A16 summarizes the results.

The evaluations mentioned above show the fact that CMP-A4-1 photovoltaic device is inferior to EMB-A4 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-A4-2 and CMP-A4-3 photovoltaic devices are inferior to EMB-A4 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc). As seen from the above, it can be concluded that the photovoltaic device (EMB-A4) according to the present invention has better characteristics and properties than the conventional photovoltaic devices (CMP-A4-1, CMP-A4-2, and CMP-A4-3).

Example A5

In this example, photovoltaic devices having a structure as shown in FIG. 1A were fabricated using the acid treatment technique for etching surfaces thereof and using a stainless-steel (SUS430-BA) plate as the substrate material. A process for manufacturing photovoltaic devices will now be described.

(1) A surface of the plate (SUS430-BA) was etched using the acid solution indicated in Table A17 in the same manner as in Example A4.

(2) A part of the substrate after the etching treatment was left as it was for evaluations (Sample-EMB-A5-1). For other part of the substrate, a Cu reflection layer was deposited on the surface thereof in the same manner as in Example A4 according to the requirements indicated in Table A17.

(3) After the Cu reflection layer was completely deposited, a ZnO transparent conductive layer was deposited on the Cu reflection layer of the substrate according to the requirements indicated in Table A17. A part of the substrate was left as it was for evaluations (Sample-EMB-A5-2).

(4) For other part of the substrate, a pin-type semiconductor layer, an $In_2O_3$ transparent electrode, and a collecting electrode were sequentially formed thereon according to the requirements indicated in Table A17, as in the same manner in Example A4, and thus the fabrication of the photovoltaic device (EMB-A5) was completed.

Comparative Example A5-1

Comparative Example A5-1 differs from abovementioned Example A5 in that the thickness of the reflection layer to be deposited is 2000 nm.

Samples (Sample-CMP-A5-1 and Sample-CMP-A5-4) and a photovoltaic device (CMP-A5-1) were fabricated in the same manner as in Example A5 except the requirement mentioned above.

Comparative Example A5-2

Comparative Example A5-2 differs from Example A5 in that the substrate temperature to be kept during depositing the reflection layer onto the substrate is 150° C. and the thickness of the reflection layer to be deposited is 1500 nm.

Samples (Sample-CMP-A5-2 and Sample-CMP-A5-5) and a photovoltaic device (CMP-A5-2) were fabricated in the same manner as in Example A5 except the requirements mentioned above.

Comparative Example A5-3

Comparative Example A5-3 differs from Example A5 in that the thickness of the transparent conductive layer to be deposited is 10 $\mu$m.

Samples (Sample-CMP-A5-3 and Sample-CMP-A5-6) and a photovoltaic device (CMP-A5-3) were fabricated in the same manner as in Example A5 except the requirement mentioned above.

Evaluation results on Sample-EMB-A5-1, Sample-CMP-A5-1, Sample-CMP-A5-2, and Sample-CMP-A5-3 which are the substrates prepared in the same manner as Example A4 by processing until after the completion of the surface treatment will be described below. For each of the samples mentioned above, the surface configuration was observed, the crystal grain size, the surface roughness (Rmax), and the schematic surface profile thereof (hereinafter referred to as "Schematic Surface Profile (Subst.)") were determined, as in the case of Example A4. After fabrication of the photovoltaic device, further observation for each of the substrate surfaces was performed using the scanning electron microscope to the precisely same position where the substrate has been observed before the fabrication of the photovoltaic device, and the schematic shape of the cross section thereof (hereinafter referred to as "Schematic Surface Profile (Photov.)") was determined.

Table A18 summarizes the results.

As seen from Table A18, Sample-EMB-A5-1 had height differences or asperities along crystal grain boundaries on the surface thereof, the height differences on the etched substrate surface were reflected to the shape on the photovoltaic device as it was, and the surface of the semiconductor layer was generally smooth. On the other hand, Sample-CMP-A5-1 had height differences or asperities along crystal grain boundaries on the surface thereof, but the surface profile of the substrate was not reflected to the photovoltaic device. Besides, Sample-CMP-A5-2 and Sample-CMP-A5-3 do not reflect the surface profile of the substrate, had pyramidal-shaped asperities, and were larger than Sample-EMB-A5-1 in Rmax.

Further, for each of Sample-EMB-A5-2, Sample-CMP-A5-4, Sample-CMP-A5-5, and Sample-CMP-A5-6 which are the substrates prepared as in the same manner in Example A4 by processing until after the deposition of the transparent conductive layer, the surface configuration was observed, and the size of the ZnO crystal grains, the total reflectance, and the irregular reflectance were determined Table A19 summarizes the results.

As in the case of Example A4, Sample-EMB-A5-2 features large size ZnO crystal grains which form a transparent conductive layer, a high total reflectance, and a high irregular reflectance. On the other hand, Sample-CMP-A5-4 had small size grains, and Sample-CMP-A5-5 and Sample-CMP-A5-6 had very low total reflectance and irregular reflectance.

Evaluation results on EMB-A5, CMP-A5-1, CMP-A5-2, and CMP A5-3 which are, as in the case of Example A4, photovoltaic devices fabricated according to abovementioned Example A5, Comparative Example A5-1, Comparative Example A5-2, and Comparative Example A5-3, respectively, will be described below. First, 5 photovoltaic devices were prepared for each sample type, and each device was further divided into 25 sub-cells. After that, the samples were checked for yield. Subsequently, as in the case of Example A4, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table A20 summarizes the results.

The evaluations mentioned above show the fact that CMP-A5-1 and CMP-A5-3 photovoltaic devices are inferior to EMB-A5 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-A5-2 photovoltaic device is inferior to EMB-A5 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc).

As seen from the above, it can be concluded that the photovoltaic device (EMB-A5) according to the present invention has better characteristics and properties than the conventional photovoltaic devices (CMP-A5-1, CMP-A5-2, and CMP-A5-3).

Example A6

Figure 7A:
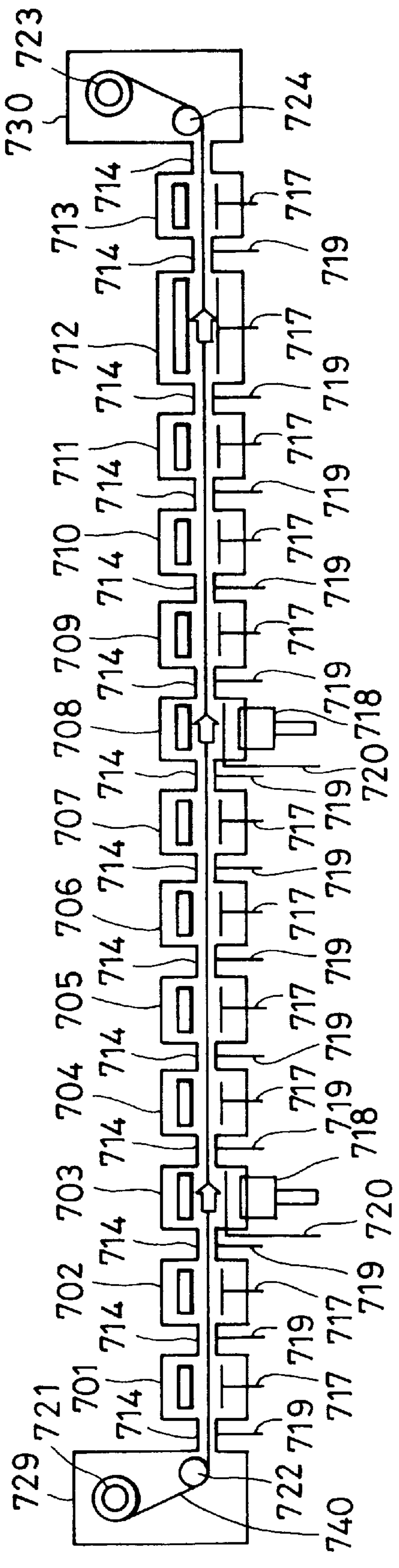
FIG. 7 is a sectional view and a plane view of a roll-to-toll deposition apparatus suitable for use in the production of a photovoltaic device in accordance with the present invention.
Figure 7B:
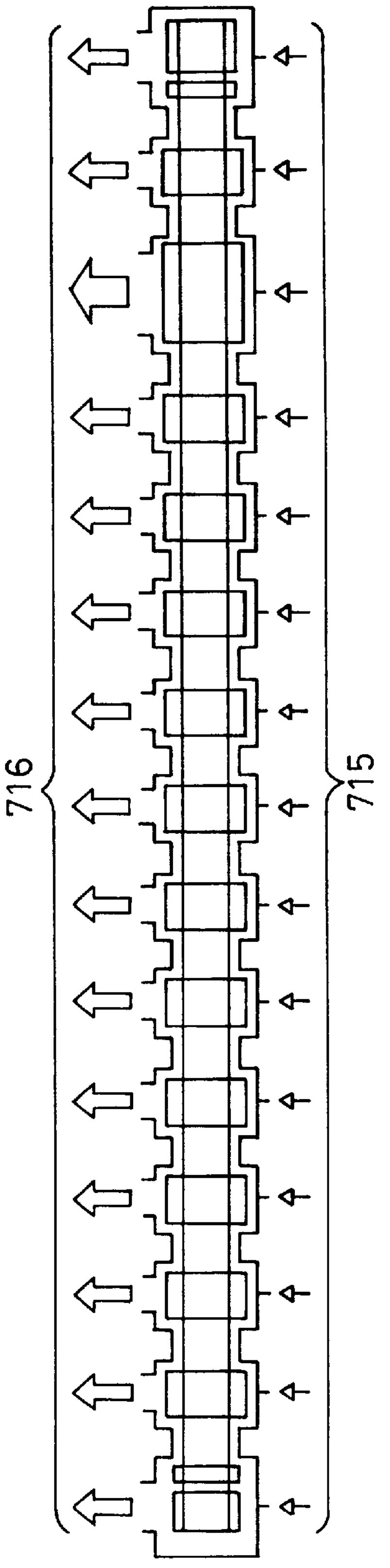

In this example, solar cells having a pinpinpin structure as shown in FIG. 2 were fabricated by means of a deposition apparatus which uses the roll-to-roll method shown in FIG. 7.

A strip stainless-steel (SUS430BA) sheet having a length of 100 m, a width of 30 cm, and a thickness of 0.15 mm as a substrate material. The stainless-steel (SUS430BA) sheet was wrapped around a feed bobbin (not shown) in a vacuum vessel (not shown). Then the sheet was subjected to the RF plasma etching by Ar plasma with feeding the SUS430BA sheet by rotating a take-up bobbin to which one end of the sheet was connected.

A part of the etched substrate (Sample EMB-A6-1) was evaluated and the shape of the cross section thereof was inspected (hereinafter referred to as "Schematic Surface Profile (Subst.)") Subsequently, a AlSi reflection layer and a ZnO transparent electrode layer were formed on the substrate using the roll-to-roll method according to the requirements indicated in Table A21. A part of the substrate was then left as it was for evaluations (Sample-EMB-A6-2) and the shape of the cross section thereof (hereinafter referred to as "Schematic Surface Profile (Ref.)") was inspected. Other part of substrate are fabricated to photovoltaic devices (EMB-A6) by means of a CVD apparatus using the roll-to-roll method according to the requirements indicated in Table A21.

The operation of the deposition apparatus shown in FIG. 7 will now be described.

FIG. 7(*a*) is a schematic view of a continuous photovoltaic device manufacturing apparatus using the roll-to-roll method. In this apparatus, a substrate feed chamber 729, multiple deposition chambers 701 to 713, and a substrate take-up chamber 730 are disposed in order and interconnected by separation passages 714. Each deposition chamber has a vent through which the inside of the deposition chamber is evacuated.

A strip substrate 740 is wound up from the substrate feed chamber to the substrate take-up chamber through the deposition chambers and the separation passages. At the same time, a gas is introduced from a gas inlet of each respective deposition chamber or each separation passage, and exhausted from every vent. Thus respective layers can be formed on the substrate. Each deposition chamber has a halogen lamp inside thereof which heats the substrate from backside thereof. The halogen lamp is heated to a predetermined temperature in the corresponding deposition chamber.

FIG. 7(*b*) is a view of the deposition chambers 701 to 713 when looking from above. Each deposition chamber has a raw material gas inlet 715 and a vent 716, and an RF electrode 717 or a microwave applicator 718 is mounted in the chamber. A raw material gas supply apparatus (not shown) is connected to respective raw material gas inlets 715. On the other hand, to the respective vents of the deposition chambers, an evacuator (not shown) such as an oil diffusion pump and a mechanical booster pump are connected. Each of the separation passages 714 interposed between deposition chambers has an inlet 719 for introducing a scavenging gas, and introduces a scavenging gas as shown in the figure.

Each of the deposition chambers 703 and 707 for depositing a MW-i layer has a bias electrode 720 to which an RF power supply (not shown) is connected as a power supply. The substrate feed chamber contains a guide roll 721 and a guide roller 722 which gives proper tension to the substrate and always keep the substrate in a horizontal position, while the substrate take-up chamber contains a take-up roll 723 and a guide roller 724.

A process for manufacturing solar cells will now be described.

(1) First, the abovementioned stainless-steel (SUS430BA) sheet was wrapped around the feed roll 721 (at a mean radius of curvature of 30 cm), set in the substrate feed chamber 710, and connected to the substrate take-up roll 723 at one end after passing through all the deposition chambers.

(2) The entire apparatus was evacuated by means of the evacuator, every lamp heater of each of deposition chambers was turned on, and the temperature in each of the deposition chambers was controlled to be kept at a predetermined temperature.

(3) When the internal pressure of the entire apparatus reached to 1 mTorr or less, the scavenging gas is introduced via respective scavenging gas inlets 719 as shown in FIG. 7, and the substrate was taken up by the take-up roll while feeding the substrate in the direction of the arrow in FIG. 7.

(4) Respective raw material gases were properly introduced to the corresponding deposition chambers. At this time, the flow rate of each gas to be introduced into respective separation passages or the pressure in each of deposition chambers are adjusted so that a raw material gas introduced into the corresponding deposition chambers was not diffused to the other deposition chambers.

(5) Subsequently, plasmas are created by introducing the RF power or the MW power plus the RF bias power. Photovoltaic devices composed of the first, second and third pin-junctions were fabricated according to the requirements indicated in Table A21. As the first pin-junction, an n1-layer was deposited in the deposition chamber 701, an i1-layer was deposited in the deposition chambers 702, 703, and 704, and a p1-layer was deposited in the deposition chamber 705. As the second pin-junction, an n2-layer was deposited in the deposition chamber 706, an i2-layer was deposited in the deposition chambers 707, 708, and 709, and a p2-layer was deposited in the deposition chamber 710. As the third pin-junction, an n3-layer was deposited in the deposition chamber 711, an i3-layer was deposited in the deposition chamber 712, and a p3-layer was deposited in the deposition chamber 713.

(6) After the substrate was completely taken up, every MW power supply and RF power supply were turned off, all plasmas were killed, and all the raw material and scavenging gases were shut off. The entire system was released and the take-up roll was taken out from the chamber.

(7) Next, a transparent electrode 213 was formed on top of the three pin junction layers according to the requirements indicated in the Table A21.

(8) A carbon paste 5 μm thick by 0.5 mm wide was placed on the substrate by screen printing on the transparent electrode 213, a silver paste 10 μm thick by 0.5 mm wide was further placed on the carbon paste, and then a collecting electrode was formed on the silver paste. After that, the rolled solar cell was cut to 250 mm×100 mm.

Thus, the fabrication of the pinpinpin type solar cell (EMB-A6) using the roll-to-roll method was completed.

Comparative Example A6-1

Comparative Example A6-1 differs from above-mentioned Example A6 in that the duration of the RF sputtering is 10 seconds.

Samples (Sample-CMP-A6-1 and Sample-CMP-A6-4) and a photovoltaic device (CMP-A6-1) were fabricated in the same manner as in Example A1 except the requirement mentioned above.

Comparative Example A6-2

Comparative Example A6-2 differs from Example A6 in that the temperature to be kept during the surface treatment of the substrate is 300° C.

Samples (Sample-CMP-A6-2 and Sample-CMP-A6-5) and a photovoltaic device (CMP-A6-2) were fabricated in the same manner as in Example A6 except the requirement mentioned above.

Comparative Example A6-3

Comparative Example A6-3 differs from Example A6 in that the duration of the RF sputtering is 60 minutes.

Samples (Sample-CMP-A6-3 and Sample-CMP-A6-6) and a photovoltaic device (CMP-A6-3) were fabricated in the same manner as in Example A6 except the requirement mentioned above.

Now, evaluation results on Sample-EMB-A6, Sample-CMP-A 6-1, Sample-CMP-A6-2, and Sample-CMP-A6-3 which are the substrates prepared by processing until after the completion of the surface treatment according to above-mentioned Example A1 will be described below. For each of the samples mentioned above, the surface configuration was observed and the crystal grain size, the surface roughness (Rmax), and the schematic shape of the cross section of the substrate (Schematic Surface Profile (Subst.)) were inspected.

Table A22 summarize the results.

As in the case of Example A1, Sample-EMB-A6-1 had height differences or asperities along crystal grain boundaries on the substrate surface and the crystalline plane was generally smooth as shown in Table A22. On the other hand, Sample-CMP-A6-1 had crystal grain boundaries but no height difference, and Sample-CMP-A6-2 and Sample-CMP-A6-3 had pyramidal-shaped asperities and were larger than Sample-EMB-A6-1 in Rmax.

Further, for each of Sample-EMB-A6-2, Sample-CMP-A6-4, Sample-CMP-A6-5, and Sample-CMP-A6-6 which are the substrates prepared by processing until after the deposition of a transparent conductive layer in the same manner as in Example A1, the surface configuration was observed, the size of the ZnO crystal grains was checked, and further a total reflectance and irregular reflectance were determined by means of a spectrophotometer with an integrating sphere.

Table A23 summarizes the results.

As in the case of Example A1, Sample-EMB-A6 features large size ZnO crystal grains which form a transparent conductive layer, a high total reflectance, and a high irregular reflectance as shown in Table A23. On the other hand, Sample-CMP-A6-4 had small size grains and low irregular reflectance, and Sample-CMP-A6-5 and Sample-CMP-A6-6 had very low total reflectance and irregular reflectance.

Evaluation results on EMB-A6, CMP-A6-1, CMP-A6-2, and CMP A6-3 photovoltaic devices which have been fabricated in the same manner as in Example A5 according to above-mentioned Example A6, Comparative Example A6-1, Comparative Example A6-3, respectively, will be described below. First, 5 photovoltaic devices were prepared for each sample type, and the measurement of the shunt resistance was performed with applying a reverse bias voltage of −1.0

V to the samples in a dark place. Supposing that the reference value of the shunt resistance being $4\times10^4$ $\Omega cm^2$, the samples were checked for yield. Subsequently, an adhesion test, a measurement of the initial photoelectric conversion efficiency (photoelectromotive force/incident photoelectric power), and evaluations of the optical degradation, the high-humidity/temperature reverse bias (HHRB) degradation, and the temperature/humidity degradation were performed in the same manner as in Example A1.

Table A24 summarizes the results.

The evaluations mentioned above show the fact that CMP-A6-1 photovoltaic device is inferior to EMB-A6 photovoltaic device in yield and adhesion. These facts are attributed to the decrease of FF due to the decrease of the series resistance depending on the adhesion. The evaluations mentioned above also show the fact that CMP-A6-2 and CMP-A6-3 photovoltaic devices are inferior to EMB-A6 photovoltaic device in initial photoelectric conversion efficiency and photoelectric conversion efficiency following each of the degradation period. The inferior initial photoelectric conversion efficiency is attributed to the decrease of a short-circuit current (Jsc) due to the decrease of the total reflectance and the irregular reflectance, while the inferior photoelectric conversion efficiencies after respective degradation are mainly attributed to the decrease of the open circuit voltage (Voc). As seen from the above, it can be concluded that the photovoltaic device (EMB-A6) according to the present invention has better characteristics and properties than the conventional photovoltaic devices (CMP-A6-1, CMP-A6-2, and CMP-A6-3).

Example A7

In this example, photovoltaic devices having a structure as shown in FIG. 1A were fabricated using an acid solution for etching surfaces thereof and using a mirror-finished stainless-steel (SUS304) plate as the substrate material.

A surface of the plate (SUS304) was etched using the acid solution indicated in Table A25 in the same manner as in Example A1. A part of the substrate after the etching treatment was left as it was for evaluations (Sample-EMB-A7-1). For other part of the substrate, a CuAl alloy reflection layer was deposited on the surface thereof in the same manner as in Example A1 according to the requirements indicated in Table A25. After the completion of the deposition of the CuAl alloy reflection layer, a ZnO transparent conductive layer was deposited on the reflection layer according to the requirements indicated in Table A25. A part of the substrate was left as it was for evaluations (Sample-EMB-A7-2). For other part of the substrate, a pin-type semiconductor layer, an $In_2O_3$ transparent electrode, and a collecting electrode were sequentially formed thereon according to the requirements indicated in Table A25, and thus the fabrication of the photovoltaic device (EMB-A-7) was completed.

Subsequently, an n-layer of a-Si, an i-layer of poly-Si, and an p-layer of pc-Si were sequentially formed on the ZnO thin film layer using a multiple chamber separation type deposition apparatus (not shown). The forming process thereof will now be described.

(1) First, an n-layer of a-Si was deposited on the ZnO thin film layer using a similar apparatus to that used in Example A1.

(2) An i-layer of poly-Si was then deposited by means of a deposition apparatus (not shown) which uses the HRCVD method with a duplex tube (not shown) according to the same requirements as indicated in Table A25.

(3) Further, a p-layer of pc-Si was deposited on the i-layer by means of the similar apparatus to that used in Example A1.

(4) After that, an $In_2O_3$ transparent electrode and a collecting electrode were formed thereon in the same manner as in Example A1 according to the requirements indicated in Table A25. Thus the fabrication of the photovoltaic device (EMB-A7) was completed.

Comparative Example A7-1

Comparative Example A7-1 differs from abovementioned Example A7 in that the duration of the acid treatment is 10 seconds.

Samples (Sample-CMP-A7-1 and Sample-CMP-A7-4) and a photovoltaic device (CMP-A7-1) were fabricated in the same manner as in Example A7 except the requirement mentioned above.

Comparative Example A7-2

Comparative Example A7-2 differs from Example A7 in that the temperature of the acid solution during the surface treatment of the substrate is 80° C.

Samples (Sample-CMP-A7-2 and Sample-CMP-A7-5) and a photovoltaic device (CMP-A7-1) were fabricated in the same manner as in Example A7 except the requirement mentioned above.

Comparative Example A7-3

Comparative Example A7-3 differs from Example A7 in that the duration of the acid treatment is 60 minutes.

Samples (Sample-CMP-A7-3 and Sample-CMP-A7-6) and a photovoltaic device (CMP-A7-3) were fabricated in the same manner as in Example A7 except the requirement mentioned above.

Evaluation results on Sample-EMB-A7-1, Sample-CMP-A7-1, Sample-CMP-A7-2, and Sample-CMP-A7-3 which are the substrates prepared by processing until after the completion of the surface treatment in the same manner as in Example A1 will be described below. For each of the samples mentioned above, the surface configuration was observed, and the crystal grain size, the surface roughness (Rmax), and the schematic shape of the cross section of the substrate (Schematic Surface Profile (Subst.) and Schematic Surface Profile (Ref.)) were inspected.

Table A26 summarizes the results.

As in the case of Example A1, Sample-EMB-A7-1 had height differences or asperities along crystal grain boundaries on the substrate surface and a generally smooth crystalline plane. On the other hand, Sample-CMP-A7-1 had crystal grain boundaries but no height difference, and Sample-CMP-A7-2 and Sample-CMP-A7-3 had pyramidal-shaped asperities and were larger than Sample-EMB-A7-2 in Rmax.

Further, for Sample-EMB-A7-2, Sample-CMP-A7-4, Sample-CMP-A7-5, and Sample-CMP-A7-6 which are the substrates prepared in the same manner as in Example A1 until after the deposition of the transparent conductive layer, the surface configuration was observed, the size of the ZnO crystal grains was checked, and the total reflectance and irregular reflectance were determined.

Table A27 summarizes the results.

As in the case of Example Al, Sample-EMB-A7-1 features large size ZnO crystal grains which form a transparent conductive layer, a high total reflectance and a high irregular reflectance. On the other hand, Sample-CMP-A7-4 had small size grains and low irregular reflectance, and Sample-CMP-A7-5 and Sample-CMP-A7-6 had very low total reflectance and irregular reflectance.

Evaluation results on EMB-A7, CMP-A7-1, CMP-A7-2, and CMP A7-3 which are photovoltaic devices fabricated in the same manner as in Example A1 according to abovementioned Example A7, Comparative Example A7-1, Comparative Example A7-3, respectively, will be described below. First, 5 photovoltaic devices were prepared for each sample type, and each device was further divided into 25 sub-cells, then the measurement of the shunt resistance was performed with applying a reverse bias voltage of −1.0 V to the samples in a dark place. Supposing that the reference value of the shunt resistance being $4\times10^4$ Ω $cm^2$, the samples were checked for yield. Subsequently, as in Example A1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table A28 summarizes the results.

The evaluations mentioned above show the fact that CMP-A7-1 photovoltaic device is inferior to EMB-A7 photovoltaic device in yield and adhesion. This fact is attributed to the decrease of FF due to the decrease of the series resistance mainly depending on the adhesion. The evaluations mentioned above also show the fact that CMP-A7-2 and CMP-A7-3 photovoltaic devices are inferior to EMB-A7 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies following the respective degradation periods are mainly attributed to the decrease of the open circuit voltage (Voc). As seen from the above, it can be concluded that the photovoltaic device (EMB-A7) according to the present invention has better characteristics and properties than the conventional photovoltaic devices (CMP-A7-1, CMP-A7-2, and CMP-A7-3).

Example A8

In this example, a relationship between a mean size of polycrystalline grains and the height difference of a polycrystalline substrate was evaluated. In the same manner as in Example A1, photovoltaic devices were fabricated by using an acid solution for etching surfaces thereof and using stainless-steel (SUS430-BA, SUS430-2B, SUS430-2D, and mirror-finished SUS304) plates as the substrate material.

A surface of each plate was etched using the acid solution indicated in Table A29 in the same manner as in Example A1. A part of each of the substrate after the etching treatment was left as it was for evaluations (Sample-EMB-A8-1 to Sample-EMB-A8-81). For other part of the substrate, an AgAl alloy reflection layer was deposited on the surface thereof in the same manner as in Example A1 according to the requirements indicated in Table A29. After the AgAl alloy reflection layer was completely deposited, a ZnO transparent electrode layer was deposited on the reflection layer in the same manner as in Example A1 according to the requirements indicated in Table A29. A part of the substrate was left as it was for evaluations (Sample-EMB-A8-1 to Sample-EMB-A8-81). For other part of the substrate, a pin-type semiconductor layer, an $In_2O_3$ transparent electrode, and a collecting electrode were sequentially formed thereon according to the requirements indicated in Table A29, and thus the fabrication of the photovoltaic devices (EMB-A8-1 to EMB-A8-81) was completed.

For each of Sample-EMB-A8-1 to Sample-EMB-A8-81 which are the substrates prepared by processing in the same manner as in Example A1 until after the completion of the surface treatment, the surface configuration was observed, the crystal grain size, the surface roughness (Rmax), and the schematic surface profile thereof were inspected.

Table A30 summarizes the results.

Table A30 shows that the crystal grains size ranges from 0.05 μm to 3000 μm and the surface roughness ranges from 0 to 7.0 μm.

Next, for each of the substrates (Sample-EMB-A8-1 TO Sample-EMB-A8-81) which were prepared by processing in the same manner as in Example A1 until after deposition of the transparent conductive layer, the surface configuration was observed, the size of the ZnO crystal grains was checked, and the total reflectance and irregular reflectance were obtained. It follows from the resultant data that a crystal grain can grow to a favorable size when the height difference (Rmax) was at least 0.01 μm. On the other hand, regarding the total reflectance ratio and the irregular reflectance ratio, the height difference (Rmax) of 0.01 μm or less results in the low irregular reflectance, and the height difference exceeds 2.00 μm results in the low total reflectance.

It is found that large size ZnO crystal grains and superior total reflectance and irregular reflectance can be obtained if suitable etching conditions are selected (Sample-EMB-A8-21 to 24, 30 to 33, 39 to 42, and 48 to 51).

For the photovoltaic devices (EMB-A8-1 to EMB-A8-81), 5 sample devices were prepared for each as in Example Al, and each device was further divided into 25 sub-cells. For each of the photovoltaic devices, the yield was checked, and an adhesion test and respective tests on the optical degradation, the high-humidity/temperature reverse bias (HHRB) degradation, and the temperature/humidity degradation were performed.

Table A31 to Table A34 summarize the results.

The evaluations mentioned above show the fact that the photovoltaic devices other EMB-A8-21 to 24, 30 to 33, 39 to 42, and 48 to 51 are inferior to the mentioned photovoltaic devices in yield and adhesion. The substrates in which each crystal grain size was less than 0.1 μm or the height difference was less than 0.01 μm were inferior in photoelectric conversion efficiency following each of the degradation periods. These facts are attributed to the decrease of FF due to the decrease of the series resistance mainly depending on the adhesion. On the other hand, the substrates having a height difference larger than 3000 μm or a height difference of 3000 μm are inferior in photoelectric conversion efficiency following each of the degradation periods. It is mainly attributed to the decrease of a short-circuit current (Jsc).

As seen from the above, it can be concluded that the photovoltaic devices according to the present invention which feature the mean polycrystalline grain size of the polycrystalline substrate of 0.1 μm to 2 mm and the height difference of 0.01 μm to 2 μm have superior characteristics and properties.

Example B

It should be understood that Example B is corresponding to the second embodiment mentioned above.

Example B1

In this example, photovoltaic devices having a structure as shown in FIG. 1B were fabricated using the acid treatment technique for etching surfaces thereof and using a stainless-steel (SUS430BA) plate as a substrate material.

A process for manufacturing photovoltaic devices will now be described.

(1) First, a substrate was prepared. A stainless steel (SUS430BA) plate which is a 0.2 mm thick square sheet measuring 50 mm on each side was ultrasonic-cleaned with acetone and isopropanol, and then dried with hot air, thereby residual oil on the plate was completely removed.

Subsequently, in preparation of etching the surface thereof, the stainless steel plate was placed on a substrate holder made of Teflon resin (not shown), then the holder was placed in a container (not shown) filled with an acid solution so that the substrate was entirely immersed therein. The acid solution was a hydrofluoric acid-nitric acid mixture (HF, $HNO_3$, and $H_2O$ in the mole ratio of 1:3:200) and controlled to be kept at room temperature as indicated in Table B1.

(2) The container filled with the acid solution was placed in a magnetic stirrer (not shown), then the substrate was subjected to a surface treatment by stirring for 5 minutes.

(3) At this stage, a part of the acid-treated substrate was left as it was for evaluations (Sample-EMB-B 1-1). For other part of the substrate, an optical reflection layer was deposited on the surface thereof by means of a sputtering apparatus.

(4) A DC magnetron sputtering apparatus shown in FIG. 5 was used to form an Al light reflection layer on the substrate. The acid-treated (SUS430BA) plate 502 was closely contacted with a heater 503 (shown in FIG. 5) and a deposition chamber 501 was evacuated via a vent to which an oil diffusion pump has been connected. When the internal pressure of the chamber was lowered to $1\times10^{-6}$ Torr, a valve 514 was opened, a mass flow controller 516 was adjusted to introduce an Ar gas at a flow rate of 50 sccm, and a conductance valve 513 was adjusted to set the internal pressure at 7 mTorr. A troidal coil was energized, the DC power of −400 V was supplied from a sputtering power supply 506 to an Al target 504 to create an Ar plasma.

(5) A target shutter 507 was opened to form an Al light reflection layer having a thickness of 0.3 $\mu$m on the surface of the stainless steel plate, then the shutter was closed. After that, the plasma was killed, and thus the deposition of the Al reflection layer was completed.

(6) In the same manner as that of the reflection layer, a ZnO thin film layer was further deposited thereon. The Ar gas was introduced to the deposition chamber at 40 sccm, the temperature of the substrate raised to 200° C., the internal pressure of the chamber was lowered to 5 mTorr, and the DC power of 510–500 V was applied to a ZnO target to create the Ar plasma.

(7) A target shutter 511 was opened to form a ZnO thin film layer having a thickness of 1.0 $\mu$m. Then the shutter was closed and the plasma was killed.

(8) After a transparent conductive layer was completely formed, a part of the substrate was left as it was for evaluations (Sample-EMB-B1-2). Then, for other part of the substrate, a semiconductor layer was deposited on the surface thereof by means of a CVD apparatus.

(9) An n-layer, an i-layer, and an p-layer were sequentially formed on the ZnO thin film layer using a multiple chamber separation type deposition apparatus shown in FIG. 6. An n-layer of a-Si and a p-layer of $\mu$c-Si was deposited by means of RFPCVD, and an i-layer of a-Si was deposited by means of RFPCVD and MWPCVD. The forming procedures thereof were as described below.

(9-1) An entire transfer system and the deposition chamber were evacuated down to a pressure of $10^{-6}$ Torr range. The substrate was placed on a substrate holder 690 and place in a load chamber 601. The load chamber was evacuated by a mechanical booster pump and rotary pump (not shown) down to $10^{-3}$ Torr range. Then the evacuating system was switched to a turbo molecular pump and the load chamber was further evacuated down to a pressure $10^{-6}$ Torr range. A gate valve 606 was opened, and the substrate holder 690 was moved into an n-type layer transfer chamber 602. The gate valve 606 was then closed. The substrate was moved until it reached a location just below a substrate heater 610, a hydrogen gas was supplied, and the internal pressure of the transfer chamber was set to the same pressure as for deposition. Then the substrate was heated to the temperature indicated in Table B1. When the temperature of the substrate has becomes stable, a raw material gas indicated in Table B1 for depositing the n-layer was introduced into the deposition chamber via mass flow controllers 641 to 639, stop valves 630 to 634 and 641 to 644. When the pressure therein becomes stable, the RF power indicated in Table B1 was introduced from an RF power supply 622 into a cup electrode 620 for introducing RF power. Thus, an n-type layer having the thickness indicated in Table B1 was deposited on the substrate after proper time duration.

(9-2) The row material gas for depositing the n-type layer was shut off, and the inside of the deposition chamber was evacuated down to $10^{-6}$ Torr range using the turbo molecular pump. The substrate heater 610 was moved upward, the gate valve 607 was opened, and the substrate holder was moved to an MW i-layer or RF i-layer transfer chamber 603. The gate valve was then closed. The substrate was moved until it reached a location below a substrate heater 611, the substrate heater 611 was lowered properly, and it was heated to and stabilized at the substrate temperature indicated in Table B1. Then an RF i-layer was deposited as described below. The raw material gas indicated in the Table B1 for depositing an RF i-layer was introduced into the deposition chamber 618 from a gas supply system (comprising a gas supply line 649, stop valves 650 to 655 and 661 to 665, mass flow controllers 656 to 660) for supplying an MW i-layer or RF i-layer deposition gas. The deposition chamber was evacuated by an exhaust pump to the degree of vacuum indicated in Table B1. Then a desired RF power was supplied from an RF power source (not shown) to a bias electrode 628, and an RF i-layer with the thickness indicated in Table B1 was deposited on the n-type layer mentioned above by means of RF plasma CVD.

(9-3) The raw material gas was shut off and the inside of the deposition chamber was evacuated down to $10^{-6}$ Torr range using the turbo molecular pump, while the substrate was heated to and kept at the temperature listed in Table B1. The material gas indicated in Table B1 which is suitable for depositing an MW i-layer was supplied from the MW i-layer or RF i-layer deposition gas supply system to the deposition chamber 618. The inside of the deposition chamber was kept at the degree of vacuum indicated in Table B1 by means of an exhaust apparatus such as a diffusion pump not shown. The MW power indicated in Table B1 was introduced from an MW power supply not shown, while the bias power indicated in Table B1 was introduced from an RF power (not shown) to a bias electrode 628. A shutter 627 was then opened, and thus deposition of the MW i-layer by means of the microwave plasma CVD according to the present invention was started.

(9-4) After that, the raw material gas indicated in Table B1 which is suitable for depositing the MW i-layer was supplied from the MW i-layer or RF i-layer deposition gas supply system to the deposition chamber 618. After the MW i-layer having a predetermined thickness was deposited onto the MW n-layer, the shutter was closed, the MW power and the like were shut off, and the supply of the raw material gas was stopped. The inside of the deposition chamber 618 was evacuated to a pressure of $10^{-6}$ Torr range. In the same manner as the deposition of the RF i-layer mentioned above, an RF i-layer was further deposited on the MW i-layer according to the requirements indicated in Table B1.

(9-5) The inside of the deposition chamber was evacuated until after the deposition of the RF i-layer was completed. The substrate heater 611 was separated from the substrate, the gate valve 608 was opened, and the substrate holder 690 was moved into a p-type layer transfer chamber. The gate valve was then closed. The substrate was moved until it reached a location just below the substrate heater 612, the substrate was heated to and stabilized at the temperature indicated in Table B1. When the temperature has become stable, a p-type layer deposition gas was supplied from a p-type layer deposition gas supply system (comprising stop valves 670 to 674 and 681 to 684, mass flow controllers 676 to 679) to the deposition chamber 619. The inside of the deposition chamber was evacuated down to the degree of vacuum indicated in Table B1 by means of the exhaust pump. When the pressure therein has become stable, the power indicated in Table B1 was introduced from an RF power supply 623 into a cup 621 for introducing RF power, and a p-type layer having the thickness indicated in Table B1 was deposited on the substrate after proper time duration by means of RF plasma CVD. Thus a pin structure was formed on the substrate.

(10) Next, the p-type layer deposition gas was shut off, and the hydrogen gas was fed for 5 minutes. Then the hydrogen gas was also shut off, the inside of the deposition chamber as well as the inside of the gas lines were evacuated down to $1\times10^{-5}$ Torr, and the substrate was moved into an unload chamber 605. The substrate was taken out to the outside after it was sufficiently cooled.

(11) Subsequently, as a transparent electrode, the ITO indicated in Table B1 was evaporated onto the p-layer by means of resistance heating vacuum evaporation technique. A mask having a comb-shaped window was then placed on the transparent conductive layer, and vacuum evaporation was performed via the mask thereby forming a comb-shaped collection electrode having a multi-layer structure consisting of Cr/Ag/Cr by means of electron-beam vacuum evaporation technique.

Thus, the fabrication of the photovoltaic device having a structure shown in FIG. 1B was completed. Hereafter, the photovoltaic device of this type will be referred to as EMB-B1.

Comparative Example B1-1

Comparative Example B1-1 differs from above-mentioned Example B1 in that the duration of the acid treatment by stirring is 10 seconds.

Samples (Sample-CMP-B1-1 and Sample-CMP-B1-4) and a photovoltaic device (CMP-B1-1) were fabricated in the same manner as in Example B1 except the requirement mentioned above.

Comparative Example B1-2

Comparative Example B1-2 differs from Example B1 in that the temperature to be kept during the ultrasonic acid treatment is 80° C.

Samples (Sample-CMP-B1-2 and Sample-CMP-B1-5) and a photovoltaic device (CMP-B1-2) were fabricated in the same manner as in Example B1 except the requirement mentioned above.

Comparative Example B1-3

Comparative Example B1-3 differs from Example B1 in that the duration of the ultrasonic acid treatment is 60 minutes.

Samples (Sample-CMP-B1-3 and Sample-CMP-B1-6) and a photovoltaic device (CMP-B1-3) were fabricated in the same manner as in Example B1 except the requirement mentioned above.

Evaluation results on Sample-EMB-B1-1, Sample-CMP-B 1-1, Sample-CMP-B1-2, and Sample-CMP-B1-3 which are the substrates prepared by processing until after the completion of the acid treatment according to above-mentioned Example B1, Comparative Example B1-1, Comparative Example B1-2, and Comparative Example B1-3, respectively, will be described below. First, for each of the samples mentioned above, the surface configuration was observed using a scanning electron microscope (SEM) and the crystal grain size was checked. Then, the surface roughness thereof (the maximum peak-to-peak value, hereinafter referred to as "Rmax") was inspected by means of a needle step, and a difference between the Rmax of a polycrystalline grain having a texture structure and the Rmax of a smooth polycrystalline grain (Hereinafter referred to as "Rmax (Difference)"). Further, the schematic surface profile thereof was determined from the resultant data.

Table B2 summarize the results.

Figure 3B:
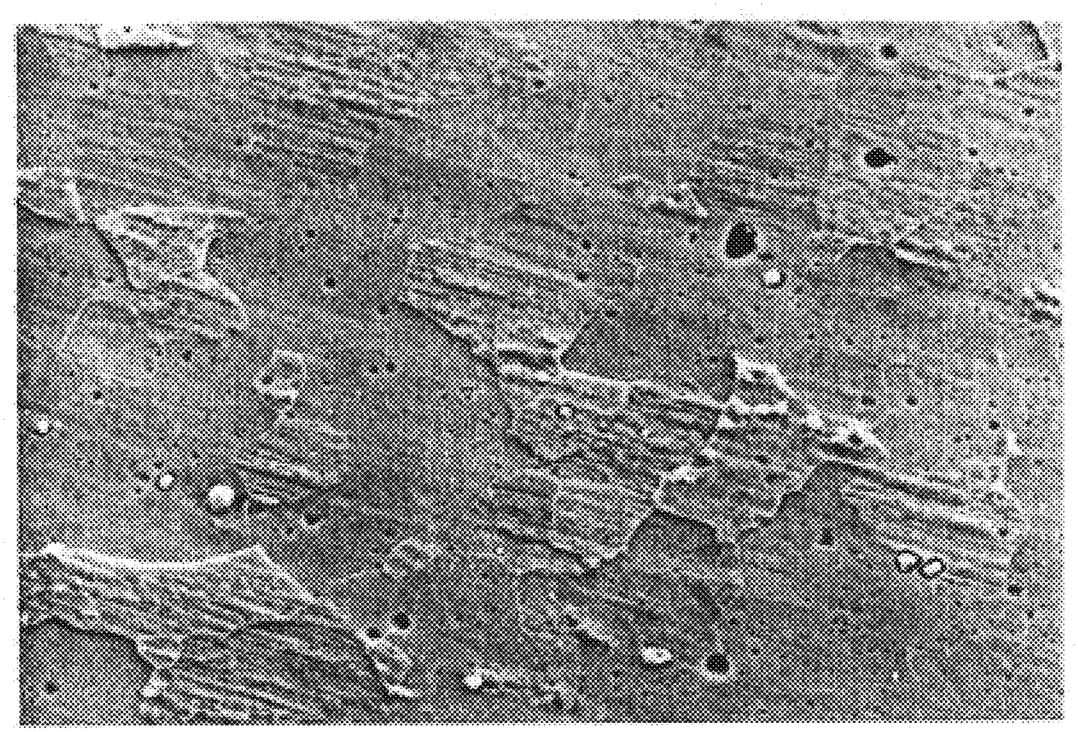

FIG. 3B shows an SEM image of Sample-EMB-B1-1. Sample-EMB-B1-1 had an area having asperities for each of the grains and a smooth area. There was a difference in Rmax between the asperity area and a smooth area. On the other hand, Sample-CMP-B1-1 had generally smooth crystal grains and no difference in Rmax, and Sample-CMP-B1-2 and Sample-CMP-B1-3 had pyramidal-shaped asperities and no difference in Rmax.

Evaluation results on Sample-EMB-B1-2, Sample-CMP-B1-4, Sample-CMP-B1-5, and Sample-CMP-B1-6 which are the substrates prepared by processing until after the deposition of a transparent conductive layer according to above-mentioned Example B1, Comparative Example B1-1, Comparative Example B1-2, and Comparative Example B1-3, respectively, will be described below. First, for each of the samples mentioned above, the surface configuration was observed using the scanning electron microscope (SEM), and the size of the ZnO crystal grains was checked. Further, for each of the samples, a total reflectance and irregular reflectance were determined by means of a spectrophotometer with an integrating sphere.

Table B3 summarizes the results.

As shown in Table B3, Sample-EMB-B1-1 features large size ZnO crystal grains which form a transparent conductive layer, a high total reflectance, and a high irregular reflectance. On the other hand, Sample-CMP-B1-4 had small size grains and low irregular reflectance, and Sample-CMP-B1-5 and Sample-CMP-B1-6 had very low total reflectance and irregular reflectance.

Evaluation results on EMB-B1, CMP-B1-1, CMP-B1-2, and CMP-B1-3 photovoltaic devices which have been fabricated according to above-mentioned Example B1, Comparative Example B1-1, Comparative Example B1-2, and Comparative Example B1-3, respectively, will be described below. First, 5 photovoltaic devices were prepared for each sample type, and each sample were further divided into 25 sub-cells, then the measurement of the shunt resistance was performed with applying a reverse bias voltage of −1.0 V to the samples in a dark place. Supposing that the reference value of the shunt resistance being $4\times10^4$ Ωcm$^2$, the samples were checked for yield. Subsequently, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

In the adhesion test, first, 10×10 scratches were formed on a surface of each of fabricated photovoltaic device samples in grid pattern at an interval of 1 mm to make 100 squares thereon according to the lattice cutting pattern tape test method. Then, an insulating tape of polyimide was pasted onto the surface and peeled off momentarily after the tape was efficiently adhered thereon, and the adhesion was evaluated based on the unstuck area.

The initial photoelectric conversion efficiency was obtained by exposing a fabricated photovoltaic device to a light of AM-1.5 (100 mW/cm$^2$) and measuring the V-1 property.

The optical degradation was evaluated as follows. First, a fabricated photovoltaic device whose initial photoelectric conversion efficiency has been obtained was placed in the environment of 25° C. and 50% relative humidity and exposed to a light of AM-1.5 for 500 hours. Subsequently, the photoelectric conversion efficiency was measured again under the illumination condition of AM 1.5 (100 mW/cm$^2$), and the falling rate relative to the initial value (the ratio of the photoelectric conversion efficiency value following the predetermined optical degradation period to the initial value) was determined.

The high-humidity/temperature reverse bias (HHRB) degradation was evaluated as follows. First, the initial photoelectric conversion efficiency of a fabricated photovoltaic device was measured. Then the photovoltaic device was placed in the environment of 85° C. and 85 % relative humidity, and a reverse bias voltage of 0.7 V was applied thereto for 100 hours. Subsequently, the photoelectric conversion efficiency was measured again under the illumination condition of AM 1.5 (100 mW/cm$^2$), and the falling rate relative to the initial value (the ratio of the photoelectric conversion efficiency value following the predetermined HHRB degradation period to the initial value) was determined.

The humidity/temperature degradation was evaluated as follows. First, the initial photoelectric conversion efficiency of a fabricated photovoltaic device was measured. The photovoltaic device was placed in a dark place at 85° C. and 85% relative humidity for 30 minutes, then the temperature was dropped to −20° C. over 70 minutes, kept −20° C. for 30 minutes, and 85° C. and 85% relative humidity were brought back over 70 minutes. This cycle was repeated 100 times. Subsequently, the photoelectric conversion efficiency was measured again under the illumination condition of AM 1.5 (100 mW/cm$^2$), and the falling rate relative to the initial value (the ratio of the photoelectric conversion efficiency value following the predetermined humidity/temperature degradation period to the initial value) was determined.

Table B4 summarizes the results.

The evaluations mentioned above show the fact that CMP-B1-1 photovoltaic device is inferior to EMB-B1 photovoltaic device in yield, adhesion, and photoelectric conversion efficiency following each of the degradation periods. These facts are attributed to the decrease of FF due to the decrease of the series resistance depending on the adhesion. The evaluations mentioned above also show the fact that CMP-B1-2 and CMP-B1-3 photovoltaic devices are inferior to EMB-B1 photovoltaic device in initial photoelectric conversion efficiency and photoelectric conversion efficiency following each of the degradation period. The inferior initial photoelectric conversion efficiency is attributed to the decrease of a short-circuit current (Jsc) due to the decrease of the total reflectance and the irregular reflectance, while the inferior photoelectric conversion efficiencies after respective degradation are mainly attributed to the decrease of the open circuit voltage (Voc).

As seen from the above, it can be concluded that the photovoltaic device (EMB-B1) according to the present invention has better characteristics and properties than the conventional photovoltaic devices (CMP-B1-1, CMP-B1-2, and CMP-B1-3).

Example B2

In this example, photovoltaic devices having a structure as shown in FIG. 1B were fabricated using the RF sputtering technique for etching surfaces thereof and using a stainless-steel (SUS430-2B) plate as the substrate material.

A process for manufacturing photovoltaic devices will now be described.

(1) After residual oil on the plate (SUS-2B) was completely removed in the same manner as in Example B1, the plate surfaces were subjected to the etching treatment by means of the sputtering apparatus shown in FIG. 5. The treated (SUS430-2B) plate 502 was closely contacted with the heater 503 (shown in FIG. 5) and the deposition chamber 501 was evacuated via the vent thereof. When the internal pressure of the chamber was lowered to $1\times10^{-6}$ Torr, the valve 514 was opened, the mass flow controller 516 was adjusted to introduce the Ar gas at a flow rate of 50 sccm, and the conductance valve 513 was adjusted to set the internal pressure at 6 mTorr. The RF power of 200 W was supplied from the sputtering power supply 506 to the substrate, and an Ar plasma was created. After maintaining the Ar plasma for 20 minutes, the plasma was then killed, and thus the etching treatment was completed. shutter was closed and the plasma was killed.

(2) A part of the substrate after the etching treatment was left as it was for evaluations (Sample-EMB-B2-1). For other part of the substrate, an Al reflection layer was deposited on the surface thereof in the same manner as in Example B1 according to the requirements indicated in Table B5.

(3) Subsequently, in the same manner as in Example B1, a ZnO transparent conductive layer was deposited on the Al reflection layer of the substrate according to the requirements indicated in Table B5. A part of the substrate was left as it was for evaluations (Sample-EMB-B2-2). For other part of the substrate, a pin-type semiconductor layer, an $In_2O_3$ transparent electrode, and a collecting electrode were sequentially formed thereon by means of the CVD apparatus according to the requirements indicated in Table B5. Thus the fabrication of the photovoltaic device (EMB-B-2) was completed.

Comparative Example B2-1

Comparative Example B2-1 differs from abovementioned Example B2 in that the duration of the RF sputtering is 20 seconds.

Samples (Sample-CMP-B2-1 and Sample-CMP-B2-4) and a photovoltaic device (CMP-B2-1) were fabricated in the same manner as in Example B2 except the requirement mentioned above.

Comparative Example B2-2

Comparative Example B2-2 differs from Example B2 in that the temperature during the surface treatment of the substrate is 300° C.

Samples (Sample-CMP-B2-2 and Sample-CMP-B2-5) and a photovoltaic device (CMP-B2-1) were fabricated in the same manner as in Example B2 except the requirement mentioned above.

Comparative Example B2-3

Comparative Example B2-3 differs from Example B2 in that the duration of the RF sputtering is 90 minutes.

Samples (Sample-CMP-B2-3 and Sample-CMP-B2-6) and a photovoltaic device (CMP-B2-3) were fabricated in the same manner as in Example B2 except the requirement mentioned above.

Evaluation results on Sample-EMB-B2-1, Sample-CMP-B2-1, Sample-CMP-B2-2, and Sample-CMP-B2-3 which are the substrates prepared by processing until after the completion of the surface treatment in the same manner as in Example B1 will be described below. First, for each of the samples mentioned above, the surface configuration was observed as in Example B1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate was determined.

Table B6 summarizes the results.

As in the case of Example B1, Sample-EMB-B2-2 had an area having asperities for each of the grains and a smooth area. There was a difference in Rmax between the asperity area and a smooth area. On the other hand, Sample-CMP-B1-1 had generally smooth crystal grains and no difference in Rmax, and Sample-CMP-B1-2 and Sample-CMP-B11-3 had pyramidal-shaped asperities and no difference in Rmax.

Evaluation results on Sample-EMB-B2-2, Sample-CMP-B2-4, Sample-CMP-B2-5, and Sample-CMP-B2-6 which are the substrates prepared in the same manner as in Example B1 will be described below. First, for each of the samples mentioned above, the surface configuration was observed, the size of the ZnO crystal grains was checked, and the total reflectance and irregular reflectance were determined by means of a spectrophotometer with an integrating sphere, as in the case of Example B1.

Table B7 summarizes the results.

As in the case of Example B1, Sample-EMB-B2-1 features large size ZnO crystal grains which form a transparent conductive layer, a high total reflectance and a high irregular reflectance. On the other hand, Sample-CMP-B2-4 had small size grains and low irregular reflectance, and Sample-CMP-B2-5 and Sample-CMP-B2-6 had very low total reflectance and irregular reflectance.

Evaluation results on EMB-B2, CMP-B2-1, CMP-B2-2, and CMP B2-3 which are photovoltaic devices fabricated in the same manner as in Example B1 according to abovementioned Example B2, Comparative Example B2-1, Comparative Example B2-3, respectively, will be described below. First, 5 photovoltaic devices were prepared for each sample type, and each device was further divided into 25 sub-cells, then the measurement of the shunt resistance was performed with applying a reverse bias voltage of −1.0 V to the samples in a dark place. Supposing that the reference value of the shunt resistance being $4\times10^4$ $\Omega cm^2$, the samples were checked for yield. Subsequently, as in Example B1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table B8 summarizes the results.

The evaluations mentioned above show the fact that CMP-B2-1 photovoltaic device is inferior to EMB-B2 photovoltaic device in yield and adhesion. This fact is attributed to the decrease of FF due to the decrease of the series resistance mainly depending on the adhesion. The evaluations mentioned above also show the fact that CMP-B2-2 and CMP-B2-3 photovoltaic devices are inferior to EMB-B2 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies following the respective degradation periods are mainly attributed to the decrease of the open circuit voltage (Voc).

As seen from the above, it can be concluded that the photovoltaic device (EMB-B2) according to the present invention has better characteristics and properties than the conventional photovoltaic devices (CMP-B2-1, CMP-B2-2, and CMP-B2-3).

Example B3

In this example, photovoltaic devices having a structure as shown in FIG. 1B were fabricated using the acid treatment technique for etching surfaces thereof and using a stainless-steel (SUS430-2D) plate as the substrate material.

A process for manufacturing photovoltaic devices will now be described.

(1) A surface of the plate (SUS430-2D) was etched using the acid solution indicated in Table B9 in the same manner as in Example B1. A part of the substrate after the etching treatment was left as it was for evaluations (Sample-EMB-B3-1). For other part of the substrate, an Al reflection layer was deposited on the surface thereof in the same manner as in Example B1 according to the requirements indicated in Table B9.

(3) After the Al reflection layer was completely deposited, a ZnO transparent conductive layer was deposited on the Al reflection layer of the substrate in the same manner as in Example B1 according to the requirements indicated in Table B9. A part of the substrate was left as it was for evaluations (Sample-EMB-B3-2).

(4) For other part of the substrate, a pin-type semiconductor layer, an $In_2O_3$ transparent electrode, and a collecting electrode were sequentially formed thereon by means of the CVD apparatus according to the requirements indicated in Table B9, and thus the fabrication of the photovoltaic device (EMB-B3) was completed.

Comparative Example B3-1

Comparative Example B3-1 differs from abovementioned Example B3 in that the mixed solution of hydrofluoric acid, nitric acid mixture, and acetic acid ($HF:HNO_3$ $H_2O:CH_3COOH$=1:3:3:500) is used for the surface treatment of the substrate.

Samples (Sample-CMP-B3-1, Sample-CMP-B3-5, and Sample-CMP-B3-9) and a photovoltaic device (CMP-B3-1) were fabricated in the same manner as in Example B3 except the requirement mentioned above.

Comparative Example B3-2

Comparative Example B3-2 differs from Example B3 in that the thickness of the reflection layer to be deposited is 3000 nm.

Samples (Sample-CMP-B3-2, Sample-CMP-B3-6 and Sample-CMP-B3-10) and a photovoltaic device (CMP-B3-l) were fabricated in the same manner as in Example B3 except the requirement mentioned above.

Comparative Example B3-3

Comparative Example B3-3 differs from Example B3 in that the substrate temperature to be kept during depositing the reflection layer onto the substrate is 150° C.

Samples (Sample-CMP-B3-3, Sample-CMP-B3-7, and Sample-CMP-B3-11) and a photovoltaic device (CMP-B3-3) were fabricated in the same manner as in Example B3 except the requirement mentioned above.

Comparative Example B3-4

Comparative Example B3-4 differs from Example B3 in that the duration of the acid treatment for the substrate surface is 90 minutes.

Samples (Sample-CMP-B3-4, Sample-CMP-B3-8, and Sample-CMP-B3-12) and a photovoltaic device (CMP-B3-4) were fabricated in the same manner as in Example B3 except the requirement mentioned above.

Evaluation results on Sample-EMB-B3-1, Sample-CMP-B3-1, Sample-CMP-B3-2, Sample-CMP-B3-3, and Sample-CMP-B3-4 which are the substrates prepared by processing in the same manner as in Example B1 until after the completion of the surface treatment will be described below. For each of the samples mentioned above, the surface configuration was observed as in Example B1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate was determined. After the reflection layer has been deposited, further observation for each of the substrates was performed using the scanning electron microscope to the precisely same position where the substrate has been observed before the deposition of the reflection layer, and the schematic shape of the cross section thereof (hereinafter referred to as "Schematic Surface Profile (Ref.) ") was determined.

Table B10 summarizes the results.

As in the case of Example B1, Sample-EMB-B3-1 had an area having asperities for each of the grains and a smooth area. There was a difference in Rmax between the asperity area and a smooth area. On the other hand, Sample-CMP-B1-1 had generally smooth crystal grains and no difference in Rmax, and Sample-CMP-B1-2 and Sample-CMP-B1-3 had pyramidal-shaped asperities and no difference in Rmax.

Further, for each of Sample-EMB-B3-2, Sample-CMP-B3-6, Sample-CMP-B3-7, and Sample-CMP-B3-8 which are the substrates prepared by processing until after deposition of the transparent conductive layer, the size of the ZnO crystal grains were obtained, and the total reflectance and irregular reflectance were determined.

Table B11 summarizes the results.

As in the case of Example B1, Sample-EMB-B3-2 features large size ZnO crystal grains which form a transparent conductive layer, a high total reflectance, and a high irregular reflectance were obtained. On the other hand, Sample-CMP-B3-5 and Sample-CMP-B3-6 had small size grains and low irregular reflectance, and Sample-CMP-B3-7 and Sample-CMP-B3-8 had very low total reflectance and irregular reflectance.

Evaluation results on EMB-B3, CMP-B3-1, CMP-B3-2, CMP-B3-3, and CMP B3-4 which are, as in the case of Example B4, photovoltaic devices fabricated according to abovementioned Example B3, Comparative Example B3-1, Comparative Example B3-2, Comparative Example B3-3, and Comparative Example B3-4 respectively, will be described below. First, 5 photovoltaic devices were prepared for each sample type, and each device was further divided into 25 sub-cells. After that, the samples were checked for yield. Subsequently, as in the case of Example B1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table B12 summarizes the results.

The evaluations mentioned above show the fact that CMP-B3-1 and CMP-B3-2 photovoltaic devices are inferior to EMB-B3 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-B3-3 and CMP-B3-4 photovoltaic devices are inferior to EMB-B3 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc).

As seen from the above, it can be concluded that the photovoltaic device (EMB-B3) according to the present invention has better characteristics and properties than the conventional photovoltaic devices (CMP-B3-1, CMP-B3-2, CMP-B3-3, and CMP-B3-4).

Example B4

In this example, photovoltaic devices having a structure as shown in FIG. 1B were fabricated using the acid treatment technique for etching surfaces thereof and using a stainless-steel (SUS430-2D) plate as the substrate material.

A process for manufacturing photovoltaic devices will now be described.

(1) A surface of the plate (SUS430-2D) was etched using the acid solution indicated in Table B13 in the same manner as in Example B3.

(2) A part of the substrate after the etching treatment was left as it was for evaluations (Sample-EMB-B4-1). For other part of the substrate, an Ag reflection layer was deposited on the surface thereof in the same manner as in Example B3 according to the requirements indicated in Table B13.

(3) After the Ag reflection layer was completely deposited, a ZnO transparent conductive layer was deposited on the Ag reflection layer of the substrate according to the requirements indicated in Table B13. A part of the substrate was left as it was for evaluations (Sample-EMB-B4-2).

(4) For other part of the substrate, a pin-type semiconductor layer, an $In_2O_3$ transparent electrode, and a collecting electrode were sequentially formed thereon according to the requirements indicated in Table B13, as in the same manner in Example B3, and thus the fabrication of the photovoltaic device (EMB-B4) was completed.

Comparative Example B4-1

Comparative Example B4-1 differs from abovementioned Example B4 in that the thickness of the reflection layer to be deposited is 3000 nm.

Samples (Sample-CMP-B4-1 and Sample-CMP-B4-4) and a photovoltaic device (CMP-B4-1) were fabricated in the same manner as in Example B4 except the requirement mentioned above.

Comparative Example B4-2

Comparative Example B4-2 differs from Example B4 in that the substrate temperature to be kept during depositing the reflection layer onto the substrate is 300° C.

Samples (Sample-CMP-B4-2 and Sample-CMP-B4-5) and a photovoltaic device (CMP-B4-2) were fabricated in the same manner as in Example B4 except the requirement mentioned above.

Comparative Example B4-3

Comparative Example B4-3 differs from Example B4 in that the duration of the acid treatment for the substrate surface is 100 minutes.

Samples (Sample-CMP-B4-3 and Sample-CMP-B4-6) and a photovoltaic device (CMP-B4-3) were fabricated in the same manner as in Example B4 except the requirement mentioned above.

Evaluation results on Sample-EMB-B4-1, Sample-CMP-B4-1, Sample-CMP-B4-2, and Sample-CMP-B4-3 which are the substrates prepared by processing in the same manner as in Example B3 until after the completion of the surface treatment will be described below. For each of the samples mentioned above, the surface configuration was observed as in Example B1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate was determined. After the reflection layer has been deposited, further observation for each of the substrates was performed using the scanning electron microscope to the precisely same position where the substrate has been observed before the deposition of the transparent conductive layer, and the schematic shape of the cross section thereof (hereinafter referred to as "Schematic Surface Profile (Transp.)") was determined.

Table B14 summarizes the results.

As in the case of Example B1, Sample-EMB-B4-1 had an area having asperities for each of the grains and a smooth area. There was a difference in Rmax between the asperity area and a smooth area. On the other hand, Sample-CMP-B4-1 had generally smooth crystal grains and no difference in Rmax, and Sample-CMP-B4-2 and Sample-CMP-B4-3 had pyramidal-shaped asperities and no difference in Rmax.

Further, for each of Sample-EMB-B4-2, Sample-CMP-B4-4, Sample-CMP-B4-5, and Sample-CMP-B4-6 which are the substrates prepared as in the same manner in Example B3 by processing until after the deposition of the transparent conductive layer, the surface configuration was observed, and the size of the ZnO crystal grains, the total reflectance, and the irregular reflectance were determined Table B15 summarizes the results.

As in the case of Example B3, Sample-EMB-B4-2 features large size ZnO crystal grains which form a transparent conductive layer, a high total reflectance, and a high irregular reflectance. On the other hand, Sample-CMP-B4-4 had small size grains and low irregular reflectance, and Sample-CMP-B4-5 and Sample-CMP-B4-6 had very low total reflectance and irregular reflectance.

Evaluation results on EMB-B4, CMP-B4-1, CMP-B4-2, and CMP B4-3 which are, as in the case Example B3, photovoltaic devices fabricated according to abovementioned Example B4, Comparative Example B4-1, Comparative Example B4-2, and Comparative Example B4-3, respectively, will be described below. First, 5 photovoltaic devices were prepared for each sample type, and each device was further divided into 25 sub-cells. After that, the samples were checked for yield. Subsequently, as in the case of Example B3, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table B16 summarizes the results.

The evaluations mentioned above show the fact that CMP-B4-1 photovoltaic device is inferior to EMB-B4 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-B4-2 and CMP-B4-3 photovoltaic devices are inferior to EMB-B4 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc). As seen from the above, it can be concluded that the photovoltaic device (EMB-B4) according to the present invention has better characteristics and properties than the conventional photovoltaic devices (CMP-B4-1, CMP-B4-2, and CMP-B4-3).

Example B5

In this example, photovoltaic devices having a structure as shown in FIG. 1B were fabricated using the acid treatment technique for etching surfaces thereof and using a stainless-steel (SUS430-BA) plate as the substrate material. A process for manufacturing photovoltaic devices will now be described.

(1) A surface of the plate (SUS430-BA) was etched using the acid solution indicated in Table B17 in the same manner as in Example B4.

(2) A part of the substrate after the etching treatment was left as it was for evaluations (Sample-EMB-B5-1). For other part of the substrate, a Cu reflection layer was deposited on the surface thereof in the same manner as in Example B4 according to the requirements indicated in Table B17.

(3) After the Cu reflection layer was completely deposited, a ZnO transparent conductive layer was deposited on the Cu reflection layer of the substrate according to the requirements indicated in Table B17. A part of the substrate was left as it was for evaluations (Sample-EMB-B5-2).

(4) For other part of the substrate, a pin-type semiconductor layer, an $In_2O_3$ transparent electrode, and a collecting electrode were sequentially formed thereon according to the requirements indicated in Table B17, as in the same manner in Example B4, and thus the fabrication of the photovoltaic device (EMB-B5) was completed.

Comparative Example B5-1

Comparative Example B5-1 differs from abovementioned Example B5 in that the thickness of the reflection layer to be deposited is 2000 nm.

Samples (Sample-CMP-B5-1 and Sample-CMP-B5-4) and a photovoltaic device (CMP-B5-1) were fabricated in the same manner as in Example B5 except the requirement mentioned above.

Comparative Example B5-2

Comparative Example B5-2 differs from Example B5 in that the substrate temperature to be kept during depositing the reflection layer onto the substrate is 350° C.

Samples (Sample-CMP-B5-2 and Sample-CMP-B5-5) and a photovoltaic device (CMP-B5-2) were fabricated in the same manner as in Example B5 except the requirement mentioned above.

Comparative Example B5-3

Comparative Example B5-3 differs from Example B5 in that the thickness of the transparent conductive layer to be deposited is 10 $\mu$m.

Samples (Sample-CMP-B5-3 and Sample-CMP-B5-6) and a photovoltaic device (CMP-B5-3) were fabricated in the same manner as in Example B5 except the requirement mentioned above.

Evaluation results on Sample-EMB-B5-1, Sample-CMP-B5-1, Sample-CMP-B5-2, and Sample-CMP-B5-3 which are the substrates prepared in the same manner as Example B4 by processing until after the completion of the surface treatment will be described below. For each of the samples mentioned above, the surface configuration was observed as in Example B1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate (Schematic Surface Profile (Subst.))was determined. After the fabrication of the photovoltaic device, further observation for each of the substrates was performed using the scanning electron microscope to the precisely same position where the substrate has been observed before the fabrication of the photovoltaic device, and the schematic shape of the cross section thereof (hereinafter referred to as "Schematic Surface Profile (Photov.)") was determined.

Table B18 summarizes the results.

As seen from Table B18, Sample-EMB-B5-1 had an area having asperities for each of the grains and a smooth area. There was a difference in Rmax between the asperity area and a smooth area, the height differences on the etched substrate surface were reflected to the shape on the photovoltaic device as it was, and the surface of the semiconductor layer follows the difference in Rmax between the asperity area and the smooth area. On the other hand, Sample-CMP-B5-1 had generally smooth crystal grains and small Rmax (Difference), and Sample-CMP-B5-2 and Sample-CMP-B5-3 had pyramidal-shaped asperities and small Rmax (Difference).

Further, for each of Sample-EMB-B5-2, Sample-CMP-B5-4, Sample-CMP-B5-5, and Sample-CMP-B5-6 which are the substrates prepared as in the same manner in Example B4 by processing until after the deposition of the transparent conductive layer, the surface configuration was observed, and the size of the ZnO crystal grains, the total reflectance, and the irregular reflectance were determined Table B19 summarizes the results.

As in the case of Example B4, Sample-EMB-B5-2 features large size ZnO crystal grains which form a transparent conductive layer, a high total reflectance, and a high irregular reflectance. On the other hand, Sample-CMP-B5-4 had small size grains, and Sample-CMP-B5-5 and Sample-CMP-B5-6 had very low total reflectance and irregular reflectance.

Evaluation results on EMB-B5, CMP-B5-1, CMP-B5-2, and CMP B5-3 which are, as in the case of Example B4, photovoltaic devices fabricated according to abovementioned Example B5, Comparative Example B5-1, Comparative Example B5-2, and Comparative Example B5-3, respectively, will be described below. First, 5 photovoltaic devices were prepared for each sample type, and each device was further divided into 25 sub-cells. After that, the samples were checked for yield. Subsequently, as in the case of Example B4, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table B20 summarizes the results.

The evaluations mentioned above show the fact that CMP-B5-1 and CMP-B5-3 photovoltaic devices are inferior to EMB-B5 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-B5-2 photovoltaic device is inferior to EMB-B5 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc). As seen from the above, it can be concluded that the photovoltaic device (EMB-B5) according to the present invention has better characteristics and properties than the conventional photovoltaic devices (CMP-B5-1, CMP-B5-2, and CMP-B5-3).

Example B6

In this example, solar cells having a pinpinpin structure as shown in FIG. 2B were fabricated by means of a deposition apparatus which uses the roll-to-roll method shown in FIG. 7.

A strip stainless-steel (SUS430BA) sheet having a length of 100 m, a width of 30 cm, and a thickness of 0.15 mm as a substrate material. The stainless-steel (SUS430BA) sheet was wrapped around a feed bobbin (not shown) in a vacuum vessel (not shown). Then the sheet was subjected to the RF plasma etching by Ar plasma with feeding the SUS430BA sheet by rotating a take-up bobbin to which one end of the sheet was connected.

A part of the etched substrate (Sample EMB-B6-1) was evaluated and the shape of the cross section thereof was inspected (hereinafter referred to as "Schematic Surface Profile (Subst.)") Subsequently, a AlSi reflection layer and a ZnO transparent electrode layer were formed on the substrate using the roll-to-roll method according to the requirements indicated in Table B21. A part of the substrate was then left as it was for evaluations (Sample-EMB-B6-2) and the shape of the cross section thereof (hereinafter referred to as "Schematic Surface Profile (Ref.)") was inspected. Other part of substrate are fabricated to photovoltaic devices (EMB-B6) by means of a CVD apparatus using the roll-to-roll method according to the requirements indicated in Table B21.

The operation of the deposition apparatus shown in FIG. 7 will now be described.

FIG. 7(*a*) is a schematic view of a continuous photovoltaic device manufacturing apparatus using the roll-to-roll method. In this apparatus, a substrate feed chamber 729, multiple deposition chambers 701 to 713, and a substrate take-up chamber 730 are disposed in order and interconnected by separation passages 714. Each deposition chamber has a vent through which the inside of the deposition chamber is evacuated.

A strip substrate 740 is wound up from the substrate feed chamber to the substrate take-up chamber through the deposition chambers and the separation passages. At the same time, a gas is introduced from a gas inlet of each respective deposition chamber or each separation passage, and exhausted from every vent. Thus respective layers can be formed on the substrate. Each deposition chamber has a halogen lamp inside thereof which heats the substrate from backside thereof. The halogen lamp is heated to a predetermined temperature in the corresponding deposition chamber.

FIG. 7(*b*) is a view of the deposition chambers 701 to 713 when looking from above. Each deposition chamber has a raw material gas inlet 715 and a vent 716, and an RF electrode 717 or a microwave applicator 718 is mounted in the chamber. A raw material gas supply apparatus (not shown) is connected to respective raw material gas inlets 715. On the other hand, to the respective vents of the deposition chambers, an evacuator (not shown) such as an oil diffusion pump and a mechanical booster pump are connected. Each of the separation passages 714 interposed between deposition chambers has an inlet 719 for introducing a scavenging gas, and introduces a scavenging gas as shown in the figure.

Each of the deposition chambers 703 and 707 for depositing a MW-i layer has a bias electrode 720 to which an RF power supply (not shown) is connected as a power supply. The substrate feed chamber contains a guide roll 721 and a guide roller 722 which gives proper tension to the substrate and always keep the substrate in a horizontal position, while the substrate take-up chamber contains a take-up roll 723 and a guide roller 724.

A process for manufacturing solar cells will now be described.

(1) First, the abovementioned stainless-steel (SUS430BA) sheet was wrapped around the feed roll 721 (at a mean radius of curvature of 30 cm), set in the substrate feed chamber 729, and connected to the substrate take-up roll 723 at one end after passing through all the deposition chambers.

(2) The entire apparatus was evacuated by means of the evacuator, every lamp heater of each of deposition chambers was turned on, and the temperature in each of the deposition chambers was controlled to be kept at a predetermined temperature.

(3) When the internal pressure of the entire apparatus reached to 1 mTorr or less, the scavenging gas is introduced via respective scavenging gas inlets 719 as shown in FIG. 7, and the substrate was taken up by the take-up roll while feeding the substrate in the direction of the arrow in FIG. 7.

(4) Respective raw material gases were properly introduced to the corresponding deposition chambers. At this time, the flow rate of each gas to be introduced into respective separation passages or the pressure in each of deposition chambers are adjusted so that a raw material gas introduced into the corresponding deposition chambers was not diffused to the other deposition chambers.

(5) Subsequently, plasmas are created by introducing the RF power or the MW power plus the RF bias power. Photovoltaic devices composed of the first, second and third pin-junctions were fabricated according to the requirements indicated in Table B21. As the first pin-junction, an n1-layer was deposited in the deposition chamber 701, an i1-layer was deposited in the deposition chambers 702, 703, and 704, and a p1-layer was deposited in the deposition chamber 705. As the second pin-junction, an n2-layer was deposited in the deposition chamber 706, an i2-layer was deposited in the deposition chambers 707, 708, and 709, and a p2-layer was deposited in the deposition chamber 710. As the third pin-junction, an n3-layer was deposited in the deposition chamber 711, an i3-layer was deposited in the deposition chamber 712, and a p3-layer was deposited in the deposition chamber 713.

(6) After the substrate was completely taken up, every MW power supply and RF power supply were turned off, all plasmas were killed, and all the raw material and scavenging gases were shut off. The entire system was released and the take-up roll was taken out from the chamber.

(7) Next, a transparent electrode 213 was formed on top of the three pin junction layers according to the requirements indicated in the Table B21.

(8) A carbon paste 5 $\mu$m thick by 0.5 mm wide was placed on the substrate by screen printing on the transparent electrode 213, a silver paste 10 $\mu$m thick by 0.5 mm wide was further placed on the carbon paste, and then a collecting electrode was formed on the silver paste. After that, the rolled solar cell was cut to 250 mm×100 mm.

Thus, the fabrication of the pinpinpin type solar cell (EMB-B6) using the roll-to-roll method was completed.

Comparative Example B6-1

Comparative Example B6-1 differs from above-mentioned Example B6 in that the duration of the RF sputtering is 15 seconds.

Samples (Sample-CMP-B6-1 and Sample-CMP-B6-4) and a photovoltaic device (CMP-B6-1) were fabricated in the same manner as in Example B1 except the requirement mentioned above.

Comparative Example B6-2

Comparative Example B6-2 differs from Example B6 in that the temperature to be kept during the surface treatment of the substrate is 300° C.

Samples (Sample-CMP-B6-2 and Sample-CMP-B6-5) and a photovoltaic device (CMP-B6-2) were fabricated in the same manner as in Example B6 except the requirement mentioned above.

Comparative Example B6-3

Comparative Example B6-3 differs from Example B6 in that the duration of the RF sputtering is 100 minutes.

Samples (Sample-CMP-B6-3 and Sample-CMP-B6-6) and a photovoltaic device (CMP-B6-3) were fabricated in the same manner as in Example B6 except the requirement mentioned above.

Now, evaluation results on Sample-EMB-B6, Sample-CMP-B6-1, Sample-CMP-B6-2, and Sample-CMP-B6-3 which are the substrates prepared by processing until after the completion of the surface treatment according to above-mentioned Example B1 will be described below. For each of the samples mentioned above, the surface configuration was observed as in Example B1. Further, the crystal grain size was determined, the difference in Rmax (hereinafter referred to as "Rmax (Difference)".) was obtained from the surface roughness (maximum peak value, hereinafter referred to "Rmax"), and the schematic surface profile of the substrate (Schematic Surface Profile (Subst.))was determined.

Table B22 summarizes the results.

As seen from Table B22, Sample-EMB-B6-1 had an area having asperities for each of the grains and a smooth area. There was a difference in Rmax between the asperity area and a smooth area. On the other hand, Sample-CMP-B6-1 had generally smooth crystal grains and no difference in Rmax, and Sample-CMP-B6-2 and Sample-CMP-B6-3 had pyramidal-shaped asperities and no difference in Rmax.

Further, for each of Sample-EMB-B6-2, Sample-CMP-B6-4, Sample-CMP-B6-5, and Sample-CMP-B6-6 which are the substrates prepared by processing until after the deposition of a transparent conductive layer in the same manner as in Example B1, the surface configuration was observed, the size of the ZnO crystal grains was checked, and further a total reflectance and irregular reflectance were determined by means of a spectrophotometer with an integrating sphere.

Table B23 summarizes the results.

As in the case of Example B1, Sample-EMB-B6 features large size ZnO crystal grains which form a transparent conductive layer, a high total reflectance, and a high irregular reflectance as shown in Table B23. On the other hand, Sample-CMP-B6-4 had small size grains and low irregular reflectance, and Sample-CMP-B6-5 and Sample-CMP-B6-6 had very low total reflectance and irregular reflectance.

Evaluation results on EMB-B6, CMP-B6-1, CMP-B6-2, and CMP B6-3 photovoltaic devices which have been fabricated in the same manner as in Example B5 according to above-mentioned Example B6, Comparative Example B6-1, Comparative Example B6-3, respectively, will be described below. First, 5 photovoltaic devices were prepared for each sample type, and the measurement of the shunt resistance was performed with applying a reverse bias voltage of −1.0 V to the samples in a dark place. Supposing that the reference value of the shunt resistance being $4\times10^4$ Ω $cm^2$, the samples were checked for yield. Subsequently, an adhesion test, a measurement of the initial photoelectric conversion efficiency (photoelectromotive force/incident photoelectric power), and evaluations of the optical degradation, the high-humidity/temperature reverse bias (HHRB) degradation, and the temperature/humidity degradation were performed in the same manner as in Example B1.

Table B24 summarizes the results.

The evaluations mentioned above show the fact that CMP-B6-1 photovoltaic device is inferior to EMB-B6 photovoltaic device in yield and adhesion. These facts are attributed to the decrease of FF due to the decrease of the series resistance depending on the adhesion. The evaluations mentioned above also show the fact that CMP-B6-2 and CMP-B6-3 photovoltaic devices are inferior to EMB-B6 photovoltaic device in initial photoelectric conversion efficiency and photoelectric conversion efficiency following each of the degradation period. The inferior initial photoelectric conversion efficiency is attributed to the decrease of a short-circuit current (Jsc) due to the decrease of the total reflectance and the irregular reflectance, while the inferior photoelectric conversion efficiencies after respective degradations are mainly attributed to the decrease of the open circuit voltage (Voc). As seen from the above, it can be concluded that the photovoltaic device (EMB-B6) according to the present invention has better characteristics and properties than the conventional photovoltaic devices (CMP-B6-1, CMP-B6-2, and CMP-B6-3).

Example B7

In this example, photovoltaic devices having a structure as shown in FIG. 1B were fabricated using an acid solution for etching surfaces thereof and using a mirror-finished stainless-steel (SUS304) plate as the substrate material.

A surface of the plate (SUS304) was etched using the acid solution indicated in Table B25 in the same manner as in Example B1. A part of the substrate after the etching treatment was left as it was for evaluations (Sample-EMB-B7-1). For other part of the substrate, a AlAg alloy reflection layer was deposited on the surface thereof in the same manner as in Example B1 according to the requirements indicated in Table B25. After the completion of the deposition of the AlAg alloy reflection layer, a ZnO transparent conductive layer was deposited on the reflection layer according to the requirements indicated in Table B25. A part of the substrate was left as it was for evaluations (Sample-EMB-B7-2). For other part of the substrate, a pin-type semiconductor layer, an $In_2O_3$ transparent electrode, and a collecting electrode were sequentially formed thereon according to the requirements indicated in Table B25, and thus the fabrication of the photovoltaic device (EMB-B7) was completed.

Subsequently, an n-layer of a-Si, an i-layer of poly-Si, and an p-layer of μc-Si were sequentially formed on the ZnO thin film layer using a multiple chamber separation type deposition apparatus (not shown). The forming process thereof will now be described.

(1) First, an n-layer of a-Si was deposited on the ZnO thin film layer using a similar apparatus to that used in Example B1.

(2) An i-layer of poly-Si was then deposited by means of a deposition apparatus (not shown) which uses the HRCVD method with a duplex tube (not shown) according to the same requirements as indicated in Table B25.

(3) Further, a p-layer of μc-Si was deposited on the i-layer by means of the similar apparatus to that used in Example B1.

(4) After that, an $In_2O_3$ transparent electrode and a collecting electrode were formed thereon in the same manner as in Example B1 according to the requirements indicated in Table B25. Thus the fabrication of the photovoltaic device (EMB-B7) was completed.

Comparative Example B7-1

Comparative Example B7-1 differs from abovementioned Example B7 in that the duration of the acid treatment is 15 seconds.

Samples (Sample-CMP-B7-1 and Sample-CMP-B7-4) and a photovoltaic device (CMP-B7-1) were fabricated in the same manner as in Example B7 except the requirement mentioned above.

Comparative Example B7-2

Comparative Example B7-2 differs from Example B7 in that the temperature of the acid solution during the surface treatment of the substrate is 85° C.

Samples (Sample-CMP-B7-2 and Sample-CMP-B7-5) and a photovoltaic device (CMP-B7-1) were fabricated in the same manner as in Example B7 except the requirement mentioned above.

Comparative Example B7-3

Comparative Example B7-3 differs from Example B7 in that the duration of the acid treatment is 100 minutes.

Samples (Sample-CMP-B7-3 and Sample-CMP-B7-6) and a photovoltaic device (CMP-B7-3) were fabricated in the same manner as in Example B7 except the requirement mentioned above.

Evaluation results on Sample-EMB-B7-1, Sample-CMP-B7-1, Sample-CMP-B7-2, and Sample-CMP-B7-3 which are the substrates prepared by processing until after the completion of the surface treatment in the same manner as in Example B1 will be described below. For each of the samples mentioned above, the surface configuration was observed, the difference in Rmax (hereinafter referred to as "Rmax (Difference)") was obtained from the surface roughness (maximum peak value, hereinafter referred to "Rmax"), and the schematic surface profile of the substrate was determined.

Table B26 summarizes the results.

As seen from Table B26, Sample-EMB-B7-1 had an area having asperities for each of the grains and a smooth area. There was a difference in Rmax between the asperity area and a smooth area. On the other hand, Sample-CMP-B7-1 had generally smooth crystal grains and no difference in Rmax, and Sample-CMP-B7-2 and Sample-CMP-B7-3 had pyramidal-shaped asperities and no difference in Rmax.

Further, for Sample-EMB-B7-2, Sample-CMP-B7-4, Sample-CMP-B7-5, and Sample-CMP-B7-6 which are the substrates prepared in the same manner as in Example B1 by processing until the deposition a transparent conductive layer, the surface configuration was observed, the size of the ZnO crystal grains was checked, and the total reflectance and irregular reflectance were determined.

Table B27 summarizes the results.

As in the case of Example B1, Sample-EMB-B7-1 features large size ZnO crystal grains which form a transparent conductive layer, a high total reflectance and a high irregular reflectance. On the other hand, Sample-CMP-B7-4 had small size grains and low irregular reflectance, and Sample-CMP-B7-5 and Sample-CMP-B7-6 had very low total reflectance and irregular reflectance.

Evaluation results on EMB-B7, CMP-B7-1, CMP-B7-2, and CMP B7-3 which are photovoltaic devices fabricated in the same manner as in Example B1 according to abovementioned Example B7, Comparative Example B7-1, Comparative Example B7-3, respectively, will be described below. First, 5 photovoltaic devices were prepared for each sample type, and each device was further divided into 25 sub-cells, then the measurement of the shunt resistance was performed with applying a reverse bias voltage of −1.0 V to the samples in a dark place. Supposing that the reference value of the shunt resistance being $4\times10^4$ Ω $cm^2$, the samples were checked for yield. Subsequently, as in Example B1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table B28 summarizes the results.

The evaluations mentioned above show the fact that CMP-B7-1 photovoltaic device is inferior to EMB-B7 photovoltaic device in yield and adhesion. This fact is attributed to the decrease of FF due to the decrease of the series resistance mainly depending on the adhesion. The evaluations mentioned above also show the fact that CMP-B7-2 and CMP-B7-3 photovoltaic devices are inferior to EMB-B7 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies following the respective degradation periods are mainly attributed to the decrease of the open circuit voltage (Voc). As seen from the above, it can be concluded that the photovoltaic device (EMB-B7) according to the present invention has better characteristics and properties than the conventional photovoltaic devices (CMP-B7-1, CMP-B7-2, and CMP-B7-3).

Example B8

In this example, relationship between a mean size of polycrystalline grains and the Rmax (Difference) of a polycrystalline substrate was evaluated. In the same manner as in Example B1, photovoltaic devices were fabricated by using an acid solution for etching surfaces thereof and using stainless-steel (SUS430-BA, SUS430-2B, SUS430-2D, and mirror-finished SUS304) plates as the substrate material.

A surface of each plate was etched using the acid solution indicated in Table B29 in the same manner as in Example B1. A part of each of the substrate after the etching treatment was left as it was for evaluations (Sample-EMB-B8-1 to Sample-EMB-B8-81). For other part of the substrate, an AgAl alloy reflection layer was deposited on the surface thereof in the same manner as in Example B1 according to the requirements indicated in Table B29. After the AgAl alloy reflection layer was completely deposited, a ZnO transparent electrode layer was deposited on the reflection layer in the same manner as in Example B1 according to the requirements indicated in Table B29. A part of the substrate was left as it was for evaluations (Sample-EMB-B8-1 to Sample-EMB-B8-81). For other part of the substrate, a pin-type semiconductor layer, an $In_2O_3$ transparent electrode, and a collecting electrode were sequentially formed thereon according to the requirements indicated in Table B29, and thus the fabrication of the photovoltaic devices (EMB-B8-1 to EMB-B8-81) was completed.

For each of Sample-EMB-B8-1 to Sample-EMB-B8-81 which are the substrates prepared by processing in the same manner as in Example B1 until after the completion of the surface treatment, the surface configuration was observed, the crystal grain size, the difference (Rmax (Difference)) in surface roughness (Rmax), and the schematic surface profile thereof were inspected.

Table B30 summarizes the results.

Table B30 shows that the crystal grains size ranges from 0.05 μm to 3200 μm and the Rmax (Difference) ranges from 0 to 8.2 μm.

Next, for each of the substrates (Sample-EMB-B8-1 TO Sample-EMB-B8-81) which were prepared by processing in the same manner as in Example B1 until after deposition of the transparent conductive layer, the surface configuration was observed, the size of the ZnO crystal grains was checked, and the total reflectance and irregular reflectance were obtained. It follows from the resultant data that a crystal grain can grow to a favorable size when the height difference (Rmax) was at least 0.01 μm. On the other hand, regarding the total reflectance ratio and the irregular reflectance ratio, the height difference (Rmax) of 0.01 μm or less results in the low irregular reflectance, and the height difference exceeds 1.50 μm results in the low total reflectance.

It is found that large size ZnO crystal grains and superior total reflectance and irregular reflectance can be obtained if suitable etching conditions are selected (Sample-EMB-B8-21 to 24, 30 to 33, 39 to 42, and 48 to 51).

For the photovoltaic devices (EMB-B8-1 to EMB-B8-81), 5 sample devices were prepared for each as in Example B1, and each device was further divided into 25 sub-cells. For each of the photovoltaic devices, the yield was checked, and an adhesion test and the respective tests on the optical degradation, the high-humidity/temperature reverse bias (HHRB) degradation, and the temperature/humidity degradation were performed.

Table B31 to Table B34 summarize the results.

The evaluations mentioned above show the fact that the photovoltaic devices other EMB-B8-21 to 24, 30 to 33, 39 to 42, and 48 to 51 are inferior to the mentioned photovoltaic devices in yield and adhesion. The substrates in which each crystal grain size was less than 0.1 μm or the Rmax (Difference) was less than 0.01 μm were inferior in photoelectric conversion efficiency following each of the degradation periods. These facts are attributed to the decrease of FF due to the decrease of the series resistance mainly depending on the adhesion. On the other hand, the substrates having a crystal grain size larger than 3000 μm or Rmax (Subst.) larger than 0.50 μ,__ are inferior in photoelectric conversion efficiency following each of the degradation periods. It is mainly attributed to the decrease of a short-circuit current (Jsc).

As seen from the above, it can be concluded that the photovoltaic devices according to the present invention which feature the mean polycrystalline grain size of the polycrystalline substrate of 0.1 μm to 2 mm and the Rmax (Difference) of 0.01 μm to 1.5 μm have superior characteristics and properties.

Example B9

In this example, a height difference of a polycrystalline substrate was evaluated. In the same manner as in Example B8, photovoltaic devices were fabricated by using an acid solution for etching surfaces thereof and using stainless-steel (SUS430-BA, SUS430-2B, SUS430-2D, and mirror-finished SUS304) plates as the substrate material.

A surface of each plate was etched using the acid solution indicated in Table B35 in the same manner as in Example B8. A part of each of the substrate after the etching treatment was used for evaluations. For other part of the substrate, an Al reflection layer was deposited on the surface thereof in the same manner as in Example B8 according to the requirements indicated in Table B35. After the Al reflection layer was completely deposited, a ZnO transparent electrode layer was deposited on the reflection layer in the same manner as in Example B8 according to the requirements indicated in Table B35. After that, in the same manner as in Example B3, a pin-type semiconductor layer, an $In_2O_3$ transparent electrode, and a collecting electrode were sequentially formed thereon according to the requirements indicated in Table B35, and thus the fabrication of the photovoltaic devices was completed.

For each of he substrates prepared by processing in the same manner as in Example B8 until after the completion of the surface treatment, the surface configuration was observed, and the substrates having a crystal grain size of about 6.0 μm and a Rmax (Difference) of about 0.2 μm were selected. Then the distribution of Rmax of the selected substrates were obtained.

As a result, it was found that the Rmax ranged from 0.005 to 3.5 μm.

In the same manner as in Example B8, photovoltaic devices were fabricated from these selected substrates. Then, for each of them, the yield was checked, and the adhesion test and the respective tests on the high-humidity/temperature reverse bias (HHRB) degradation and the temperature/humidity degradation were performed.

Table B36 to Table B39 summarize the results.

From the measurements, it was found that the substrates having an Rmax of 0.01 to 2.00 μm produced favorable results. However, the substrates having an Rmax of 0.01 μm or less result in low photoelectric conversion after the adhesion test. This is attributed to the decrease of FF due to the decrease of the series resistance mainly depending on the adhesion. On the other hand, the substrates having an Rmax of 2.00 μm or larger were not so inferior in yield and adhesion, but considerably inferior in photoelectric conversion efficiency following each of the other degradation tests. These are mainly attributed to the decrease of a short-circuit current (Jsc).

As seen from the above, it can be concluded that the photovoltaic devices according to the present invention which have a height difference of the polycrystalline substrate of 0.01 μm to 2 μm have superior characteristics and properties.

Example C

It should be understood that Example C is corresponding to the third embodiment mentioned above.

Example C1

In this example, photovoltaic devices having a structure as shown in FIG. 1C were fabricated using the acid treatment technique for etching surfaces thereof and using a stainless-steel (SUS430BA) plate as a substrate material.

A process for manufacturing photovoltaic devices will now be described.

(1) First, a substrate was prepared. A stainless steel (SUS430BA) plate which is a 0.5 mm thick square sheet measuring 50 mm on each side was ultrasonic-cleaned with acetone and isopropanol, and then dried with hot air, thereby residual oil on the plate was completely removed.

(2) In preparation of etching the surface thereof, the stainless steel plate was placed on a substrate holder made of Teflon resin (not shown), then the holder was placed in a container filled with an acid solution (not shown) so that the substrate was entirely immersed therein. The acid solution was a hydrofluoric acid-nitric acid mixture (HF, $HNO_3$, and $H_2O$ in the mole ratio of 1:3:4) and controlled to be kept at room temperature as indicated in Table C1.

(3) The container filled with the acid solution was placed in a ultrasonic cleaner (not shown), then the substrate was subjected to a surface treatment by applying ultrasonic waves for 1 minute.

(4) At this stage, a part of the acid-treated substrate was left as it was for evaluations (Sample-EMB-C1-1). For other part of the substrate, an optical reflection layer was deposited on the surface thereof by means of a sputtering apparatus.

(5) A DC magnetron sputtering apparatus shown in FIG. 5 was used to form an Al light reflection layer on the substrate. The acid-treated (SUS430BA) plate 502 was closely contacted with a heater 503 (shown in FIG. 5) and a deposition chamber 501 was evacuated via a vent to which an oil diffusion pump has been connected. When the internal pressure of the chamber was lowered to $1\times10^{-6}$ Torr, a valve 514 was opened, a mass flow controller 516 was adjusted to introduce an Ar gas at a flow rate of 50 sccm, and a conductance valve 513 was adjusted to set the internal pressure at 7 mTorr. A troidal coil was energized, the DC power of −380 V was supplied from a sputtering power supply 506 to an Al target 504 to create an Ar plasma.

(6) A target shutter 507 was opened to form an Al light reflection layer having a thickness of 0.2 μm on the surface of the stainless steel plate, then the shutter was closed. After that, the plasma was killed, and thus the deposition of the Al reflection layer was completed.

(7) In the same manner as that of the reflection layer, a ZnO thin film layer was further deposited thereon. The Ar gas was introduced to the deposition chamber at 40 sccm, the temperature of the substrate raised to 200° C., the internal pressure of the chamber was lowered to 5 mTorr, and the DC power of 510–500 V was applied to a ZnO target to create the Ar plasma.

(8) A target shutter 511 was opened to form a ZnO thin film layer having a thickness of 1.0 μm. Then the shutter was closed and the plasma was killed.

(9) After a transparent conductive layer was completely formed, a part of the substrate was left as it was for evaluations (Sample-EMB-C1-2). Then, for other part of the substrate, a semiconductor layer was deposited on the surface thereof by means of a CVD apparatus.

(10) An n-layer, an i-layer, and an p-layer were sequentially formed on the ZnO thin film layer using a multiple chamber separation type deposition apparatus shown in FIG. 6. An n-layer of a-Si and a p-layer of μc-Si was deposited by means of RFPCVD, and an i-layer of a-Si was deposited by means of RFPCVD and MWPCVD. The forming procedures thereof were as described below.

(10-1) An entire transfer system and the deposition chamber were evacuated down to a pressure of $10^{-6}$ Torr range. The substrate was placed on a substrate holder 690 and place in a load chamber 601. The load chamber was evacuated by a mechanical booster pump and rotary pump (not shown) down to $10^{-3}$ Torr range. Then the evacuating system was switched to a turbo molecular pump and the load chamber was further evacuated down to a pressure $10^{-6}$ Torr range. A gate valve 606 was opened, and the substrate holder 690 was moved into an n-type layer transfer chamber 602. The gate valve 606 was then closed. The substrate was moved until it reached a location just below a substrate heater 610, a hydrogen gas was supplied, and the internal pressure of the transfer chamber was set to the same pressure as for deposition. Then the substrate was heated to the temperature indicated in Table C1. When the temperature of the substrate has becomes stable, a raw material gas indicated in Table C1 for depositing the n-layer was introduced into the deposition chamber via mass flow controllers 641 to 639, stop valves 630 to 634 and 641 to 644. When the pressure therein becomes stable, the RF power indicated in Table C1 was introduced from an RF power supply 622 into a cup 620 for introducing RF power. Thus, an n-type layer having the thickness indicated in Table C1 was deposited on the substrate after proper time duration.

(10-2) The row material gas for depositing the n-type layer was shut off, and the inside of the deposition chamber was evacuated down to $10^{-6}$ Torr range using the turbo molecular pump. The substrate heater 610 was moved upward, the gate valve 607 was opened, and the substrate holder was moved to an MW i-layer or RF i-layer transfer chamber 603. The gate valve was then closed. The substrate was moved until it reached a location below a substrate heater 611, the substrate heater 611 was lowered properly, and it was heated to and stabilized at the substrate temperature indicated in Table C1. Then an RF i-layer was deposited as described below. The raw material gas indicated in Table C1 for depositing an RF i-layer was introduced into the deposition chamber 618 from a gas supply system (comprising a gas supply pipe 649, stop valves 650 to 655 and 661 to 665, mass flow controllers 656 to 660) for supplying an MW i-layer or RF i-layer deposition gas. The deposition chamber was evacuated by an exhaust pump to the degree of vacuum indicated in Table C1. Then a desired RF power was supplied from an RF power source (not shown) to a bias electrode 628, and an RF i-layer with the thickness indicated in Table C1 was deposited on the n-type layer mentioned above by means of RF plasma CVD.

(10-3) The raw material gas was shut off and the inside of the deposition chamber was evacuated down to $10^{-6}$ Torr range using the turbo molecular pump, while the substrate was heated to and kept at the temperature listed in Table C1. The material gas indicated in Table C1 which is suitable for depositing an MW i-layer was supplied from the MW i-layer or RF i-layer deposition gas supply system to the deposition chamber 618. The inside of the deposition chamber was kept at the degree of vacuum indicated in Table C1 by means of an exhaust apparatus such as a diffusion pump not shown. The MW power indicated in Table C1 was introduced from an MW power supply not shown, while the bias power indicated in Table C1 was introduced from an RF power (not shown) to a bias electrode 628. A shutter 627 was then opened, and thus deposition of the MW i-layer by means of the microwave plasma CVD according to the present invention was started.

(10-4) After that, the raw material gas indicated in Table C1 which is suitable for depositing the MW i-layer was supplied from the MW i-layer or RF i-layer deposition gas supply system to the deposition chamber 618. After the MW i-layer having a predetermined thickness was deposited onto the MW n-layer, the shutter was closed, the MW power and the like were shut off, and the supply of the raw material gas was stopped. The inside of the deposition chamber 618 was evacuated to a pressure of $10^{-6}$ Torr range. In the same manner as the deposition of the RF i-layer mentioned above, an RF i-layer was further deposited on the MW i-layer according to the requirements indicated in Table C1.

(10-5) The inside of the deposition chamber was evacuated until after the deposition of the RF i-layer was completed. The substrate heater 611 was separated from the substrate, the gate valve 608 was opened, and the substrate holder 690 was moved into a p-type layer transfer chamber. The gate valve was then closed. The substrate was moved until it reached a location just below the substrate heater 612, the substrate was heated to and stabilized at the temperature indicated in Table C1. When the temperature has become stable, a p-type layer deposition gas was supplied from a p-type layer deposition gas supply system (comprising stop valves 670 to 674 and 681 to 684, mass flow controllers 676 to 679) to the deposition chamber 619. The inside of the deposition chamber was evacuated down to the degree of vacuum indicated in Table C1 by means of the exhaust pump. When the pressure therein has become stable, the power indicated in Table C1 was introduced from an RF power supply 623 into a cup 621 for introducing RF power, and a p-type layer having the thickness indicated in Table C1 was deposited on the substrate after proper time duration by means of RF plasma CVD. Thus a pin structure was formed on the substrate.

(11) Next, the p-type layer deposition gas was shut off, and the hydrogen gas was fed for 5 minutes. Then the hydrogen gas was also shut off, the inside of the deposition chamber as well as the inside of the gas lines were evacuated down to $1\times10^{-5}$ Torr, and the substrate was moved into an unload chamber 605. The substrate was taken out to the outside after it was sufficiently cooled.

(12) Subsequently, as a transparent electrode, the ITO indicated in Table C1 was evaporated onto the p-layer by means of resistance heating vacuum evaporation technique. A mask having a comb-shaped window was then placed on the transparent conductive layer, and vacuum evaporation was performed via the mask thereby forming a comb-shaped collection electrode having a multi-layer structure consisting of Cr/Ag/Cr by means of electron-beam vacuum evaporation technique.

Thus, the fabrication of the photovoltaic device having a structure shown in FIG. 1A was completed. Hereafter, the photovoltaic device of this type will be referred to as EMB-C1.

Comparative Example C1-1

Comparative Example C1-1 differs from above-mentioned Example C1 in that the duration of the ultrasonic acid treatment is 5 seconds.

Samples (Sample-CMP-C1-1 and Sample-CMP-C1-4) and a photovoltaic device (CMP-C1-1) were fabricated in the same manner as in Example C1 except the requirement mentioned above.

Comparative Example C1-2

Comparative Example C1 -2 differs from Example C1 in that the temperature to be kept during the ultrasonic acid treatment is 80 ° C.

Samples (Sample-CMP-C1-2 and Sample-CMP-C1-5) and a photovoltaic device (CMP-C1-2) were fabricated in the same manner as in Example C1 except the requirement mentioned above.

Comparative Example C1-3

Comparative Example C1 -3 differs from Example C1 in that the duration of the ultrasonic acid treatment is 10 minutes.

Samples (Sample-CMP-C1-3 and Sample-CMP-C1-6) and a photovoltaic device (CMP-C1-3) were fabricated in the same manner as in Example C1 except the requirement mentioned above.

Evaluation results on Sample-EMB-C1-1, Sample-CMP-C1-1, Sample-CMP-C1-2, and Sample-CMP-C1-3 which are the substrates prepared by processing until after the completion of the acid treatment according to above-mentioned Example C1, Comparative Example C1-1, Comparative Example C1-2, and Comparative Example C1-3, respectively, will be described below.

First, for each of the samples mentioned above, the surface configuration was observed using a scanning electron microscope (SEM) and the crystal grain size was checked. Then, the surface roughness thereof (the maximum peak to peak value, hereinafter referred to as "Rmax") was inspected by means of a needle step. Further, the schematic surface profile thereof was determined from the resultant data.

Table C2 summarize the results.

Figure 3C:
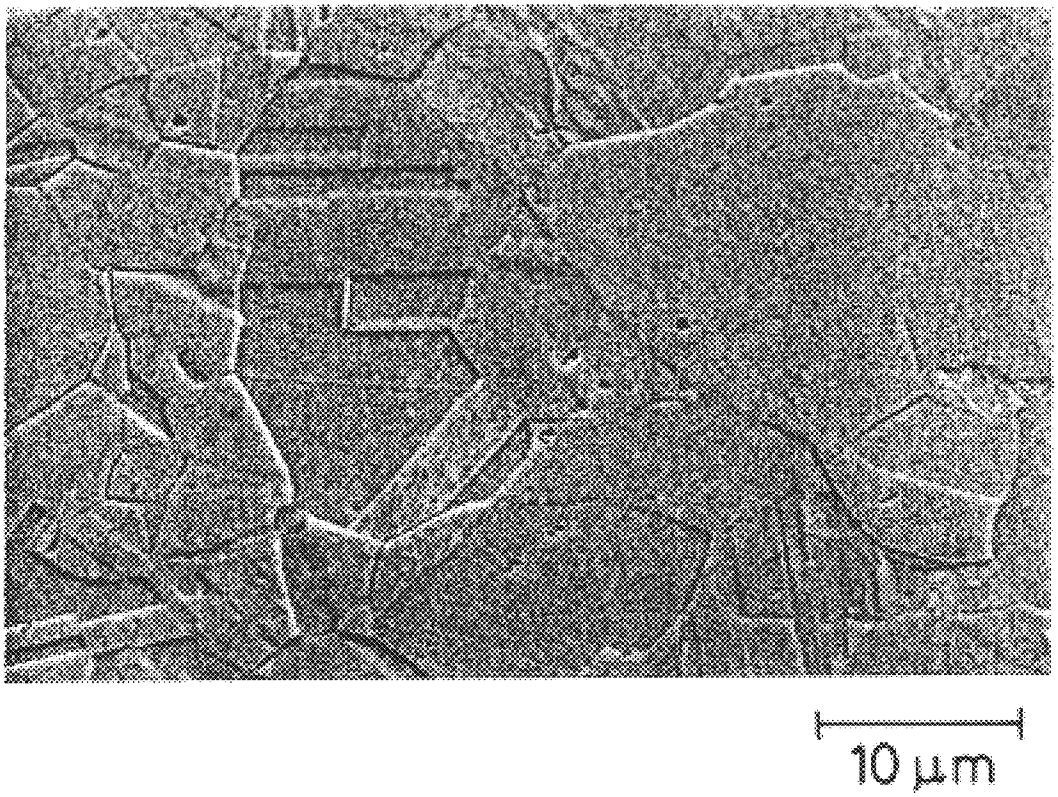

FIG. 3C shows an SEM image of Sample-EMB-C1-1. Sample-EMB-C1-1 had height differences or asperities along crystal grain boundaries on the substrate surface and the crystalline plane was generally smooth. On the other hand, Sample-CMP-C1-1 had crystal grain boundaries but no height difference, and Sample-CMP-C1-2 and Sample-CMP-C1-3 had pyramidal-shaped asperities and were larger than Sample-EMB-C1-1 in Rmax.

Evaluation results on Sample-EMB-C1-2, Sample-CMP-C1-4, Sample-CMP-C1-5, and Sample-CMP-C1-6 which are the substrates prepared by processing until after the deposition of a transparent conductive layer according to above-mentioned Example C1, Comparative Example C1-1, Comparative Example C1-2, and Comparative Example C1-3, respectively, will be described below. First, for each of the samples mentioned above, the surface configuration was observed using the scanning electron microscope (SEM), and the size of the ZnO crystal grains was checked. Further, for each of the samples, a total reflectance and irregular reflectance were determined by means of a spectrophotometer with an integrating sphere.

Table C3 summarizes the results.

As shown in Table C3, Sample-EMB-C1-1 features large size ZnO crystal grains which form a transparent conductive layer, a high total reflectance, and a high irregular reflectance. On the other hand, Sample-CMP-C1-4 had small size grains and low irregular reflectance, and Sample-CMP-C1-5 and Sample-CMP-C1-6 had very low total reflectance and irregular reflectance.

Evaluation results on EMB-Cl, CMP-C1-1, CMP-C1-2, and CMP-C1-3 photovoltaic devices which have been fabricated according to above-mentioned Example C1, Comparative Example C1-1, Comparative Example C1-2, and Comparative Example C1-3, respectively, will be described below. First, 5 photovoltaic devices were prepared for each sample type, and each sample were further divided into 25 sub-cells, then the measurement of the shunt resistance was performed with applying a reverse bias voltage of −1.0 V to the samples in a dark place. Supposing that the reference value of the shunt resistance being $4\times10^{4}$ ωcm$^{2}$, the samples were checked for yield. Subsequently, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

In the adhesion test, first, 10×10 scratches were formed on a surface of each of fabricated photovoltaic device samples in grid pattern at an interval of 1 mm to make 100 squares thereon according to the lattice cutting pattern tape test method. Then, an insulating tape of polyimide was pasted onto the surface and peeled off momentarily after the tape was efficiently adhered thereon, and the adhesion was evaluated based on the unstuck area.

The initial photoelectric conversion efficiency was obtained by exposing a fabricated photovoltaic device to a light of AM-1.5 (100 $mW/cm^2$) and measuring the V-1 property.

The optical degradation was evaluated as follows. First, a fabricated photovoltaic device whose initial photoelectric conversion efficiency has been obtained was placed in the environment of 25° C. and 50% relative humidity and exposed to a light of AM-1.5 for 500 hours. Subsequently, the photoelectric conversion efficiency was measured again under the illumination condition of AM 1.5 (100 mW/cm2), and the falling rate relative to the initial value (the ratio of the photoelectric conversion efficiency value following the predetermined optical degradation period to the initial value) was determined.

The high-humidity/temperature reverse bias (HHRB) degradation was evaluated as follows. First, the initial photoelectric conversion efficiency of a fabricated photovoltaic device was measured. Then the photovoltaic device was placed in the environment of 85° C. and 85% relative humidity, and a reverse bias voltage of 0.7 V was applied thereto for 100 hours. Subsequently, the photoelectric conversion efficiency was measured again under the illumination condition of AM 1.5 (100 mW/cm2), and the falling rate relative to the initial value (the ratio of the photoelectric conversion efficiency value following the predetermined HHRB degradation period to the initial value) was determined.

The humidity/temperature degradation was evaluated as follows. First, the initial photoelectric conversion efficiency of a fabricated photovoltaic device was measured. The photovoltaic device was placed in a dark place at 85° C. and 85% relative humidity for 30 minutes, then the temperature was dropped to −20° C. over 70 minutes, kept −20° C. for 30 minutes, and 85° C. and 85% relative humidity were brought back over 70 minutes. This cycle was repeated 100 times. Subsequently, the photoelectric conversion efficiency was measured again under the illumination condition of AM 1.5 (100 mW/cm2), and the falling rate relative to the initial value (the ratio of the photoelectric conversion efficiency value following the predetermined humidity/temperature degradation period to the initial value) was determined.

Table C4 summarizes the results.

The evaluations mentioned above show the fact that CMP-C1-1 photovoltaic device is inferior to EMB-C1 photovoltaic device in yield, adhesion, and photoelectric conversion efficiency following each of the degradation periods. These facts are attributed to the decrease of FF due to the decrease of the series resistance depending on the adhesion. The evaluations mentioned above also show the fact that CMP-C1-2 and CMP-C1-3 photovoltaic devices are inferior to EMB-C1 photovoltaic device in initial photoelectric conversion efficiency and photoelectric conversion efficiency following each of the degradation period. The inferior initial photoelectric conversion efficiency is attributed to the decrease of a short-circuit current (Jsc) due to the decrease of the total reflectance and the irregular reflectance, while the inferior photoelectric conversion efficiencies after respective degradations are mainly attributed to the decrease of the open circuit voltage (Voc).

As seen from the above, it can be concluded that the photovoltaic device (EMB-C1) according to the present invention has better characteristics and properties than the conventional photovoltaic devices (CMP-C1-1, CMP-C1-2, and CMP-C1-3).

Example C2

In this example, photovoltaic devices having a structure as shown in FIG. 1C were fabricated using the RF sputtering technique for etching surfaces thereof and using a stainless-steel (SUS430-2B) plate as the substrate material.

A process for manufacturing photovoltaic devices will now be described.

(1) After residual oil on the plate (SUS-2B) was completely removed in the same manner as in Example C1 , the plate surfaces were subjected to the etching treatment by means of the sputtering apparatus shown in FIG. 5. The treated (SUS430-2B) plate 502 was closely contacted with the heater 503 (shown in FIG. 5) and the deposition chamber 501 was evacuated via the vent thereof. When the internal pressure of the chamber was lowered to $1\times10^{-6}$ Torr, the valve 514 was opened, the mass flow controller 516 was adjusted to introduce the Ar gas at a flow rate of 50 sccm, and the conductance valve 513 was adjusted to set the internal pressure at 6 mTorr. The RF power of 400 W was supplied from the sputtering power supply 506 to the substrate, and an Ar plasma was created. After maintaining the Ar plasma for 10 minutes, the plasma was then killed, and thus the etching treatment was completed. shutter was closed and the plasma was killed.

(2) A part of the substrate after the etching treatment was left as it was for evaluations (Sample-EMB-C2-1). For other part of the substrate, an Al reflection layer was deposited on the surface thereof in the same manner as in Example C1 according to the requirements indicated in Table C5.

(3) Subsequently, in the same manner as in Example C1, a ZnO transparent conductive layer was deposited on the Al reflection layer of the substrate according to the requirements indicated in Table C5. A part of the substrate was left as it was for evaluations (Sample-EMB-C2-2). For other part of the substrate, a pin-type semiconductor layer, an $In_2O_3$ transparent electrode, and a collecting electrode were sequentially formed thereon by means of the CVD apparatus according to the requirements indicated in Table C5. Thus the fabrication of the photovoltaic device (EMB-C-2) was completed.

Comparative Example C2-1

Comparative Example C2-1 differs from abovementioned Example C2 in that the duration of the RF sputtering is 10 seconds.

Samples (Sample-CMP-C2-l and Sample-CMP-C2-4) and a photovoltaic device (CMP-C2-1) were fabricated in the same manner as in Example C2 except the requirement mentioned above.

Comparative Example C2-2

Comparative Example C2-2 differs from Example C2 in that the temperature during the surface treatment of the substrate is 200° C.

Samples (Sample-CMP-C2-2 and Sample-CMP-C2-5) and a photovoltaic device (CMP-C2-1) were fabricated in the same manner as in Example C2 except the requirement mentioned above.

Comparative Example C2-3

Comparative Example C2-3 differs from Example C2 in that the duration of the RF sputtering is 60 minutes.

Samples (Sample-CMP-C2-3 and Sample-CMP-C2-6) and a photovoltaic device (CMP-C2-3) were fabricated in the same manner as in Example C2 except the requirement mentioned above.

Evaluation results on Sample-EMB-C2-1, Sample-CMP-C2-1, Sample-CMP-C2-2, and Sample-CMP-C2-3 which are the substrates prepared by processing until after the completion of the surface treatment in the same manner as in Example C1 will be described below.

First, for each of the samples mentioned above, the surface configuration was observed as in Example C1. The crystal grain size, the surface roughness (Rmax), and the schematic surface profile thereof were then determined.

Table C6 summarizes the results.

As in the case of Example C1, Sample-EMB-C2-2 had height differences or asperities along crystal grain boundaries on the substrate surface and a generally smooth crystalline plane. On the other hand, Sample-CMP-C2-1 had crystal grain boundaries but no height difference, and Sample-CMP-C2-2 and Sample-CMP-C2-3 had pyramidal-shaped asperities and were larger than Sample-EMB-C2-2 in Rmax.

Evaluation results on Sample-EMB-C2-2, Sample-CMP-C2-4, Sample-CMP-C2-5, and Sample-CMP-C2-6 which are the substrates prepared in the same manner as in Example C1 will be described below. First, for each of the samples mentioned above, the surface configuration was observed, the size of the ZnO crystal grains was checked, and the total reflectance and irregular reflectance were determined by means of a spectrophotometer with an integrating sphere, as in the case of Example C1.

Table C7 summarizes the results.

As in the case of Example C1, Sample-EMB-C2-1 features large size ZnO crystal grains which form a transparent conductive layer, a high total reflectance and a high irregular reflectance. On the other hand, Sample-CMP-C2-4 had small size grains and low irregular reflectance, and Sample-CMP-C2-5 and Sample-CMP-C2-6 had very low total reflectance and irregular reflectance.

Evaluation results on EMB-C2, CMP-C2-1, CMP-C2-2, and CMP-C2-3 which are photovoltaic devices fabricated in the same manner as in Example C1 according to abovementioned Example C2, Comparative Example C2-1, Comparative Example C2-3, respectively, will be described below. First, 5 photovoltaic devices were prepared for each sample type, and each device was further divided into 25 sub-cells, then the measurement of the shunt resistance was performed with applying a reverse bias voltage of −1.0 V to the samples in a dark place. Supposing that the reference value of the shunt resistance being $4\times10^4$ ωcm$^2$, the samples were checked for yield. Subsequently, as in Example C1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table C8 summarizes the results.

The evaluations mentioned above show the fact that CMP-C2-1 photovoltaic device is inferior to EMB-C2 photovoltaic device in yield and adhesion. This fact is attributed to the decrease of FF due to the decrease of the series resistance mainly depending on the adhesion. The evaluations mentioned above also show the fact that CMP-C2-2 and CMP-C2-3 photovoltaic devices are inferior to EMB-C2 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies following the respective degradation periods are mainly attributed to the decrease of the open circuit voltage (Voc).

As seen from the above, it can be concluded that the photovoltaic device (EMB-C2) according to the present invention has better characteristics and properties than the conventional photovoltaic devices (CMP-C2-1, CMP-C2-2, and CMP-C2-3).

Example C3

In this example, photovoltaic devices having a structure as shown in FIG. 1C were fabricated using the acid treatment technique for etching surfaces thereof and using a stainless-steel (SUS430-2B) plate as the substrate material.

A process for manufacturing photovoltaic devices will now be described.

(1) A surface of the plate (SUS430-2B) was etched using the acid solution indicated in Table C9 in the same manner as in Example C1. A part of the substrate after the etching treatment was left as it was for evaluations (Sample-EMB-C3-1). For other part of the substrate, an Al reflection layer was deposited on the surface thereof in the same manner as in Example C1 according to the requirements indicated in Table C9.

(3) After the Al reflection layer was completely deposited, a ZnO transparent conductive layer was deposited on the Al reflection layer of the substrate in the same manner as in Example C1 according to the requirements indicated in Table C9. A part of the substrate was left as it was for evaluations (Sample-EMB-C3-2).

(4) For other part of the substrate, a pin-type semiconductor layer, an $In_2O_3$ transparent electrode, and a collecting electrode were sequentially formed thereon by means of the CVD apparatus according to the requirements indicated in Table C9, and thus the fabrication of the photovoltaic device (EMB-C-3) was completed.

Comparative Example C3-1

Comparative Example C3-1 differs from abovementioned Example C3 in that the mixed solution of hydrofluoric acid, nitric acid mixture, and acetic acid ($HF:HNO_3$ $H_2O:CH_3COOH$=1:3:3:200) is used for the surface treatment of the substrate.

Samples (Sample-CMP-C3-1, Sample-CMP-C3-5, and Sample-CMP-C3-9) and a photovoltaic device (CMP-C3-1) were fabricated in the same manner as in Example C3 except the requirement mentioned above.

Comparative Example C3-2

Comparative Example C3-2 differs from Example C3 in that the thickness of the reflection layer to be deposited is 1000 nm.

Samples (Sample-CMP-C3-2, Sample-CMP-C3-6 and Sample-CMP-C3-10) and a photovoltaic device (CMP-C3-1) were fabricated in the same manner as in Example C3 except the requirement mentioned above.

Comparative Example C3-3

Comparative Example C3-3 differs from Example C3 in that the substrate temperature to be kept during depositing the reflection layer onto the substrate is 150° C.

Samples (Sample-CMP-C3-3, Sample-CMP-C3-7, and Sample-CMP-C3-11) and a photovoltaic device (CMP-C3-3) were fabricated in the same manner as in Example C3 except the requirement mentioned above.

Comparative Example C3-4

Comparative Example C3-4 differs from Example C3 in that the duration of the acid treatment for the substrate surface is 90 minutes.

Samples (Sample-CMP-C3-4, Sample-CMP-C3-8, and Sample-CMP-C3-12) and a photovoltaic device (CMP-C3-4) were fabricated in the same manner as in Example C3 except the requirement mentioned above.

Evaluation results on Sample-EMB-C3-l, Sample-CMP-C3-1, Sample-CMP-C3-2, Sample-CMP-C3-3, and Sample-CMP-C3-4 which are the substrates prepared by processing in the same manner as in Example C1 until after the completion of the surface treatment will be described below. For each of the samples mentioned above, the surface configuration was observed, the crystal grain size, the surface roughness (Rmax), and the schematic surface profile thereof (hereinafter referred to as "Schematic Surface Profile (Subst.)") were determined, as in the case of Example C1. After the reflection layer has been deposited, further observation for each of the substrates was performed using the scanning electron microscope to the precisely same position where the substrate has been observed before the deposition of the reflection layer, and the schematic shape of the cross section thereof (hereinafter referred to as "Schematic Surface Profile (Ref.)") was determined.

Table C10 summarizes the results.

As seen from Table C10, Sample-EMB-C3-1 had height differences or asperities along crystal grain boundaries on the surface thereof, the height differences on the etched substrate surface were reflected to the shape of the reflection layer as it was, and the crystalline plane was generally smooth. On the other hand, Sample-CMP-C3-1 had crystal grain boundaries but no height difference, and Sample-CMP-C3-2 and Sample-CMP-C3-3 had pyramidal-shaped asperities and were larger than Sample-EMB-C3-2 in Rmax.

Further, for each of Sample-EMB-C3-2, Sample-CMP-C3-6, Sample-CMP-C3-7, and Sample-CMP-C3-8 which are the substrates prepared by processing until after deposition of the transparent conductive layer, the size of the ZnO crystal grains were obtained, and the total reflectance and irregular reflectance were determined Table C11 summarizes the results.

As in the case of Example C1, Sample-EMB-C3-2 features large size ZnO crystal grains which form a transparent conductive layer, a high total reflectance, and a high irregular reflectance were obtained. On the other hand, Sample-CMP-C3-5 and Sample-CMP-C3-6 had small size grains and low irregular reflectance, and Sample-CMP-C3-7 and Sample-CMP-C3-8 had very low total reflectance and irregular reflectance.

Evaluation results on EMB-C3, CMP-C3-1, CMP-C3-2, CMP-C3-3, and CMP-C3-4 which are, as in the case of Example C4, photovoltaic devices fabricated according to abovementioned Example C3, Comparative Example C3-1, Comparative Example C3-2, Comparative Example C3-3, and Comparative Example C3-4 respectively, will be described below. First, 5 photovoltaic devices were prepared for each sample type, and each device was further divided into 25 sub-cells. After that, the samples were checked for yield. Subsequently, as in the case of Example C1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table C12 summarizes the results.

The evaluations mentioned above show the fact that CMP-C3-1 and CMP-C3-2 photovoltaic devices are inferior to EMB-C3 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-C3-3 and CMP-C3-4 photovoltaic devices are inferior to EMB-C3 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc).

As seen from the above, it can be concluded that the photovoltaic device (EMB-C3) according to the present invention has better characteristics and properties than the conventional photovoltaic devices (CMP-C3-1, CMP-C3-2, CMP-C3-3, and CMP-C3-4).

Example C4

In this example, photovoltaic devices having a structure as shown in FIG. 1C were fabricated using the acid treatment technique for etching surfaces thereof and using a stainless-steel (SUS430-2B) plate as the substrate material.

A process for manufacturing photovoltaic devices will now be described.

(1) A surface of the plate (SUS430-2B) was etched using the acid solution indicated in Table C13 in the same manner as in Example C3.

(2) A part of the substrate after the etching treatment was left as it was for evaluations (Sample-EMB-C4-1). For other part of the substrate, an Ag reflection layer was deposited on the surface thereof in the same manner as in Example C3 according to the requirements indicated in Table C13.

(3) After the Ag reflection layer was completely deposited, a ZnO transparent conductive layer was deposited on the Ag reflection layer of the substrate according to the requirements indicated in Table C13. A part of the substrate was left as it was for evaluations (Sample-EMB-C4-2).

(4) For other part of the substrate, a pin-type semiconductor layer, an $In_2O_3$ transparent electrode, and a collecting electrode were sequentially formed thereon according to the requirements indicated in Table C13, as in the same manner in Example C3, and thus the fabrication of the photovoltaic device (EMB-C4) was completed.

Comparative Example C4-1

Comparative Example C4-1 differs from abovementioned Example C4 in that the thickness of the reflection layer to be deposited is 2000 nm.

Samples (Sample-CMP-C4-1 and Sample-CMP-C4-4) and a photovoltaic device (CMP-C4-1) were fabricated in the same manner as in Example C4 except the requirement mentioned above.

Comparative Example C4-2

Comparative Example C4-2 differs from Example C4 in that the substrate temperature to be kept during depositing the reflection layer onto the substrate is 300° C.

Samples (Sample-CMP-C4-2 and Sample-CMP-C4-5) and a photovoltaic device (CMP-C4-2) were fabricated in the same manner as in Example C4 except the requirement mentioned above.

Comparative Example C4-3

Comparative Example C4-3 differs from Example C4 in that the duration of the acid treatment for the substrate surface is 70 minutes.

Samples (Sample-CMP-C4-3 and Sample-CMP-C4-6) and a photovoltaic device (CMP-C4-3) were fabricated in the same manner as in Example C4 except the requirement mentioned above.

Evaluation results on Sample-EMB-C4-1, Sample-CMP-C4-1, Sample-CMP-C4-2, and Sample-CMP-C4-3 which are the substrates prepared by processing in the same manner as in Example C3 until after the completion of the surface treatment will be described below. For each of the samples mentioned above, the surface configuration was observed, the crystal grain size, the surface roughness (Rmax), and the schematic surface profile thereof (hereinafter referred to as “Schematic Surface Profile (Subst.)”) were determined, as in the case of Example C3. After the transparent conductive layer has been deposited, further observation for each of the substrates was performed using the scanning electron microscope to the precisely same position where the substrate has been observed before the deposition of the reflection layer, and the schematic shape of the cross section thereof (hereinafter referred to as “Schematic Surface Profile (Transp.)”) was determined.

Table C14 summarizes the results.

As seen from Table C14, Sample-EMB-C4-1 had height differences or asperities along crystal grain boundaries on the surface thereof, the height differences on the etched substrate surface were reflected to the shape of the transparent conductive layer as it was, and the crystalline plane was generally smooth. On the other hand, Sample-CMP-C4-1 had height differences or asperities along crystal grain boundaries on the surface thereof, but the shape thereof was not reflected to that of the transparent conductive layer. Besides, Sample-CMP-C4-2 and Sample-CMP-C4-3 had pyramidal-shaped asperities and were larger than Sample-EMB-C4-1 in Rmax.

Further, for each of Sample-EMB-C4-2, Sample-CMP-C4-4, Sample-CMP-C4-5, and Sample-CMP-C4-6 which are the substrates prepared as in the same manner in Example C3 by processing until after the deposition of the transparent conductive layer, the surface configuration was observed, and the size of the ZnO crystal grains, the total reflectance, and the irregular reflectance were determined Table C15 summarizes the results.

As in the case of Example C3, Sample-EMB-C4-2 features large size ZnO crystal grains which form a transparent conductive layer, a high total reflectance, and a high irregular reflectance. On the other hand, Sample-CMP-C4-4 had small size grains and low irregular reflectance, and Sample-CMP-C4-5 and Sample-CMP-C4-6 had very low total reflectance and irregular reflectance.

Evaluation results on EMB-C4, CMP-C4-1, CMP-C4-2, and CMP-C4-3 which are, as in the case Example C3, photovoltaic devices fabricated according to abovementioned Example C4, Comparative Example C4-1, Comparative Example C4-2, and Comparative Example C4-3, respectively, will be described below. First, 5 photovoltaic devices were prepared for each sample type, and each device was further divided into 25 sub-cells. After that, the samples were checked for yield. Subsequently, as in the case of Example C3, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table C16 summarizes the results.

The evaluations mentioned above show the fact that CMP-C4-1 photovoltaic device is inferior to EMB-C4 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-C4-2 and CMP-C4-3 photovoltaic devices are inferior to EMB-C4 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc). As seen from the above, it can be concluded that the photovoltaic device (EMB-C4) according to the present invention has better characteristics and properties than the conventional photovoltaic devices (CMP-C4-1, CMP-C4-2, and CMP-C4-3).

Example C5

In this example, photovoltaic devices having a structure as shown in FIG. 1C were fabricated using the acid treatment technique for etching surfaces thereof and using a stainless-steel (SUS430-BA) plate as the substrate material. A process for manufacturing photovoltaic devices will now be described.

(1) A surface of the plate (SUS430-BA) was etched using the acid solution indicated in Table C17 in the same manner as in Example C4.

(2) A part of the substrate after the etching treatment was left as it was for evaluations (Sample-EMB-C5-1). For other part of the substrate, a Cu reflection layer was deposited on the surface thereof in the same manner as in Example C4 according to the requirements indicated in Table C17.

(3) After the Cu reflection layer was completely deposited, a ZnO transparent conductive layer was deposited on the Cu reflection layer of the substrate according to the requirements indicated in Table C17. A part of the substrate was left as it was for evaluations (Sample-EMB-C5-2).

(4) For other part of the substrate, a pin-type semiconductor layer, an $In_2O_3$ transparent electrode, and a collecting electrode were sequentially formed thereon according to the requirements indicated in Table C17, as in the same manner in Example C4, and thus the fabrication of the photovoltaic device (EMB-C5) was completed.

Comparative Example C5-1

Comparative Example C5-1 differs from abovementioned Example C5 in that the thickness of the reflection layer to be deposited is 2000 nm.

Samples (Sample-CMP-C5-1 and Sample-CMP-C5-4) and a photovoltaic device (CMP-C5-1) were fabricated in the same manner as in Example C5 except the requirement mentioned above.

Comparative Example C5-2

Comparative Example C5-2 differs from Example C5 in that the substrate temperature to be kept during depositing the reflection layer onto the substrate is 1500° C. and the thickness of the reflection layer to be deposited is 1500 nm.

Samples (Sample-CMP-C5-2 and Sample-CMP-C5-5) and a photovoltaic device (CMP-C5-2) were fabricated in the same manner as in Example C5 except the requirements mentioned above.

Comparative Example C5-3

Comparative Example C5-3 differs from Example C5 in that the thickness of the transparent conductive layer to be deposited is 10 $\mu$m.

Samples (Sample-CMP-C5-3 and Sample-CMP-C5-6) and a photovoltaic device (CMP-C5-3) were fabricated in the same manner as in Example C5 except the requirement mentioned above.

Evaluation results on Sample-EMB-C5-1, Sample-CMP-C5-1, Sample-CMP-C5-2, and Sample-CMP-C5-3 which are the substrates prepared in the same manner as Example C4 by processing until after the completion of the surface treatment will be described below. For each of the samples mentioned above, the surface configuration was observed, the crystal grain size, the surface roughness (Rmax), and the schematic surface profile thereof (hereinafter referred to as "Schematic Surface Profile (Subst.)") were determined, as in the case of Example C4. After fabrication of the photovoltaic device, further observation for each of the substrate surfaces was performed using the scanning electron microscope to the precisely same position where the substrate has been observed before the fabrication of the photovoltaic device, and the schematic shape of the cross section thereof (hereinafter referred to as "Schematic Surface Profile (Photov.)") was determined.

Table C18 summarizes the results.

As seen from Table C18, Sample-EMB-C5-1 had height differences or asperities along crystal grain boundaries on the surface thereof, the height differences on the etched substrate surface were reflected to the shape on the photovoltaic device as it was, and the surface of the semiconductor layer was generally smooth. On the other hand, Sample-CMP-C5-1 had height differences or asperities along crystal grain boundaries on the surface thereof, but the surface profile of the substrate was not reflected to the photovoltaic device. Besides, Sample-CMP-C5-2 and Sample-CMP-C5-3 do not reflect the surface profile of the substrate, had pyramidal-shaped asperities, and were larger than Sample-EMB-C5-1 in Rmax.

Further, for each of Sample-EMB-C5-2, Sample-CMP-C5-4, Sample-CMP-C5-5, and Sample-CMP-C5-6 which are the substrates prepared as in the same manner in Example C4 by processing until after the deposition of the transparent conductive layer, the surface configuration was observed, and the size of the ZnO crystal grains, the total reflectance, and the irregular reflectance were determined Table C19 summarizes the results.

As in the case of Example C4, Sample-EMB-C5-2 features large size ZnO crystal grains which form a transparent conductive layer, a high total reflectance, and a high irregular reflectance. On the other hand, Sample-CMP-C5-4 had small size grains, and Sample-CMP-C5-5 and Sample-CMP-C5-6 had very low total reflectance and irregular reflectance.

Evaluation results on EMB-C5, CMP-C5-1, CMP-C5-2, and CMP-C5-3 which are, as in the case of Example C4, photovoltaic devices fabricated according to abovementioned Example C5, Comparative Example C5-1, Comparative Example C5-2, and Comparative Example C5-3, respectively, will be described below. First, 5 photovoltaic devices were prepared for each sample type, and each device was further divided into 25 sub-cells. After that, the samples were checked for yield. Subsequently, as in the case of Example C4, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table C20 summarizes the results.

The evaluations mentioned above show the fact that CMP-C5-1 and CMP-C5-3 photovoltaic devices are inferior to EMB-C5 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-C5-2 photovoltaic device is inferior to EMB-C5 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc).

As seen from the above, it can be concluded that the photovoltaic device (EMB-C5) according to the present invention has better characteristics and properties than the conventional photovoltaic devices (CMP-C5-1, CMP-C5-2, and CMP-C5-3).

Example C6

In this example, solar cells having a pinpinpin structure as shown in FIG. 2 were fabricated by means of a deposition apparatus which uses the roll-to-roll method shown in FIG. 7.

A strip stainless-steel (SUS430BA) sheet having a length of 100 m, a width of 30 cm, and a thickness of 0.15 mm as a substrate material. The stainless-steel (SUS430BA) sheet was wrapped around a feed bobbin (not shown) in a vacuum vessel (not shown). Then the sheet was subjected to the RF plasma etching by Ar plasma with feeding the SUS430BA sheet by rotating a take-up bobbin to which one end of the sheet was connected.

A part of the etched substrate (Sample EMB-C6-1) was evaluated and the shape of the cross section thereof was inspected (hereinafter referred to as "Schematic Surface Profile (Subst.)") Subsequently, a AlSi reflection layer and a ZnO transparent electrode layer were formed on the substrate using the roll-to-roll method according to the requirements indicated in Table C21. A part of the substrate was then left as it was for evaluations (Sample-EMB-C6-2) and the shape of the cross section thereof (hereinafter referred to as "Schematic Surface Profile (Ref.)") was inspected. Other part of substrate are fabricated to photovoltaic devices (EMB-C6) by means of a CVD apparatus using the roll-to-roll method according to the requirements indicated in Table C21.

The operation of the deposition apparatus shown in FIG. 7 will now be described.

FIG. 7(*a*) is a schematic view of a continuous photovoltaic device manufacturing apparatus using the roll-to-roll method. In this apparatus, a substrate feed chamber 729, multiple deposition chambers 701 to 713, and a substrate take-up chamber 730 are disposed in order and interconnected by separation passages 714. Each deposition chamber has a vent through which the inside of the deposition chamber is evacuated.

A strip substrate 740 is wound up from the substrate feed chamber to the substrate take-up chamber through the deposition chambers and the separation passages. At the same time, a gas is introduced from a gas inlet of each respective deposition chamber or each separation passage, and exhausted from every vent. Thus respective layers can be formed on the substrate. Each deposition chamber has a halogen lamp inside thereof which heats the substrate from backside thereof. The halogen lamp is heated to a predetermined temperature in the corresponding deposition chamber.

FIG. 7(*b*) is a view of the deposition chambers 701 to 713 when looking from above. Each deposition chamber has a raw material gas inlet 715 and a vent 716, and an RF electrode 717 or a microwave applicator 718 is mounted in the chamber. A raw material gas supply apparatus (not shown) is connected to respective raw material gas inlets 715. On the other hand, to the respective vents of the deposition chambers, an evacuator (not shown) such as an oil diffusion pump and a mechanical booster pump are connected. Each of the separation passages 714 interposed between deposition chambers has an inlet 719 for introducing a scavenging gas, and introduces a scavenging gas as shown in the figure.

Each of the deposition chambers 703 and 707 for depositing a MW-i layer has a bias electrode 720 to which an RF power supply (not shown) is connected as a power supply. The substrate feed chamber contains a guide roll 721 and a guide roller 722 which gives proper tension to the substrate and always keep the substrate in a horizontal position, while the substrate take-up chamber contains a take-up roll 723 and a guide roller 724.

A process for manufacturing solar cells will now be described.

(1) First, the abovementioned stainless-steel (SUS430BA) sheet was wrapped around the feed roll 721 (at a mean radius of curvature of 30 cm), set in the substrate feed chamber 710, and connected to the substrate take-up roll 723 at one end after passing through all the deposition chambers.

(2) The entire apparatus was evacuated by means of the evacuator, every lamp heater of each of deposition chambers was turned on, and the temperature in each of the deposition chambers was controlled to be kept at a predetermined temperature.

(3) When the internal pressure of the entire apparatus reached to 1 mTorr or less, the scavenging gas is introduced via respective scavenging gas inlets 719 as shown in FIG. 7, and the substrate was taken up by the take-up roll while feeding the substrate in the direction of the arrow in FIG. 7.

(4) Respective raw material gases were properly introduced to the corresponding deposition chambers. At this time, the flow rate of each gas to be introduced into respective separation passages or the pressure in each of deposition chambers are adjusted so that a raw material gas introduced into the corresponding deposition chambers was not diffused to the other deposition chambers.

(5) Subsequently, plasmas are created by introducing the RF power or the MW power plus the RF bias power. Photovoltaic devices composed of the first, second and third pin-junctions were fabricated according to the requirements indicated in Table C21. As the first pin-junction, an n1-layer was deposited in the deposition chamber 701, an i1-layer was deposited in the deposition chambers 702, 703, and 704, and a p1-layer was deposited in the deposition chamber 705. As the second pin-junction, an n2-layer was deposited in the deposition chamber 706, an i2-layer was deposited in the deposition chambers 707, 708, and 709, and a p2-layer was deposited in the deposition chamber 710. As the third pin-junction, an n3-layer was deposited in the deposition chamber 711, an i3-layer was deposited in the deposition chamber 712, and a p3-layer was deposited in the deposition chamber 713.

(6) After the substrate was completely taken up, every MW power supply and RF power supply were turned off, all plasmas were killed, and all the raw material and scavenging gases were shut off. The entire system was released and the take-up roll was taken out from the chamber.

(7) Next, a transparent electrode 213 was formed on top of the three pin junction layers according to the requirements indicated in the Table C21.

(8) A carbon paste 5 μm thick by 0.5 mm wide was placed on the substrate by screen printing on the transparent electrode 213, a silver paste 10 μm thick by 0.5 mm wide was further placed on the carbon paste, and then a collecting electrode was formed on the silver paste. After that, the rolled solar cell was cut to 250 mm×100 mm.

Thus, the fabrication of the pinpinpin type solar cell (EMB-C6) using the roll-to-roll method was completed.

Comparative Example C6-1

Comparative Example C6-1 differs from above-mentioned Example C6 in that the duration of the RF sputtering is 10 seconds.

Samples (Sample-CMP-C6-1 and Sample-CMP-C6-4) and a photovoltaic device (CMP-C6-1) were fabricated in the same manner as in Example C1 except the requirement mentioned above.

Comparative Example C6-2

Comparative Example C6-2 differs from Example C6 in that the temperature to be kept during the surface treatment of the substrate is 300° C.

Samples (Sample-CMP-C6-2 and Sample-CMP-C6-5) and a photovoltaic device (CMP-C6-2) were fabricated in the same manner as in Example C6 except the requirement mentioned above.

Comparative Example C6-3

Comparative Example C6-3 differs from Example C6 in that the duration of the RF sputtering is 60 minutes.

Samples (Sample-CMP-C6-3 and Sample-CMP-C6-6) and a photovoltaic device (CMP-C6-3) were fabricated in the same manner as in Example C6 except the requirement mentioned above.

Now, evaluation results on Sample-EMB-C6, Sample-CMP-C6-1, Sample-CMP-C6-2, and Sample-CMP-C6-3 which are the substrates prepared by processing until after the completion of the surface treatment according to above-mentioned Example C1 will be described below. For each of the samples mentioned above, the surface configuration was observed and the crystal grain size, the surface roughness (Rmax), and the schematic shape of the cross section of the substrate (Schematic Surface Profile (Subst.)) were inspected.

Table C22 summarize the results.

As in the case of Example C1, Sample-EMB-C6-1 had height differences or asperities along crystal grain boundaries on the substrate surface and the crystalline plane was generally smooth as shown in Table C22. On the other hand, Sample-CMP-C6-1 had crystal grain boundaries but no height difference, and Sample-CMP-C6-2 and Sample-CMP-C6-3 had pyramidal-shaped asperities and were larger than Sample-EMB-C6-1 in Rmax.

Further, for each of Sample-EMB-C6-2, Sample-CMP-C6-4, Sample-CMP-C6-5, and Sample-CMP-C6-6 which are the substrates prepared by processing until after the deposition of a transparent conductive layer in the same manner as in Example C1, the surface configuration was observed, the size of the ZnO crystal grains was checked, and further a total reflectance and irregular reflectance were determined by means of a spectrophotometer with an integrating sphere.

Table C23 summarizes the results.

As in the case of Example C1, Sample-EMB-C6 features large size ZnO crystal grains which form a transparent conductive layer, a high total reflectance, and a high irregular reflectance as shown in Table C23. On the other hand, Sample-CMP-C6-4 had small size grains and low irregular reflectance, and Sample-CMP-C6-5 and Sample-CMP-C6-6 had very low total reflectance and irregular reflectance.

Evaluation results on EMB-C6, CMP-C6-1, CMP-C6-2, and CMP-C6-3 photovoltaic devices which have been fabricated in the same manner as in Example C5 according to above-mentioned Example C6, Comparative Example C6-1, Comparative Example C6-3, respectively, will be described below. First, 5 photovoltaic devices were prepared for each sample type, and the measurement of the shunt resistance was performed with applying a reverse bias voltage of −1.0 V to the samples in a dark place. Supposing that the reference value of the shunt resistance being $4\times10^4$ ωcm$^2$, the samples were checked for yield. Subsequently, an adhesion test, a measurement of the initial photoelectric conversion efficiency (photoelectromotive force/incident photoelectric power), and evaluations of the optical degradation, the high-humidity/temperature reverse bias (HHRB) degradation, and the temperature/humidity degradation were performed in the same manner as in Example C1.

Table C24 summarizes the results.

The evaluations mentioned above show the fact that CMP-C6-1 photovoltaic device is inferior to EMB-C6 photovoltaic device in yield and adhesion. These facts are attributed to the decrease of FF due to the decrease of the series resistance depending on the adhesion. The evaluations mentioned above also show the fact that CMP-C6-2 and CMP-C6-3 photovoltaic devices are inferior to EMB-C6 photovoltaic device in initial photoelectric conversion efficiency and photoelectric conversion efficiency following each of the degradation period. The inferior initial photoelectric conversion efficiency is attributed to the decrease of a short-circuit current (Jsc) due to the decrease of the total reflectance and the irregular reflectance, while the inferior photoelectric conversion efficiencies after respective degradations are mainly attributed to the decrease of the open circuit voltage (Voc). As seen from the above, it can be concluded that the photovoltaic device (EMB-C6) according to the present invention has better characteristics and properties than the conventional photovoltaic devices (CMP-C6-1, CMP-C6-2, and CMP-C6-3).

Example C7

In this example, photovoltaic devices having a structure as shown in FIG. 1C were fabricated using an acid solution for etching surfaces thereof and using a mirror-finished stainless-steel (SUS304) plate as the substrate material.

A surface of the plate (SUS304) was etched using the acid solution indicated in Table C25 in the same manner as in Example C1. A part of the substrate after the etching treatment was left as it was for evaluations (Sample-EMB-C7-1). For other part of the substrate, a CuAl alloy reflection layer was deposited on the surface thereof in the same manner as in Example C1 according to the requirements indicated in Table C25. After the completion of the deposition of the CuAl alloy reflection layer, a ZnO transparent conductive layer was deposited on the reflection layer according to the requirements indicated in Table C25. A part of the substrate was left as it was for evaluations (Sample-EMB-C7-2). For other part of the substrate, a pin-type semiconductor layer, an $In_2O_3$ transparent electrode, and a collecting electrode were sequentially formed thereon according to the requirements indicated in Table C25, and thus the fabrication of the photovoltaic device (EMB-C-7) was completed.

Subsequently, an n-layer of a-Si, an i-layer of poly-Si, and an p-layer of μc-Si were sequentially formed on the ZnO thin film layer using a multiple chamber separation type deposition apparatus (not shown). The forming process thereof will now be described.

(1) First, an n-layer of a-Si was deposited on the ZnO thin film layer using a similar apparatus to that used in Example C1.

(2) An i-layer of poly-Si was then deposited by means of a deposition apparatus (not shown) which uses the HRCVD method with a duplex tube (not shown) according to the same requirements as indicated in Table C25.

(3) Further, a p-layer of pc-Si was deposited on the i-layer by means of the similar apparatus to that used in Example C1.

(4) After that, an $In_2O_3$ transparent electrode and a collecting electrode were formed thereon in the same manner as in Example C1 according to the requirements indicated in Table C25. Thus the fabrication of the photovoltaic device (EMB-C7) was completed.

Comparative Example C7-1

Comparative Example C7-1 differs from abovementioned Example C7 in that the duration of the acid treatment is 10 seconds.

Samples (Sample-CMP-C7-1 and Sample-CMP-C7-4) and a photovoltaic device (CMP-C7-1) were fabricated in the same manner as in Example C7 except the requirement mentioned above.

By 8Comparative Example C7-2 Comparative Example C7-2 differs from Example C7 in that the temperature of the acid solution during the surface treatment of the substrate is 80° C.

Samples (Sample-CMP-C7-2 and Sample-CMP-C7-5) and a photovoltaic device (CMP-C7-1) were fabricated in the same manner as in Example C7 except the requirement mentioned above.

Comparative Example C7-3

Comparative Example C7-3 differs from Example C7 in that the duration of the acid treatment is 60 minutes.

Samples (Sample-CMP-C7-3 and Sample-CMP-C7-6) and a photovoltaic device (CMP-C7-3) were fabricated in the same manner as in Example C7 except the requirement mentioned above.

Evaluation results on Sample-EMB-C7-1, Sample-CMP-C7-1, Sample-CMP-C7-2, and Sample-CMP-C7-3 which are the substrates prepared by processing until after the completion of the surface treatment in the same manner as in Example C1 will be described below. For each of the samples mentioned above, the surface configuration was observed, and the crystal grain size, the surface roughness (Rmax), and the schematic shape of the cross section of the substrate (Schematic Surface Profile (Subst.) and Schematic Surface Profile (Ref.)) were inspected.

Table C26 summarizes the results.

As in the case of Example C1, Sample-EMB-C7-1 had height differences or asperities along crystal grain boundaries on the substrate surface and a generally smooth crystalline plane. On the other hand, Sample-CMP-C7-1 had crystal grain boundaries but no height difference, and Sample-CMP-C7-2 and Sample-CMP-C7-3 had pyramidal-shaped asperities and were larger than Sample-EMB-C7-2 in Rmax.

Further, for Sample-EMB-C7-2, Sample-CMP-C7-4, Sample-CMP-C7-5, and Sample-CMP-C7-6 which are the substrates prepared in the same manner as in Example C1 until after the deposition of the transparent conductive layer, the surface configuration was observed, the size of the ZnO crystal grains was checked, and the total reflectance and irregular reflectance were determined.

Table C27 summarizes the results.

As in the case of Example C1, Sample-EMB-C7-1 features large size ZnO crystal grains which form a transparent conductive layer, a high total reflectance and a high irregular reflectance. On the other hand, Sample-CMP-C7-4 had small size grains and low irregular reflectance, and Sample-CMP-C7-5 and Sample-CMP-C7-6 had very low total reflectance and irregular reflectance.

Evaluation results on EMB-C7, CMP-C7-1, CMP-C7-2, and CMP-C7-3 which are photovoltaic devices fabricated in the same manner as in Example C1 according to abovementioned Example C7, Comparative Example C7-1, Comparative Example C7-3, respectively, will be described below. First, 5 photovoltaic devices were prepared for each sample type, and each device was further divided into 25 sub-cells, then the measurement of the shunt resistance was performed with applying a reverse bias voltage of −1.0 V to the samples in a dark place. Supposing that the reference value of the shunt resistance being $4\times10^4$ ωcm$^2$, the samples were checked for yield. Subsequently, as in Example C1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table C28 summarizes the results.

The evaluations mentioned above show the fact that CMP-C7-1 photovoltaic device is inferior to EMB-C7 photovoltaic device in yield and adhesion. This fact is attributed to the decrease of FF due to the decrease of the series resistance mainly depending on the adhesion. The evaluations mentioned above also show the fact that CMP-C7-2 and CMP-C7-3 photovoltaic devices are inferior to EMB-C7 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies following the respective degradation periods are mainly attributed to the decrease of the open circuit voltage (Voc). As seen from the above, it can be concluded that the photovoltaic device (EMB-C7) according to the present invention has better characteristics and properties than the conventional photovoltaic devices (CMP-C7-1, CMP-C7-2, and CMP-C7-3).

Example C8

In this Example C relationship between a mean size of polycrystalline grains and the height difference of a polycrystalline substrate was evaluated. In the same manner as in Example C1, photovoltaic devices were fabricated by using an acid solution for etching surfaces thereof and using stainless-steel (SUS430-BA, SUS430-2B, SUS430-2D, and mirror-finished SUS304) plates as the substrate material.

A surface of each plate was etched using the acid solution indicated in Table C29 in the same manner as in Example C1. A part of each of the substrate after the etching treatment was left as it was for evaluations (Sample-EMB-C8-1 to Sample-EMB-C8-81). For other part of the substrate, an AgAl alloy reflection layer was deposited on the surface thereof in the same manner as in Example C1 according to the requirements indicated in Table C29. After the AgAl alloy reflection layer was completely deposited, a ZnO transparent electrode layer was deposited on the reflection layer in the same manner as in Example C1 according to the requirements indicated in Table C29. A part of the substrate was left as it was for evaluations (Sample-EMB-C8-1 to Sample-EMB-C8-81). For other part of the substrate, a pin-type semiconductor layer, an $In_2O_3$ transparent electrode, and a collecting electrode were sequentially formed thereon according to the requirements indicated in Table C29, and thus the fabrication of the photovoltaic devices (EMB-C8-1 to EMB-C8-81) was completed.

For each of Sample-EMB-C8-1 to Sample-EMB-C8-81 which are the substrates prepared by processing in the same manner as in Example C1 until after the completion of the surface treatment, the surface configuration was observed, the crystal grain size, the surface roughness (Rmax), and the schematic surface profile thereof were inspected.

Table C30 summarizes the results.

Table C30 shows that the crystal grains size ranges from 0.05 μm to 3000 μm and the surface roughness ranges from 0 to 7.0 μm.

Next, for each of the substrates (Sample-EMB-C8-1 to Sample-EMB-C8-81) which were prepared by processing in the same manner as in Example C1 until after deposition of the transparent conductive layer, the surface configuration was observed, the size of the ZnO crystal grains was checked, and the total reflectance and irregular reflectance were obtained. It follows from the resultant data that a crystal grain can grow to a favorable size when the height difference (Rmax) was at least 0.01 μm. On the other hand, regarding the total reflectance ratio and the irregular reflectance ratio, the height difference (Rmax) of 0.01 μm or less results in the low irregular reflectance, and the height difference exceeds 2.00 μm results in the low total reflectance.

It is found that large size ZnO crystal grains and superior total reflectance and irregular reflectance can be obtained if suitable etching conditions are selected (Sample-EMB-C8-21 to 24, 30 to 33, 39 to 42, and 48 to 51).

For the photovoltaic devices (EMB-C8-1 to EMB-C8-81), 5 sample devices were prepared for each as in Example C1, and each device was further divided into 25 sub-cells. For each of the photovoltaic devices, the yield was checked, and an adhesion test and respective tests on the optical degradation, the high-humidity/temperature reverse bias (HHRB) degradation, and the temperature/humidity degradation were performed.

Table C31 to Table C34 summarize the results.

The evaluations mentioned above show the fact that the photovoltaic devices other EMB-C8-21 to 24, 30 to 33, 39 to 42, and 48 to 51 are inferior to the mentioned photovoltaic devices in yield and adhesion. The substrates in which each crystal grain size was less than 0.1 $\mu$m or the height difference was less than 0.01 $\mu$m were inferior in photoelectric conversion efficiency following each of the degradation periods. These facts are attributed to the decrease of FF due to the decrease of the series resistance mainly depending on the adhesion. On the other hand, the substrates having a height difference larger than 3000 $\mu$m or a height difference of 3000 $\mu$m are inferior in photoelectric conversion efficiency following each of the degradation periods. It is mainly attributed to the decrease of a short-circuit current (Jsc).

As seen from the above, it can be concluded that the photovoltaic devices according to the present invention which feature the mean polycrystalline grain size of the polycrystalline substrate of 0.1 $\mu$m to 2 mm and the height difference of 0.01 $\mu$m to 2 $\mu$m have superior characteristics and properties.

Example D

It should be understood that Example D is corresponding to the fourth embodiment mentioned above.

Example D1

In this example, photovoltaic devices having a structure as shown in FIG. 1D were fabricated using the acid treatment technique for etching surfaces thereof and using a stainless-steel (SUS430BA) plate as a substrate material.

A process for manufacturing photovoltaic devices will now be described.

(1) First, a substrate was prepared. A stainless steel (SUS430BA) plate which is a 0.2 mm thick square sheet measuring 50 mm on each side was ultrasonic-cleaned with acetone and isopropanol, and then dried with hot air, thereby residual oil on the plate was completely removed.

Subsequently, in preparation of etching the surface thereof, the stainless steel plate was placed on a substrate holder made of Teflon resin (not shown), then the holder was placed in a container (not shown) filled with an acid solution so that the substrate was entirely immersed therein. The acid solution was a hydrofluoric acid-nitric acid mixture (HF, $HNO_3$, and $H_2O$ in the mole ratio of 1:3:200) and controlled to be kept at room temperature as indicated in Table D1.

(2) The container filled with the acid solution was placed in a magnetic stirrer (not shown), then the substrate was subjected to a surface treatment by stirring for 5 minutes.

(3) At this stage, a part of the acid-treated substrate was left as it was for evaluations (Sample-EMB-D1-1). For other part of the substrate, an optical reflection layer was deposited on the surface thereof by means of a sputtering apparatus.

(4) A DC magnetron sputtering apparatus shown in FIG. 5 was used to form an Al light reflection layer on the substrate. The acid-treated (SUS430BA) plate 502 was closely contacted with a heater 503 (shown in FIG. 5) and a deposition chamber 501 was evacuated via a vent to which an oil diffusion pump has been connected. When the internal pressure of the chamber was lowered to $1\times10^{-6}$ Torr, a valve 514 was opened, a mass flow controller 516 was adjusted to introduce an Ar gas at a flow rate of 50 sccm, and a conductance valve 513 was adjusted to set the internal pressure at 7 mTorr. A troidal coil was energized, the DC power of −400 V was supplied from a sputtering power supply 506 to an Al target 504 to create an Ar plasma.

(5) A target shutter 507 was opened to form an AL light reflection layer having a thickness of 0.3 $\mu$m on the surface of the stainless steel plate, then the shutter was closed. After that, the plasma was killed, and thus the deposition of the Al reflection layer was completed.

(6) In the same manner as that of the reflection layer, a ZnO thin film layer was further deposited thereon. The Ar gas was introduced to the deposition chamber at 40 sccm, the temperature of the substrate raised to 200° C., the internal pressure of the chamber was lowered to 5 mTorr, and the DC power of 510–500 V was applied to a ZnO target to create the Ar plasma.

(7) A target shutter 511 was opened to form a ZnO thin film layer having a thickness of 1.0 $\mu$m. Then the shutter was closed and the plasma was killed.

(8) After a transparent conductive layer was completely formed, a part of the substrate was left as it was for evaluations (Sample-EMB-D1-2). Then, for other part of the substrate, a semiconductor layer was deposited on the surface thereof by means of a CVD apparatus.

(9) An n-layer, an i-layer, and an p-layer were sequentially formed on the ZnO thin film layer using a multiple chamber separation type deposition apparatus shown in FIG. 6. An n-layer of a-Si and a p-layer of pc-Si was deposited by means of RFPCVD, and an i-layer of a-Si was deposited by means of RFPCVD and MWPCVD. The forming procedures thereof were as described below.

(9-1) An entire transfer system and the deposition chamber were evacuated down to a pressure of $10^{-6}$ Torr range. The substrate was placed on a substrate holder 690 and place in a load chamber 601. The load chamber was evacuated by a mechanical booster pump and rotary pump (not shown) down to $10^{-3}$ Torr range. Then the evacuating system was switched to a turbo molecular pump and the load chamber was further evacuated down to a pressure $10^{-5}$ Torr range. A gate valve 606 was opened, and the substrate holder 690 was moved into an n-type layer transfer chamber 602. The gate valve 606 was then closed. The substrate was moved until it reached a location just below a substrate heater 610, a hydrogen gas was supplied, and the internal pressure of the transfer chamber was set to the same pressure as for deposition. Then the substrate was heated to the temperature indicated in Table D1. When the temperature of the substrate has becomes stable, the raw material gas indicated in Table D1 for depositing the n-layer was introduced into the deposition chamber via mass flow controllers 641 to 639, stop valves 630 to 634 and 641 to 644. When the pressure therein becomes stable, the RF power indicated in Table D1 was introduced from an RF power supply 622 into a cup 620 for introducing RF power. Thus, an n-type layer having the thickness indicated in Table D1 was deposited on the substrate after proper time duration.

(9-2) The row material gas for depositing the n-type layer was shut off, and the inside of the deposition chamber was evacuated down to $10^{-6}$ Torr range using the turbo molecular pump. The substrate heater 610 was moved upward, the gate valve 607 was opened, and the substrate holder was moved to an MW i-layer or RF i-layer transfer chamber 603. The gate valve was then closed. The substrate was moved until it reached a location below a substrate heater 611, the substrate heater 611 was lowered properly, and it was heated to and stabilized at the substrate temperature indicated in Table D1. Then an RF i-layer was deposited as described below. The raw material gas indicated in the Table D1 for depositing an RF i-layer was introduced into the deposition chamber 618 from a gas supply system (comprising a gas supply pipe 649, stop valves 650 to 655 and 661 to 665, mass flow controllers 656 to 660) for supplying an MW i-layer or RF i-layer deposition gas. The deposition chamber was evacuated by an exhaust pump to the degree of vacuum indicated in Table D1. Then a desired RF power was supplied from an RF power source (not shown) to a bias electrode 628, and an RF i-layer with the thickness indicated in Table D1 was deposited on the n-type layer mentioned above by means of RF plasma CVD.

(9-3) The raw material gas was shut off and the inside of the deposition chamber was evacuated down to $10^{-6}$ Torr range using the turbo molecular pump, while the substrate was heated to and kept at the temperature listed in Table D1. The material gas indicated in Table D1 which is suitable for depositing an MW i-layer was supplied from the MW i-layer or RF i-layer deposition gas supply system to the deposition chamber 618. The inside of the deposition chamber was kept at the degree of vacuum indicated in Table D1 by means of an exhaust apparatus such as a diffusion pump not shown. The MW power indicated in Table D1 was introduced from an MW power supply not shown, while the bias power indicated in Table D1 was introduced from an RF power (not shown) to a bias electrode 628. A shutter 627 was then opened, and thus deposition of the MW i-layer by means of the microwave plasma CVD according to the present invention was started.

(9-4) After that, the raw material gas indicated in Table D1 which is suitable for depositing the MW i-layer was supplied from the MW i-layer or RF i-layer deposition gas supply system to the deposition chamber 618. After the MW i-layer having a predetermined thickness was deposited onto the MW n-layer, the shutter was closed, the MW power and the like were shut off, and the supply of the raw material gas was stopped. The inside of the deposition chamber 618 was evacuated to a pressure of $10^{-6}$ Torr range. In the same manner as the deposition of the RF i-layer mentioned above, an RF i-layer was further deposited on the MW i-layer according to the requirements indicated in Table D1.

(9-5) The inside of the deposition chamber was evacuated until after the deposition of the RF i-layer was completed. The substrate heater 611 was separated from the substrate, the gate valve 608 was opened, and the substrate holder 690 was moved into a p-type layer transfer chamber. The gate valve was then closed. The substrate was moved until it reached a location just below the substrate heater 612, the substrate was heated to and stabilized at the temperature indicated in Table D1. When the temperature has become stable, a p-type layer deposition gas was supplied from a p-type layer deposition gas supply system (comprising stop valves 670 to 674 and 681 to 684, mass flow controllers 676 to 679) to the deposition chamber 619. The inside of the deposition chamber was evacuated down to the degree of vacuum indicated in Table D1 by means of the exhaust pump. When the pressure therein has become stable, the power indicated in Table D1 was introduced from an RF power supply 623 into a cup 621 for introducing RF power, and a p-type layer having the thickness indicated in Table D1 was deposited on the substrate after proper time duration by means of RF plasma CVD. Thus a pin structure was formed on the substrate.

(10) Next, the p-type layer deposition gas was shut off, and the hydrogen gas was fed for 5 minutes. Then the hydrogen gas was also shut off, the inside of the deposition chamber as well as the inside of the gas lines were evacuated down to $1 \times 10^{-5}$ Torr, and the substrate was moved into an unload chamber 605. The substrate was taken out to the outside after it was sufficiently cooled.

(11) Subsequently, as a transparent electrode, the ITO indicated in Table D1 was evaporated onto the p-layer by means of resistance heating vacuum evaporation technique. A mask having a comb-shaped window was then placed on the transparent conductive layer, and vacuum evaporation was performed via the mask thereby forming a comb-shaped collection electrode having a multi-layer structure consisting of Cr/Ag/Cr by means of electron-beam vacuum evaporation technique.

Thus, the fabrication of the photovoltaic device having a structure shown in FIG. 1D was completed. Hereafter, the photovoltaic device of this type will be referred to as EMB-D1.

Comparative Example D1-1

Comparative Example D1-1 differs from above-mentioned Example D1 in that the duration of the acid treatment by stirring is 10 seconds.

Samples (Sample-CMP-D1-1 and Sample-CMP-D1-4) and a photovoltaic device (CMP-D1-1) were fabricated in the same manner as in Example D1 except the requirement mentioned above.

Comparative Example D1-2

Comparative Example D1-2 differs from Example D1 in that the temperature to be kept during the acid treatment is 80° C.

Samples (Sample-CMP-D1-2 and Sample-CMP-D1-5) and a photovoltaic device (CMP-D1-2) were fabricated in the same manner as in Example D1 except the requirement mentioned above.

Comparative Example D1-3

Comparative Example D1-3 differs from Example D1 in that the duration of the acid treatment is 60 minutes.

Samples (Sample-CMP-D1-3 and Sample-CMP-D1-6) and a photovoltaic device (CMP-D1-3) were fabricated in the same manner as in Example D1 except the requirement mentioned above.

Evaluation results on Sample-EMB-D1-1, Sample-CMP-D1-1, Sample-CMP-D1-2, and Sample-CMP-D1-3 which are the substrates prepared by processing until after the completion of the acid treatment according to above-mentioned Example D1, Comparative Example D1-1, Comparative Example D1-2, and Comparative Example D1-3, respectively, will be described below. First, for each of the samples mentioned above, the surface configuration was observed using a scanning electron microscope (SEM) and the crystal grain size was checked. Then, the surface roughness thereof (the maximum peak-to-peak value, hereinafter referred to as "Rmax") was inspected by means of a needle step, and a difference between the Rmax of a polycrystalline grain having a texture structure and the Rmax of a smooth polycrystalline grain (Hereinafter referred to as "Rmax (Difference)"). Further, the schematic surface profile thereof was determined from the resultant data.

Table D2 summarize the results.

Figure 3D:
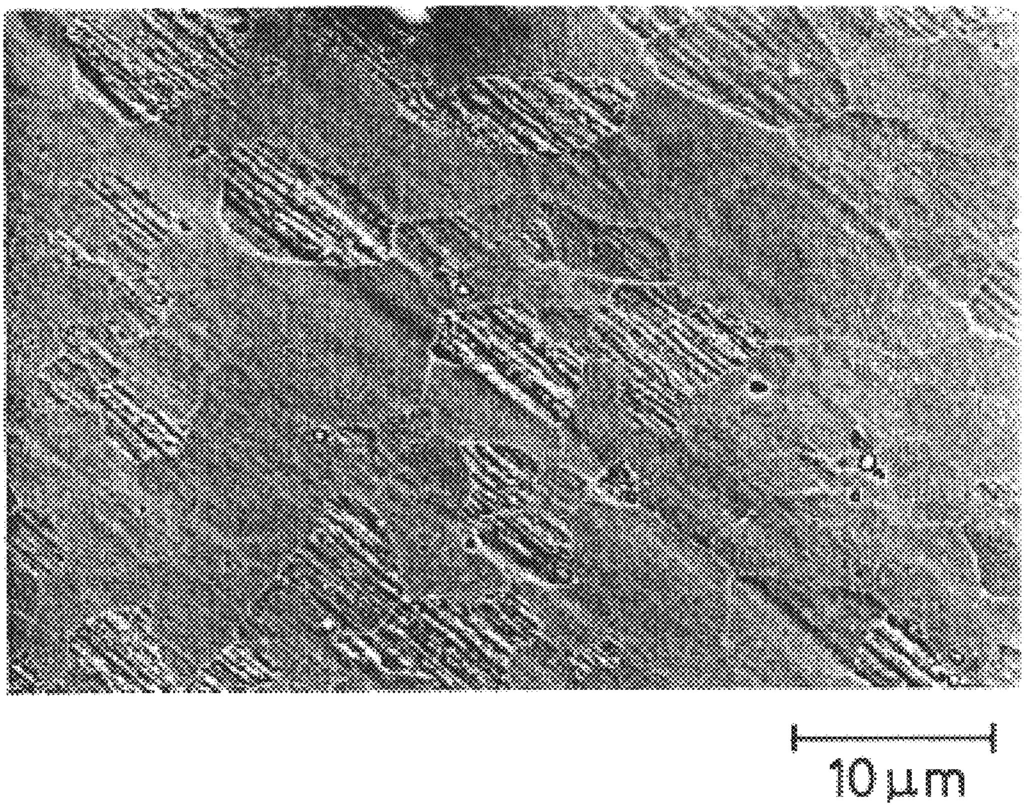

FIG. 3D shows an SEM image of Sample-EMB-D1-1. Sample-EMB-D1-l had an area having asperities for each of the grains and a smooth area. There was a difference in Rmax between the asperity area and a smooth area. On the other hand, Sample-CMP-D1-l had generally smooth crystal grains and no difference in Rmax, and Sample-CMP-D1-2 and Sample-CMP-D1-3 had pyramidal-shaped asperities and no difference in Rmax.

Evaluation results on Sample-EMB-D1-2, Sample-CMP-D1-4, Sample-CMP-D1-5, and Sample-CMP-D1-6 which are the substrates prepared by processing until after the deposition of a transparent conductive layer according to above-mentioned Example D1, Comparative Example D1-1, Comparative Example D1-2, and Comparative Example D1-3, respectively, will be described below. First, for each of the samples mentioned above, the surface configuration was observed using the scanning electron microscope (SEM), and the size of the ZnO crystal grains was checked. Further, for each of the samples, a total reflectance and irregular reflectance were determined by means of a spectrophotometer with an integrating sphere.

Table D3 summarizes the results.

As shown in Table D3, Sample-EMB-D1-1 features large size ZnO crystal grains which form a transparent conductive layer, a high total reflectance, and a high irregular reflectance. On the other hand, Sample-CMP-D1-4 had small size grains and low irregular reflectance, and Sample-CMP-D1-5 and Sample-CMP-D1-6 had very low total reflectance and irregular reflectance.

Evaluation results on EMB-D1, CMP-D1-1, CMP-D1-2, and CMP-D1-3 photovoltaic devices which have been fabricated according to above-mentioned Example D1, Comparative Example D1-1, Comparative Example D1-2, and Comparative Example D1-3, respectively, will be described below. First, 5 photovoltaic devices were prepared for each sample type, and each sample were further divided into 25 sub-cells, then the measurement of the shunt resistance was performed with applying a reverse bias voltage of −1.0 V to the samples in a dark place. Supposing that the reference value of the shunt resistance being $4\times10^4$ ωcm$^2$, the samples were checked for yield. Subsequently, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

In the adhesion test, first, 10×10 scratches were formed on a surface of each of fabricated photovoltaic device samples in grid pattern at an interval of 1 mm to make 100 squares thereon according to the lattice cutting pattern tape test method. Then, an insulating tape of polyimide was pasted onto the surface and peeled off momentarily after the tape was efficiently adhered thereon, and the adhesion was evaluated based on the unstuck area.

The initial photoelectric conversion efficiency was obtained by exposing a fabricated photovoltaic device to a light of AM-1.5 (100 mW/cm$^2$) and measuring the V-1 property.

The optical degradation was evaluated as follows. First, a fabricated photovoltaic device whose initial photoelectric conversion efficiency has been obtained was placed in the environment of 25° C. and 50% relative humidity and exposed to a light of AM-1.5 for 500 hours. Subsequently, the photoelectric conversion efficiency was measured again under the illumination condition of AM 1.5 (100 mW/cm2), and the falling rate relative to the initial value (the ratio of the photoelectric conversion efficiency value following the predetermined optical degradation period to the initial value) was determined.

The high-humidity/temperature reverse bias (HHRB) degradation was evaluated as follows. First, the initial photoelectric conversion efficiency of a fabricated photovoltaic device was measured. Then the photovoltaic device was placed in the environment of 85° C. and 85% relative humidity, and a reverse bias voltage of 0.7 V was applied thereto for 100 hours. Subsequently, the photoelectric conversion efficiency was measured again under the illumination condition of AM 1.5 (100 mW/cm2), and the falling rate relative to the initial value (the ratio of the photoelectric conversion efficiency value following the predetermined HHRB degradation period to the initial value) was determined.

The humidity/temperature degradation was evaluated as follows. First, the initial photoelectric conversion efficiency of a fabricated photovoltaic device was measured. The photovoltaic device was placed in a dark place at 85° C. and 85% relative humidity for 30 minutes, then the temperature was dropped to −20° C. over 70 minutes, kept −20° C. for 30 minutes, and 85° C. and 85% relative humidity were brought back over 70 minutes. This cycle was repeated 100 times. Subsequently, the photoelectric conversion efficiency was measured again under the illumination condition of AM 1.5 (100 mW/cm2), and the falling rate relative to the initial value (the ratio of the photoelectric conversion efficiency value following the predetermined humidity/temperature degradation period to the initial value) was determined.

Table D4 summarizes the results.

The evaluations mentioned above show the fact that CMP-D1-l photovoltaic device is inferior to EMB-D1 photovoltaic device in yield, adhesion, and photoelectric conversion efficiency following each of the degradation periods. These facts are attributed to the decrease of FF due to the decrease of the series resistance depending on the adhesion. The evaluations mentioned above also show the fact that CMP-D1-2 and CMP-D1-3 photovoltaic devices are inferior to EMB-D1 photovoltaic device in initial photoelectric conversion efficiency and photoelectric conversion efficiency following each of the degradation period. The inferior initial photoelectric conversion efficiency is attributed to the decrease of a short-circuit current (Jsc) due to the decrease of the total reflectance and the irregular reflectance, while the inferior photoelectric conversion efficiencies after respective degradations are mainly attributed to the decrease of the open circuit voltage (Voc).

As seen from the above, it can be concluded that the photovoltaic device (EMB-D1) according to the present invention has better characteristics and properties than the conventional photovoltaic devices (CMP-D1-1, CMP-D1-2, and CMP-D1-3).

Example D2

In this example, photovoltaic devices having a structure as shown in FIG. 1D were fabricated using the RF sputtering technique for etching surfaces thereof and using a stainless-steel (SUS430-2B) plate as the substrate material.

A process for manufacturing photovoltaic devices will now be described.

(1) After residual oil on the plate (SUS-2B) was completely removed in the same manner as in Example D1, the plate surfaces were subjected to the etching treatment by means of the sputtering apparatus shown in FIG. 5. The treated (SUS430-2B) plate 502 was closely contacted with the heater 503 (shown in FIG. 5) and the deposition chamber 501 was evacuated via the vent thereof. When the internal pressure of the chamber was lowered to $1\times10^{-6}$ Torr, the valve 514 was opened, the mass flow controller 516 was adjusted to introduce the Ar gas at a flow rate of 50 sccm, and the conductance valve 513 was adjusted to set the internal pressure at 6 mTorr. The RF power of 200 W was supplied from the sputtering power supply 506 to the substrate, and an Ar plasma was created. After maintaining the Ar plasma for 20 minutes, the plasma was then killed, and thus the etching treatment was completed.
shutter was closed and the plasma was killed.

(2) A part of the substrate after the etching treatment was left as it was for evaluations (Sample-EMB-D2-1). For other part of the substrate, an Al reflection layer was deposited on the surface thereof in the same manner as in Example D1 according to the requirements indicated in Table D5.

(3) Subsequently, in the same manner as in Example D1, a ZnO transparent conductive layer was deposited on the Al reflection layer of the substrate according to the requirements indicated in Table D5. A part of the substrate was left as it was for evaluations (Sample-EMB-D2-2). For other part of the substrate, a pin-type semiconductor layer, an $In_2O_3$ transparent electrode, and a collecting electrode were sequentially formed thereon by means of the CVD apparatus according to the requirements indicated in Table D5. Thus the fabrication of the photovoltaic device (EMB-D-2) was completed.

Comparative Example D2-1

Comparative Example D2-1 differs from abovementioned Example D2 in that the duration of the RF sputtering is 20 seconds.

Samples (Sample-CMP-D2-1 and Sample-CMP-D2-4) and a photovoltaic device (CMP-D2-1) were fabricated in the same manner as in Example D2 except the requirement mentioned above.

Comparative Example D2-2

Comparative Example D2-2 differs from Example D2 in that the temperature during the surface treatment of the substrate is 300° C.

Samples (Sample-CMP-D2-2 and Sample-CMP-D2-5) and a photovoltaic device (CMP-D2-2) were fabricated in the same manner as in Example D2 except the requirement mentioned above.

Comparative Example D2-3

Comparative Example D2-3 differs from Example D2 in that the duration of the RF sputtering is 90 minutes.

Samples (Sample-CMP-D2-3 and Sample-CMP-D2-6) and a photovoltaic device (CMP-D2-3) were fabricated in the same manner as in Example D2 except the requirement mentioned above.

Evaluation results on Sample-EMB-D2-1, Sample-CMP-D2-1, Sample-CMP-D2-2, and Sample-CMP-D2-3 which are the substrates prepared by processing until after the completion of the surface treatment in the same manner as in Example D1 will be described below. First, for each of the samples mentioned above, the surface configuration was observed as in Example D1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate was determined.

Table D6 summarizes the results.

As in the case of Example D1, Sample-EMB-D2-2 had an area having asperities for each of the grains and a smooth area. There was a difference in Rmax between the asperity area and a smooth area. On the other hand, Sample-CMP-D1-l had generally smooth crystal grains and no difference in Rmax, and Sample-CMP-D1-2 and Sample-CMP-D1-3 had pyramidal-shaped asperities and no difference in Rmax.

Evaluation results on Sample-EMB-D2-2, Sample-CMP-D2-4, Sample-CMP-D2-5, and Sample-CMP-D2-6 which are the substrates prepared in the same manner as in Example D1 will be described below. First, for each of the samples mentioned above, the surface configuration was observed, the size of the ZnO crystal grains was checked, and the total reflectance and irregular reflectance were determined by means of a spectrophotometer with an integrating sphere, as in the case of Example D1.

Table D7 summarizes the results.

As in the case of Example D1, Sample-EMB-D2-1 features large size ZnO crystal grains which form a transparent conductive layer, a high total reflectance and a high irregular reflectance. On the other hand, Sample-CMP-D2-4 had small size grains and low irregular reflectance, and Sample-CMP-D2-5 and Sample-CMP-D2-6 had very low total reflectance and irregular reflectance.

Evaluation results on EMB-D2, CMP-D2-1, CMP-D2-2, and CMP-D2-3 according to abovementioned Example D2, Comparative Example D2-1, Comparative Example D2-3, respectively, will be described below. First, 5 photovoltaic devices were prepared for each sample type, and each device was further divided into 25 sub-cells, then the measurement of the shunt resistance was performed with applying a reverse bias voltage of −1.0 V to the samples in a dark place. Supposing that the reference value of the shunt resistance being $4\times10^4$ 1 $cm^2$, the samples were checked for yield. Subsequently, as in Example D1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table D8 summarizes the results.

The evaluations mentioned above show the fact that CMP-D2-1 photovoltaic device is inferior to EMB-D2 photovoltaic device in yield and adhesion. This fact is attributed to the decrease of FF due to the decrease of the series resistance mainly depending on the adhesion. The evaluations mentioned above also show the fact that CMP-D2-2 and CMP-D2-3 photovoltaic devices are inferior to EMB-D2 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies following the respective degradation periods are mainly attributed to the decrease of the open circuit voltage (Voc).

As seen from the above, it can be concluded that the photovoltaic device (EMB-D2) according to the present invention has better characteristics and properties than the conventional photovoltaic devices (CMP-D2-1, CMP-D2-2, and CMP-D2-3).

Example D3

In this example, photovoltaic devices having a structure as shown in FIG. 1D were fabricated using the acid treatment technique for etching surfaces thereof and using a stainless-steel (SUS430-2D) plate as the substrate material.

A process for manufacturing photovoltaic devices will now be described.

(1) A surface of the plate (SUS430-2D) was etched using the acid solution indicated in Table D9 in the same manner as in Example D1. A part of the substrate after the etching treatment was left as it was for evaluations (Sample-EMB-D3-1). For other part of the substrate, an Al reflection layer was deposited on the surface thereof in the same manner as in Example D1 according to the requirements indicated in Table D9.

(3) After the Al reflection layer was completely deposited, a ZnO transparent conductive layer was deposited on the Al reflection layer of the substrate in the same manner as in Example D1 according to the requirements indicated in Table D9. A part of the substrate was left as it was for evaluations (Sample-EMB-D3-2).

(4) For other part of the substrate, a pin-type semiconductor layer, an $In_2O_3$ transparent electrode, and a collecting electrode were sequentially formed thereon by means of the CVD apparatus according to the requirements indicated in Table D9, and thus the fabrication of the photovoltaic device (EMB-D3) was completed.

Comparative Example D3-1

Comparative Example D3-1 differs from abovementioned Example D3 in that the mixed solution of hydrofluoric acid, nitric acid mixture, and acetic acid ($HF:HNO_3$ $H_2O:CH_3COOH$=1:3:3:500) is used for the surface treatment of the substrate.

Samples (Sample-CMP-D3-1, Sample-CMP-D3-5, and Sample-CMP-D3-9) and a photovoltaic device (CMP-D3-1) were fabricated in the same manner as in Example D3 except the requirement mentioned above.

Comparative Example D3-2

Comparative Example D3-2 differs from Example D3 in that the thickness of the reflection layer to be deposited is 3000 nm.

Samples (Sample-CMP-D3-2, Sample-CMP-D3-6 and Sample-CMP-D3-10) and a photovoltaic device (CMP-D3-1) were fabricated in the same manner as in Example D3 except the requirement mentioned above.

Comparative Example D3-3

Comparative Example D3-3 differs from Example D3 in that the substrate temperature to be kept during depositing the reflection layer onto the substrate is 150° C.

Samples (Sample-CMP-D3-3, Sample-CMP-D3-7, and Sample-CMP-D3-11) and a photovoltaic device (CMP-D3-3) were fabricated in the same manner as in Example D3 except the requirement mentioned above.

Comparative Example D3-4

Comparative Example D3-4 differs from Example D3 in that the duration of the acid treatment for the substrate surface is 90 minutes.

Samples (Sample-CMP-D3-4, Sample-CMP-D3-8, and Sample-CMP-D3-12) and a photovoltaic device (CMP-D3-4) were fabricated in the same manner as in Example D3 except the requirement mentioned above.

Evaluation results on Sample-EMB-D3-1, Sample-CMP-D3-1, Sample-CMP-D3-2, Sample-CMP-D3-3, and Sample-CMP-D3-4 which are the substrates prepared by processing in the same manner as in Example D1 until after the completion of the surface treatment will be described below. For each of the samples mentioned above, the surface configuration was observed as in Example D1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate was determined. After the reflection layer has been deposited, further observation for each of the substrates was performed using the scanning electron microscope to the precisely same position where the substrate has been observed before the deposition of the reflection layer, and the schematic shape of the cross section thereof (hereinafter referred to as "Schematic Surface Profile (Ref.) ") was determined.

Table D10 summarizes the results.

As in the case of Example D1, Sample-EMB-D3-1 had an area having asperities for each of the grains and a smooth area. There was a difference in Rmax between the asperity area and a smooth area. On the other hand, Sample-CMP-D1-l had generally smooth crystal grains and no difference in Rmax, and Sample-CMP-D1-2 and Sample-CMP-D1-3 had pyramidal-shaped asperities and no difference in Rmax.

Further, for each of Sample-EMB-D3-2, Sample-CMP-D3-6, Sample-CMP-D3-7, and Sample-CMP-D3-8 which are the substrates prepared by processing until after deposition of the transparent conductive layer, the size of the ZnO crystal grains were obtained, and the total reflectance and irregular reflectance were determined Table D11 summarizes the results.

As in the case of Example D1, Sample-EMB-D3-2 features large size ZnO crystal grains which form a transparent conductive layer, a high total reflectance, and a high irregular reflectance were obtained. On the other hand, Sample-CMP-D3-5 and Sample-CMP-D3-6 had small size grains and low irregular reflectance, and Sample-CMP-D3-7 and Sample-CMP-D3-8 had very low total reflectance and irregular reflectance.

Evaluation results on EMB-D3, CMP-D3-1, CMP-D3-2, CMP-D3-3, and CMP-D3-4 which are, as in the case of Example D4, photovoltaic devices fabricated according to abovementioned Example D3, Comparative Example D3-1, Comparative Example D3-2, Comparative Example D3-3, and Comparative Example D3-4 respectively, will be described below. First, 5 photovoltaic devices were prepared for each sample type, and each device was further divided into 25 sub-cells. After that, the samples were checked for yield. Subsequently, as in the case of Example D1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table D12 summarizes the results.

The evaluations mentioned above show the fact that CMP-D3-1 and CMP-D3-2 photovoltaic devices are inferior to EMB-D3 photovoltaic device in yield and adhesion.

Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-D3-3 and CMP-D3-4 photovoltaic devices are inferior to EMB-D3 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc).

As seen from the above, it can be concluded that the photovoltaic device (EMB-D3) according to the present invention has better characteristics and properties than the conventional photovoltaic devices (CMP-D3-1, CMP-D3-2, CMP-D3-3, and CMP-D3-4).

Example D4

In this example, photovoltaic devices having a structure as shown in FIG. 1D were fabricated using the acid treatment technique for etching surfaces thereof and using a stainless-steel (SUS430-2D) plate as the substrate material.

A process for manufacturing photovoltaic devices will now be described.

(1) A surface of the plate (SUS430-2D) was etched using the acid solution indicated in Table D13 in the same manner as in Example D3.

(2) A part of the substrate after the etching treatment was left as it was for evaluations (Sample-EMB-D4-1). For other part of the substrate, an Ag reflection layer was deposited on the surface thereof in the same manner as in Example D3 according to the requirements indicated in Table D13.

(3) After the Ag reflection layer was completely deposited, a ZnO transparent conductive layer was deposited on the Ag reflection layer of the substrate according to the requirements indicated in Table D13. A part of the substrate was left as it was for evaluations (Sample-EMB-D4-2).

(4) For other part of the substrate, a pin-type semiconductor layer, an $In_2 0_3$ transparent electrode, and a collecting electrode were sequentially formed thereon according to the requirements indicated in Table D13, as in the same manner in Example D3, and thus the fabrication of the photovoltaic device (EMB-D4) was completed.

Comparative Example D4-1

Comparative Example D4-1 differs from abovementioned Example D4 in that the thickness of the reflection layer to be deposited is 3000 nm.

Samples (Sample-CMP-D4-1 and Sample-CMP-D4-4) and a photovoltaic device (CMP-D4-1) were fabricated in the same manner as in Example D4 except the requirement mentioned above.

Comparative Example D4-2

Comparative Example D4-2 differs from Example D4 in that the substrate temperature to be kept during depositing the reflection layer onto the substrate is 300° C.

Samples (Sample-CMP-D4-2 and Sample-CMP-D4-5) and a photovoltaic device (CMP-D4-2) were fabricated in the same manner as in Example D4 except the requirement mentioned above.

Comparative Example D4-3

Comparative Example D4-3 differs from Example D4 in that the duration of the acid treatment for the substrate surface is 100 minutes.

Samples (Sample-CMP-D4-3 and Sample-CMP-D4-6) and a photovoltaic device (CMP-D4-3) were fabricated in the same manner as in Example D4 except the requirement mentioned above.

Evaluation results on Sample-EMB-D4-1, Sample-CMP-D4-1, Sample-CMP-D4-2, and Sample-CMP-D4-3 which are the substrates prepared by processing in the same manner as in Example D3 until after the completion of the surface treatment will be described below. For each of the samples mentioned above, the surface configuration was observed as in Example D1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate was determined. After the reflection layer has been deposited, further observation for each of the substrates was performed using the scanning electron microscope to the precisely same position where the substrate has been observed before the deposition of the transparent conductive layer, and the schematic shape of the cross section thereof (hereinafter referred to as "Schematic Surface Profile (Transp.)") was determined.

Table D14 summarizes the results.

As in the case of Example D1, Sample-EMB-D4-1 had an area having asperities for each of the grains and a smooth area. There was a difference in Rmax between the asperity area and a smooth area. On the other hand, Sample-CMP-D4-1 had generally smooth crystal grains and no difference in Rmax, and Sample-CMP-D4-2 and Sample-CMP-D4-3 had pyramidal-shaped asperities and no difference in Rmax.

Further, for each of Sample-EMB-D4-2, Sample-CMP-D4-4, Sample-CMP-D4-5, and Sample-CMP-D4-6 which are the substrates prepared as in the same manner in Example D3 by processing until after the deposition of the transparent conductive layer, the surface configuration was observed, and the size of the ZnO crystal grains, the total reflectance, and the irregular reflectance were determined Table D15 summarizes the results.

As in the case of Example D3, Sample-EMB-D4-2 features large size ZnO crystal grains which form a transparent conductive layer, a high total reflectance, and a high irregular reflectance. On the other hand, Sample-CMP-D4-4 had small size grains and low irregular reflectance, and Sample-CMP-D4-5 and Sample-CMP-D4-6 had very low total reflectance and irregular reflectance.

Evaluation results on EMB-D4, CMP-D4-1, CMP-D4-2, and CMP-D4-3 which are, as in the case Example D3, photovoltaic devices fabricated according to abovementioned Example D4, Comparative Example D4-1, Comparative Example D4-2, and Comparative Example D4-3, respectively, will be described below. First, 5 photovoltaic devices were prepared for each sample type, and each device was further divided into 25 sub-cells. After that, the samples were checked for yield. Subsequently, as in the case of Example D3, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table D16 summarizes the results.

The evaluations mentioned above show the fact that CMP-D4-1 photovoltaic device is inferior to EMB-D4 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-D4-2 and CMP-D4-3 photovoltaic devices are inferior to EMB-D4 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc). As seen from the above, it can be concluded that the photovoltaic device (EMB-D4) according to the present invention has better characteristics and properties than the conventional photovoltaic devices (CMP-D4-1, CMP-D4-2, and CMP-D4-3).

Example D5

In this example, photovoltaic devices having a structure as shown in FIG. 1D were fabricated using the acid treatment technique for etching surfaces thereof and using a stainless-steel (SUS430-BA) plate as the substrate material. A process for manufacturing photovoltaic devices will now be described.

(1) A surface of the plate (SUS430-BA) was etched using the acid solution indicated in Table D17 in the same manner as in Example D4.

(2) A part of the substrate after the etching treatment was left as it was for evaluations (Sample-EMB-D5-1). For other part of the substrate, a Cu reflection layer was deposited on the surface thereof in the same manner as in Example D4 according to the requirements indicated in Table D17.

(3) After the Cu reflection layer was completely deposited, a ZnO transparent conductive layer was deposited on the Cu reflection layer of the substrate according to the requirements indicated in Table D17. A part of the substrate was left as it was for evaluations (Sample-EMB-D5-2).

(4) For other part of the substrate, a pin-type semiconductor layer, an $In_2O_3$ transparent electrode, and a collecting electrode were sequentially formed thereon according to the requirements indicated in Table D17, as in the same manner in Example D4, and thus the fabrication of the photovoltaic device (EMB-D5) was completed.

Comparative Example-D5-1

Comparative Example D5-1 differs from abovementioned Example D5 in that the thickness of the reflection layer to be deposited is 2000 nm.

Samples (Sample-CMP-D5-1 and Sample-CMP-D5-4) and a photovoltaic device (CMP-D5-1) were fabricated in the same manner as in Example D5 except the requirement mentioned above.

Comparative Example D5-2

Comparative Example D5-2 differs from Example D5 in that the substrate temperature to be kept during depositing the reflection layer onto the substrate is 350° C.

Samples (Sample-CMP-D5-2 and Sample-CMP-D5-5) and a photovoltaic device (CMP-D5-2) were fabricated in the same manner as in Example D5 except the requirement mentioned above.

Comparative Example D5-3

Comparative Example D5-3 differs from Example D5 in that the thickness of the transparent conductive layer to be deposited is 10 μm.

Samples (Sample-CMP-D5-3 and Sample-CMP-D5-6) and a photovoltaic device (CMP-D5-3) were fabricated in the same manner as in Example D5 except the requirement mentioned above.

Evaluation results on Sample-EMB-D5-1, Sample-CMP-D5-1, Sample-CMP-D5-2, and Sample-CMP-D5-3 which are the substrates prepared in the same manner as Example D4 by processing until after the completion of the surface treatment will be described below. For each of the samples mentioned above, the surface configuration was observed as in Example D1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate (Schematic Surface Profile (Subst.))was determined. After the fabrication of the photovoltaic device, further observation for each of the substrates was performed using the scanning electron microscope to the precisely same position where the substrate has been observed before the fabrication of the photovoltaic device, and the schematic shape of the cross section thereof (hereinafter referred to as "Schematic Surface Profile (Photov.)") was determined.

Table D18 summarizes the results.

As seen from Table D18, Sample-EMB-D5-1 had an area having asperities for each of the grains and a smooth area. There was a difference in Rmax between the asperity area and a smooth area, the height differences on the etched substrate surface were reflected to the shape on the photovoltaic device as it was, and the surface of the semiconductor layer follows the difference in Rmax between the asperity area and the smooth area. On the other hand, Sample-CMP-D5-1 had generally smooth crystal grains and small Rmax (Difference), and Sample-CMP-D5-2 and Sample-CMP-D5-3 had pyramidal-shaped asperities and small Rmax (Difference).

Further, for each of Sample-EMB-D5-2, Sample-CMP-D5-4, Sample-CMP-D5-5, and Sample-CMP-D5-6 which are the substrates prepared as in the same manner in Example D4 by processing until after the deposition of the transparent conductive layer, the surface configuration was observed, and the size of the ZnO crystal grains, the total reflectance, and the irregular reflectance were determined Table D19 summarizes the results.

As in the case of Example D4, Sample-EMB-D5-2 features large size ZnO crystal grains which form a transparent conductive layer, a high total reflectance, and a high irregular reflectance. On the other hand, Sample-CMP-D5-4 had small size grains, and Sample-CMP-D5-5 and Sample-CMP-D5-6 had very low total reflectance and irregular reflectance.

Evaluation results on EMB-D5, CMP-D5-1, CMP-D5-2, and CMP-D5-3 which are, as in the case of Example D4, photovoltaic devices fabricated according to abovementioned Example D5, Comparative Example D5-1, Comparative Example D5-2, and Comparative Example D5-3, respectively, will be described below. First, 5 photovoltaic devices were prepared for each sample type, and each device was further divided into 25 sub-cells. After that, the samples were checked for yield. Subsequently, as in the case of Example D4, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table D20 summarizes the results.

The evaluations mentioned above show the fact that CMP-D5-1 and CMP-D5-3 photovoltaic devices are inferior to EMB-D5 photovoltaic device in yield and adhesion. Further, they are also inferior in photoelectric conversion efficiency following each of the degradation periods. These facts are attributed to the decrease of FF due to the decrease of the series resistance mainly depending on the adhesion. The evaluations mentioned above also show the fact that CMP-D5-2 photovoltaic device is inferior to EMB-D5 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies after respective degradation periods are mainly attributed to the decrease of the open circuit voltage (Voc). As seen from the above, it can be concluded that the photovoltaic device (EMB-D5) according to the present invention has better characteristics and properties than the conventional photovoltaic devices (CMP-D5-1, CMP-D5-2, and CMP-D5-3).

Example D6

In this example, solar cells having a pinpinpin structure as shown in FIG. 2B were fabricated by means of a deposition apparatus which uses the roll-to-roll method shown in FIG. 7.

A strip stainless-steel (SUS430BA) sheet having a length of 100 m, a width of 30 cm, and a thickness of 0.15 mm as a substrate material. The stainless-steel (SUS430BA) sheet was wrapped around a feed bobbin (not shown) in a vacuum vessel (not shown). Then the sheet was subjected to the RF plasma etching by Ar plasma with feeding the SUS430BA sheet by rotating a take-up bobbin to which one end of the sheet was connected.

A part of the etched substrate (Sample EMB-D6-1) was evaluated and the shape of the cross section thereof was inspected (hereinafter referred to as "Schematic Surface Profile (Subst.)") Subsequently, a AlSi reflection layer and a ZnO transparent electrode layer were formed on the substrate using the roll-to-roll method according to the requirements indicated in Table D21. A part of the substrate was then left as it was for evaluations (Sample-EMB-D6-2) and the shape of the cross section thereof (hereinafter referred to as "Schematic Surface Profile (Ref.)") was inspected. Other part of substrate are fabricated to photovoltaic devices (EMB-D6) by means of a CVD apparatus using the roll-to-roll method according to the requirements indicated in Table D21.

The operation of the deposition apparatus shown in FIG. 7 will now be described.

FIG. 7(*a*) is a schematic view of a continuous photovoltaic device manufacturing apparatus using the roll-to-roll method. In this apparatus, a substrate feed chamber 729, multiple deposition chambers 701 to 713, and a substrate take-up chamber 730 are disposed in order and interconnected by separation passages 714. Each deposition chamber has a vent through which the inside of the deposition chamber is evacuated.

A strip substrate 740 is wound up from the substrate feed chamber to the substrate take-up chamber through the deposition chambers and the separation passages. At the same time, a gas is introduced from a gas inlet of each respective deposition chamber or each separation passage, and exhausted from every vent. Thus respective layers can be formed on the substrate. Each deposition chamber has a halogen lamp inside thereof which heats the substrate from backside thereof. The halogen lamp is heated to a predetermined temperature in the corresponding deposition chamber.

FIG. 7(*b*) is a view of the deposition chambers 701 to 713 when looking from above. Each deposition chamber has a raw material gas inlet 715 and a vent 716, and an RF electrode 717 or a microwave applicator 718 is mounted in the chamber. A raw material gas supply apparatus (not shown) is connected to respective raw material gas inlets 715. On the other hand, to the respective vents of the deposition chambers, an evacuator (not shown) such as an oil diffusion pump and a mechanical booster pump are connected. Each of the separation passages 714 interposed between deposition chambers has an inlet 719 for introducing a scavenging gas, and introduces a scavenging gas as shown in the figure.

Each of the deposition chambers 703 and 707 for depositing a MW-i layer has a bias electrode 720 to which an RF power supply (not shown) is connected as a power supply. The substrate feed chamber contains a guide roll 721 and a guide roller 722 which gives proper tension to the substrate and always keep the substrate in a horizontal position, while the substrate take-up chamber contains a take-up roll 723 and a guide roller 724.

A process for manufacturing solar cells will now be described.

(1) First, the abovementioned stainless-steel (SUS430BA) sheet was wrapped around the feed roll 721 (at a mean radius of curvature of 30 cm), set in the substrate feed chamber 729, and connected to the substrate take-up roll 723 at one end after passing through all the deposition chambers.

(2) The entire apparatus was evacuated by means of the evacuator, every lamp heater of each of deposition chambers was turned on, and the temperature in each of the deposition chambers was controlled to be kept at a predetermined temperature.

(3) When the internal pressure of the entire apparatus reached to 1 mTorr or less, the scavenging gas is introduced via respective scavenging gas inlets 719 as shown in FIG. 7, and the substrate was taken up by the take-up roll while feeding the substrate in the direction of the arrow in FIG. 7.

(4) Respective raw material gases were properly introduced to the corresponding deposition chambers. At this time, the flow rate of each gas to be introduced into respective separation passages or the pressure in each of deposition chambers are adjusted so that a raw material gas introduced into the corresponding deposition chambers was not diffused to the other deposition chambers.

(5) Subsequently, plasmas are created by introducing the RF power or the MW power plus the RF bias power. Photovoltaic devices composed of the first, second and third pin-junctions were fabricated according to the requirements indicated in Table D21. As the first pin-junction, an n1-layer was deposited in the deposition chamber 701, an i1-layer was deposited in the deposition chambers 702, 703, and 704, and a p1-layer was deposited in the deposition chamber 705. As the second pin-junction, an n2-layer was deposited in the deposition chamber 706, an i2-layer was deposited in the deposition chambers 707, 708, and 709, and a p2-layer was deposited in the deposition chamber 710. As the third pin-junction, an n3-layer was deposited in the deposition chamber 711, an i3-layer was deposited in the deposition chamber 712, and a p3-layer was deposited in the deposition chamber 713.

(6) After the substrate was completely taken up, every MW power supply and RF power supply were turned off, all plasmas were killed, and all the raw material and scavenging gases were shut off. The entire system was released and the take-up roll was taken out from the chamber.

(7) Next, a transparent electrode 213 was formed on top of the three pin junction layers according to the requirements indicated in the Table D21.

(8) A carbon paste 5 μm thick by 0.5 mm wide was placed on the substrate by screen printing on the transparent electrode 213, a silver paste 10 μm thick by 0.5 mm wide was further placed on the carbon paste, and then a collecting electrode was formed on the silver paste. After that, the rolled solar cell was cut to 250 mm×100 mm.

Thus, the fabrication of the pinpinpin type solar cell (EMB-D6) using the roll-to-roll method was completed.

Comparative Example D6-1

Comparative Example D6-1 differs from above-mentioned Example D6 in that the duration of the RF sputtering is 15 seconds.

Samples (Sample-CMP-D6-1 and Sample-CMP-D6-4) and a photovoltaic device (CMP-D6-1) were fabricated in the same manner as in Example D1 except the requirement mentioned above.

Comparative Example D6-2

Comparative Example D6-2 differs from Example D6 in that the temperature to be kept during the surface treatment of the substrate is 300° C.

Samples (Sample-CMP-D6-2 and Sample-CMP-D6-5) and a photovoltaic device (CMP-D6-2) were fabricated in the same manner as in Example D6 except the requirement mentioned above.

Comparative Example D6-3

Comparative Example D6-3 differs from Example D6 in that the duration of the RF sputtering is 100 minutes.

Samples (Sample-CMP-D6-3 and Sample-CMP-D6-6) and a photovoltaic device (CMP-D6-3) were fabricated in the same manner as in Example D6 except the requirement mentioned above.

Now, evaluation results on Sample-EMB-D6, Sample-CMP-D6-1, Sample-CMP-D6-2, and Sample-CMP-D6-3 which are the substrates prepared by processing until after the completion of the surface treatment according to above-mentioned Example D1 will be described below. For each of the samples mentioned above, the surface configuration was observed as in Example D1. Further, the crystal grain size was determined, the difference in Rmax (hereinafter referred to as "Rmax (Difference)") was obtained from the surface roughness (maximum peak value, hereinafter referred to "Rmax"), and the schematic surface profile of the substrate (Schematic Surface Profile (Subst.))was determined.

Table D22 summarizes the results.

As seen from Table D22, Sample-EMB-D6-1 had an area having asperities for each of the grains and a smooth area. There was a difference in Rmax between the asperity area and a smooth area. On the other hand, Sample-CMP-D6-1 had generally smooth crystal grains and no difference in Rmax, and Sample-CMP-D6-2 and Sample-CMP-D6-3 had pyramidal-shaped asperities and no difference in Rmax.

Further, for each of Sample-EMB-D6-2, Sample-CMP-D6-4, Sample-CMP-D6-5, and Sample-CMP-D6-6 which are the substrates prepared by processing until after the deposition of a transparent conductive layer in the same manner as in Example D1, the surface configuration was observed, the size of the ZnO crystal grains was checked, and further a total reflectance and irregular reflectance were determined by means of a spectrophotometer with an integrating sphere.

Table D23 summarizes the results.

As in the case of Example D1, Sample-EMB-D6 features large size ZnO crystal grains which form a transparent conductive layer, a high total reflectance, and a high irregular reflectance as shown in Table D23. On the other hand, Sample-CMP-D6-4 had small size grains and low irregular reflectance, and Sample-CMP-D6-5 and Sample-CMP-D6-6 had very low total reflectance and irregular reflectance.

Evaluation results on EMB-D6, CMP-D6-1, CMP-D6-2, and CMP-D6-3 photovoltaic devices which have been fabricated in the same manner as in Example D5 according to above-mentioned Example D6, Comparative Example D6-1, Comparative Example D6-3, respectively, will be described below. First, 5 photovoltaic devices were prepared for each sample type, and the measurement of the shunt resistance was performed with applying a reverse bias voltage of −1.0 V to the samples in a dark place. Supposing that the reference value of the shunt resistance being $4\times10^4$ Ω $cm^2$, the samples were checked for yield. Subsequently, an adhesion test, a measurement of the initial photoelectric conversion efficiency (photoelectromotive force/incident photoelectric power), and evaluations of the optical degradation, the high-humidity/temperature reverse bias (HHRB) degradation, and the temperature/humidity degradation were performed in the same manner as in Example D1.

Table D24 summarizes the results.

The evaluations mentioned above show the fact that CMP-D6-1 photovoltaic device is inferior to EMB-D6 photovoltaic device in yield and adhesion. These facts are attributed to the decrease of FF due to the decrease of the series resistance depending on the adhesion. The evaluations mentioned above also show the fact that CMP-D6-2 and CMP-D6-3 photovoltaic devices are inferior to EMB-D6 photovoltaic device in initial photoelectric conversion efficiency and photoelectric conversion efficiency following each of the degradation period. The inferior initial photoelectric conversion efficiency is attributed to the decrease of a short-circuit current (Jsc) due to the decrease of the total reflectance and the irregular reflectance, while the inferior photoelectric conversion efficiencies after respective degradation are mainly attributed to the decrease of the open circuit voltage (Voc). As seen from the above, it can be concluded that the photovoltaic device (EMB-D6) according to the present invention has better characteristics and properties than the conventional photovoltaic devices (CMP-D6-1, CMP-D6-2, and CMP-D6-3).

Example D7

In this example, photovoltaic devices having a structure as shown in FIG. 1D were fabricated using an acid solution for etching surfaces thereof and using a mirror-finished stainless-steel (SUS304) plate as the substrate material.

A surface of the plate (SUS304) was etched using the acid solution indicated in Table D25 in the same manner as in Example D1. A part of the substrate after the etching treatment was left as it was for evaluations (Sample-EMB-D7-1). For other part of the substrate, a AlAg alloy reflection layer was deposited on the surface thereof in the same manner as in Example D1 according to the requirements indicated in Table D25. After the completion of the deposition of the AlAg alloy reflection layer, a ZnO transparent conductive layer was deposited on the reflection layer according to the requirements indicated in Table D25. A part of the substrate was left as it was for evaluations (Sample-EMB-D7-2). For other part of the substrate, a pin-type semiconductor layer, an $In_2O_3$ transparent electrode, and a collecting electrode were sequentially formed thereon according to the requirements indicated in Table D25, and thus the fabrication of the photovoltaic device (EMB-D7) was completed.

Subsequently, an n-layer of a-Si, an i-layer of poly-Si, and an p-layer of uc-Si were sequentially formed on the ZnO thin film layer using a multiple chamber separation type deposition apparatus (not shown). The forming process thereof will now be described.

(1) First, an n-layer of a-Si was deposited on the ZnO thin film layer using a similar apparatus to that used in Example D1.

(2) An i-layer of poly-Si was then deposited by means of a deposition apparatus (not shown) which uses the HRCVD method with a duplex tube (not shown) according to the same requirements as indicated in Table D25.

(3) Further, a p-layer of pc-Si was deposited on the i-layer by means of the similar apparatus to that used in Example D1 .

(4) After that, an $In_2O_3$ transparent electrode and a collecting electrode were formed thereon in the same manner as in Example D1 according to the requirements indicated in Table D25. Thus the fabrication of the photovoltaic device (EMB-D7) was completed.

Comparative Example D7-1

Comparative Example D7-1 differs from abovementioned Example D7 in that the duration of the acid treatment is 15 seconds.

Samples (Sample-CMP-D7-1 and Sample-CMP-D7-4) and a photovoltaic device (CMP-D7-1) were fabricated in the same manner as in Example D7 except the requirement mentioned above.

Comparative Example D7-2

Comparative Example D7-2 differs from Example D7 in that the temperature of the acid solution during the surface treatment of the substrate is 85° C.

Samples (Sample-CMP-D7-2 and Sample-CMP-D7-5) and a photovoltaic device (CMP-D7-1) were fabricated in the same manner as in Example D7 except the requirement mentioned above.

Comparative Example D7-3

Comparative Example D7-3 differs from Example D7 in that the duration of the acid treatment is 100 minutes.

Samples (Sample-CMP-D7-3 and Sample-CMP-D7-6) and a photovoltaic device (CMP-D7-3) were fabricated in the same manner as in Example D7 except the requirement mentioned above.

Evaluation results on Sample-EMB-D7-1, Sample-CMP-D 7-1, Sample-CMP-D7-2, and Sample-CMP-D7-3 which are the substrates prepared by processing until after the completion of the surface treatment in the same manner as in Example D1 will be described below. For each of the samples mentioned above, the surface configuration was observed, the difference in Rmax (hereinafter referred to as "Rmax (Difference)") was obtained from the surface roughness (maximum peak value, hereinafter referred to "Rmax"), and the schematic surface profile of the substrate was determined.

Table D26 summarizes the results.

As seen from Table D26, Sample-EMB-D7-1 had an area having asperities for each of the grains and a smooth area. There was a difference in Rmax between the asperity area and a smooth area. On the other hand, Sample-CMP-D7-1 had generally smooth crystal grains and no difference in Rmax, and Sample-CMP-D7-2 and Sample-CMP-D7-3 had pyramidal-shaped asperities and no difference in Rmax.

Further, for Sample-EMB-D7-2, Sample-CMP-D7-4, Sample-CMP-D7-5, and Sample-CMP-D7-6 which are the substrates prepared in the same manner as in Example D1 by processing until the deposition a transparent conductive layer, the surface configuration was observed, the size of the ZnO crystal grains was checked, and the total reflectance and irregular reflectance were determined.

Table D27 summarizes the results.

As in the case of Example D1, Sample-EMB-D7-1 features large size ZnO crystal grains which form a transparent conductive layer, a high total reflectance and a high irregular reflectance. On the other hand, Sample-CMP-D7-4 had small size grains and low irregular reflectance, and Sample-CMP-D7-5 and Sample-CMP-D7-6 had very low total reflectance and irregular reflectance.

Evaluation results on EMB-D7, CMP-D7-1, CMP-D7-2, and CMP-D7-3 which are photovoltaic devices fabricated in the same manner as in Example D1 according to abovementioned Example D7, Comparative Example D7-1, Comparative Example D7-3, respectively, will be described below. First, 5 photovoltaic devices were prepared for each sample type, and each device was further divided into 25 sub-cells, then the measurement of the shunt resistance was performed with applying a reverse bias voltage of −1.0 V to the samples in a dark place. Supposing that the reference value of the shunt resistance being $4\times10^4$ Ω $cm^2$, the samples were checked for yield. Subsequently, as in Example D1, an adhesion test and a measurement of the initial photoelectric conversion efficiency (photoelectromotive force/incident photoelectric power) were performed, then the optical degradation, the high-humidity/temperature reverse bias (HHRB) degradation, and the temperature/humidity degradation were evaluated.

Table D28 summarizes the results.

The evaluations mentioned above show the fact that CMP-D7-1 photovoltaic device is inferior to EMB-D7 photovoltaic device in yield and adhesion. This fact is attributed to the decrease of FF due to the decrease of the series resistance mainly depending on the adhesion. The evaluations mentioned above also show the fact that CMP-D7-2 and CMP-D7-3 photovoltaic devices are inferior to EMB-D7 photovoltaic device in initial photoelectric conversion efficiency and photoelectric conversion efficiency following each of the degradation periods. The inferior initial photoelectric conversion efficiency is attributed to the decrease of a short-circuit current (Jsc) due to the decrease of the total reflectance and the irregular reflectance, while the inferior photoelectric conversion efficiencies following the respective degradation periods are mainly attributed to the decrease of the open circuit voltage (Voc). As seen from the above, it can be concluded that the photovoltaic device (EMB-D7) according to the present invention has better characteristics and properties than the conventional photovoltaic devices (CMP-D7-1, CMP-D7-2, and CMP-D7-3).

Example D8

In this example, relationship between a mean size of polycrystalline grains and the Rmax (Difference) of a polycrystalline substrate was evaluated. In the same manner as in Example D1, photovoltaic devices were fabricated by using an acid solution for etching surfaces thereof and using stainless-steel (SUS430-BA, SUS430-2B, SUS430-2D, and mirror-finished SUS304) plates as the substrate material.

A surface of each plate was etched using the acid solution indicated in Table D29 in the same manner as in Example D1. A part of each of the substrate after the etching treatment was left as it was for evaluations (Sample-EMB-D8-1 to Sample-EMB-D8-81). For other part of the substrate, an AgAl alloy reflection layer was deposited on the surface thereof in the same manner as in Example D1 according to the requirements indicated in Table D29. After the AgAl alloy reflection layer was completely deposited, a ZnO transparent electrode layer was deposited on the reflection layer in the same manner as in Example D1 according to the requirements indicated in Table D29. A part of the substrate was left as it was for evaluations (Sample-EMB-D8-1 to Sample-EMB-D8-81). For other part of the substrate, a pin-type semiconductor layer, an $In_2O_3$ transparent electrode, and a collecting electrode were sequentially formed thereon according to the requirements indicated in Table D29, and thus the fabrication of the photovoltaic devices (EMB-D8-1 to EMB-D8-81) was completed.

For each of Sample-EMB-D8-1 to Sample-EMB-D8-81 which are the substrates prepared by processing in the same manner as in Example D1 until after the completion of the surface treatment, the surface configuration was observed, the crystal grain size, the difference (Rmax (Difference)) in surface roughness (Rmax), and the schematic surface profile thereof were inspected.

Table D30 summarizes the results.

Table D30 shows that the crystal grains size ranges from 0.05 μm to 3200 μm and the Rmax (Difference) ranges from 0 to 8.2 μm.

Next, for each of the substrates (Sample-EMB-D8-1 TO Sample-EMB-D8-81) which were prepared by processing in the same manner as in Example D1 until after deposition of the transparent conductive layer, the surface configuration was observed, the size of the ZnO crystal grains was checked, and the total reflectance and irregular reflectance were obtained. It follows from the resultant data that a crystal grain can grow to a favorable size when the height difference (Rmax) was at least 0.01 μm. On the other hand, regarding the total reflectance ratio and the irregular reflectance ratio, the height difference (Rmax) of 0.01 μm or less results in the low irregular reflectance, and the height difference exceeds 1.50 μm results in the low total reflectance.

It is found that large size ZnO crystal grains and superior total and irregular can be obtained if suitable etching conditions are selected (Sample-EMB-D8-21 to 24, 30 to 33, 39 to 42, and 48 to 51).

For the photovoltaic devices (EMB-D8-1 to EMB-D8-81), 5 sample devices were prepared for each as in Example D1, and each device was further divided into 25 sub-cells. For each of the photovoltaic devices, the yield was checked, and an adhesion test and the respective tests on the optical degradation, the high-humidity/temperature reverse bias (HHRB) degradation, and the temperature/humidity degradation were performed.

Table D31 to Table D34 summarize the results.

The evaluations mentioned above show the fact that the photovoltaic devices other EMB-D8-21 to 24, 30 to 33, 39 to 42, and 48 to 51 are inferior to the mentioned photovoltaic devices in yield and adhesion. The substrates in which each crystal grain size was less than 0.1 μm or the Rmax (Difference) was less than 0.01 μm were inferior in photoelectric conversion efficiency following each of the degradation periods. These facts are attributed to the decrease of FF due to the decrease of the series resistance mainly depending on the adhesion. On the other hand, the substrates having a crystal grain size larger than 3000 μm or Rmax (Subst.) larger than 1.50 μ,__ are inferior in photoelectric conversion efficiency following each of the degradation periods. It is mainly attributed to the decrease of a short-circuit current (Jsc).

As seen from the above, it can be concluded that the photovoltaic devices according to the present invention which feature the mean polycrystalline grain size of the polycrystalline substrate of 0.1 μm to 2 mm and the Rmax (Difference) of 0.01 μm to 1.5 μm have superior characteristics and properties.

Example D9

In this Example, the height difference of a polycrystalline substrate was evaluated. In the same manner as in Example D8, photovoltaic devices were fabricated by using an acid solution for etching surfaces thereof and using stainless-steel (SUS430-BA, SUS430-2B, SUS430-2D, and mirror-finished SUS304) plates as the substrate material.

A surface of each plate was etched using the acid solution indicated in Table D35 in the same manner as in Example D8. A part of each of the substrate after the etching treatment was used for evaluations. For other part of the substrate, an Al reflection layer was deposited on the surface thereof in the same manner as in Example D8 according to the requirements indicated in Table D35. After the Al reflection layer was completely deposited, a ZnO transparent electrode layer was deposited on the reflection layer in the same manner as in Example D8 according to the requirements indicated in Table D35. After that, in the same manner as in Example D3, a pin-type semiconductor layer, an $In_2O_3$ transparent electrode, and a collecting electrode were sequentially formed thereon according to the requirements indicated in Table D35, and thus the fabrication of the photovoltaic devices was completed.

For each of he substrates prepared by processing in the same manner as in Example D8 until after the completion of the surface treatment, the surface configuration was observed, and the substrates having a crystal grain size of about 6.0 μm and a Rmax (Difference) of about 0.2 μm were selected. Then the distribution of Rmax of the selected substrates were obtained.

As a result, it was found that the Rmax ranged from 0.005 to 3.5 μm.

In the same manner as in Example D8, photovoltaic devices were fabricated from these selected substrates. Then, for each of them, the yield was checked, and the adhesion test and the respective tests on the high-humidity/temperature reverse bias (HHRB) degradation and the temperature/humidity degradation were performed.

Table D36 to Table D39 summarize the results.

From the measurements, it was found that the substrates having an Rmax of 0.01 to 2.00 μm produced favorable results. However, the substrates having an Rmax of 0.01 μm or less result in low photoelectric conversion after the adhesion test. This is attributed to the decrease of FF due to the decrease of the series resistance mainly depending on the adhesion. On the other hand, the substrates having an Rmax of 2.00 μm or larger were not so inferior in yield and adhesion, but considerably inferior in photoelectric conversion efficiency following each of the other degradation tests. These are mainly attributed to the decrease of a short-circuit current (Jsc).

As seen from the above, it can be concluded that the photovoltaic devices according to the present invention which have a height difference of the polycrystalline substrate of 0.01 μm to 2μm have superior characteristics and properties.

TABLE A1

| | |
|---|---|
| Substrate | Stainless steel plate: SUS430BA<br>Thickness: 0.5 mm |
| Surface treatment | Hydrofluoric acid-nitric acid mixture<br>($HF:HNO_3:H_2O$ = 1:3:4)<br>Ultrasonic wave: For 1 minute |
| Backside metallic reflection layer | Al: 200 nm Substrate temp.: Room temperature |
| Transparent conductive layer | ZnO: 1 $\mu$m Substrate temp.: 200° C. |
| n-type layer | $SiH_4$: 1 sccm $H_2$: 50 sccm<br>$PH_3$ (diluted to 1% with $H_2$): 0.5 sccm<br>Pressure: 1.2 Torr RF power: 2 W<br>Substrate temp.: 350° C. Thickness: 40 nm |
| RF i-layer | $Si_2H_6$: 4 sccm $H_2$: 80 sccm Pressure: 0.5 Torr<br>RF power: 2 W Substrate temp.: 300° C.<br>Thickness: 10 nm |
| MW i-layer | $SiH_4$: 40 sccm $GeH_4$: 40 sccm $H_2$: 150 sccm<br>Pressure: 10 m Torr MW power: 250 W<br>RF bias power: 700 W<br>Substrate temp.: 380° C., Thickness: 70 nm |
| RF i-layer | $Si_2H_6$: 4 sccm $H_2$: 80 sccm Pressure: 0.5 Torr<br>RF power: 2 W Substrate temp.: 300° C.<br>Thickness: 20 nm |
| Hydrogen plasma treatment | $H_2$: 100 sccm Pressure: 0.5 Torr<br>RF power: 30 W Substrate temp.: 250° C. |
| p-type layer | $SiH_4$ (diluted to 10% with $H_2$): 0.25 sccm<br>$H_2$: 34 sccm<br>$BF_3$ (diluted to 2% with $H_2$): 2 sccm<br>Pressure: 2 Torr RF power: 30 W<br>Substrate temp.: 200° C. |
| Transparent electrode | $In_2O_3$ reactive evaporation method: 70 nm |
| Collecting electrode | Cr (100 nm)/Ag (1 $\mu$m)/Cr (100 nm) |

TABLE A2

| Sample No. | Grain size ($\mu$m) | Rmax (difference) ($\mu$m) | Surface profile (schematic view) |
|---|---|---|---|
| Sample EMB-A1-1 | 0.8 | 0.1 |  |
| Sample CMP-A1-1 | 0.7 | 0 | |
| Sample CMP-A1-2 | 0.7 | 15.0 |  |
| Sample CMP-A1-3 | 0.7 | 17.0 |  |

TABLE A3

| Sample No. | Mean grain size ratio | Total reflectance | Irregular reflectance |
|---|---|---|---|
| Sample EMB-A1-2 | 1.0 | 1.0 | 1.0 |
| Sample CMP-A1-4 | 0.85 | 0.98 | 0.80 |
| Sample CMP-A1-5 | 0.90 | 0.71 | 0.70 |
| Sample CMP-A1-6 | 0.91 | 0.65 | 0.64 |

TABLE A4

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-A1 | 1.0 | 1.0 | 1.0 | 1.0 | 1.0 | 1.0 |
| CMP-A1-1 | 0.88 | 0.86 | 0.94 | 0.90 | 0.85 | 0.88 |
| CMP-A1-2 | 0.92 | 0.90 | 0.86 | 0.83 | 0.90 | 0.91 |
| CMP-A1-3 | 0.90 | 0.91 | 0.82 | 0.81 | 0.90 | 0.92 |

TABLE A5

| | |
|---|---|
| Substrate | Stainless steel plate: SUS430-2B<br>Thickness: 0.5 mm |
| Surface treatment | RF sputtering<br>RF 400 W: For 10 minutes<br>Substrate temp.: Room temperature |
| Reflection layer | Al: 100 nm Substrate temp.: Room temperature |
| Transparent conductive layer | ZnO: 1 $\mu$m Substrate temp.: 300° C. |
| n-type layer | $SiH_4$: 1 sccm $H_2$: 50 sccm<br>$PH_3$ (diluted to 1% with $H_2$): 0.5 sccm<br>Pressure: 1.2 Torr RF power: 2 W<br>Substrate temp.: 350° C.<br>Thickness: 40 nm |
| RF i-layer | $Si_2H_6$: 4 sccm $H_2$: 80 sccm Pressure: 0.5 Torr<br>RF power: 2 W Substrate temp.: 300° C.<br>Thickness: 10 nm |
| MW i-layer | $SiH_4$: 40 sccm $GeH_4$: 40 sccm $H_2$: 150 sccm<br>Pressure: 10 m Torr MW power: 250 W<br>RF bias power: 700 W<br>Substrate temp.: 380° C. Thickness: 70 nm |
| RF i-layer | $Si_2H_6$: 4 sccm $H_2$: 80 sccm Pressure: 0.5 Torr<br>RF power: 2 W Substrate temp.: 300° C.<br>Thickness: 20 nm |
| Hydrogen plasma treatment | $H_2$: 100 sccm Pressure: 0.5 Torr RF power: 30 W<br>Substrate temp.: 250° C. |
| p-type layer | $SiH_4$ (diluted to 10% with $H_2$): 0.25 sccm<br>$H_2$: 34 sccm<br>$BF_3$ (diluted to 2% with $H_2$): 2 sccm<br>Pressure: 2 Torr RF power: 30 W<br>Substrate temp.: 200° C. |
| Transparent electrode | $In_2O_3$ reactive evaporation method: 70 nm |
| Collecting electrode | Cr (100 nm)/Ag (1 $\mu$m)/Cr (100 nm) |

TABLE A6

| Sample No. | Grain size ($\mu$m) | Rmax (difference) ($\mu$m) | Surface profile (schematic view) |
|---|---|---|---|
| Sample EMB-A2-1 | 5.0 | 0.3 |  |
| Sample CMP-A2-1 | 5.0 | 0 | |

TABLE A6-continued

| Sample No. | Grain size ($\mu$m) | Rmax (difference) ($\mu$m) | Surface profile (schematic view) |
|---|---|---|---|
| Sample CMP-A2-2 | 3.5 | 6.0 |  |
| Sample CMP-A2-3 | 4.6 | 9.5 |  |

TABLE A7

| Sample No. | Mean grain size ratio | Total reflectance | Irregular reflectance |
|---|---|---|---|
| Sample EMB-A2-2 | 1.0 | 1.0 | 1.0 |
| Sample CMP-A2-4 | 0.87 | 0.97 | 0.78 |
| Sample CMP-A2-5 | 0.90 | 0.85 | 0.81 |
| Sample CMP-A2-6 | 0.92 | 0.81 | 0.79 |

TABLE A8

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-A2 | 1.0 | 1.0 | 1.0 | 1.0 | 1.0 | 1.0 |
| CMP-A2-1 | 0.90 | 0.87 | 0.93 | 0.91 | 0.84 | 0.86 |
| CMP-A2-2 | 0.92 | 0.91 | 0.88 | 0.85 | 0.89 | 0.89 |
| CMP-A2-3 | 0.94 | 0.91 | 0.86 | 0.84 | 0.87 | 0.91 |

TABLE A9

| | |
|---|---|
| Substrate | Stainless steel plate: SUS430-2B Thickness: 0.5 mm |
| Surface treatment | Hydrofluoric acid-nitric acid-acetic acid mixture ($HF:HNO_3:H_2O:CH_3COOH$ = 1:3:3:50) Stirring with magnetic stirrer: For 10 minutes |
| Reflection layer | Al: 100 nm Substrate temp.: Room temperature |
| Transparent | ZnO: 1 $\mu$m Substrate temp.: 300° C. |

TABLE A9-continued

| | |
|---|---|
| conductive layer | |
| n-type layer | $SiH_4$: 1 sccm $H_2$: 50 sccm $PH_3$ (diluted to 1% with $H_2$): 0.5 sccm Pressure: 1.2 Torr RF power: 2 W Substrate temp.: 350° C. Thickness: 40 nm |
| Rf i-layer | $Si_2H_6$: 4 sccm $H_2$: 80 sccm Pressure: 0.5 Torr RF power: 2 W Substrate temp.: 300° C. Thickness: 10 nm |
| MW i-layer | $SiH_4$: 38 sccm $GeH_4$: 42 sccm $H_2$: 220 sccm Pressure: 15 m Torr MW power: 220 W RF bias power: 800 W Substrate temp.: 380° C. Thickness: 70 nm |
| RF i-layer | $Si_2H_6$: 4 sccm $H_2$: 80 sccm Pressure: 0.5 Torr RF power: 2 W Substrate temp.: 300° C. Thickness: 20 nm |
| Hydrogen plasma treatment | $H_2$: 100 sccm Pressure: 0.5 Torr RF power: 40 W Substrate temp.: 250° C. |
| p-type layer | $SiH_4$ (diluted to 10% with $H_2$): 0.25 sccm $H_2$: 34 sccm $BF_3$ (diluted to 2% with $H_2$): 2 sccm Pressure: 2 Torr RF power: 40 W Substrate temp.: 200° C. |

TABLE A9-continued

| | |
|---|---|
| Transparent electrode | $In_2O_3$ reactive evaporation method: 70 nm |
| Collecting electrode | Cr (100 nm)/Ag (1 $\mu$m)/Cr (100 nm) |

TABLE A10

| Sample No. | Grain size ($\mu$m) | Rmax (difference) ($\mu$m) | Surface profile (Subst.) (schematic view) | Surface profile (Ref.) (schematic view) |
|---|---|---|---|---|
| Sample EMB-A3-1 | 5.0 | 0.5 |  |  |
| Sample CMP-A3-1 | 5.0 | 0 | | |
| Sample CMP-A3-2 | 5.2 | 0.5 |  | |
| Sample CMP-A3-3 | 5.2 | 0.45 |  |  |
| Sample CMP-A3-4 | 0.8 | 5.5 |  |  |

TABLE A11

| Sample No. | Mean grain size ratio | Total reflectance | Irregular reflectance |
|---|---|---|---|
| Sample EMB-A3-2 | 1.0 | 1.0 | 1.0 |
| Sample CMP-A3-5 | 0.87 | 0.96 | 0.77 |
| Sample CMP-A3-6 | 0.89 | 0.95 | 0.79 |
| Sample CMP-A3-7 | 0.93 | 0.86 | 0.80 |
| Sample CMP-A3-8 | 0.93 | 0.88 | 0.81 |

TABLE A12

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-A3 | 1.0 | 1.0 | 1.0 | 1.0 | 1.0 | 1.0 |
| CMP-A3-1 | 0.91 | 0.88 | 0.94 | 0.91 | 0.85 | 0.87 |
| CMP-A3-2 | 0.91 | 0.89 | 0.90 | 0.92 | 0.88 | 0.88 |
| CMP-A3-3 | 0.94 | 0.92 | 0.89 | 0.83 | 0.90 | 0.90 |
| CMP-A3-4 | 0.95 | 0.92 | 0.89 | 0.85 | 0.90 | 0.90 |

TABLE A13

| | |
|---|---|
| Substrate | Stainless steel plate: SUS430-2B<br>Thickness: 0.5 mm |
| Surface treatment | Hydrochloric acid-nitric acid mixture<br>($HCl:HNO_3:H_2O$ = 1:1:100)<br>Stirring with magnetic stirrer: For 10 minutes |
| Reflection layer | Ag: 200 nm<br>Substrate temp.: Room temperature |
| Transparent conductive layer | ZnO: 1 μm Substrate temp.: 280° C. |

TABLE A14

| Sample No. | Grain size (μm) | Rmax (difference) (μm) | Surface profile (Subst.) (schematic view) | Surface profile (Transp.) (schematic view) |
|---|---|---|---|---|
| Sample EMB-A4-1 | 5.0 | 0.3 |  |  |
| Sample CMP-A4-1 | 5.1 | 0 |  |  |
| Sample CMP-A4-2 | 5.1 | 0.4 |  |  |
| Sample CMP-A4-3 | 3.9 | 9.5 |  |  |

TABLE A15

| Sample No. | Mean grain size ratio | Total reflectance | Irregular reflectance |
|---|---|---|---|
| Sample EMB-A4-2 | 1.0 | 1.0 | 1.0 |
| Sample CMP-A4-4 | 0.87 | 0.97 | 0.78 |
| Sample CMP-A4-5 | 0.90 | 0.85 | 0.81 |
| Sample CMP-A4-6 | 0.92 | 0.81 | 0.79 |

TABLE A16

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-A4 | 1.0 | 1.0 | 1.0 | 1.0 | 1.0 | 1.0 |
| CMP-A4-1 | 0.90 | 0.87 | 0.93 | 0.91 | 0.84 | 0.86 |
| CMP-A4-2 | 0.92 | 0.91 | 0.88 | 0.85 | 0.89 | 0.89 |
| CMP-A4-3 | 0.94 | 0.91 | 0.86 | 0.84 | 0.87 | 0.91 |

TABLE A17

| | |
|---|---|
| Substrate | Stainless steel plate: SUS430-BA<br>Thickness: 0.15 mm |
| Surface treatment | Hydrofluoric acid-nitric acid mixture<br>($HF:HNO_3:H_2O$ = 1:3:50)<br>Stirring with magnetic stirrer: For 1 minute |
| Reflection layer | Cu: 200 nm Substrate temp.: Room temperature |
| Transparent conductive layer | ZnO: 1 μm Substrate temp.: 175° C. |

TABLE A21

| | |
|---|---|
| Substrate | Stainless steel sheet: SUS430-BA<br>Thickness: 0.15 mm |
| Surface treatment | RF sputtering<br>RF 400 W: For 10 minutes<br>Substrate temp.: Room temperature |
| Reflection layer | AlSi: 100 nm<br>Substrate temp.: Room temperature |
| Transparent conductive layer | ZnO: 0.75 μm Substrate temp.: 280° C. |
| n1-layer | a-Si Thickness: 20 nm |

TABLE A18

| Sample No. | Grain size (μm) | Rmax (difference) (μm) | Surface profile (Subst.) (schematic view) | Surface profile (Transp.) (schematic view) |
|---|---|---|---|---|
| Sample EMB-A5-1 | 5.6 | 0.45 |  |  |
| Sample CMP-A5-1 | 5.5 | 0.35 |  |  |
| Sample CMP-A5-2 | 5.5 | 0.40 |  |  |
| Sample CMP-A5-3 | 5.3 | 0.38 |  |  |

TABLE A19

| Sample No. | Mean grain size ratio | Total reflectance | Irregular reflectance |
|---|---|---|---|
| Sample EMB-A5-2 | 1.0 | 1.0 | 1.0 |
| Sample CMP-A5-4 | 0.87 | 0.97 | 0.78 |
| Sample CMP-A5-5 | 0.90 | 0.85 | 0.81 |
| Sample CMP-A5-6 | 0.92 | 0.81 | 0.79 |

TABLE A21-continued

| | |
|---|---|
| RFi1-layer | a-Si Thickness: 10 nm |
| MWi1-layer | a-SiGe Thickness: 60 nm |
| RFi1-layer | a-Si Thickness: 18 nm |
| p1-layer | μc-Si Thickness: 15 nm |
| n2-layer | a-Si Thickness: 10 nm |
| RFi2-layer | a-Si Thickness: 10 nm |
| MWi2-layer | a-SiGe Thickness: 50 nm |
| RFi2-layer | a-Si Thickness: 18 nm |

TABLE A20

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-A5 | 1.0 | 1.0 | 1.0 | 1.0 | 1.0 | 1.0 |
| CMP-A5-1 | 0.90 | 0.87 | 0.93 | 0.91 | 0.84 | 0.86 |
| CMP-A5-2 | 0.92 | 0.91 | 0.88 | 0.85 | 0.89 | 0.89 |
| CMP-A5-3 | 0.94 | 0.91 | 0.86 | 0.84 | 0.87 | 0.91 |

TABLE A21-continued

| | |
|---|---|
| p2-layer | $\mu$c-Si Thickness: 15 nm |
| n3-layer | a-Si Thickness: 10 nm |
| RFi3-layer | a-Si Thickness: 90 nm |
| p3-layer | $\mu$c-Si Thickness: 20 nm |
| Transparent electrode | ITO Thickness: 75 nm |
| Collecting electrode | Ag paste Thickness: 10 $\mu$m |

TABLE A22

| Sample No. | Grain size ($\mu$m) | Rmax (difference) ($\mu$m) | Surface profile (Subst.) (schematic view) |
|---|---|---|---|
| Sample EMB-A6-1 | 8.0 | 0.4 |  |
| Sample CMP-A6-1 | 1.0 | 0 | |
| Sample CMP-A6-2 | 5.5 | 0.4 |  |
| Sample CMP-A6-3 | 2.5 | 7.2 |  |

TABLE A23

| Sample No. | Mean grain size ratio | Total reflectance | Irregular reflectance |
|---|---|---|---|
| Sample EMB-A6-2 | 1.0 | 1.0 | 1.0 |
| Sample CMP-A6-4 | 0.85 | 0.96 | 0.77 |
| Sample CMP-A6-5 | 0.92 | 0.86 | 0.81 |
| Sample CMP-A6-6 | 0.95 | 0.85 | 0.80 |

TABLE A24

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-A6 | 1.0 | 1.0 | 1.0 | 1.0 | 1.0 | 1.0 |
| CMP-A6-1 | 0.93 | 0.83 | 0.93 | 0.90 | 0.82 | 0.80 |
| CMP-A6-2 | 0.92 | 0.89 | 0.90 | 0.88 | 0.90 | 0.88 |
| CMP-A6-3 | 0.94 | 0.92 | 0.89 | 0.87 | 0.89 | 0.90 |

TABLE A25

| | |
|---|---|
| Substrate | Mirror finished stainless steel plate: SUS304 Thickness: 0.3 mm |
| Surface treatment | Hydrofluoric acid ($HF:H_2O$ = 1:10) Ultrasonic wave: For 5 minutes |
| Backside metallic reflection layer | CuAl: 200 nm Substrate temp.: Room temperature |
| Transparent conductive layer | ZnO: 1 $\mu$m Substrate temp.: 150° C. |

TABLE A25-continued

| | |
|---|---|
| $n_+$-type layer | $SiH_4$: 1 sccm $H_2$: 50 sccm $PH_3$ (diluted to 1% with $H_2$): 3 sccm Pressure: 1.2 Torr RF power: 2 W Substrate temp.: 300° C. |
| Polycrystalline i-layer | $SiF_4$: 100 sccm $H_2$: 20 sccm Ar: 100 sccm Pressure: 0.5 Torr MW power: 600 W Substrate temp.: 300° C. |
| p-type layer | $SiH_4$ (diluted to 10% with $H_2$): 0.5 sccm $H_2$: 80 sccm $BF_3$ (diluted to 2% with $H_2$): 4 sccm Pressure: 2 Torr RF power: 50 W Substrate temp.: 150° C. |
| Transparent electrode | $In_2O_3$ reactive evaporation method: 70 nm |
| Collecting electrode | Cr (100 nm)/Ag (1 $\mu$m)/Cr (100 nm) |

TABLE A26

| Sample No. | Grain size ($\mu$m) | Rmax (difference) ($\mu$m) | Surface profile (Subst.) (schematic view) |
|---|---|---|---|
| Sample EMB-A7-1 | 5.8 | 0.4 |  |
| Sample CMP-A7-1 | 2.0 | 0 | |
| Sample CMP-A7-2 | 5.6 | 0.5 |  |
| Sample CMP-A7-3 | 3.0 | 9.5 |  |

TABLE A27

| Sample No. | Mean grain size ratio | Total reflectance | Irregular reflectance |
|---|---|---|---|
| Sample EMB-A7-2 | 1.0 | 1.0 | 1.0 |
| Sample CMP-A7-4 | 0.82 | 0.98 | 0.75 |
| Sample CMP-A7-5 | 0.92 | 0.82 | 0.80 |
| Sample CMP-A7-6 | 0.95 | 0.79 | 0.78 |

TABLE A28

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-A7 | 1.0 | 1.0 | 1.0 | 1.0 | 1.0 | 1.0 |
| CMP-A7-1 | 0.92 | 0.82 | 0.92 | 0.92 | 0.85 | 0.87 |
| CMP-A7-2 | 0.93 | 0.92 | 0.89 | 0.88 | 0.88 | 0.88 |
| CMP-A7-3 | 0.94 | 0.93 | 0.88 | 0.88 | 0.86 | 0.90 |

TABLE A29

| | |
|---|---|
| Substrate | Stainless steel plate |
| Surface treatment | Hydrofluoric acid-nitric acid mixture<br>($HF:HNO_3:H_2O$ = 1:3:3 to 1:4:100<br>Using ultrasonic wave or magnetic stirrer)<br>Hydrochloric acid-nitric acid mixture<br>($HCl:HNO_3:H_2O$ = 1:5:10 to 1:20:100<br>Using ultrasonic wave or magnetic stirrer)<br>Hydrofluoric acid-nitric acid-acetic acid mixture<br>($HF:HNO_3:H_2O:CH_3COOH$ = 1:3:3:1 to 1:5:5:50<br>Using ultrasonic wave or magnetic stirrer)<br>Hydrofluoric acid<br>($HF:H_2O$ = 1:1–100<br>Using ultrasonic wave or magnetic stirrer) |
| Backside metallic reflection layer | AgAl: 300 nm Substrate temp.: Room temperature |
| Transparent conductive layer | ZnO: 1 μm Substrate temp.: 150° C. |

TABLE A30

| | | Grain size (μm) | | | | | | | | |
|---|---|---|---|---|---|---|---|---|---|---|
| | | 0.05 | 0.08 | 0.10 | 2.00 | 100 | 2000 | 2100 | 2500 | 3000 |
| Hight difference (μm) | 0 | EMB-A8-1 | EMB-A8-2 | EMB-A8-3 | EMB-A8-4 | EMB-A8-5 | EMB-A8-6 | EMB-A8-7 | EMB-A8-8 | EMB-A8-9 |
| | 0.008 | EMB-A8-10 | EMB-A8-11 | EMB-A8-12 | EMB-A8-13 | EMB-A8-14 | EMB-A8-15 | EMB-A8-16 | EMB-A8-17 | EMB-A8-18 |
| | 0.01 | EMB-A8-19 | EMB-A8-20 | EMB-A8-21 | EMB-A8-22 | EMB-A8-23 | EMB-A8-24 | EMB-A8-25 | EMB-A8-26 | EMB-A8-27 |
| | 0.10 | EMB-A8-28 | EMB-A8-29 | EMB-A8-30 | EMB-A8-31 | EMB-A8-32 | EMB-A8-33 | EMB-A8-34 | EMB-A8-35 | EMB-A8-36 |
| | 0.50 | EMB-A8-37 | EMB-A8-38 | EMB-A8-39 | EMB-A8-40 | EMB-A8-41 | EMB-A8-42 | EMB-A8-43 | EMB-A8-44 | EMB-A8-45 |
| | 2.00 | EMB-A8-46 | EMB-A8-47 | EMB-A8-48 | EMB-A8-49 | EMB-A8-50 | EMB-A8-51 | EMB-A8-52 | EMB-A8-53 | EMB-A8-54 |
| | 2.50 | EMB-A8-55 | EMB-A8-56 | EMB-A8-57 | EMB-A8-58 | EMB-A8-59 | EMB-A8-60 | EMB-A8-61 | EMB-A8-62 | EMB-A8-63 |
| | 5.00 | EMB-A8-64 | EMB-A8-65 | EMB-A8-66 | EMB-A8-67 | EMB-A8-68 | EMB-A8-69 | EMB-A8-70 | EMB-A8-71 | EMB-A8-72 |
| | 7.00 | EMB-A8-73 | EMB-A8-74 | EMB-A8-75 | EMB-A8-76 | EMB-A8-77 | EMB-A8-78 | EMB-A8-79 | EMB-A8-80 | EMB-A8-81 |

TABLE A31

| | | Grain size (μm) | | | | | | | | |
|---|---|---|---|---|---|---|---|---|---|---|
| Yield | | 0.05 | 0.08 | 0.10 | 2.00 | 100 | 2000 | 2100 | 2500 | 3000 |
| Hight difference (μm) | 0 | 0.92 | 0.9 | 0.93 | 0.94 | 0.94 | 0.95 | 0.94 | 0.93 | 0.92 |
| | 0.008 | 0.96 | 0.95 | 0.95 | 0.95 | 0.96 | 0.95 | 0.95 | 0.95 | 0.92 |
| | 0.01 | 0.97 | 0.96 | 1.0 | 1.0 | 1.03 | 1.04 | 0.9 | 0.97 | 0.97 |
| | 0.10 | 0.98 | 0.97 | 1.0 | 1.0 | 1.01 | 1.04 | 0.95 | 0.96 | 0.97 |
| | 0.50 | 0.97 | 0.98 | 1.0 | 1.01 | 1.02 | 1.03 | 0.95 | 0.95 | 0.97 |
| | 2.00 | 0.9 | 0.98 | 1.0 | 1.01 | 1.01 | 1.02 | 0.95 | 0.96 | 0.96 |
| | 2.50 | 0.94 | 0.92 | 0.95 | 0.92 | 0.94 | 0.95 | 0.94 | 0.93 | 0.92 |
| | 5.00 | 0.88 | 0.89 | 0.90 | 0.89 | 0.92 | 0.91 | 0.92 | 0.90 | 0.89 |
| | 7.00 | 0.87 | 0.85 | 0.88 | 0.87 | 0.88 | 0.89 | 0.86 | 0.84 | 0.85 |

TABLE A32

| Adhesion test | | Grain size (μm) 0.05 | 0.08 | 0.10 | 2.00 | 100 | 2000 | 2100 | 2500 | 3000 |
|---|---|---|---|---|---|---|---|---|---|---|
| Hight | 0 | 0.84 | 0.86 | 0.88 | 0.89 | 0.88 | 0.86 | 0.85 | 0.84 | 0.86 |
| difference | 0.008 | 0.86 | 0.85 | 0.84 | 0.83 | 0.82 | 0.83 | 0.84 | 0.82 | 0.85 |
| (μm) | 0.01 | 0.90 | 0.90 | 1.00 | 1.02 | 1.02 | 1.02 | 0.96 | 0.93 | 0.92 |
| | 0.10 | 0.92 | 0.92 | 1.04 | 1.03 | 1.02 | 1.02 | 0.96 | 0.92 | 0.94 |
| | 0.50 | 0.91 | 0.90 | 1.03 | 1.03 | 1.02 | 1.00 | 0.96 | 0.96 | 0.95 |
| | 2.00 | 0.92 | 0.92 | 1.04 | 1.04 | 1.03 | 1.04 | 0.95 | 0.94 | 0.92 |
| | 2.50 | 0.93 | 0.93 | 0.95 | 0.96 | 0.95 | 0.95 | 0.95 | 0.96 | 0.96 |
| | 5.00 | 0.94 | 0.93 | 0.94 | 0.96 | 0.94 | 0.95 | 0.96 | 0.96 | 0.95 |
| | 7.00 | 0.93 | 0.94 | 0.95 | 0.94 | 0.95 | 0.95 | 0.95 | 0.96 | 0.94 |

TABLE A33

| HHRB degradation | | Grain size (μm) 0.05 | 0.08 | 0.10 | 2.00 | 100 | 2000 | 2100 | 2500 | 3000 |
|---|---|---|---|---|---|---|---|---|---|---|
| Hight | 0 | 0.80 | 0.82 | 0.83 | 0.84 | 0.83 | 0.83 | 0.81 | 0.82 | 0.83 |
| difference | 0.008 | 0.84 | 0.85 | 0.84 | 0.85 | 0.86 | 0.84 | 0.85 | 0.86 | 0.84 |
| (μm) | 0.01 | 0.84 | 0.86 | 1.00 | 1.02 | 1.03 | 1.03 | 0.85 | 0.83 | 0.82 |
| | 0.10 | 0.84 | 0.86 | 1.02 | 1.03 | 1.02 | 1.01 | 0.92 | 0.90 | 0.88 |
| | 0.50 | 0.86 | 0.88 | 1.03 | 1.02 | 1.03 | 1.00 | 0.89 | 0.92 | 0.93 |
| | 2.00 | 0.87 | 0.89 | 1.04 | 1.03 | 1.03 | 1.03 | 0.92 | 0.9 | 0.92 |
| | 2.50 | 0.88 | 0.90 | 0.92 | 0.92 | 0.91 | 0.91 | 0.89 | 0.89 | 0.90 |
| | 5.00 | 0.90 | 0.91 | 0.89 | 0.91 | 0.90 | 0.92 | 0.93 | 0.90 | 0.91 |
| | 7.00 | 0.89 | 0.92 | 0.91 | 0.90 | 0.91 | 0.91 | 0.91 | 0.92 | 0.91 |

TABLE A34

| Temperature and humidity degradation | | Grain size (μm) 0.05 | 0.08 | 0.10 | 2.00 | 100 | 2000 | 2100 | 2500 | 3000 |
|---|---|---|---|---|---|---|---|---|---|---|
| Rmax | 0 | 0.87 | 0.88 | 0.89 | 0.90 | 0.91 | 0.89 | 0.89 | 0.90 | 0.91 |
| (Difference) | 0.008 | 0.90 | 0.91 | 0.90 | 0.89 | 0.88 | 0.89 | 0.88 | 0.87 | 0.88 |
| (μm) | 0.01 | 0.89 | 0.90 | 1.00 | 1.01 | 1.02 | 1.01 | 0.93 | 0.94 | 0.95 |
| | 0.10 | 0.92 | 0.91 | 1.01 | 1.02 | 1.00 | 1.02 | 0.94 | 0.96 | 0.94 |
| | 0.50 | 0.92 | 0.92 | 1.02 | 1.02 | 1.01 | 1.02 | 0.95 | 0.96 | 0.96 |
| | 2.00 | 0.91 | 0.92 | 1.01 | 1.01 | 1.02 | 1.03 | 0.94 | 0.94 | 0.96 |
| | 2.50 | 0.92 | 0.91 | 0.90 | 0.92 | 0.93 | 0.92 | 0.91 | 0.92 | 0.93 |
| | 5.00 | 0.89 | 0.90 | 0.89 | 0.90 | 0.91 | 0.92 | 0.91 | 0.93 | 0.94 |
| | 7.00 | 0.92 | 0.91 | 0.93 | 0.94 | 0.91 | 0.93 | 0.90 | 0.92 | 0.92 |

TABLE B1

| | |
|---|---|
| Substrate | Stainless steel plate: SUS430BA Thickness: 0.2 mm |
| Surface treatment | Hydrofluoric acid-nitric acid mixture ($HF:HNO_3:H_2O$ = 1:3:200) Stirring with magnetic stirrer: For 5 minute |
| Backside metallic reflection layer | Al: 300 nm Substrate temp.: Room temperature |
| Transparent conductive layer | ZnO: 1 μm Substrate temp.: 200° C. |
| n-type layer | $SiH_4$: 1 sccm $H_2$: 50 sccm $PH_3$ (diluted to 1% with $H_2$): 0.5 sccm Pressure: 1.2 Torr RF power: 2 W Substrate temp.: 350° C. Thickness: 40 nm |
| RF i-layer | $Si_2H_6$: 4 sccm $H_2$: 80 sccm Pressure: 0.5 Torr RF power: 2 W Substrate temp.: 300° C. Thickness: 10 nm |

TABLE B1-continued

| | |
|---|---|
| MW i-layer | $SiH_4$: 40 sccm $GeH_4$: 40 sccm $H_2$: 150 sccm Pressure: 10 m Torr MW power: 250 W RF bias power: 700 W Substrate temp.: 380° C. Thickness: 70 nm |
| RF i-layer | $Si_2H_6$: 4 sccm $H_2$: 80 sccm Pressure: 0.5 Torr RF power: 2 W Substrate temp.: 300° C. Thickness: 20 nm |
| Hydrogen plasma treatment | $H_2$: 100 sccm Pressure: 0.5 Torr RF power: 30 W Substrate temp.: 250° C. |
| p-type layer | $SiH_4$ (diluted to 10% with $H_2$): 0.25 sccm $H_2$: 34 sccm $BF_3$ (diluted to 2% with $H_2$): 2 sccm Pressure: 2 Torr RF power: 30 W Substrate temp.: 200° C. |
| Transparent electrode | $In_2O_3$ reactive evaporation method: 70 nm |
| Collecting electrode | Cr (100 nm)/Ag (1 μm)/Cr (100 nm) |

TABLE B2

| Sample No. | Grain size (μm) | Rmax (difference) (μm) | Surface profile (schematic view) |
|---|---|---|---|
| Sample EMB-B1-1 | 0.75 | 0.1 | 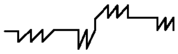 |
| Sample CMP-B1-1 | 0.70 | 0 | — |
| Sample CMP-B1-2 | 0.75 | 0.005 |  |
| Sample CMP-B1-3 | 0.70 | 0.005 |  |

TABLE B3

| Sample No. | Mean grain size ratio | Total reflectance | Irregular reflectance |
|---|---|---|---|
| Sample EMB-B1-2 | 1.0 | 1.0 | 1.0 |
| Sample CMP-B1-4 | 0.82 | 0.96 | 0.76 |
| Sample CMP-B1-5 | 0.93 | 0.70 | 0.73 |
| Sample CMP-B1-6 | 0.90 | 0.68 | 0.69 |

TABLE B4

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-B1 | 1.0 | 1.0 | 1.0 | 1.0 | 1.0 | 1.0 |
| CMP-B1-1 | 0.89 | 0.88 | 0.95 | 0.91 | 0.88 | 0.87 |
| CMP-B1-2 | 0.93 | 0.91 | 0.88 | 0.82 | 0.89 | 0.88 |
| CMP-B1-3 | 0.91 | 0.90 | 0.83 | 0.80 | 0.91 | 0.91 |

TABLE B5

| | |
|---|---|
| Substrate | Stainless steel plate: SUS430-2B Thickness: 0.2 mm |
| Surface treatment | RF sputtering<br>RF 200 W: For 20 minutes<br>Substrate temp.: Room temperature |
| Reflection layer | Al: 100 nm Substrate temp.: Room temperature |
| Transparent conductive layer | ZnO: 1 μm Substrate temp.: 290° C. |
| n-type layer | $SiH_4$: 1 sccm $H_2$: 50 sccm<br>$PH_3$ (diluted to 1% with $H_2$): 0.5 sccm<br>Pressure: 1.2 Torr RF power: 2 W<br>Substrate temp.: 350° C. Thickness: 40 nm |
| RF i-layer | $Si_2H_6$: 4 sccm $H_2$: 80 sccm Pressure: 0.5 Torr<br>RF power: 2 W Substrate temp.: 300° C.<br>Thickness: 10 nm |
| MW i-layer | $SiH_4$: 40 sccm $GeH_4$: 40 sccm $H_2$: 150 sccm<br>Pressure: 10 m Torr MW power: 250 W<br>RF bias power: 700 W Substrate temp.: 380° C.<br>Thickness: 70 nm |
| RF i-layer | $Si_2H_6$: 4 sccm $H_2$: 80 sccm Pressure: 0.5 Torr<br>RF power: 2 W Substrate temp.: 300° C.<br>Thickness: 20 nm |

TABLE B5-continued

| | |
|---|---|
| Hydrogen plasma treatment | $H_2$: 100 sccm Pressure: 0.5 Torr<br>RF power: 30 W Substrate temp.: 250° C. |
| p-type layer | $SiH_4$ (diluted to 10% with $H_2$): 0.25 sccm $H_2$: 34 sccm<br>$BF_3$ (diluted to 2% with $H_2$): 2 sccm<br>Pressure: 2 Torr RF power: 30 W<br>Substrate temp.: 200° C. |
| Transparent electrode | $In_2O_3$ reactive evaporation method: 70 nm |
| Collecting electrode | Cr (100 nm)/Ag (1 μm)/Cr (100 nm) |

TABLE B6

| Sample No. | Grain size (μm) | Rmax (difference) (μm) | Surface profile (schematic view) |
|---|---|---|---|
| Sample EMB-B2-1 | 5.5 | 0.200 | 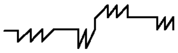 |
| Sample CMP-B2-1 | 5.5 | 0 | — |
| Sample CMP-B2-2 | 5.3 | 0.005 |  |

TABLE B6-continued

| Sample No. | Grain size (μm) | Rmax (difference) (μm) | Surface profile (schematic view) |
|---|---|---|---|
| Sample CMP-B2-3 | 4.8 | 0.005 |  |

TABLE B7

| Sample No. | Mean grain size ratio | Total reflectance | Irregular reflectance |
|---|---|---|---|
| Sample EMB-B2-2 | 1.0 | 1.0 | 1.0 |
| Sample CMP-B2-4 | 0.88 | 0.96 | 0.88 |
| Sample CMP-B2-5 | 0.91 | 0.88 | 0.82 |
| Sample CMP-B2-6 | 0.93 | 0.80 | 0.82 |

TABLE B8

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-B2 | 1.0 | 1.0 | 1.0 | 1.0 | 1.0 | 1.0 |
| CMP-B2-1 | 0.91 | 0.85 | 0.92 | 0.90 | 0.83 | 0.84 |
| CMP-B2-2 | 0.93 | 0.92 | 0.90 | 0.86 | 0.88 | 0.88 |
| CMP-B2-3 | 0.92 | 0.92 | 0.87 | 0.83 | 0.85 | 0.90 |

TABLE B9

| | |
|---|---|
| Substrate | Stainless steel plate: SUS430-2D Thickness: 0.3 mm |
| Surface treatment | Hydrofluoric acid-nitric acid-acetic acid mixture ($HF:HNO_3:H_2O:CH_3COOH$ = 1:3:3:150) Stirring with magnetic stirrer: For 10 minutes |
| Reflection layer | CuMg: 100 nm Substrate temp.: Room temperature |
| Transparent conductive layer | ZnO: 1 $\mu$m Substrate temp.: 300° C. |
| n-type layer | $SiH_4$: 1 sccm $H_2$: 50 sccm $PH_3$ (diluted to 1% with $H_2$): 0.5 sccm Pressure: 1.2 Torr RF power: 2 W Substrate temp.: 350° C. Thickness: 40 nm |
| RF i-layer | $Si_2H_6$: 4 sccm $H_2$: 80 sccm Pressure: 0.5 Torr RF power: 2 W Substrate temp.: 300° C. Thickness: 10 nm |
| MW i-layer | $SiH_4$: 38 sccm $GeH_4$: 42 sccm $H_2$: 220 sccm Pressure: 15 m Torr MW power: 220 W RF bias power: 800 W Substrate temp.: 380° C. Thickness: 70 nm |
| RF i-layer | $Si_2H_6$: 4 sccm $H_2$: 80 sccm Pressure: 0.5 Torr RF power: 2 W Substrate temp.: 300° C. Thickness: 20 nm |
| Hydrogen plasma treatment | $H_2$: 100 sccm Pressure: 0.5 Torr RF power: 40 W Substrate temp.: 250° C. |
| p-type layer | $SiH_4$ (diluted to 10% with $H_2$): 0.25 sccm $H_2$: 34 sccm $BF_3$ (diluted to 2% with $H_2$): 2 sccm Pressure: 2 Torr RF power: 40 W Substrate temp.: 200° C. |
| Transparent electrode | $In_2O_3$ reactive evaporation method: 70 nm |
| Collecting electrode | Cr (100 nm)/Ag (1 $\mu$m)/Cr (100 nm) |

TABLE B10

| Sample No. | Grain size ($\mu$m) | Rmax (difference) ($\mu$m) | Surface profile (Subst.) (schematic view) | Surface profile (Ref.) (schematic view) |
|---|---|---|---|---|
| Sample EMB-B3-1 | 6.0 | 0.15 | 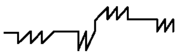 | 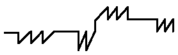 |
| Sample CMP-B3-1 | 5.5 | 0 | | |
| Sample CMP-B3-2 | 6.0 | 0.13 | 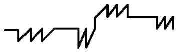 | |
| Sample CMP-B3-3 | 6.0 | 0.14 | 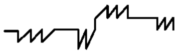 |  |
| Sample CMP-B3-4 | 5.8 | 0.008 |  |  |

TABLE B11

| Sample No. | Mean grain size ratio | Total reflectance | Irregular reflectance |
|---|---|---|---|
| Sample EMB-B3-2 | 1.0 | 1.0 | 1.0 |
| Sample CMP-B3-5 | 0.88 | 0.97 | 0.80 |
| Sample CMP-B3-6 | 0.90 | 0.94 | 0.81 |
| Sample CMP-B3-7 | 0.92 | 0.88 | 0.81 |
| Sample CMP-B3-8 | 0.92 | 0.89 | 0.83 |

TABLE B12

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-B3 | 1.0 | 1.0 | 1.0 | 1.0 | 1.0 | 1.0 |
| CMP-B3-1 | 0.90 | 0.89 | 0.95 | 0.90 | 0.86 | 0.89 |
| CMP-B3-2 | 0.92 | 0.88 | 0.91 | 0.90 | 0.89 | 0.89 |
| CMP-B3-3 | 0.95 | 0.93 | 0.88 | 0.82 | 0.91 | 0.89 |
| CMP-B3-4 | 0.96 | 0.93 | 0.90 | 0.88 | 0.91 | 0.89 |

TABLE B13

| | |
|---|---|
| Substrate | Stainless steel plate: SUS430-2D Thickness: 0.3 mm |
| Surface treatment | Hydrochloric acid-nitric acid mixture ($HCl:HNO_3:H_2O$ = 1:2:200) Stirring with magnetic stirrer: For 10 minutes |
| Reflection layer | Ag: 200 nm Substrate temp.: Room temperature |
| Transparent conductive layer | ZnO: 1 μm Substrate temp.: 280° C. |

TABLE B14

| Sample No. | Grain size (μm) | Rmax (difference) (μm) | Surface profile (Subst.) (schematic view) | Surface profile (Transp.) (schematic view) |
|---|---|---|---|---|
| Sample EMB-B4-1 | 6.0 | 0.25 | 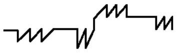 | 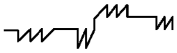 |
| Sample CMP-B4-1 | 6.0 | 0.26 | 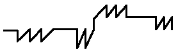 |  |
| Sample CMP-B4-2 | 6.1 | 0.22 | 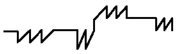 |  |
| Sample CMP-B4-3 | 5.9 | 0.009 |  |  |

TABLE B15

| Sample No. | Mean grain size ratio | Total reflectance | Irregular reflectance |
|---|---|---|---|
| Sample EMB-B4-2 | 1.0 | 1.0 | 1.0 |
| Sample CMP-B4-4 | 0.88 | 0.96 | 0.80 |
| Sample CMP-B4-5 | 0.92 | 0.83 | 0.79 |
| Sample CMP-B4-6 | 0.90 | 0.82 | 0.80 |

TABLE B16

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-B4 | 1.0 | 1.0 | 1.0 | 1.0 | 1.0 | 1.0 |
| CMP-B4-1 | 0.92 | 0.88 | 0.93 | 0.90 | 0.82 | 0.82 |
| CMP-B4-2 | 0.91 | 0.90 | 0.89 | 0.84 | 0.90 | 0.90 |
| CMP-B4-3 | 0.95 | 0.96 | 0.82 | 0.82 | 0.83 | 0.89 |

TABLE B17

| | |
|---|---|
| Substrate | Stainless steel plate: SUS430-2B Thickness: 0.25 mm |
| Surface treatment | Hydrofluoric acid-nitric acid mixture ($HF:HNO_3:H_2O$ = 1:3:300) Ultrasonic cleaning: For 1 minute |
| Reflection layer | CuAl: 200 nm Substrate temp.: Room temperature |
| Transparent conductive layer | ZnO: 1.2 $\mu$m Substrate temp: 175° C. |

TABLE B18

| Sample No. | Grain size ($\mu$m) | Rmax (difference) ($\mu$m) | Surface profile (Subst.) (schematic view) | Surface profile (Transp.) (schematic view) |
|---|---|---|---|---|
| Sample EMB-B5-1 | 5.5 | 0.30 | 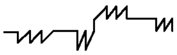 | 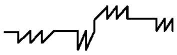 |
| Sample CMP-B5-1 | 5.6 | 0.28 | 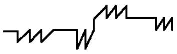 |  |
| Sample CMP-B5-2 | 5.6 | 0.29 | 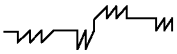 |  |
| Sample CMP-B5-3 | 5.5 | 0.30 | 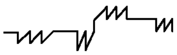 |  |

TABLE B19

| Sample No. | Mean grain size ratio | Total reflectance | Irregular reflectance |
|---|---|---|---|
| Sample EMB-B5-2 | 1.0 | 1.0 | 1.0 |
| Sample CMP-B5-4 | 0.90 | 0.96 | 0.80 |
| Sample CMP-B5-5 | 0.91 | 0.84 | 0.83 |
| Sample CMP-B5-6 | 0.93 | 0.84 | 0.80 |

TABLE B20

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-B5 | 1.0 | 1.0 | 1.0 | 1.0 | 1.0 | 1.0 |
| CMP-B5-1 | 0.91 | 0.89 | 0.92 | 0.90 | 0.86 | 0.84 |
| CMP-B5-2 | 0.93 | 0.90 | 0.89 | 0.94 | 0.90 | 0.89 |
| CMP-B5-3 | 0.94 | 0.91 | 0.88 | 0.83 | 0.87 | 0.89 |

TABLE B21

| | |
|---|---|
| Substrate | Stainless steel plate: SUS430-BA<br>Thickness: 0.15 mm |
| Surface treatment | RF sputtering<br>RF 300 W: For 10 minutes<br>Substrate temp.: Room temperature |
| Reflection layer | AlSi: 100 nm Substrate temp.: Room temperature |
| Transparent conductive layer | ZnO: 0.75 μm Substrate temp.: 250° C. |
| n1-layer | a-Si Thickness: 20 nm |
| RF i1-layer | a-Si Thickness: 10 nm |
| MW i1-layer | a-SiGe Thickness: 60 nm |
| RF i1-layer | a-Si Thickness: 18 nm |
| p1-layer | μc-Si Thickness: 15 nm |
| n2-layer | a-Si Thickness: 10 nm |
| RF i2-layer | a-Si Thickness: 10 nm |
| MW i2-layer | a-SiGe Thickness: 50 nm |
| RF i2-layer | a-Si Thickness: 18 nm |
| p2-layer | μc-Si Thickness: 15 nm |
| n3-layer | a-Si Thickness: 10 nm |
| RF i3-layer | a-Si Thickness: 90 nm |
| p3-layer | μc-Si Thickness: 20 nm |
| Transparent electrode | ITO Thickness: 75 nm |
| Collecting electrode | Ag paste Thickness: 10 μm |

TABLE B22

| Sample No. | Grain size (μm) | Rmax (difference) (μm) | Surface profile (Subst.) (schematic view) |
|---|---|---|---|
| Sample EMB-B6-1 | 7.6 | 0.320 | 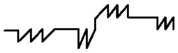 |
| Sample CMP-B6-1 | 5.5 | 0 | |
| Sample CMP-B6-2 | 6.5 | 0.007 |  |
| Sample CMP-B6-3 | 6.8 | 0.006 |  |

TABLE B23

| Sample No. | Mean grain size ratio | Total reflectance | Irregular reflectance |
|---|---|---|---|
| Sample EMB-B6-2 | 1.0 | 1.0 | 1.0 |
| Sample CMP-B6-4 | 0.90 | 0.95 | 0.78 |
| Sample CMP-B6-5 | 0.93 | 0.90 | 0.80 |
| Sample CMP-B6-6 | 0.94 | 0.83 | 0.81 |

TABLE B24

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-B6 | 1.0 | 1.0 | 1.0 | 1.0 | 1.0 | 1.0 |
| CMP-B6-1 | 0.92 | 0.86 | 0.94 | 0.89 | 0.84 | 0.81 |
| CMP-B6-2 | 0.93 | 0.90 | 0.91 | 0.87 | 0.88 | 0.86 |
| CMP-B6-3 | 0.93 | 0.91 | 0.90 | 0.88 | 0.91 | 0.88 |

TABLE B25

| | |
|---|---|
| Substrate | Mirror finished stainless steel plate: SUS304<br>Thickness: 0.3 mm |
| Surface treatment | Hydrofluoric acid ($HF:H_2O$ = 1:50)<br>Ultrasonic wave: For 5 minutes |
| Backside metallic reflection layer | AlAg: 200 nm Substrate temp.: Room temperature |
| Transparent conductive layer | ZnO: 1 μm Substrate temp.: 175° C. |
| $n_+$-type layer | $SiH_4$: 1 sccm $H_2$: 50 sccm<br>$PH_3$ (diluted to 1% with $H_2$): 3 sccm<br>Pressure: 1.2 Torr<br>RF power: 2 W Substrate temp.: 300° C. |
| Polycrystalline i-layer | $SiF_4$: 100 sccm $H_2$: 20 sccm Ar: 100 sccm<br>Pressure: 0.5 Torr MW power: 600 W<br>Substrate temp.: 300° C. |
| p-type layer | $SiH_4$ (diluted to 10% with $H_2$): 0.5 sccm $H_2$: 80 sccm<br>$BF_3$ (diluted to 2% with $H_2$): 4 sccm Pressure: 2 Torr<br>RF power: 50 W Substrate temp.: 150° C. |
| Transparent electrode | $In_2O_3$ reactive evaporation method: 70 nm |
| Collecting electrode | Cr (100 nm)/Ag (1 μm)/Cr (100 nm) |

TABLE B26

| Sample No. | Grain size (μm) | Rmax (difference) (μm) | Surface profile (Subst.) (schematic view) |
|---|---|---|---|
| Sample EMB-B7-1 | 6.5 | 0.350 | 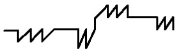 |
| Sample CMP-B7-1 | 6.1 | 0 | |
| Sample CMP-B7-2 | 5.5 | 0.007 |  |
| Sample CMP-B7-3 | 5.6 | 0.005 |  |

TABLE B27

| Sample No. | Mean grain size ratio | Total reflectance | Irregular reflectance |
|---|---|---|---|
| Sample EMB-B7-2 | 1.0 | 1.0 | 1.0 |
| Sample CMP-B7-4 | 0.85 | 0.94 | 0.77 |
| Sample CMP-B7-5 | 0.92 | 0.85 | 0.81 |
| Sample CMP-B7-6 | 0.92 | 0.80 | 0.73 |

TABLE B28

| Cell No. | Yield | Adhesion | Initial Efficiency | Efficiency following optical degradation | Efficiency following HHRB degradation | Efficiency following Temperature and humidity degradation |
|---|---|---|---|---|---|---|
| EMB-B7 | 1.0 | 1.0 | 1.0 | 1.0 | 1.0 | 1.0 |
| CMP-B7-1 | 0.91 | 0.85 | 0.91 | 0.90 | 0.84 | 0.83 |
| CMP-B7-2 | 0.90 | 0.91 | 0.90 | 0.87 | 0.87 | 0.86 |
| CMP-B7-3 | 0.93 | 0.92 | 0.90 | 0.87 | 0.86 | 0.87 |

TABLE B29

| | |
|---|---|
| Substrate | Stainless steel plate |
| Surface treatment | Hydrofluoric acid-nitric acid mixture<br>($HF:HNO_3:H_2O$ = 1:3:3 to 1:4:100<br>Using ultrasonic wave or magnetic stirrer)<br>Hydrochloric acid-nitric acid mixture<br>($HCl:HNO_3:H_2O$ = 1:5:10 to 1:20:100<br>Using ultrasonic wave or magnetic stirrer)<br>Hydrofluoric acid-nitric acid-acetic acid mixture<br>($HF:HNO_3:H_2O:CH_3COOH$ = 1:3:3:1 to 1:5:5:50<br>Using ultrasonic wave or magnetic stirrer)<br>Hydrofluoric acid<br>($HF:H_2O$ = 1:1–100<br>Using ultrasonic wave or magnetic stirrer) |
| Backside metallic reflection layer | AgAl: 300 nm Substrate temp.: Room temperature |
| Transparent conductive layer | ZnO: 1 μm Substrate temp.: 150° C. |

TABLE B30

| | | Grain size (μm) | | | | | | | | |
|---|---|---|---|---|---|---|---|---|---|---|
| | | 0.05 | 0.08 | 0.10 | 2.00 | 100 | 2000 | 2100 | 3000 | 3200 |
| Rmax (Difference) (μm) | 0 | EMB-B8-1 | EMB-B8-2 | EMB-B8-3 | EMB-B8-4 | EMB-B8-5 | EMB-B8-6 | EMB-B8-7 | EMB-B8-8 | EMB-B8-9 |
| | 0.008 | EMB-B8-10 | EMB-B8-11 | EMB-B8-12 | EMB-B8-13 | EMB-B8-14 | EMB-B8-15 | EMB-B8-16 | EMB-B8-17 | EMB-B8-18 |
| | 0.01 | EMB-B8-19 | EMB-B8-20 | EMB-B8-21 | EMB-B8-22 | EMB-B8-23 | EMB-B8-24 | EMB-B8-25 | EMB-B8-26 | EMB-B8-27 |
| | 0.10 | EMB-B8-28 | EMB-B8-29 | EMB-B8-30 | EMB-B8-31 | EMB-B8-32 | EMB-B8-33 | EMB-B8-34 | EMB-B8-35 | EMB-B8-36 |
| | 0.50 | EMB-B8-37 | EMB-B8-38 | EMB-B8-39 | EMB-B8-40 | EMB-B8-41 | EMB-B8-42 | EMB-B8-43 | EMB-B8-44 | EMB-B8-45 |
| | 1.50 | EMB-B8-46 | EMB-B8-47 | EMB-B8-48 | EMB-B8-49 | EMB-B8-50 | EMB-B8-51 | EMB-B8-52 | EMB-B8-53 | EMB-B8-54 |
| | 1.60 | EMB-B8-55 | EMB-B8-56 | EMB-B8-57 | EMB-B8-58 | EMB-B8-59 | EMB-B8-60 | EMB-B8-61 | EMB-B8-62 | EMB-B8-63 |
| | 4.50 | EMB-B8-64 | EMB-B8-65 | EMB-B8-66 | EMB-B8-67 | EMB-B8-68 | EMB-B8-69 | EMB-B8-70 | EMB-B8-71 | EMB-B8-72 |
| | 8.20 | EMB-B8-73 | EMB-B8-74 | EMB-B8-75 | EMB-B8-76 | EMB-B8-77 | EMB-B8-78 | EMB-B8-79 | EMB-B8-80 | EMB-B8-81 |

TABLE B31

| | | Grain size (μm) | | | | | | | | |
|---|---|---|---|---|---|---|---|---|---|---|
| Yield | | 0.05 | 0.08 | 0.10 | 2.00 | 100 | 2000 | 2100 | 3000 | 3200 |
| Rmax (Difference) (μm) | 0 | 0.93 | 0.93 | 0.92 | 0.93 | 0.93 | 0.94 | 0.93 | 0.92 | 0.93 |
| | 0.008 | 0.95 | 0.95 | 0.95 | 0.96 | 0.95 | 0.95 | 0.96 | 0.96 | 0.94 |
| | 0.01 | 0.98 | 0.97 | 1.00 | 1.01 | 1.03 | 1.03 | 0.95 | 0.96 | 0.94 |
| | 0.10 | 0.97 | 0.98 | 1.03 | 1.02 | 1.00 | 1.02 | 0.96 | 0.95 | 0.96 |
| | 0.50 | 0.97 | 0.96 | 1.02 | 1.00 | 1.01 | 1.03 | 0.95 | 0.96 | 0.96 |
| | 1.50 | 0.90 | 0.97 | 1.01 | 1.00 | 1.02 | 1.01 | 0.96 | 0.95 | 0.95 |
| | 1.60 | 0.95 | 0.93 | 0.96 | 0.95 | 0.95 | 0.96 | 0.95 | 0.92 | 0.91 |
| | 4.50 | 0.89 | 0.89 | 0.90 | 0.90 | 0.91 | 0.90 | 0.91 | 0.90 | 0.88 |
| | 8.20 | 0.88 | 0.86 | 0.89 | 0.88 | 0.89 | 0.90 | 0.87 | 0.83 | 0.82 |

TABLE B32

| Adhesion Test | | Grain size (μm) 0.05 | 0.08 | 0.10 | 2.00 | 100 | 2000 | 2100 | 3000 | 3200 |
|---|---|---|---|---|---|---|---|---|---|---|
| Rmax | 0 | 0.83 | 0.85 | 0.87 | 0.90 | 0.90 | 0.87 | 0.86 | 0.85 | 0.85 |
| (Difference) | 0.008 | 0.87 | 0.86 | 0.85 | 0.84 | 0.82 | 0.81 | 0.81 | 0.82 | 0.81 |
| (μm) | 0.01 | 0.89 | 0.89 | 1.00 | 1.02 | 1.02 | 1.01 | 0.98 | 0.93 | 0.92 |
| | 0.10 | 0.90 | 0.93 | 1.02 | 1.02 | 1.01 | 1.02 | 0.97 | 0.95 | 0.93 |
| | 0.50 | 0.90 | 0.90 | 1.02 | 1.03 | 1.00 | 0.94 | 0.95 | 0.93 | 0.95 |
| | 1.50 | 0.93 | 0.92 | 1.03 | 1.02 | 1.04 | 1.00 | 0.94 | 0.95 | 0.92 |
| | 1.60 | 0.94 | 0.95 | 0.95 | 0.96 | 0.97 | 0.95 | 0.94 | 0.95 | 0.96 |
| | 4.50 | 0.95 | 0.92 | 0.93 | 0.94 | 0.95 | 0.95 | 0.96 | 0.97 | 0.95 |
| | 8.20 | 0.92 | 0.93 | 0.92 | 0.94 | 0.93 | 0.95 | 0.94 | 0.93 | 0.95 |

TABLE B33

| HHRB degradation | | Grain size (μm) 0.05 | 0.08 | 0.10 | 2.00 | 100 | 2000 | 2100 | 3000 | 3200 |
|---|---|---|---|---|---|---|---|---|---|---|
| Rmax | 0 | 0.81 | 0.82 | 0.83 | 0.82 | 0.84 | 0.83 | 0.82 | 0.81 | 0.82 |
| (Difference) | 0.008 | 0.83 | 0.84 | 0.83 | 0.82 | 0.85 | 0.84 | 0.85 | 0.85 | 0.84 |
| (μm) | 0.01 | 0.83 | 0.86 | 1.00 | 1.01 | 1.02 | 1.03 | 0.85 | 0.85 | 0.84 |
| | 0.10 | 0.83 | 0.85 | 1.02 | 1.00 | 1.01 | 1.02 | 0.93 | 0.91 | 0.89 |
| | 0.50 | 0.87 | 0.88 | 1.01 | 1.03 | 1.02 | 1.01 | 0.90 | 0.91 | 0.92 |
| | 1.50 | 0.88 | 0.89 | 1.03 | 1.02 | 1.03 | 1.02 | 0.95 | 0.94 | 0.93 |
| | 1.60 | 0.89 | 0.90 | 0.91 | 0.91 | 0.92 | 0.92 | 0.90 | 0.90 | 0.92 |
| | 4.50 | 0.91 | 0.92 | 0.90 | 0.91 | 0.92 | 0.91 | 0.92 | 0.93 | 0.90 |
| | 8.20 | 0.90 | 0.91 | 0.90 | 0.92 | 0.92 | 0.91 | 0.90 | 0.92 | 0.92 |

TABLE B34

| Temperature and humidity degradation | | Grain size (μm) 0.05 | 0.08 | 0.10 | 2.00 | 100 | 2000 | 2100 | 3000 | 3200 |
|---|---|---|---|---|---|---|---|---|---|---|
| Rmax | 0 | 0.88 | 0.89 | 0.90 | 0.89 | 0.90 | 0.90 | 0.90 | 0.91 | 0.89 |
| (Difference) | 0.008 | 0.89 | 0.90 | 0.90 | 0.90 | 0.88 | 0.87 | 0.86 | 0.87 | 0.88 |
| (μm) | 0.01 | 0.90 | 0.91 | 1.00 | 1.02 | 1.01 | 1.02 | 0.93 | 0.93 | 0.94 |
| | 0.10 | 0.91 | 0.90 | 1.02 | 1.01 | 1.02 | 1.00 | 0.95 | 0.96 | 0.94 |
| | 0.50 | 0.91 | 0.91 | 1.02 | 1.02 | 1.02 | 1.01 | 0.96 | 0.95 | 0.94 |
| | 1.50 | 0.90 | 0.91 | 1.01 | 1.02 | 1.01 | 1.02 | 0.95 | 0.94 | 0.95 |
| | 1.60 | 0.90 | 0.92 | 0.93 | 0.93 | 0.92 | 0.91 | 0.90 | 0.91 | 0.92 |
| | 4.50 | 0.90 | 0.90 | 0.91 | 0.92 | 0.92 | 0.91 | 0.90 | 0.94 | 0.94 |
| | 8.20 | 0.92 | 0.93 | 0.92 | 0.91 | 0.92 | 0.93 | 0.91 | 0.92 | 0.91 |

TABLE B35

| | |
|---|---|
| Substrate | Stainless steel plate |
| Surface treatment | Hydrofluoric acid-nitric acid mixture<br>($HF:HNO_3:H_2O$ = 1:3:3 to 1:4:100<br>Using ultrasonic wave or magnetic stirrer)<br>Hydrochloric acid-nitric acid mixture<br>($HCl:HNO_3:H_2O$ = 1:5:10 to 1:20:100<br>Using ultrasonic wave or magnetic stirrer)<br>Hydrofluoric acid-nitric acid-acetic acid mixture<br>($HF:HNO_3:H_2O:CH_3COOH$ = 1:3:3:1 to 1:5:5:50<br>Using ultrasonic wave or magnetic stirrer)<br>Hydrofluoric acid<br>($HF:H_2O$ = 1:1–100<br>Using ultrasonic wave or magnetic stirrer) |
| Backside metallic reflection layer | AgAl: 300 nm Substrate temp.: Room temperature |
| Transparent conductive layer | ZnO: 1 μm Substrate temp.: 150° C. |

TABLE B36

| | Remax (μm) 0.005 | 0.008 | 0.010 | 0.012 | 0.100 | 0.800 | 2.00 | 2.20 | 3.50 |
|---|---|---|---|---|---|---|---|---|---|
| Yield | 0.90 | 0.89 | 1.00 | 1.02 | 1.05 | 1.02 | 1.03 | 0.97 | 0.92 |

TABLE B37

| | Remax (μm) 0.005 | 0.008 | 0.010 | 0.012 | 0.100 | 0.800 | 2.00 | 2.20 | 3.50 |
|---|---|---|---|---|---|---|---|---|---|
| Adhesion test | 0.78 | 0.82 | 1.00 | 1.01 | 1.02 | 1.03 | 1.03 | 0.98 | 0.96 |

TABLE B38

| | Remax (μm) | | | | | | | | |
|---|---|---|---|---|---|---|---|---|---|
| | 0.005 | 0.008 | 0.010 | 0.012 | 0.100 | 0.800 | 2.00 | 2.20 | 3.50 |
| HHRB degradation | 0.92 | 0.93 | 1.00 | 1.02 | 1.03 | 1.02 | 1.03 | 0.89 | 0.90 |

TABLE B39

| | Remax (μm) | | | | | | | | |
|---|---|---|---|---|---|---|---|---|---|
| | 0.005 | 0.008 | 0.010 | 0.012 | 0.100 | 0.800 | 2.00 | 2.20 | 3.50 |
| Temperature and humidity degradation | 0.90 | 0.91 | 1.00 | 1.03 | 1.02 | 1.02 | 1.01 | 0.88 | 0.86 |

TABLE C1

| | |
|---|---|
| Substrate | Stainless steel plate: SUS430BA Thickness: 0.3 mm |
| Backside metallic reflection layer | Al: 3000 nm Substrate temp.: Room temperature |
| Surface treatment | Phosphoric acid-nitric acid mixture ($H_3PO_4$:$HNO_3$:$H_2O$ = 3:1:10) Ultrasonic wave: For 1 minute |
| Transparent conductive layer | ZnO: 1 μm Substrate temp.: 200° C. |
| n-type layer | $SiH_4$: 1 sccm $H_2$: 50 sccm $PH_3$ (diluted to 1% with $H_2$): 0.5 sccm Pressure: 1.2 Torr RF power: 2 W Substrate temp.: 350° C. Thickness: 40 nm |
| RF i-layer | $Si_2H_6$: 4 sccm $H_2$: 80 sccm Pressure: 0.5 Torr RF power: 2 W Substrate temp.: 300° C. Thickness: 10 nm |
| MW i-layer | $SiH_4$: 40 sccm $GeH_4$: 40 sccm $H_2$: 150 sccm Pressure: 10 m Torr MW power: 250 W RF bias power: 700 W Substrate temp.: 380° C. Thickness: 70 nm |
| RF i-layer | $Si_2H_6$: 4 sccm $H_2$: 80 sccm Pressure: 0.5 Torr RF power: 2 W Substrate temp.: 300° C. Thickness: 20 nm |
| Hydrogen plasma treatment | $H_2$: 100 sccm Pressure: 0.5 Torr RF power: 30 W Substrate temp.: 250° C. |
| p-type layer | $SiH_4$ (diluted to 10% with $H_2$): 0.25 sccm $H_2$: 34 sccm $BF_3$ (diluted to 2% with $H_2$): 2 sccm Pressure: 2 Torr RF power: 30 W Substrate temp.: 200° C. |
| Transparent electrode | $In_2O_3$ reactive evaporation method: 70 nm |
| Collecting electrode | Cr (100 nm)/Ag (1 μm)/Cr (100 nm) |

TABLE C2

| Sample No. | Grain size (μm) | Rmax (difference) (μm) | Surface profile (schematic view) |
|---|---|---|---|
| Sample EMB-C1-1 | 4.0 | 0.2 |  |
| Sample CMP-C1-1 | 0.11 | 0 |  |
| Sample CMP-C1-2 | 4.0 | 2.2 |  |

TABLE C2-continued

| Sample No. | Grain size (μm) | Rmax (difference) (μm) | Surface profile (schematic view) |
|---|---|---|---|
| Sample CMP-C1-3 | 3.9 | 2.3 |  |

TABLE C3

| Sample No. | Mean grain size ratio | Total reflectance | Irregular reflectance |
|---|---|---|---|
| Sample EMB-C1-2 | 1.0 | 1.0 | 1.0 |
| Sample CMP-C1-4 | 0.87 | 0.96 | 0.81 |
| Sample CMP-C1-5 | 0.92 | 0.76 | 0.73 |
| Sample CMP-C1-6 | 0.92 | 0.72 | 0.71 |

TABLE C4

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-C1 | 1.0 | 1.0 | 1.0 | 1.0 | 1.0 | 1.0 |
| CMP-C1-1 | 0.89 | 0.84 | 0.93 | 0.92 | 0.83 | 0.90 |
| CMP-C1-2 | 0.93 | 0.93 | 0.89 | 0.87 | 0.88 | 0.87 |
| CMP-C1-3 | 0.92 | 0.94 | 0.88 | 0.87 | 0.88 | 0.88 |

TABLE C5

| | |
|---|---|
| Substrate | Stainless steel plate: SUS430-2B Thickness: 0.3 mm |
| Reflection layer | AlSi: 200 nm Substrate temp.: Room temperature |
| Surface treatment | RF sputtering<br>RF 300 W: For 20 minutes<br>Substrate temp.: Room temperature |
| Transparent conductive layer | ZnO: 1 $\mu$m Substrate temp.: 300° C. |
| n-type layer | $SiH_4$: 1 sccm $H_2$: 50 sccm<br>$PH_3$ (diluted to 1% with $H_2$): 0.5 sccm<br>Pressure: 1.2 Torr RF power: 2 W<br>Substrate temp.: 350° C. Thickness: 40 nm |
| RF i-layer | $Si_2H_6$: 4 sccm $H_2$: 80 sccm Pressure: 0.5 Torr<br>RF power: 2 W Substrate temp.: 300° C.<br>Thickness: 10 nm |
| MW i-layer | $SiH_4$: 40 sccm $GeH_4$: 40 sccm $H_2$: 150 sccm<br>Pressure: 10 m Torr MW power: 250 W<br>RF bias power: 700 W Substrate temp.: 380° C.<br>Thickness: 70 nm |
| RF i-layer | $Si_2H_6$: 4 sccm $H_2$: 80 sccm Pressure: 0.5 Torr<br>RF power: 2 W Substrate temp.: 300° C.<br>Thickness: 20 nm |
| Hydrogen plasma treatment | $H_2$: 100 sccm Pressure: 0.5 Torr<br>RF power: 30 W Substrate temp.: 250° C. |
| p-type layer | $SiH_4$ (diluted to 10% with $H_2$): 0.25 sccm $H_2$: 34 sccm<br>$BF_3$ (diluted to 2% with $H_2$): 2 sccm<br>Pressure: 2 Torr RF power: 30 W<br>Substrate temp.: 200° C. |
| Transparent electrode | $In_2O_3$ reactive evaporation method: 70 nm |
| Collecting electrode | Cr (100 nm)/Ag (1 $\mu$m)/Cr (100 nm) |

TABLE C6

| Sample No. | Grain size ($\mu$m) | Rmax (difference) ($\mu$m) | Surface profile (schematic view) |
|---|---|---|---|
| Sample EMB-C2-1 | 4.0 | 0.1 | 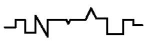 |
| Sample CMP-C2-1 | 0.1 | 0 | |
| Sample CMP-C2-2 | 2.5 | 0.2 |  |
| Sample CMP-C2-3 | 2.0 | 0.2 |  |

TABLE C7

| Sample No. | Mean grain size ratio | Total reflectance | Irregular reflectance |
|---|---|---|---|
| Sample EMB-C2-2 | 1.0 | 1.0 | 1.0 |
| Sample CMP-C2-4 | 0.87 | 0.96 | 0.75 |
| Sample CMP-C2-5 | 0.90 | 0.78 | 0.75 |
| Sample CMP-C2-6 | 0.90 | 0.75 | 0.73 |

TABLE C8

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-C2 | 1.0 | 1.0 | 1.0 | 1.0 | 1.0 | 1.0 |
| CMP-C2-1 | 0.87 | 0.86 | 0.92 | 0.92 | 0.90 | 0.89 |
| CMP-C2-2 | 0.90 | 0.92 | 0.78 | 0.76 | 0.75 | 0.74 |
| CMP-C2-3 | 0.91 | 0.93 | 0.79 | 0.75 | 0.76 | 0.73 |

TABLE C9

| | |
|---|---|
| Substrate | Stainless steel plate: SUS430-2D Thickness: 0.3 mm |
| Reflection layer | AlSi: 3000 nm Substrate temp.: Room temperature |
| Surface treatment | Dry etching<br>RF 200 W: For 5 minutes<br>Substrate temp.: Room temperature |
| Transparent conductive layer | ZnO: 1 $\mu$m Substrate temp.: 300° C. |
| n-type layer | $SiH_4$: 1 sccm $H_2$: 50 sccm<br>$PH_3$ (diluted to 1% with $H_2$): 0.5 sccm<br>Pressure: 1.2 Torr RF power: 2 W<br>Substrate temp.: 350° C. Thickness: 40 nm |
| RF i-layer | $Si_2H_6$: 4 sccm $H_2$: 80 sccm Pressure: 0.5 Torr<br>RF power: 2 W Substrate temp.: 300° C.<br>Thickness: 10 nm |
| MW i-layer | $SiH_4$: 40 sccm $GeH_4$: 40 sccm $H_2$: 150 sccm<br>Pressure: 10 m Torr MW power: 250 W<br>RF bias power: 700 W Substrate temp.: 380° C.<br>Thickness: 70 nm |
| RF i-layer | $Si_2H_6$: 4 sccm $H_2$: 80 sccm Pressure: 0.5 Torr<br>RF power: 2 W Substrate temp.: 300° C.<br>Thickness: 20 nm |
| Hydrogen plasma treatment | $H_2$: 100 sccm Pressure: 0.5 Torr<br>RF power: 30 W Substrate temp.: 250° C. |
| p-type layer | $SiH_4$ (diluted to 10% with $H_2$): 0.25 sccm $H_2$: 34 sccm<br>$BF_3$ (diluted to 2% with $H_2$): 2 sccm<br>Pressure: 2 Torr RF power: 30 W<br>Substrate temp.: 200° C. |
| Transparent electrode | $In_2O_3$ reactive evaporation method: 70 nm |
| Collecting electrode | Cr (100 nm)/Ag (1 $\mu$m)/Cr (100 nm) |

TABLE C10

| Sample No. | Grain size ($\mu$m) | Rmax (Ref.) ($\mu$m) | Surface profile (Ref.) (schematic view) | Surface profile (Transp.) (schematic view) |
|---|---|---|---|---|
| Sample EMB-C3-1 | 5.0 | 0.7 |  |  |
| Sample CMP-C3-1 | 0.08 | 0 |  |  |
| Sample CMP-C3-2 | 10.5 | 2.2 |  |  |
| Sample CMP-C3-3 | 12.0 | 2.4 |  |  |

TABLE C11

| Sample No. | Mean grain size ratio | Total reflectance | Irregular reflectance |
|---|---|---|---|
| Sample EMB-C3-2 | 1.0 | 1.0 | 1.0 |
| Sample CMP-C3-4 | 0.82 | 0.93 | 0.73 |
| Sample CMP-C3-5 | 0.92 | 0.83 | 0.82 |
| Sample CMP-C3-6 | 0.94 | 0.84 | 0.80 |

TABLE C12

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-C3 | 1.0 | 1.0 | 1.0 | 1.0 | 1.0 | 1.0 |
| CMP-C3-1 | 0.91 | 0.91 | 0.93 | 0.92 | 0.88 | 0.85 |
| CMP-C3-2 | 0.92 | 0.94 | 0.86 | 0.85 | 0.83 | 0.83 |
| CMP-C3-3 | 0.93 | 0.93 | 0.84 | 0.83 | 0.81 | 0.80 |

TABLE C13

| | |
|---|---|
| Substrate | Stainless steel plate: SUS430-2B Thickness: 0.5 mm |
| Reflection layer | Ag: 300 nm Substrate temp.: Room temperature |
| Surface treatment | RF sputtering |
| | RF 300 w: For 10 minutes |
| | Substrate temp.: Room temperature |
| Reflection layer | Ag: 200 nm Substrate temp.: Room temperature |
| Transparent conductive layer | ZnO: 1 μm Substrate temp.: 280° C. |

TABLE C14

| Sample No. | Grain size (μm) | Rmax (Ref.) (μm) | Surface profile (Ref.) (schematic view) | Surface profile (Transp.) (schematic view) |
|---|---|---|---|---|
| Sample EMB-C4-1 | 7.0 | 0.15 |  |  |
| Sample CMP-C4-1 | 8.0 | 0.15 |  |  |
| Sample CMP-C4-2 | 8.5 | 0.15 |  |  |
| Sample CMP-C4-3 | 12.0 | 0.3 |  |  |

TABLE C15

| Sample No. | Mean grain size ratio | Total reflectance | Irregular reflectance |
|---|---|---|---|
| Sample EMB-C4-2 | 1.0 | 1.0 | 1.0 |
| Sample CMP-C4-4 | 0.95 | 0.97 | 0.78 |
| Sample CMP-C4-5 | 0.98 | 0.82 | 0.75 |
| Sample CMP-C4-6 | 0.90 | 0.80 | 0.72 |

TABLE C16

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-C4 | 1.0 | 1.0 | 1.0 | 1.0 | 1.0 | 1.0 |
| CMP-C4-1 | 0.88 | 0.87 | 0.93 | 0.92 | 0.92 | 0.90 |
| CMP-C4-2 | 0.91 | 0.92 | 0.87 | 0.86 | 0.86 | 0.86 |
| CMP-C4-3 | 0.90 | 0.92 | 0.87 | 0.85 | 0.84 | 0.85 |

TABLE C17

| | |
|---|---|
| Substrate | Stainless steel plate: SUS430-BA Thickness: 0.25 mm |
| Reflection layer | Cu: 200 nm Substrate temp.: Room temperature |
| Surface treatment | RF sputtering |
| | RF 500 W: For 5 minute |
| | Substrate temp.: Room temperature |
| Transparent conductive layer | ZnO: 1 μm Substrate temp.: 175° C. |

TABLE C18

| Sample No. | Grain size (μm) | Rmax (Ref.) (μm) | Surface profile (Ref.) (schematic view) | Surface profile (Photv.) (schematic view) |
|---|---|---|---|---|
| Sample EMB-C5-1 | 7.5 | 0.13 |  | 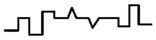 |
| Sample CMP-C5-1 | 8.0 | 0.10 | 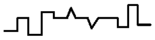 |  |
| Sample CMP-C5-2 | 7.8 | 0.15 |  |  |
| Sample CMP-C5-3 | 8.5 | 0.20 |  |  |

TABLE C19

| Sample No. | Mean grain size ratio | Total reflectance | Irregular reflectance |
|---|---|---|---|
| Sample EMB-C5-2 | 1.0 | 1.0 | 1.0 |
| Sample CMP-C5-4 | 0.91 | 0.96 | 0.76 |
| Sample CMP-C5-5 | 0.95 | 0.82 | 0.80 |
| Sample CMP-C5-6 | 0.92 | 0.80 | 0.83 |

TABLE C20

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-C5 | 1.0 | 1.0 | 1.0 | 1.0 | 1.0 | 1.0 |
| CMP-C5-1 | 0.93 | 0.89 | 0.93 | 0.90 | 0.88 | 0.89 |
| CMP-C5-2 | 0.95 | 0.92 | 0.91 | 0.90 | 0.91 | 0.91 |
| CMP-C5-3 | 0.94 | 0.92 | 0.92 | 0.80 | 0.91 | 0.91 |

TABLE C21

| | |
|---|---|
| Substrate | Stainless steel sheet: SUS430-BA<br>Thickness: 0.15 mm |
| Reflection layer | AlSi: 300 nm Substrate temp.: Room temperature |
| Surface treatment | Dry etching ($CCl_4$: 0.3 Torr)<br>RF 200 W Substrate temp.: Room temperature |
| Transparent conductive layer | ZnO: 0.75 μm Substrate temp.: 280° C. |
| n1-layer | a-Si Thickness: 20 nm |
| RF i1-layer | a-Si Thickness: 10 nm |
| MW i1-layer | a-SiGe Thickness: 60 nm |
| RF i1-layer | a-Si Thickness: 18 nm |
| p1-layer | μc-Si Thickness: 15 nm |
| n2-layer | a-Si Thickness: 10 nm |
| RF i2-layer | a-Si Thickness: 10 nm |
| MW i2-layer | a-SiGe Thickness: 50 nm |
| RF i2-layer | a-Si Thickness: 18 nm |
| p2-layer | μc-Si Thickness: 15 nm |
| n3-layer | a-Si Thickness: 10 nm |
| RF i3-layer | a-Si Thickness: 90 nm |
| p3-layer | μc-Si Thickness: 20 nm |
| Transparent electrode | ITO Thickness: 75 nm |
| Collecting electrode | Ag paste Thickness: 10 μm |

TABLE C22

| Sample No. | Grain size (μm) | Rmax (Ref.) (μm) | Surface profile (Ref.) (schematic view) |
|---|---|---|---|
| Sample EMB-C6-1 | 5.1 | 0.2 |  |
| Sample CMP-C6-1 | 0.08 | 0 |  |
| Sample CMP-C6-2 | 5.2 | 0.3 |  |
| Sample CMP-C6-3 | 5.0 | 0.3 |  |

TABLE C23

| Sample No. | Mean grain size ratio | Total reflectance | Irregular reflectance |
|---|---|---|---|
| Sample EMB-C6-2 | 1.0 | 1.0 | 1.0 |
| Sample CMP-C6-4 | 0.87 | 0.92 | 0.79 |
| Sample CMP-C6-5 | 0.90 | 0.87 | 0.82 |
| Sample CMP-C6-6 | 0.92 | 0.86 | 0.83 |

TABLE C24

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-C6 | 1.0 | 1.0 | 1.0 | 1.0 | 1.0 | 1.0 |
| CMP-C6-1 | 0.90 | 0.85 | 0.95 | 0.93 | 0.88 | 0.85 |
| CMP-C6-2 | 0.91 | 0.89 | 0.94 | 0.89 | 0.90 | 0.90 |
| CMP-C6-3 | 0.92 | 0.90 | 0.93 | 0.89 | 0.92 | 0.90 |

TABLE C25

| | |
|---|---|
| Substrate | Mirror finished stainless steel plate: SUS304 |
| Backside metallic reflection layer | CuAl: 200 nm Substrate temp.: Room temperature |
| Surface treatment | Phosphoric acid-acetic acid mixture ($H_3PO_4$:$HNO_3$:$CH_3COOH$ = 2:1:20) Ultrasonic wave: For 1 minute |
| Transparent conductive layer | ZnO: 1 μm Substrate temp.: 150° C. |
| $n_+$-type layer | $SiH_4$: 1 sccm $H_2$: 50 sccm $PH_3$ (diluted to 1% with $H_2$): 3 sccm Pressure: 1.2 Torr RF power: 2 W Substrate temp.: 300° C. |
| Polycrystalline i-layer | $SiF_4$: 100 sccm $H_2$: 20 sccm Ar: 100 sccm Pressure: 0.5 Torr MW power: 600 W Substrate temp.: 300° C. |
| p-type layer | $SiH_4$ (diluted to 10% with $H_2$): 0.5 sccm $H_2$: 80 sccm $BF_3$ (diluted to 2% with $H_2$): 4 sccm Pressure: 2 Torr RF power: 50 W Substrate temp.: 150° C. |
| Transparent electrode | $In_2O_3$ reactive evaporation method: 70 nm |
| Collecting electrode | Cr (100 nm)/Ag (1 μm)/Cr (100 nm) |

TABLE C26

| Sample No. | Grain size (μm) | Rmax (Transp.) (μm) | Surface profile (Subst.) (schematic view) |
|---|---|---|---|
| Sample EMB-C7-1 | 8.0 | 0.1 |  |
| Sample CMP-C7-1 | 0.09 | 0 | |
| Sample CMP-C7-2 | 4.3 | 0.2 |  |
| Sample CMP-C7-3 | 5.5 | 0.2 |  |

TABLE C27

| Sample No. | Mean grain size ratio | Total reflectance | Irregular reflectance |
|---|---|---|---|
| Sample EMB-C7-2 | 1.0 | 1.0 | 1.0 |
| Sample CMP-C7-4 | 0.88 | 0.96 | 0.81 |
| Sample CMP-C7-5 | 0.92 | 0.85 | 0.80 |
| Sample CMP-C7-6 | 0.93 | 0.82 | 0.79 |

TABLE C28

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-C7 | 1.0 | 1.0 | 1.0 | 1.0 | 1.0 | 1.0 |
| CMP-C7-1 | 0.93 | 0.90 | 0.90 | 0.90 | 0.80 | 0.81 |
| CMP-C7-2 | 0.94 | 0.92 | 0.87 | 0.86 | 0.85 | 0.86 |
| CMP-C7-3 | 0.95 | 0.92 | 0.85 | 0.83 | 0.84 | 0.86 |

TABLE C29

| | |
|---|---|
| Substrate | Stainless steel plate: SUS430 BA |
| Reflection layer | 100–3000 nm Substrate temp.: Room temperature |
| Surface treatment | Dry etching |
| Transparent conductive layer | ZnO: 1 μm Substrate temp.: 150° C. |

TABLE C30

| | | Grain size (μm) | | | | | | | | |
|---|---|---|---|---|---|---|---|---|---|---|
| | | 0.06 | 0.08 | 0.10 | 2.00 | 200 | 2000 | 2050 | 2200 | 2400 |
| Height difference (μm) | 0 | EMB-C8-1 | EMB-C8-2 | EMB-C8-3 | EMB-C8-4 | EMB-C8-5 | EMB-C8-6 | EMB-C8-7 | EMB-C8-8 | EMB-C8-9 |
| | 0.008 | EMB-C8-10 | EMB-C8-11 | EMB-C8-12 | EMB-C8-13 | EMB-C8-14 | EMB-C8-15 | EMB-C8-16 | EMB-C8-17 | EMB-C8-18 |
| | 0.01 | EMB-C8-19 | EMB-C8-20 | EMB-C8-21 | EMB-C8-22 | EMB-C8-23 | EMB-C8-24 | EMB-C8-25 | EMB-C8-26 | EMB-C8-27 |
| | 0.05 | EMB-C8-28 | EMB-C8-29 | EMB-C8-30 | EMB-C8-31 | EMB-C8-32 | EMB-C8-33 | EMB-C8-34 | EMB-C8-35 | EMB-C8-36 |
| | 0.40 | EMB-C8-37 | EMB-C8-38 | EMB-C8-39 | EMB-C8-40 | EMB-C8-41 | EMB-C8-42 | EMB-C8-43 | EMB-C8-44 | EMB-C8-45 |
| | 2.00 | EMB-C8-46 | EMB-C8-47 | EMB-C8-48 | EMB-C8-49 | EMB-C8-50 | EMB-C8-51 | EMB-C8-52 | EMB-C8-53 | EMB-C8-54 |
| | 2.10 | EMB-C8-55 | EMB-C8-56 | EMB-C8-57 | EMB-C8-58 | EMB-C8-59 | EMB-C8-60 | EMB-C8-61 | EMB-C8-62 | EMB-C8-63 |
| | 2.50 | EMB-C8-64 | EMB-C8-65 | EMB-C8-66 | EMB-C8-67 | EMB-C8-68 | EMB-C8-69 | EMB-C8-70 | EMB-C8-71 | EMB-C8-72 |
| | 2.80 | EMB-C8-73 | EMB-C8-74 | EMB-C8-75 | EMB-C8-76 | EMB-C8-77 | EMB-C8-78 | EMB-C8-79 | EMB-C8-80 | EMB-C8-81 |

TABLE C31

| Yield | | Grain size (μm) 0.06 | 0.08 | 0.10 | 2.00 | 200 | 2000 | 2050 | 2200 | 2400 |
|---|---|---|---|---|---|---|---|---|---|---|
| Height difference (μm) | 0 | 0.91 | 0.92 | 0.92 | 0.94 | 0.93 | 0.92 | 0.91 | 0.91 | 0.90 |
| | 0.008 | 0.94 | 0.92 | 0.93 | 0.91 | 0.92 | 0.93 | 0.94 | 0.93 | 0.90 |
| | 0.01 | 0.96 | 0.95 | 1.00 | 1.00 | 1.02 | 1.02 | 0.90 | 0.96 | 0.93 |
| | 0.05 | 0.97 | 0.96 | 1.00 | 1.00 | 1.01 | 1.03 | 0.93 | 0.94 | 0.95 |
| | 0.40 | 0.96 | 0.97 | 1.00 | 1.01 | 1.02 | 1.02 | 0.94 | 0.93 | 0.96 |
| | 2.00 | 0.92 | 0.97 | 1.01 | 1.01 | 1.01 | 1.04 | 0.93 | 0.94 | 0.95 |
| | 2.10 | 0.93 | 0.91 | 0.94 | 0.92 | 0.93 | 0.94 | 0.93 | 0.92 | 0.92 |
| | 2.50 | 0.90 | 0.89 | 0.89 | 0.90 | 0.91 | 0.92 | 0.91 | 0.92 | 0.91 |
| | 2.80 | 0.90 | 0.89 | 0.88 | 0.88 | 0.87 | 0.89 | 0.85 | 0.82 | 0.84 |

TABLE C32

| Adhesion test | | Grain size (μm) 0.06 | 0.08 | 0.10 | 2.00 | 200 | 2000 | 2050 | 2200 | 2400 |
|---|---|---|---|---|---|---|---|---|---|---|
| Height difference (μm) | 0 | 0.84 | 0.85 | 0.87 | 0.88 | 0.88 | 0.85 | 0.84 | 0.84 | 0.85 |
| | 0.008 | 0.85 | 0.84 | 0.85 | 0.83 | 0.81 | 0.82 | 0.83 | 0.81 | 0.84 |
| | 0.01 | 0.89 | 0.89 | 1.00 | 1.01 | 1.03 | 1.02 | 0.96 | 0.90 | 0.89 |
| | 0.05 | 0.92 | 0.92 | 1.04 | 1.03 | 1.03 | 1.02 | 0.94 | 0.93 | 0.94 |
| | 0.40 | 0.90 | 0.89 | 1.03 | 1.02 | 1.03 | 1.00 | 0.96 | 0.94 | 0.92 |
| | 2.00 | 0.91 | 0.91 | 1.03 | 1.04 | 1.02 | 1.04 | 0.95 | 0.95 | 0.91 |
| | 2.10 | 0.92 | 0.94 | 0.96 | 0.95 | 0.96 | 0.94 | 0.96 | 0.94 | 0.93 |
| | 2.50 | 0.93 | 0.92 | 0.94 | 0.95 | 0.95 | 0.94 | 0.95 | 0.94 | 0.93 |
| | 2.80 | 0.92 | 0.93 | 0.94 | 0.94 | 0.94 | 0.93 | 0.94 | 0.95 | 0.93 |

TABLE C33

| HHRB degradation | | Grain size (μm) 0.06 | 0.08 | 0.10 | 2.00 | 200 | 2000 | 2050 | 2200 | 2400 |
|---|---|---|---|---|---|---|---|---|---|---|
| Height difference (μm) | 0 | 0.84 | 0.82 | 0.82 | 0.84 | 0.84 | 0.84 | 0.82 | 0.84 | 0.84 |
| | 0.008 | 0.83 | 0.86 | 0.85 | 0.86 | 0.87 | 0.86 | 0.85 | 0.86 | 0.86 |
| | 0.01 | 0.87 | 0.86 | 1.00 | 1.03 | 1.02 | 1.03 | 0.88 | 0.84 | 0.83 |
| | 0.05 | 0.83 | 0.85 | 1.03 | 1.02 | 1.01 | 1.02 | 0.89 | 0.91 | 0.89 |
| | 0.40 | 0.87 | 0.88 | 1.02 | 1.01 | 1.01 | 1.01 | 0.88 | 0.95 | 0.94 |
| | 2.00 | 0.88 | 0.90 | 1.02 | 1.01 | 1.02 | 1.03 | 0.91 | 0.93 | 0.92 |
| | 2.10 | 0.89 | 0.91 | 0.91 | 0.92 | 0.92 | 0.91 | 0.90 | 0.90 | 0.91 |
| | 2.50 | 0.89 | 0.90 | 0.91 | 0.90 | 0.91 | 0.92 | 0.91 | 0.92 | 0.91 |
| | 2.80 | 0.90 | 0.91 | 0.92 | 0.91 | 0.90 | 0.92 | 0.91 | 0.90 | 0.90 |

TABLE C34

| Temperature and humidity degradation | | Grain size (μm) 0.06 | 0.08 | 0.10 | 2.00 | 200 | 2000 | 2050 | 2200 | 2400 |
|---|---|---|---|---|---|---|---|---|---|---|
| Height difference (μm) | 0 | 0.88 | 0.89 | 0.89 | 0.91 | 0.90 | 0.90 | 0.90 | 0.91 | 0.90 |
| | 0.008 | 0.91 | 0.90 | 0.91 | 0.90 | 0.89 | 0.90 | 0.90 | 0.89 | 0.90 |
| | 0.01 | 0.90 | 0.91 | 1.00 | 1.02 | 1.01 | 1.02 | 0.91 | 0.90 | 0.92 |
| | 0.05 | 0.90 | 0.91 | 1.02 | 1.00 | 1.01 | 1.02 | 0.95 | 0.93 | 0.95 |
| | 0.40 | 0.91 | 0.91 | 1.01 | 1.02 | 1.03 | 1.01 | 0.96 | 0.95 | 0.93 |
| | 2.00 | 0.92 | 0.91 | 1.00 | 1.01 | 1.01 | 1.02 | 0.95 | 0.93 | 0.95 |
| | 2.10 | 0.91 | 0.90 | 0.96 | 0.92 | 0.95 | 0.94 | 0.93 | 0.92 | 0.91 |
| | 2.50 | 0.90 | 0.91 | 0.90 | 0.91 | 0.90 | 0.92 | 0.91 | 0.92 | 0.93 |
| | 2.80 | 0.91 | 0.90 | 0.92 | 0.93 | 0.90 | 0.93 | 0.92 | 0.92 | 0.91 |

TABLE D1

| | |
|---|---|
| Substrate | Stainless steel plate: SUS430BA Thickness: 0.2 mm |
| Backside metallic reflection layer | Al: 2500 nm Substrate temp.: Room temperature |
| Surface treatment | Phosphoric acid-nitric acid mixture ($H_3PO_4$:$HNO_3$:$H_2O$ = 3:1:20)<br>Ultrasonic wave: For 30 seconds |

TABLE D1-continued

| | |
|---|---|
| Transparent conductive layer | ZnO: 1 $\mu$m Substrate temp.: 200° C. |
| n-type layer | $SiH_4$: 1 sccm $H_2$: 50 sccm<br>$PH_3$ (diluted to 1% with $H_2$): 0.5 sccm<br>Pressure: 1.2 Torr RF power: 2 W<br>Substrate temp.: 350° C. Thickness: 40 nm |
| RF i-layer | $Si_2H_6$: 4 sccm $H_2$: 80 sccm Pressure: 0.5 Torr<br>RF power: 2 W Substrate temp.: 300° C.<br>Thickness: 10 nm |
| MW i-layer | $SiH_4$: 40 sccm $GeH_4$: 40 sccm $H_2$: 150 sccm<br>Pressure: 10 m Torr MW power: 250 W<br>RF bias power: 700 W Substrate temp.: 380° C.<br>Thickness: 70 nm |
| RF i-layer | $Si_2H_6$: 4 sccm $H_2$: 80 sccm Pressure: 0.5 Torr<br>RF power: 2 W Substrate temp.: 300° C.<br>Thickness: 20 nm |
| Hydrogen plasma treatment | $H_2$: 100 sccm Pressure: 0.5 Torr<br>RF power: 30 W Substrate temp.: 250° C. |
| p-type layer | $SiH_4$ (diluted to 10% with $H_2$): 0.25 sccm $H_2$: 34 sccm<br>$BF_3$ (diluted to 2% with $H_2$): 2 sccm<br>Pressure: 2 Torr RF power: 30 W<br>Substrate temp.: 200° C. |
| Transparent electrode | $In_2O_3$ reactive evaporation method: 70 nm |
| Collecting electrode | Cr (100 nm)/Ag (1 $\mu$m)/Cr (100 nm) |

TABLE D2

| Sample No. | Grain size ($\mu$m) | Rmax (difference) ($\mu$m) | Surface profile (schematic view) |
|---|---|---|---|
| Sample EMB-D1-1 | 0.90 | 0.09 |  |
| Sample CMP-D1-1 | 0.90 | 0 |  |
| Sample CMP-D1-2 | 0.95 | 0.005 |  |
| Sample CMP-D1-3 | 0.80 | 0.005 |  |

TABLE D3

| Sample No. | Mean grain size ratio | Total reflectance | Irregular reflectance |
|---|---|---|---|
| Sample EMB-D1-2 | 1.0 | 1.0 | 1.0 |
| Sample CMP-D1-4 | 0.83 | 0.93 | 0.80 |
| Sample CMP-D1-5 | 0.91 | 0.75 | 0.78 |
| Sample CMP-D1-6 | 0.92 | 0.70 | 0.70 |

TABLE D4

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-D1 | 1.0 | 1.0 | 1.0 | 1.0 | 1.0 | 1.0 |
| CMP-D1-1 | 0.88 | 0.89 | 0.94 | 0.90 | 0.88 | 0.88 |
| CMP-D1-2 | 0.91 | 0.91 | 0.89 | 0.83 | 0.90 | 0.89 |
| CMP-D1-3 | 0.92 | 0.92 | 0.84 | 0.81 | 0.92 | 0.93 |

TABLE D5

| | |
|---|---|
| Substrate | Stainless steel plate: SUS430-2B Thickness: 0.3 mm |
| Reflection layer | AlSi: 200 nm Substrate temp.: Room temperature |
| Surface treatment | RF sputtering<br>RF 150 W: For 15 minutes<br>Substrate temp.: Room temperature |
| Transparent conductive layer | ZnO: 1 $\mu$m Substrate temp.: 300° C. |
| n-type layer | $SiH_4$: 1 sccm $H_2$: 50 sccm<br>$PH_3$ (diluted to 1% with $H_2$): 0.5 sccm<br>Pressure: 1.2 Torr RF power: 2 W<br>Substrate temp.: 350° C. Thickness: 40 nm |
| RF i-layer | $Si_2H_6$: 4 sccm $H_2$: 80 sccm Pressure: 0.5 Torr<br>RF power: 2 W Substrate temp.: 300° C.<br>Thickness: 10 nm |
| MW i-layer | $SiH_4$: 40 sccm $GeH_4$: 40 sccm $H_2$: 150 sccm<br>Pressure: 10 m Torr MW power: 250 W<br>RF bias power: 700 W Substrate temp.: 380° C.<br>Thickness: 70 nm |
| RF i-layer | $Si_2H_6$: 4 sccm $H_2$: 80 sccm Pressure: 0.5 Torr<br>RF power: 2 W Substrate temp.: 300° C.<br>Thickness: 20 nm |
| Hydrogen plasma treatment | $H_2$: 100 sccm Pressure: 0.5 Torr<br>RF power: 30 W Substrate temp.: 250° C. |
| p-type layer | $SiH_4$ (diluted to 10% with $H_2$): 0.25 sccm $H_2$: 34 sccm<br>$BF_3$ (diluted to 2% with $H_2$): 2 sccm<br>Pressure: 2 Torr RF power: 30 W<br>Substrate temp.: 200° C. |
| Transparent electrode | $In_2O_3$ reactive evaporation method: 70 nm |
| Collecting electrode | Cr (100 nm)/Ag (1 $\mu$m)/Cr (100 nm) |

TABLE D6

| Sample No. | Grain size ($\mu$m) | Rmax (difference) ($\mu$m) | Surface profile (schematic view) |
|---|---|---|---|
| Sample EMB-D2-1 | 6.0 | 0.05 |  |
| Sample CMP-D2-1 | 6.0 | 0 |  |
| Sample CMP-D2-2 | 5.5 | 0.005 |  |

TABLE D6-continued

| Sample No. | Grain size (μm) | Rmax (difference) (μm) | Surface profile (schematic view) |
| --- | --- | --- | --- |
| Sample CMP-D2-3 | 5.0 | 0.005 |  |

TABLE D7

| Sample No. | Mean grain size ratio | Total reflectance | Irregular reflectance |
| --- | --- | --- | --- |
| Sample EMB-D2-2 | 1.0 | 1.0 | 1.0 |
| Sample CMP-D2-4 | 0.86 | 0.94 | 0.90 |
| Sample CMP-D2-5 | 0.90 | 0.87 | 0.80 |
| Sample CMP-D2-6 | 0.92 | 0.88 | 0.80 |

TABLE D8

| Cell No. | Yield | Adhesion | Initial Efficiency | Efficiency following optical degradation | Efficiency following HHRB degradation | Efficiency following temperature and humidity degradation |
| --- | --- | --- | --- | --- | --- | --- |
| EMB-D2 | 1.0 | 1.0 | 1.0 | 1.0 | 1.0 | 1.0 |
| CMP-D2-1 | 0.90 | 0.84 | 0.91 | 0.89 | 0.83 | 0.82 |
| CMP-D2-2 | 0.91 | 0.92 | 0.88 | 0.85 | 0.84 | 0.88 |
| CMP-D2-3 | 0.91 | 0.91 | 0.86 | 0.84 | 0.83 | 0.89 |

TABLE D9

| | |
| --- | --- |
| Substrate | Stainless steel plate: SUS430-2D Thickness: 0.2 mm |
| Reflection layer | AlSi: 3000 nm Substrate temp.: Room temperature |
| Surface treatment | Dry etching<br>RF 200 W: For 5 minutes<br>Substrate temp.: Room temperature |
| Transparent conductive layer | ZnO: 1 μm Substrate temp.: 300° C. |
| n-type layer | $SiH_4$: 1 sccm $H_2$: 50 sccm<br>$PH_3$ (diluted to 1% with $H_2$): 0.5 sccm<br>Pressure: 1.2 Torr RF power: 2 W<br>Substrate temp.: 350° C. Thickness: 40 nm |
| RF i-layer | $Si_2H_6$: 4 sccm $H_2$: 80 sccm Pressure: 0.5 Torr<br>RF power: 2 W Substrate temp.: 300° C.<br>Thickness: 10 nm |
| MW i-layer | $SiH_4$: 40 sccm $GeH_4$: 40 sccm $H_2$: 150 sccm<br>Pressure: 10 m Torr MW power: 250 W<br>RF bias power: 700 W Substrate temp.: 380° C.<br>Thickness: 70 nm |
| RF i-layer | $Si_2H_6$: 4 sccm $H_2$: 80 sccm Pressure: 0.5 Torr<br>RF power: 2 W Substrate temp.: 300° C.<br>Thickness: 20 nm |
| Hydrogen plasma treatment | $H_2$: 100 sccm Pressure: 0.5 Torr<br>RF power: 30 W Substrate temp.: 250° C. |
| p-type layer | $SiH_4$ (diluted to 10% with $H_2$): 0.25 sccm $H_2$: 34 sccm<br>$BF_3$ (diluted to 2% with $H_2$): 2 sccm<br>Pressure: 2 Torr RF power: 30 W<br>Substrate temp.: 200° C. |
| Transparent electrode | $In_2O_3$ reactive evaporation method: 70 nm |
| Collecting electrode | Cr (100 nm)/Ag (1 μm)/Cr (100 nm) |

TABLE D10

| Sample No. | Grain size (μm) | Rmax (difference) (μm) | Surface profile (Ref.) (schematic view) | Surface profile (Transp.) (schematic view) |
|---|---|---|---|---|
| Sample EMB-D3-1 | 7.5 | 0.12 |  |  |
| Sample CMP-D3-1 | 0.008 | 0 | — | — |
| Sample CMP-D3-2 | 8.5 | 0.13 |  |  |
| Sample CMP-D3-3 | 10.0 | 0.14 |  |  |

TABLE D11

| Sample No. | Mean grain size ratio | Total reflectance | Irregular reflectance |
|---|---|---|---|
| Sample EMB-D3-2 | 1.0 | 1.0 | 1.0 |
| Sample CMP-D3-4 | 0.83 | 0.92 | 0.70 |
| Sample CMP-D3-5 | 0.93 | 0.85 | 0.84 |
| Sample CMP-D3-6 | 0.92 | 0.80 | 0.79 |

TABLE D12

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-D3 | 1.0 | 1.0 | 1.0 | 1.0 | 1.0 | 1.0 |
| CMP-D3-1 | 0.90 | 0.90 | 0.92 | 0.90 | 0.87 | 0.83 |
| CMP-D3-2 | 0.93 | 0.92 | 0.86 | 0.84 | 0.82 | 0.84 |
| CMP-D3-3 | 0.92 | 0.92 | 0.85 | 0.85 | 0.82 | 0.79 |

TABLE D13

| | |
|---|---|
| Substrate | Stainless steel plate: SUS430-2D Thickness: 0.3 mm |
| Reflection layer | Ag: 200 nm Substrate temp.: Room temperature |
| Surface treatment | RF sputtering<br>RF 200 W: For 2 minutes |
| Transparent conductive layer | ZnO: 1 μm Substrate temp.: 280° C. |

TABLE D14

| Sample No. | Grain size (μm) | Rmax (difference) (μm) | Surface profile (Ref.) (schematic view) | Surface profile (Transp.) (schematic view) |
|---|---|---|---|---|
| Sample EMB-D4-1 | 5.0 | 0.12 |  |  |
| Sample CMP-D4-1 | 5.1 | 0.13 |  | — |

TABLE D14-continued

| Sample No. | Grain size (μm) | Rmax (difference) (μm) | Surface profile (Ref.) (schematic view) | Surface profile (Transp.) (schematic view) |
|---|---|---|---|---|
| Sample CMP-D4-2 | 5.1 | 0.12 |  |  |
| Sample CMP-D4-3 | 5.2 | 0.009 |  |  |

TABLE D15

| Sample No. | Mean grain size ratio | Total reflectance | Irregular reflectance |
|---|---|---|---|
| Sample EMB-D4-2 | 1.0 | 1.0 | 1.0 |
| Sample CMP-D4-4 | 0.89 | 0.95 | 0.81 |
| Sample CMP-D4-5 | 0.91 | 0.82 | 0.80 |
| Sample CMP-D4-6 | 0.89 | 0.82 | 0.78 |

TABLE D16

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-D4 | 1.0 | 1.0 | 1.0 | 1.0 | 1.0 | 1.0 |
| CMP-D4-1 | 0.89 | 0.87 | 0.92 | 0.92 | 0.91 | 0.89 |
| CMP-D4-2 | 0.90 | 0.91 | 0.88 | 0.88 | 0.87 | 0.86 |
| CMP-D4-3 | 0.90 | 0.91 | 0.88 | 0.86 | 0.85 | 0.86 |

TABLE D17

| | |
|---|---|
| Substrate | Stainless steel plate: SUS430-2B Thickness: 0.25 mm |
| Reflection layer | CuAl: 200 nm Substrate temp.: Room temperature |
| Surface treatment | Hydrofluoric acid-nitric acid mixture ($HF:HNO_3:H_2O$ = 1:3:300) Ultrasonic cleaning: For 1 minute |
| Transparent conductive layer | ZnO: 1.2 μm Substrate temp.: 175° C. |

TABLE D18

| Sample No. | Grain size (μm) | Rmax (difference) (μm) | Surface profile (Ref.) (schematic view) | Surface profile (Photov.) (schematic view) |
|---|---|---|---|---|
| Sample EMB-D5-1 | 5.8 | 0.16 |  |  |
| Sample CMP-D5-2 | 5.8 | 0.15 |  |  |
| Sample CMP-D5-2 | 5.9 | 0.16 |  |  |
| Sample CMP-D5-3 | 3.2 | 0.20 |  |  |

TABLE D19

| Sample No. | Mean grain size ratio | Total reflectance | Irregular reflectance |
|---|---|---|---|
| Sample EMB-D5-2 | 1.0 | 1.0 | 1.0 |
| Sample CMP-D5-4 | 0.89 | 0.95 | 0.77 |
| Sample CMP-D5-5 | 0.93 | 0.83 | 0.82 |
| Sample CMP-D5-6 | 0.92 | 0.82 | 0.81 |

TABLE D20

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-D5 | 1.0 | 1.0 | 1.0 | 1.0 | 1.0 | 1.0 |
| CMP-D5-1 | 0.92 | 0.90 | 0.91 | 0.88 | 0.87 | 0.84 |
| CMP-D5-2 | 0.92 | 0.89 | 0.90 | 0.93 | 0.89 | 0.90 |
| CMP-D5-3 | 0.95 | 0.92 | 0.90 | 0.84 | 0.88 | 0.87 |

TABLE D21

| | |
|---|---|
| Substrate | Stainless steel sheet: SUS430-BA<br>Thickness: 0.125 mm |
| Reflection layer | AlSi: 100 nm Substrate temp.: Room temperature |
| Surface treatment | RF sputtering<br>RF 100 W: For 5 minutes<br>Substrate temp.: Room temperature |
| Transparent conductive layer | ZnO: 0.75 μm Substrate temp.: 250° C. |
| n1-layer | a-Si Thickness: 20 nm |
| RF i1-layer | a-Si Thickness: 10 nm |
| MW i1-layer | a-SiGe Thickness: 60 nm |
| RF i1-layer | a-Si Thickness: 18 nm |
| p1-layer | μc-Si Thickness: 15 nm |
| n2-layer | a-Si Thickness: 10 nm |
| RF i2-layer | a-Si Thickness: 10 nm |
| MW i2-layer | a-SiGe Thickness: 50 nm |
| RF i2-layer | a-Si Thickness: 18 nm |
| p2-layer | μc-Si Thickness: 15 nm |
| n3-layer | a-Si Thickness: 10 nm |
| RF i3-layer | a-Si Thickness: 90 nm |
| p3-layer | μc-Si Thickness: 20 nm |
| Transparent electrode | ITO Thickness: 75 nm |
| Collecting electrode | Ag paste Thickness: 10 μm |

TABLE D22

| Sample No. | Grain size (μm) | Rmax (difference) (μm) | Surface profile (Ref.) (schematic view) |
|---|---|---|---|
| Sample EMB-D6-1 | 4.5 | 0.08 |  |
| Sample CMP-D6-1 | 4.5 | 0 |  |
| Sample CMP-D6-2 | 4.0 | 0.008 |  |
| Sample CMP-D6-3 | 4.5 | 0.007 |  |

TABLE D23

| Sample No. | Mean grain size ratio | Total reflectance | Irregular reflectance |
|---|---|---|---|
| Sample EMB-D6-2 | 1.0 | 1.0 | 1.0 |
| Sample CMP-D6-4 | 0.89 | 0.91 | 0.80 |
| Sample CMP-D6-5 | 0.92 | 0.91 | 0.82 |
| Sample CMP-D6-6 | 0.93 | 0.84 | 0.82 |

TABLE D24

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-D6 | 1.0 | 1.0 | 1.0 | 1.0 | 1.0 | 1.0 |
| CMP-D6-1 | 0.90 | 0.85 | 0.93 | 0.90 | 0.85 | 0.80 |
| CMP-D6-2 | 0.92 | 0.89 | 0.90 | 0.88 | 0.88 | 0.87 |
| CMP-D6-3 | 0.94 | 0.92 | 0.91 | 0.90 | 0.89 | 0.88 |

TABLE D25

| | |
|---|---|
| Substrate | Mirror finished stainless steel plate: SUS304<br>Thickness: 0.3 mm |
| Backside metallic reflection layer | CuAg: 200 nm Substrate temp.: Room temperature |
| Surface treatment | Phosphoric acid-acetic acid mixture<br>($H_3PO_4$:$HNO_3$:$CH_3COOH$ = 2:1:30)<br>Ultrasonic wave: For 0.5 minutes |
| Transparent conductive layer | ZnO: 1 $\mu$m Substrate temp.: 175° C. |
| n-type layer | $SiH_4$: 1 sccm $H_2$: 50 sccm<br>$PH_3$ (diluted to 1% with $H_2$): 3 sccm Pressure: 1.2 Torr<br>RF power: 2 W Substrate temp.: 300° C. |
| Polycrystalline i-layer | $SiF_4$: 100 sccm $H_2$: 20 sccm Ar: 100 sccm<br>Pressure: 0.5 Torr MW power: 600 W<br>Substrate temp.: 300° C. |
| p-type layer | $SiH_4$ (diluted to 10% with $H_2$): 0.5 sccm $H_2$: 80 sccm<br>$BF_3$ (diluted to 2% with $H_2$): 4 sccm Pressure: 2 Torr<br>RF power: 50 W Substrate temp.: 150° C. |
| Transparent electrode | $In_2O_3$ reactive evaporation method: 70 nm |
| Collecting electrode | Cr (100 nm)/Ag (1 $\mu$m)/Cr (100 nm) |

TABLE D26

| Sample No. | Grain size ($\mu$m) | Rmax (difference) ($\mu$m) | Surface profile (Ref.) (schematic view) |
|---|---|---|---|
| Sample EMB-D7-1 | 6.0 | 0.18 |  |
| Sample CMP-D7-1 | 5.5 | 0 | |
| Sample CMP-D7-2 | 6.0 | 0.20 |  |
| Sample CMP-D7-3 | 6.5 | 0.20 |  |

TABLE D27

| Sample No. | Mean grain size ratio | Total reflectance | Irregular reflectance |
|---|---|---|---|
| Sample EMB-D7-2 | 1.0 | 1.0 | 1.0 |
| Sample CMP-D7-4 | 0.89 | 0.95 | 0.80 |
| Sample CMP-D7-5 | 0.91 | 0.86 | 0.82 |
| Sample CMP-D7-6 | 0.93 | 0.81 | 0.77 |

TABLE D28

| Cell No. | Yield | Adhesion | Initial Efficiency | Efficiency following optical degradation | Efficiency following HHRB degradation | Efficiency following temperature and humidity degradation |
|---|---|---|---|---|---|---|
| EMB-D7 | 1.0 | 1.0 | 1.0 | 1.0 | 1.0 | 1.0 |
| CMP-D7-1 | 0.92 | 0.86 | 0.91 | 0.91 | 0.86 | 0.94 |
| CMP-D7-2 | 0.91 | 0.90 | 0.89 | 0.88 | 0.89 | 0.86 |
| CMP-D7-3 | 0.95 | 0.91 | 0.86 | 0.83 | 0.83 | 0.86 |

TABLE D29

| | |
|---|---|
| Substrate | Stainless steel plate: SUS430BA |
| Reflection layer | 100–3000 nm Substrate temp.: Room temperature |
| Surface treatment | Dry etching |
| Transparent conductive layer | ZnO: 1 μm Substrate temp.: 150° C. |

TABLE D30

| | | Grain size (μm) | | | | | | | | |
|---|---|---|---|---|---|---|---|---|---|---|
| | | 0.05 | 0.08 | 0.10 | 2.00 | 100 | 2000 | 2100 | 3000 | 3200 |
| Rmax (Difference) (μm) | 0 | EMB-D8-1 | EMB-D8-2 | EMB-D8-3 | EMB-D8-4 | EMB-D8-5 | EMB-D8-6 | EMB-D8-7 | EMB-D8-8 | EMB-D8-9 |
| | 0.008 | EMB-D8-10 | EMB-D8-11 | EMB-D8-12 | EMB-D8-13 | EMB-D8-14 | EMB-D8-15 | EMB-D8-16 | EMB-D8-17 | EMB-D8-18 |
| | 0.01 | EMB-D8-19 | EMB-D8-20 | EMB-D8-21 | EMB-D8-22 | EMB-D8-23 | EMB-D8-24 | EMB-D8-25 | EMB-D8-26 | EMB-D8-27 |
| | 0.10 | EMB-D8-28 | EMB-D8-29 | EMB-D8-30 | EMB-D8-31 | EMB-D8-32 | EMB-D8-33 | EMB-D8-34 | EMB-D8-35 | EMB-D8-36 |
| | 0.50 | EMB-D8-37 | EMB-D8-38 | EMB-D8-39 | EMB-D8-40 | EMB-D8-41 | EMB-D8-42 | EMB-D8-43 | EMB-D8-44 | EMB-D8-45 |
| | 1.50 | EMB-D8-46 | EMB-D8-47 | EMB-D8-48 | EMB-D8-49 | EMB-D8-50 | EMB-D8-51 | EMB-D8-52 | EMB-D8-53 | EMB-D8-54 |
| | 1.60 | EMB-D8-55 | EMB-D8-56 | EMB-D8-57 | EMB-D8-58 | EMB-D8-59 | EMB-D8-60 | EMB-D8-61 | EMB-D8-62 | EMB-D8-63 |
| | 4.50 | EMB-D8-64 | EMB-D8-65 | EMB-D8-66 | EMB-D8-67 | EMB-D8-68 | EMB-D8-69 | EMB-D8-70 | EMB-D8-71 | EMB-D8-72 |
| | 8.20 | EMB-D8-73 | EMB-D8-74 | EMB-D8-75 | EMB-D8-76 | EMB-D8-77 | EMB-D8-78 | EMB-D8-79 | EMB-D8-80 | EMB-D8-81 |

TABLE D31

| Yield | | Grain size (μm) 0.05 | 0.08 | 0.10 | 2.00 | 100 | 2000 | 2100 | 3000 | 3200 |
|---|---|---|---|---|---|---|---|---|---|---|
| Rmax | 0 | 0.91 | 0.92 | 0.91 | 0.93 | 0.92 | 0.92 | 0.93 | 0.92 | 0.91 |
| (Difference) | 0.008 | 0.94 | 0.94 | 0.94 | 0.95 | 0.94 | 0.93 | 0.95 | 0.95 | 0.93 |
| (μm) | 0.01 | 0.97 | 0.96 | 1.00 | 1.02 | 1.02 | 1.03 | 0.94 | 0.96 | 0.93 |
| | 0.10 | 0.97 | 0.97 | 1.02 | 1.03 | 1.00 | 1.02 | 0.95 | 0.93 | 0.92 |
| | 0.50 | 0.97 | 0.97 | 1.01 | 1.02 | 1.00 | 1.02 | 0.96 | 0.95 | 0.94 |
| | 1.50 | 0.96 | 0.98 | 1.02 | 1.00 | 1.01 | 1.02 | 0.97 | 0.94 | 0.96 |
| | 1.60 | 0.95 | 0.94 | 0.95 | 0.96 | 0.97 | 0.96 | 0.95 | 0.94 | 0.93 |
| | 4.50 | 0.89 | 0.90 | 0.91 | 0.91 | 0.92 | 0.91 | 0.92 | 0.91 | 0.90 |
| | 8.20 | 0.88 | 0.87 | 0.88 | 0.89 | 0.90 | 0.89 | 0.90 | 0.88 | 0.84 |

TABLE D32

| Adhesion test | | Grain size (μm) 0.05 | 0.08 | 0.10 | 2.00 | 100 | 2000 | 2100 | 3000 | 3200 |
|---|---|---|---|---|---|---|---|---|---|---|
| Rmax | 0 | 0.85 | 0.86 | 0.88 | 0.91 | 0.91 | 0.85 | 0.91 | 0.86 | 0.87 |
| (Difference) | 0.008 | 0.88 | 0.86 | 0.86 | 0.84 | 0.81 | 0.81 | 0.80 | 0.82 | 0.82 |
| (μm) | 0.01 | 0.90 | 0.89 | 1.00 | 1.01 | 1.02 | 1.00 | 0.98 | 0.94 | 0.92 |
| | 0.10 | 0.92 | 0.93 | 1.03 | 1.01 | 1.01 | 1.01 | 0.98 | 0.96 | 0.93 |
| | 0.50 | 0.91 | 0.90 | 1.01 | 1.03 | 1.01 | 0.94 | 0.96 | 0.93 | 0.96 |
| | 1.50 | 0.94 | 0.92 | 1.02 | 1.02 | 1.02 | 1.02 | 0.96 | 0.95 | 0.91 |
| | 1.60 | 0.95 | 0.95 | 0.96 | 0.96 | 0.98 | 0.95 | 0.96 | 0.95 | 0.95 |
| | 4.50 | 0.94 | 0.92 | 0.96 | 0.94 | 0.97 | 0.95 | 0.95 | 0.97 | 0.94 |
| | 8.20 | 0.93 | 0.93 | 0.93 | 0.94 | 0.95 | 0.95 | 0.95 | 0.93 | 0.94 |

TABLE D33

| HHRB degradation | | Grain size (μm) 0.05 | 0.08 | 0.10 | 2.00 | 100 | 2000 | 2100 | 3000 | 3200 |
|---|---|---|---|---|---|---|---|---|---|---|
| Rmax | 0 | 0.83 | 0.83 | 0.82 | 0.83 | 0.82 | 0.85 | 0.84 | 0.82 | 0.82 |
| (Difference) | 0.008 | 0.82 | 0.84 | 0.85 | 0.83 | 0.84 | 0.85 | 0.83 | 0.84 | 0.82 |
| (μm) | 0.01 | 0.84 | 0.85 | 1.00 | 1.02 | 1.01 | 1.02 | 0.86 | 0.86 | 0.85 |
| | 0.10 | 0.85 | 0.85 | 1.02 | 1.00 | 1.02 | 1.02 | 0.95 | 0.91 | 0.90 |
| | 0.50 | 0.88 | 0.89 | 1.02 | 1.03 | 1.01 | 1.01 | 0.92 | 0.92 | 0.92 |
| | 1.50 | 0.89 | 0.89 | 1.02 | 1.02 | 1.02 | 1.02 | 0.98 | 0.96 | 0.95 |
| | 1.60 | 0.90 | 0.91 | 0.91 | 0.95 | 0.94 | 0.92 | 0.92 | 0.92 | 0.92 |
| | 4.50 | 0.92 | 0.92 | 0.91 | 0.93 | 0.91 | 0.92 | 0.93 | 0.94 | 0.92 |
| | 8.20 | 0.91 | 0.92 | 0.90 | 0.93 | 0.92 | 0.92 | 0.91 | 0.92 | 0.91 |

TABLE D34

| Temperature and humidity degradation | | Grain size (μm) 0.05 | 0.08 | 0.10 | 2.00 | 100 | 2000 | 2100 | 3000 | 3200 |
|---|---|---|---|---|---|---|---|---|---|---|
| Rmax | 0 | 0.89 | 0.90 | 0.91 | 0.90 | 0.91 | 0.91 | 0.92 | 0.92 | 0.90 |
| (Difference) | 0.008 | 0.90 | 0.89 | 0.90 | 0.91 | 0.95 | 0.88 | 0.86 | 0.88 | 0.88 |
| (μm) | 0.01 | 0.90 | 0.92 | 1.00 | 1.02 | 1.01 | 1.02 | 0.93 | 0.95 | 0.91 |
| | 0.10 | 0.92 | 0.95 | 1.03 | 1.03 | 1.02 | 1.01 | 0.96 | 0.95 | 0.94 |
| | 0.50 | 0.91 | 0.93 | 1.02 | 1.03 | 1.01 | 1.01 | 0.96 | 0.95 | 0.94 |
| | 1.50 | 0.90 | 0.95 | 1.01 | 1.02 | 1.01 | 1.02 | 0.95 | 0.94 | 0.91 |
| | 1.60 | 0.91 | 0.93 | 0.95 | 0.93 | 0.92 | 0.91 | 0.95 | 0.91 | 0.92 |
| | 4.50 | 0.90 | 0.90 | 0.91 | 0.92 | 0.92 | 0.93 | 0.93 | 0.91 | 0.91 |
| | 8.20 | 0.92 | 0.93 | 0.92 | 0.91 | 0.92 | 0.93 | 0.93 | 0.92 | 0.91 |

TABLE D35

| | |
|---|---|
| Substrate | Stainless steel plate: SUS430-2B |
| Reflection layer | 50–2000 nm Substrate temp.: Room temperature |
| Surface treatment | Phosphoric acid-nitric acid-acetic acid mixture |
| Transparent conductive layer | ZnO: 1 μm Substrate temp.: 150° C. |

TABLE D36

| | Rmax (μm) | | | | | | | | |
|---|---|---|---|---|---|---|---|---|---|
| | 0.005 | 0.008 | 0.010 | 0.012 | 0.100 | 0.500 | 1.00 | 1.20 | 1.50 |
| Yield | 0.89 | 0.90 | 1.00 | 1.01 | 1.02 | 1.02 | 1.03 | 0.96 | 0.95 |

TABLE D37

| | Rmax (μm) | | | | | | | | |
|---|---|---|---|---|---|---|---|---|---|
| | 0.005 | 0.008 | 0.010 | 0.012 | 0.100 | 0.500 | 1.00 | 1.20 | 1.50 |
| Adhesion test | 0.81 | 0.82 | 1.00 | 1.02 | 1.00 | 1.02 | 1.01 | 0.96 | 0.94 |

TABLE D38

| | Rmax (μm) | | | | | | | | |
|---|---|---|---|---|---|---|---|---|---|
| | 0.005 | 0.008 | 0.010 | 0.012 | 0.100 | 0.500 | 1.00 | 1.20 | 1.50 |
| HHRB degradation | 0.92 | 0.92 | 1.00 | 1.01 | 1.02 | 1.02 | 1.00 | 0.93 | 0.92 |

TABLE D39

| | Rmax (μm) | | | | | | | | |
|---|---|---|---|---|---|---|---|---|---|
| | 0.005 | 0.008 | 0.010 | 0.012 | 0.100 | 0.500 | 1.00 | 1.20 | 1.50 |
| Temperature and humidity degradation | 0.90 | 0.91 | 1.00 | 1.03 | 1.02 | 1.02 | 1.01 | 0.88 | 0.86 |

TABLE D40

| | |
|---|---|
| Substrate | Stainless steel plate: SUS430-2B |
| Reflection layer | 100–2500 nm Substrate temp.: Room temperature |
| Surface treatment | Phosphoric acid-nitric acid-acetic acid mixture |
| Transparent conductive layer | ZnO: 1 μm Substrate temp.: 150° C. |

TABLE D41

| | Height difference (μm) | | | | | | | | |
|---|---|---|---|---|---|---|---|---|---|
| | 0.005 | 0.008 | 0.010 | 0.012 | 0.100 | 0.900 | 2.00 | 2.20 | 2.50 |
| Yield | 0.89 | 0.90 | 1.00 | 1.01 | 1.02 | 1.02 | 1.03 | 0.96 | 0.95 |

TABLE D42

| | Height difference (μm) | | | | | | | | |
|---|---|---|---|---|---|---|---|---|---|
| | 0.005 | 0.008 | 0.010 | 0.012 | 0.100 | 0.900 | 2.00 | 2.20 | 2.50 |
| Adhesion test | 0.81 | 0.82 | 1.00 | 1.02 | 1.00 | 1.02 | 1.01 | 0.96 | 0.94 |

TABLE D43

| | Height difference (μm) | | | | | | | | |
|---|---|---|---|---|---|---|---|---|---|
| | 0.005 | 0.008 | 0.010 | 0.012 | 0.100 | 0.900 | 2.00 | 2.20 | 2.50 |
| HHRB degradation | 0.92 | 0.92 | 1.00 | 1.01 | 1.02 | 1.02 | 1.00 | 0.93 | 0.92 |

TABLE D44

| | Height difference (μm) | | | | | | | | |
|---|---|---|---|---|---|---|---|---|---|
| | 0.005 | 0.008 | 0.010 | 0.012 | 0.100 | 0.900 | 2.00 | 2.20 | 2.50 |
| Temperature and humidity degradation | 0.91 | 0.89 | 1.00 | 1.01 | 1.02 | 1.02 | 1.01 | 0.87 | 0.84 |

Although the invention has been described through its specific terms, it is to be understood that the described embodiments are only illustrative and various changes and modifications may be imparted thereto without departing from the scope of the present invention which is limited solely by the appended claims.

What is claimed is:

1. A photovoltaic device comprising:

a substrate made of a polycrystalline material; and a non-single-crystal semiconductor formed on said substrate;

wherein polycrystal grains having a smooth surface parallel to a principal surface of said substrate and polycrystal grains having a rough surface not parallel to the principal surface of said substrate exist in the surface of said substrate.

2. A photovoltaic device according to claim 1, further comprising a metallic back-side reflection layer formed on said substrate, a transparent conductive layer formed on said metallic back-side reflection layer, and a non-single-crystal semiconductor formed on said transparent conductive layer.

3. A photovoltaic device according to claim 2, wherein the surface of said transparent conductive layer has different degrees of roughness corresponding to the polycrystal grain boundaries of said substrate.

4. A photovoltaic device according to claim 2, wherein the predominant amount of material of said metallic back-side reflection layer is at least one element selected from the group consisting of gold, silver, copper, aluminum and magnesium.

5. A photovoltaic device according to claim 1, wherein the surface of said metallic back-side reflection layer has different degrees of roughness corresponding to the polycrystal grain boundaries of said substrate.

6. A photovoltaic device according to claim 1, wherein the surface of said photovoltaic device has different degrees of roughness corresponding to the polycrystal grain boundaries of said substrate.

7. A photovoltaic device according to claim 1, wherein the surface of said substrate has a step along the polycrystal grain boundary, or a protrusion or a recess at the polycrystalline grain boundaries.

8. A photovoltaic device according to claim 7, wherein the height and depth of the step, protrusion or recess existing on the surface of said substrate along the polycrystalline crystal grain boundary ranges from 0.01 μm to 2 μm.

9. A photovoltaic device according to claim 1, wherein the predominant amount of material of said substrate is a metal or an alloy.

10. A photovoltaic device according to claim 1, wherein the difference in the degree of roughness of the surfaces of the individual polycrystal grains exposed on the surface of said substrate ranges from 0.01 μm to 1.5 μm in terms of the difference in Rmax.

11. A photovoltaic device according to claim 1, wherein the mean grain size of the polycrystal grains of said substrate ranges from 0.1 μm to 2 mm.

12. A photovoltaic device comprising.

a substrate; and a polycrystalline film and a non-single-crystal semiconductor which are formed on said substrate;

wherein each of the individual polycrystal grains of said polycrystalline film has a smooth surface parallel to a principal surface of said substrate, and the surface of said polycrystalline film has a step along the polycrystal grain boundary, or a protrusion or recess at the grain boundary and wherein the predominant amount of material of said polycrystalline film is at least one element selected from the group consisting of gold, silver, copper, aluminum and magnesium.

13. A photovoltaic device comprising: in sequence a substrate;

a polycrystalline film; a transparent conductive layer and a non-single-crystal semiconductor which are formed on said substrate;

wherein each of the individual polycrystal grains of said polycrystalline film has a smooth surface parallel to a principal surface of said substrate, and the surface of said polycrystalline film has a step along the polycrystal grain boundary, or a protrusion or recess at the grain boundary.

14. A photovoltaic device according to claim 13 wherein the predominant amount of material of said polycrystalline film is a metal or an alloy.

15. A photovoltaic device according to claim 13, wherein the surface of said transparent conductive layer has a step, protrusion or a recess corresponding to the polycrystal grain boundary of said polycrystalline film.

16. A photovoltaic device comprising:

a substrate and;

a polycrystalline film and a non-single-crystal semiconductor which are formed on said substrate; wherein said polycrystalline film is a transparent conductive layer and wherein each of the individual polycrystal grains of said polycrystalline film has a smooth surface parallel to a principal surface of said substrate, and the surface of said polycrystalline film has a step along the polycrystal grain boundary, or a protrusion or recess at the grain boundary.

17. A photovoltaic device according to claim 12, 13 or 16, wherein the surface of said photovoltaic device has a step, protrusion or a recess corresponding to the polycrystal grain boundary of said polycrystalline film.

18. A photovoltaic device according to claim 12, 13 or 16, wherein the height or depth of the step, protrusion or recess at the polycrystal grain boundary ranges from 0.1 μm to 2 μm.

19. A photovoltaic device according to claim 12, 13 or 16, wherein the mean grain size of said polycrystal of said polycrystalline film ranges from 0.1 μm to 2 mm.

20. A photovoltaic device according to claim 12, 13 or 16, wherein a degree of roughness of the surface of said substrate ranges from 0.01 μm to 1 μm in terms of Rmax.

21. A photovoltaic device comprising:

a substrate; and a polycrystalline film and a non-single-crystal semiconductor;

wherein polycrystal grains having a smooth surface parallel to a principal surface of said substrate and polycrystal grains having a rough surface not parallel to the principal surface of said substrate exist in the surface of said polycrystalline film.

22. A photovoltaic device according to claim 21, wherein the predominant amount of material of said polycrystalline film is a metal or an alloy.

23. A photovoltaic device according to claim 21, wherein the predominant amount of material of said polycrystalline film is at least one element selected the group consisting of gold, silver, copper, aluminum and magnesium.

24. A photovoltaic device according to claim 21, further comprising a transparent conductive layer intervening between said polycrystalline film and said non-single-crystal semiconductor.

25. A photovoltaic device according to claim 21, wherein the surface of said transparent conductive layer has a difference in the degree of roughness corresponding to the polycrystal grain boundary of said polycrystalline film.

26. A photovoltaic device according to claim 21, wherein said polycrystalline film is a transparent conductive layer.

27. A photovoltaic device according to claim 21 wherein the surface of said photovoltaic device has a difference in the degree of roughness corresponding to the polycrystal grain boundary of said polycrystalline film.

28. A photovoltaic device according to claim 21, wherein the surface of said polycrystalline film has a step along the polycrystal grain boundary, or a protrusion or a recess at the polycrystalline grain boundaries.

29. A photovoltaic device according to claim 21, wherein the difference in the degree of roughness of the individual polycrystal grains ranges from 0.01 $\mu$m to 1.5 $\mu$m in terms of Rmax.

30. A photovoltaic device according to claim 21, wherein the mean grain size of said polycrystal of said polycrystalline film ranges from 0.1 $\mu$m to 2 mm.

31. A photovoltaic device according to claim 21, wherein a degree of roughness of the surface of said substrate ranges from 0.01 $\mu$m to 1 $\mu$m in terms of Rmax.

32. A photovoltaic device according to claim 21, wherein the height or depth of the step, protrusion or recess along the polycrystal grain boundary ranges from 0.01 $\mu$m to 2 $\mu$m.

* * * * *

UNITED STATES PATENT AND TRADEMARK OFFICE

CERTIFICATE OF CORRECTION

PATENT NO. : 6,184,456 B1
DATED : February 6, 2001
INVENTOR(S) : Matsuyama et al.

It is certified that error appears in the above-identified patent and that said Letters Patent is hereby corrected as shown below:

Column 1,
Line 13, "device" should be deleted;
Line 20, "device" should be deleted; and
Line 43, "the" (second occurrence) should be delete.

Column 9,
Line 45, "an" should read -- and --; and
Line 54, "method" should read -- methods --.

Column 11,
Line 31, "chloric" should read -- hydrochloric --.

Column 22,
Line 57, "ell" should read -- well --.

Column 24,
Line 27, "a" should read -- an --.

Column 25,
Line 25, "has becomes" should read -- become --;
Line 29, "becomes" should read -- become --; and
Line 34, "row" should read -- raw --.

Column 27,
Line 39, "summarize" should read -- summarizes --.

Column 29,
Line 50, "shutter was" should read -- The shutter was --.

Column 40,
Line 33, "summarizes" should read -- summarizes --.

Column 46,
Line 1, "an" should read -- a --;
Line 23, "has becomes" should read -- became --; and
Line 27, "becomes" should read -- became --.

UNITED STATES PATENT AND TRADEMARK OFFICE
CERTIFICATE OF CORRECTION

PATENT NO. : 6,184,456 B1
DATED : February 6, 2001
INVENTOR(S) : Matsuyama et al.

It is certified that error appears in the above-identified patent and that said Letters Patent is hereby corrected as shown below:

Column 47,
Line 26, “has become” should read -- became --; and
Line 33, “has become” should read -- became --.

Column 48,
Line 39, “summarize” should read -- summarizes --.

Column 50,
Line 49, “shutter was” should read -- The shutter was --.

Column 52,
Line 50, “(3)” should read -- (2) --; and
Line 56, “(4)” should read -- (3) --.

Column 53,
Line 44, “to” should read -- to as --;
Line 46, “has” should read -- had --; and
Line 48, “has” should read -- had --.

Column 55,
Line 49, “to” should read -- to as --; and
Line 55, “has” should read -- had --.

Column 61,
Line 21, “.)” should read -- ) --; and
Line 22, “to” should read -- as --.

Column 62,
Line 44, “an” should read -- a --.

Column 63,
Line 31, “to” should read -- to as --.

Column 66,
Line 67, “a” should read -- an --.

Column 67,
Line 41, “an” (scond occurrence) should read -- a --; and
Line 51, “place” should read -- placed --.

UNITED STATES PATENT AND TRADEMARK OFFICE

CERTIFICATE OF CORRECTION

PATENT NO. : 6,184,456 B1 
DATED : February 6, 2001
INVENTOR(S) : Matsuyama et al.

It is certified that error appears in the above-identified patent and that said Letters Patent is hereby corrected as shown below:

Column 68,
Line 2, “becomes” should read -- became --; and
line 6, “has become” should read -- became --.

Column 69,
Line 1, “has become” should read -- became --.; and
Line 7, “has become” should read -- became --.

Column 70,
Line 11, “summarize” should read -- summarizes --; and
Line 47, “were” should read -- was --.

Column 74,
Line 25, “(3)” should read -- (2) --; and
Line 31, “(4)” should read -- (3) --.

Column 75,
Line 41, “determine” should read -- determined --.

Column 83,
Line 5, “summarize” should read -- summarizes --.

Column 84,
Line 27, “an” should read -- a --; and
Line 56, “By 8 Comparative Example” should read -- Comparative Example C7-2--;
Line 57, “C7-2 differs” should read -- Comparative Example C7-2 differs --.

Column 88,
Line 56, “has becomes” should read -- became --; and
Line 60, “becomes” should read -- became --.

Column 91,
Line 3, “summarize” should read -- summarizes --.

Column 93,
Line 15, “shutter was” should read -- the shutter was --.

Column 96,
Line 15, “to” should read -- to as --.

UNITED STATES PATENT AND TRADEMARK OFFICE

CERTIFICATE OF CORRECTION

PATENT NO. : 6,184,456 B1
DATED : February 6, 2001
INVENTOR(S) : Matsuyama et al.

It is certified that error appears in the above-identified patent and that said Letters Patent is hereby corrected as shown below:

Column 98,
Line 19, “to” should read -- to as --;
Lines 21 and 24, “has” should read -- had --;
Line 39, “as” should read -- and --;
Line 39. “in” should read -- as in --; and
Line 43, “determined” should read -- determined. --.

Column 100,
Line 17, “to” should read -- to as; --;
Line 22, “has” should read -- had --;
Line 41, “as” should be deleted; and
Line 44, “determined” should read -- determined. --.

Column 102,
Line 20, “keep” should read -- keeps --;
Line 37, “to” should be deleted.

Column 103,
Line 48, “to” should read -- to as --.

Column 104,
Line 15, “with” should read -- by --.

Column 105,
Line 2, “ur-Si” should read -- μc-Si --;
Line 13, “pc-Si” should read -- μc-Si --; and
Line 55, “to” should read -- to as --.

Column 106,
Line 2, “deposition” should read -- deposition of --

Column 107,
Line 18, “grains” should read -- grain --;
Line 22, “TO” should read -- to --;
Line 49, “other” should read -- other than --; and
Line 58, “1.50 μ,__” should read -- 1.50 μm, --

Column 108,
Line 28, “he” should read -- the --.

UNITED STATES PATENT AND TRADEMARK OFFICE
CERTIFICATE OF CORRECTION

PATENT NO. : 6,184,456 B1
DATED : February 6, 2001
INVENTOR(S) : Matsuyama et al.

It is certified that error appears in the above-identified patent and that said Letters Patent is hereby corrected as shown below:

Column 120,
Line TA30, "Hight" should read -- Height --; and
Line TA31, "Hight" should read -- Hight --.

Column 121,
Line TA32, "Hight" should read -- Height --;
Line TA33, "Hight" should read -- Height --; and
Line TB1, "minute" should read -- minutes --.

Column 126,
Line TB9-cont., "Collecting electrode | Cr (100 nm)/Ag (1 μm)/Cr (100 nm)"
ahould read -- Collecting electrode | Cr (100 nm)/Ag (1 μm)/Cr (100 nm) --.

Column 136,
Line TB36, "Remax" should read -- Rmax --; and
Line TB39, "Remax" should read -- Rmax --.

Column 143,
Line TC17, "minute" should read -- minutes --.

Column 153,
Line TD1, "ZuO:" should read -- Zn O: --.

UNITED STATES PATENT AND TRADEMARK OFFICE

CERTIFICATE OF CORRECTION

PATENT NO. : 6,184,456 B1
DATED : February 6, 2001
INVENTOR(S) : Matsuyama et al.

It is certified that error appears in the above-identified patent and that said Letters Patent is hereby corrected as shown below:

Column 173,
Line 15, "the" should read --from the --.

Signed and Sealed this

Eighteenth Day of June, 2002

*Attest:*

JAMES E. ROGAN

*Attesting Officer* *Director of the United States Patent and Trademark Office*